(12) United States Patent
Atanackovic

(10) Patent No.: US 7,928,317 B2
(45) Date of Patent: *Apr. 19, 2011

(54) THIN FILM SOLAR CELL

(75) Inventor: Petar B. Atanackovic, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 584 days.

This patent is subject to a terminal disclaimer.

(21) Appl. No.: 11/788,153

(22) Filed: Apr. 18, 2007

(65) Prior Publication Data

US 2008/0078444 A1    Apr. 3, 2008

Related U.S. Application Data

(60) Provisional application No. 60/811,311, filed on Jun. 5, 2006, provisional application No. 60/847,767, filed on Sep. 27, 2006.

(51) Int. Cl.
   *H01L 31/00* (2006.01)
(52) U.S. Cl. ............... 136/252; 136/261; 136/262
(58) Field of Classification Search ........... 136/243–265
   See application file for complete search history.

(56) References Cited

U.S. PATENT DOCUMENTS

| | | |
|---|---|---|
| 4,834,501 A | 5/1989 | Honda |
| 5,548,128 A | 8/1996 | Soref |
| 6,734,453 B2 | 5/2004 | Atanackovic |
| 6,858,864 B2 | 2/2005 | Atanackovic |
| 6,943,385 B2 | 9/2005 | Usuda |
| 7,018,484 B1 | 3/2006 | Atanackovic |
| 7,023,011 B2 | 4/2006 | Atanackovic |
| 7,037,806 B1 | 5/2006 | Atanackovic |
| 7,135,699 B1 | 11/2006 | Atanackovic |
| 7,199,015 B2 | 4/2007 | Atanackovic |
| 7,199,451 B2 | 4/2007 | Kelman |
| 7,211,821 B2 | 5/2007 | Atanackovic |
| 7,217,636 B1 | 5/2007 | Atanackovic |
| 7,253,080 B1 | 8/2007 | Atanackovic |
| 7,273,657 B2 | 9/2007 | Atanackovic |
| 7,351,993 B2 | 4/2008 | Atanackovic |
| 7,384,481 B2 | 6/2008 | Atanackovic |
| 7,416,959 B2 | 8/2008 | Atanackovic |
| 7,589,003 B2 | 9/2009 | Kouvetakis |

(Continued)

OTHER PUBLICATIONS

Laughlin, Optical absoption edge of SiO2, Physical Review B, vol. 22, No. 6, pp. 3021-3029, Sep. 15, 1980.*

(Continued)

*Primary Examiner* — Jessica L Ward
*Assistant Examiner* — Kevin E Yoon
(74) *Attorney, Agent, or Firm* — Fernandez & Associates, LLP

(57) ABSTRACT

Optimal structures for high efficiency thin film silicon solar energy conversion devices and systems are disclosed. Thin film silicon active layer photoelectron conversion structures using ion implantation are disclosed. Thin film semiconductor devices optimized for exploiting the high energy and ultraviolet portion of the solar spectrum at the earths surface are also disclosed. Solar cell fabrication using high oxygen concentration single crystal silicon substrates formed using in preference the CZ method are used advantageously. Furthermore, the present invention discloses optical coatings for advantageous coupling of solar radiation into thin film solar cell devices via the use of rare-earth metal oxide ($REO_x$), rare-earth metal oxynitride ($REO_xN_y$) and rare-earth metal oxy-phosphide ($REO_xP_y$) glasses and or crystalline material. The rare-earth metal is chosen from the group commonly known in the periodic table of elements as the lanthanide series.

5 Claims, 114 Drawing Sheets

Lateral Graded Field Cell

U.S. PATENT DOCUMENTS

| | | |
|---|---|---|
| 7,598,513 B2 | 10/2009 | Kouvetakis |
| 2005/0161773 A1 | 7/2005 | Atanackovic |
| 2005/0163692 A1 | 7/2005 | Atanackovic |
| 2006/0060826 A1 | 3/2006 | Atanackovic |
| 2007/0020891 A1 | 1/2007 | Kouvetakis |
| 2008/0187768 A1 | 8/2008 | Kouvetakis |
| 2008/0217695 A1 | 9/2008 | Atanackovic |
| 2008/0223438 A1 | 9/2008 | Xiang |
| 2008/0241519 A1 | 10/2008 | Schroeder |
| 2008/0277647 A1 | 11/2008 | Kouvetakis |
| 2008/0286949 A1 | 11/2008 | Atanackovic |
| 2008/0308143 A1 | 12/2008 | Atanackovic |
| 2009/0001329 A1 | 1/2009 | Atanackovic |
| 2009/0038669 A1 | 2/2009 | Atanackovic |
| 2009/0085115 A1 | 4/2009 | Atanackovic |
| 2009/0183774 A1 | 7/2009 | Atanackovic |
| 2009/0229661 A1 | 9/2009 | Mortenson |
| 2009/0236595 A1 | 9/2009 | Atanackovic |
| 2009/0242019 A1 | 10/2009 | Ramamoorthy |

OTHER PUBLICATIONS

Mikhelashvili et al., Structural properties and electrical characteristics of electron-beam gun evaporated erbium oxide films, Applied Physics Letters, vol. 80, No. 12, pp. 2156-2158, Mar. 25, 2002.*

* cited by examiner

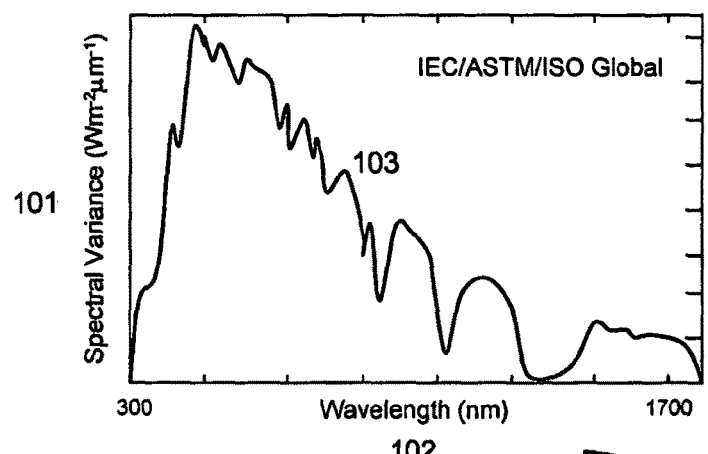
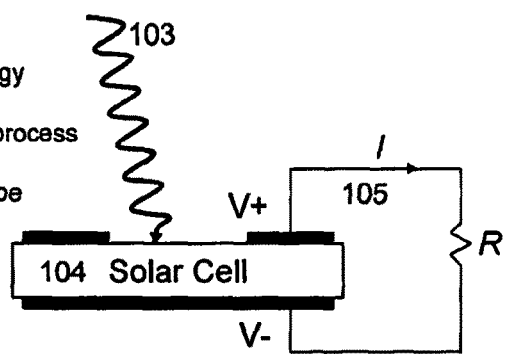
- Incident optical energy converted into electrical energy
- Solar cell efficiency depends on *optical → electrical* process
- Solar cells can be current sources or photovoltaic type
FIGURE 1B

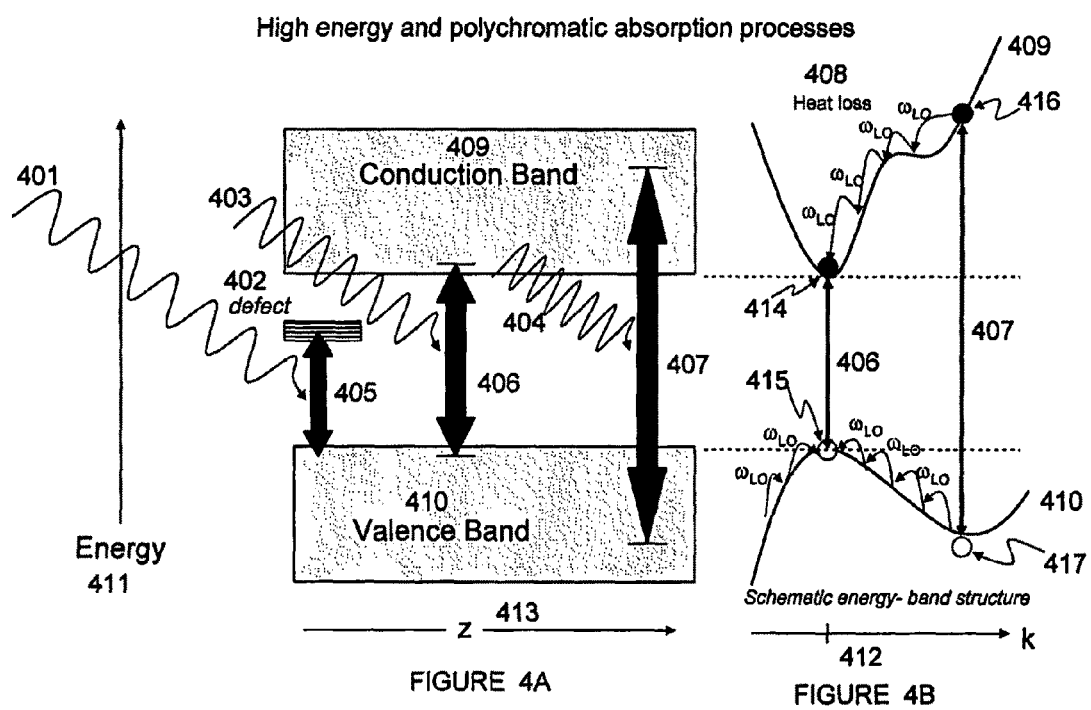

High energy and polychromatic absorption processes

Schematic energy-band structure

- Semiconductors absorb optical energy above the band gap
- Defective crystals or impurities with energy within the band gap may also absorb
- High energy photons can generate carriers but lose energy via emitting phonons of energy $\omega_{LO}$ thereby heating the lattice
- High energy photogenerated carriers relax to band extrema filling up available phase space for low energy absorption n.b.: *RE-Oxide good optical window material & can be engineered to be insulator or conductor !*

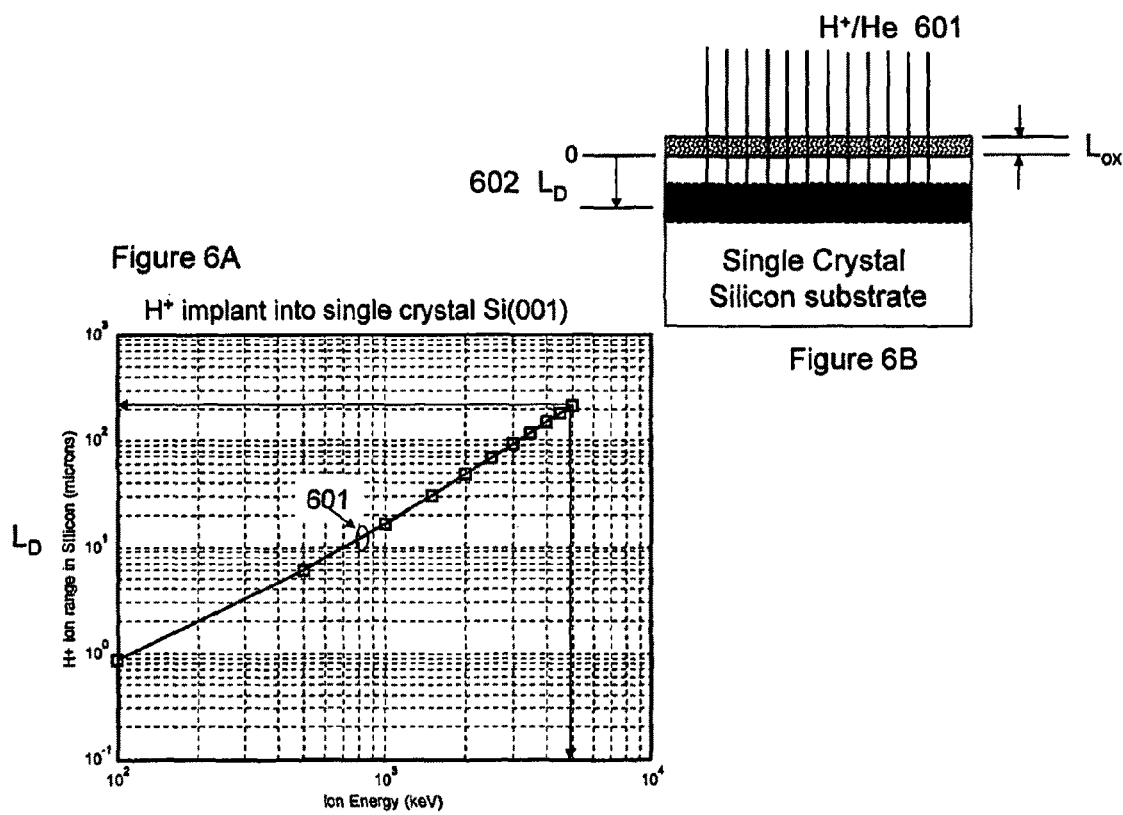
SRIM 2003 Simulation of Hydrogen depth profile versus incident H⁺ energy.

SRIM 2003 Simulation of Hydrogen depth profile versus incident H⁺ energy.

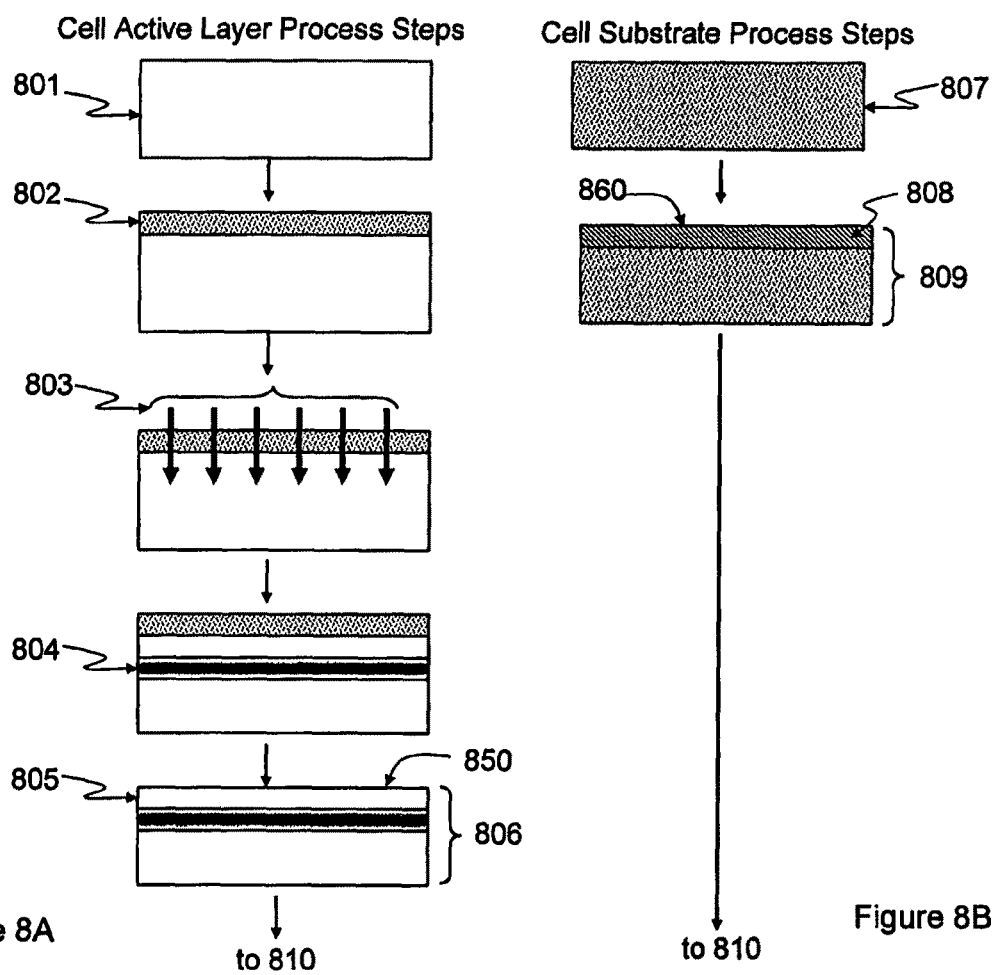

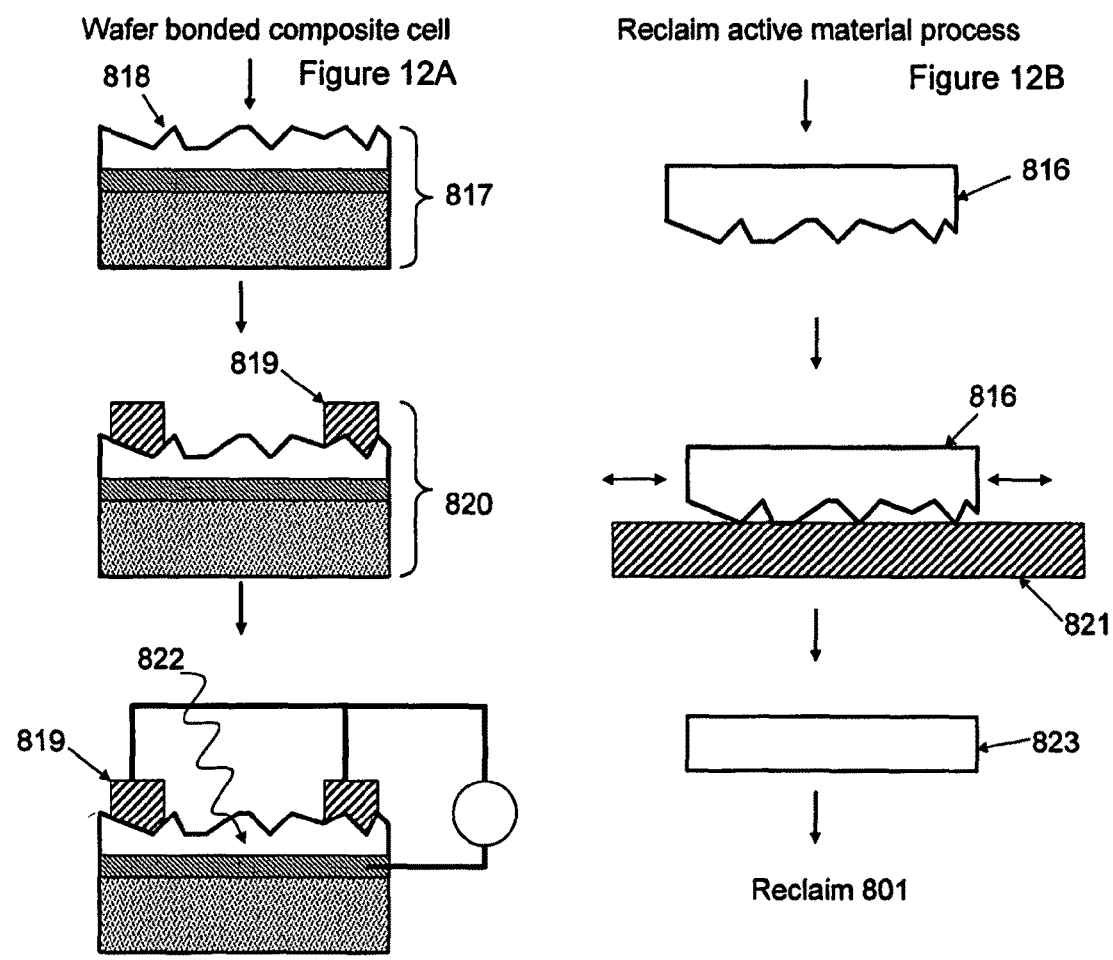

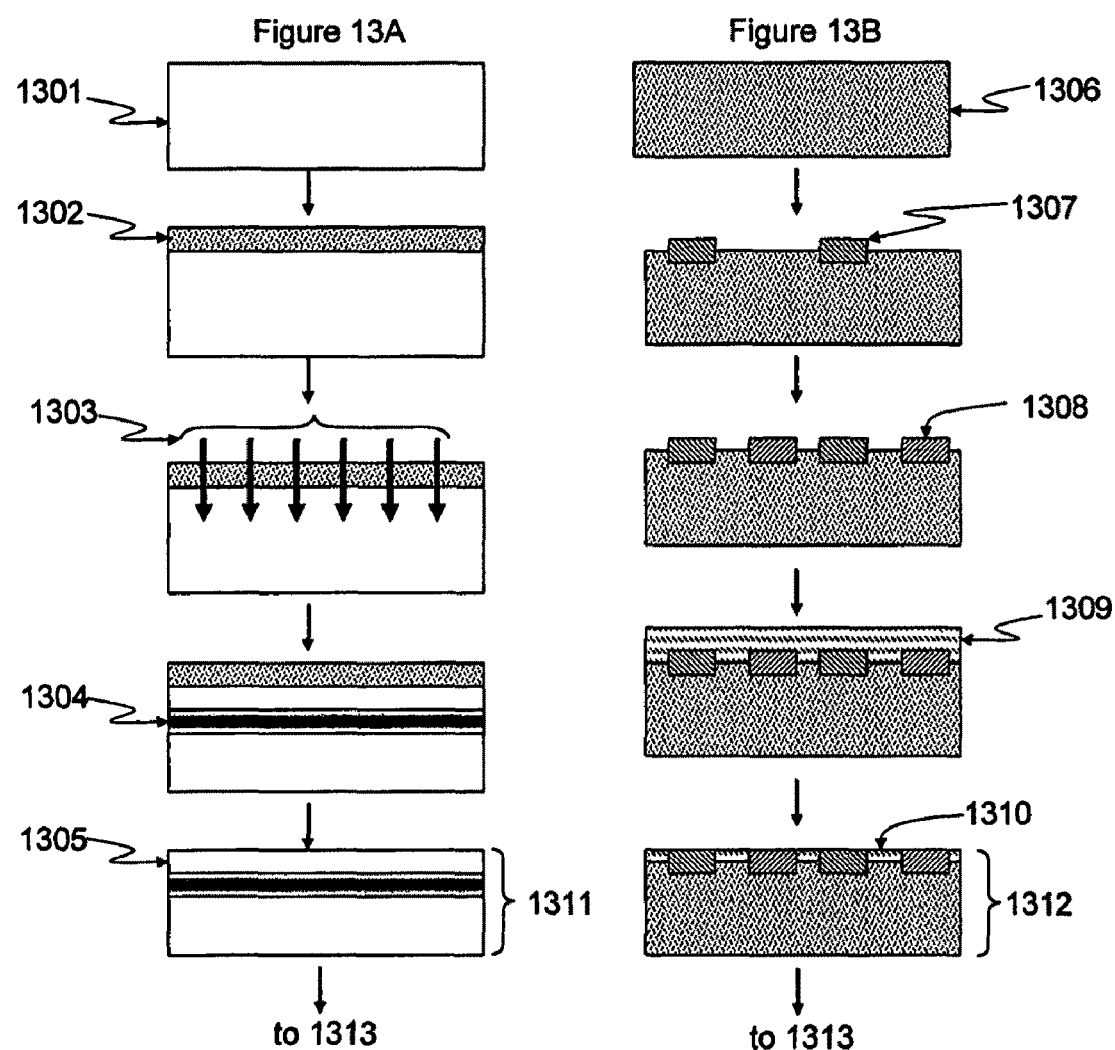

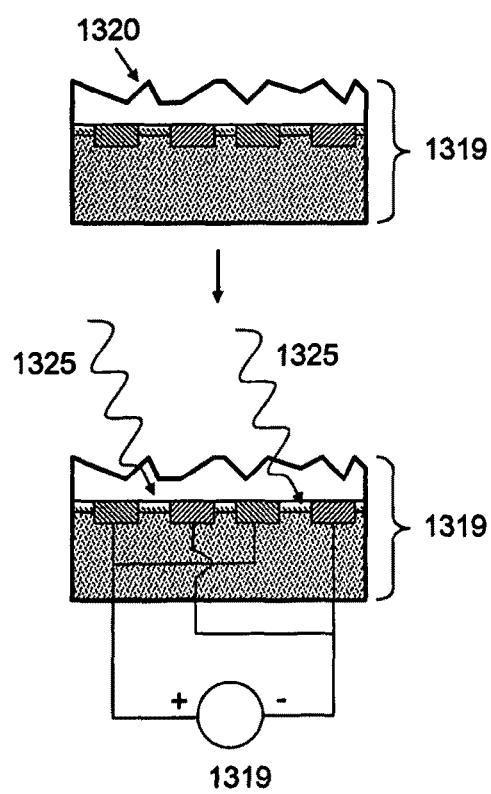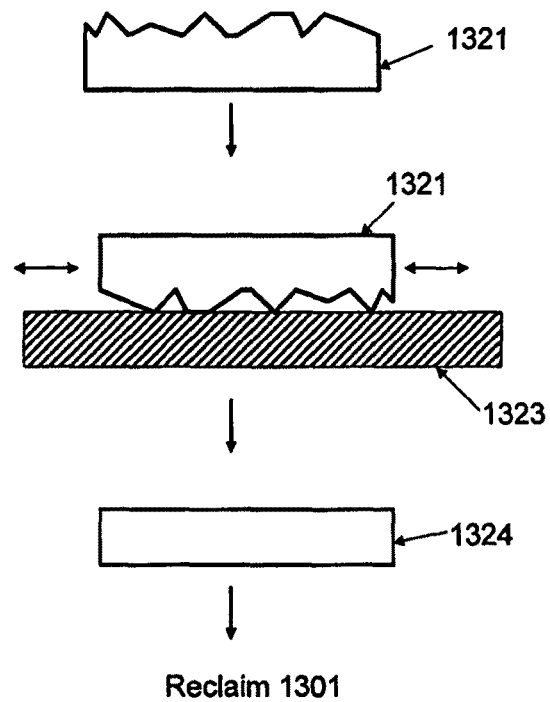
Figure 17A
Figure 17B

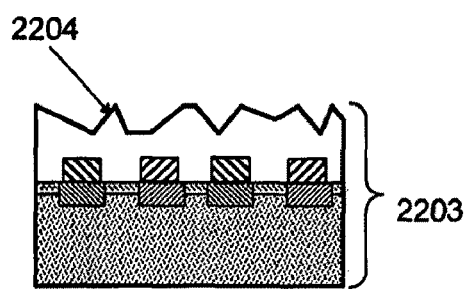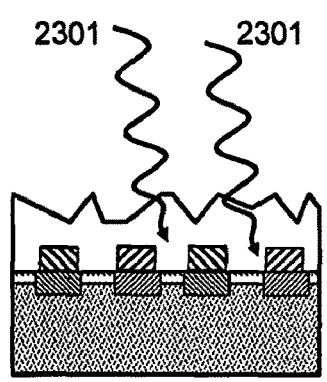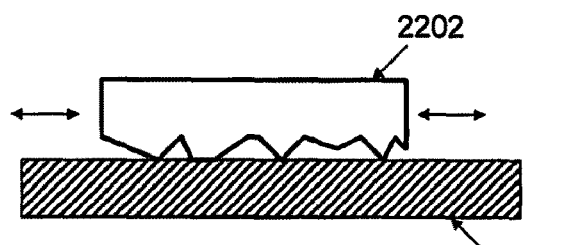
Reclaim 1901
Figure 23A  Figure 23B

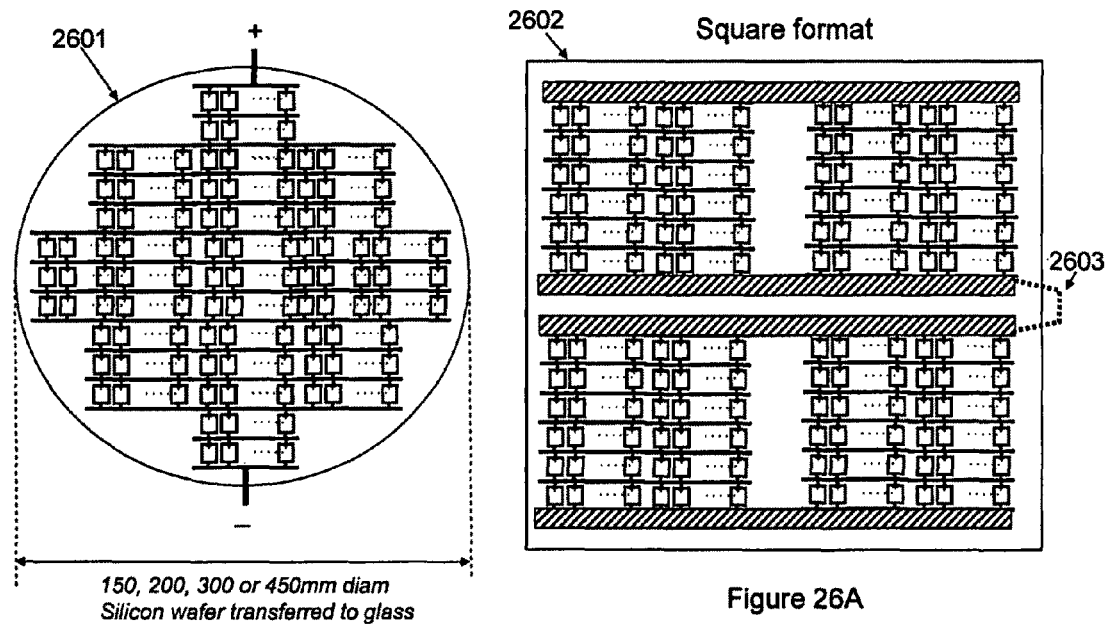
Single Wafer High Voltage and High Current Integrated Cell & Module
Figure 26B — 150, 200, 300 or 450mm diam Silicon wafer transferred to glass
Figure 26A — Square format CMP wedge multi-wavelength selective solar energy conversion device Dual Lateral-Vertical p-n, 4500

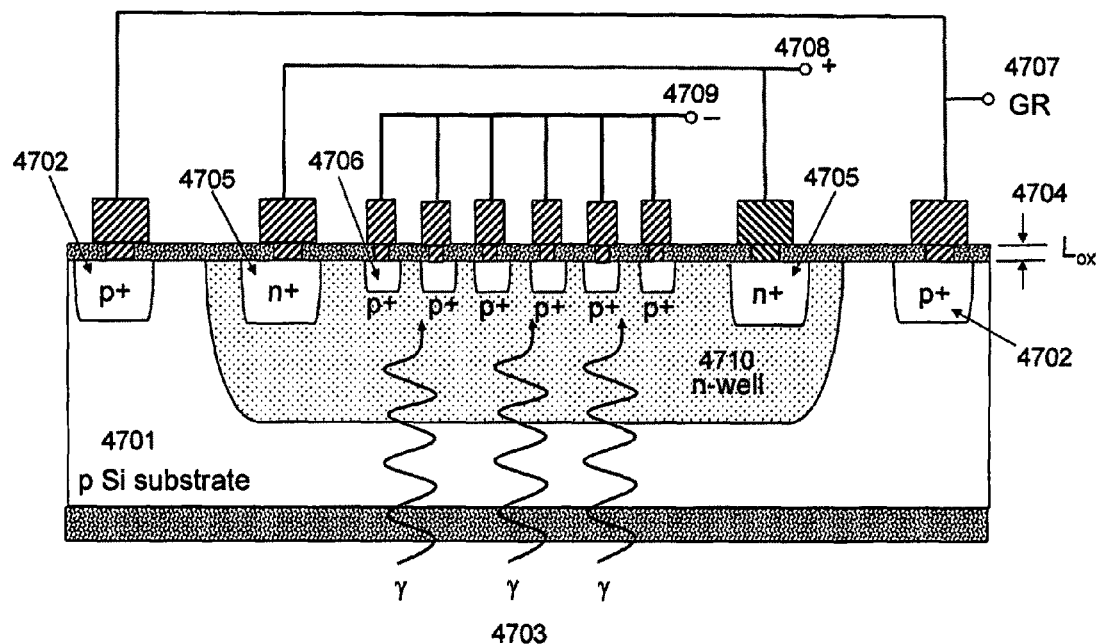
Figure 47A     Maximize depletion regions available for carrier collection near surface

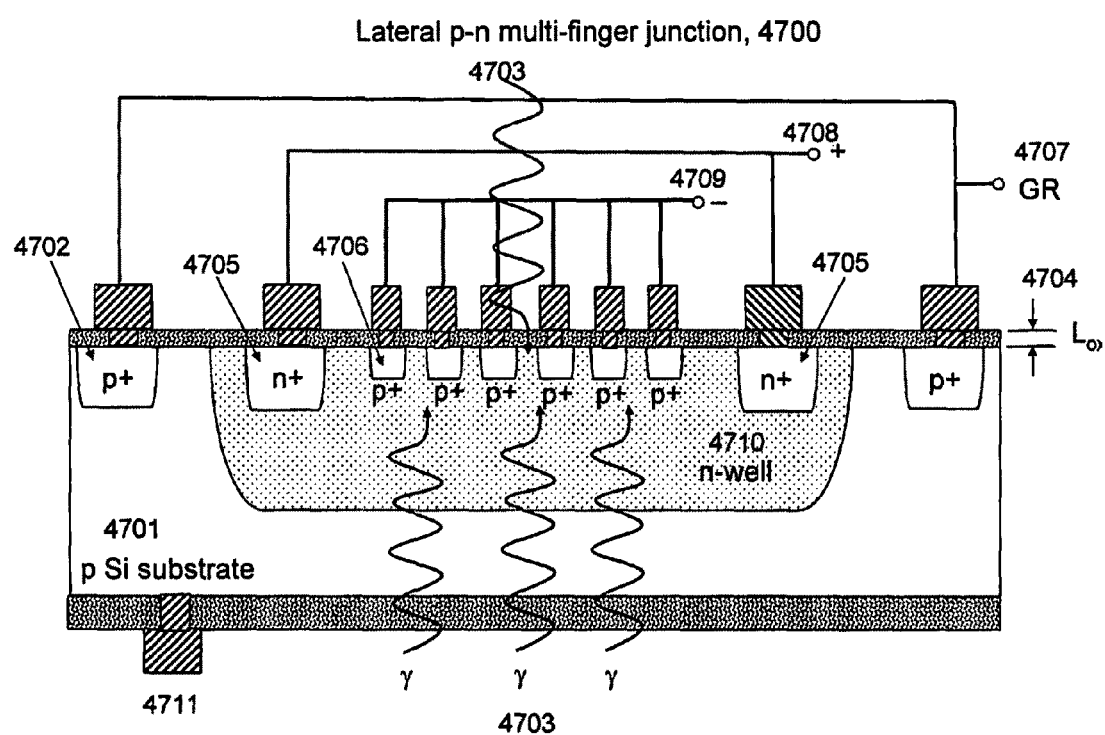
Figure 47B   Maximize depletion regions available for carrier collection near surface

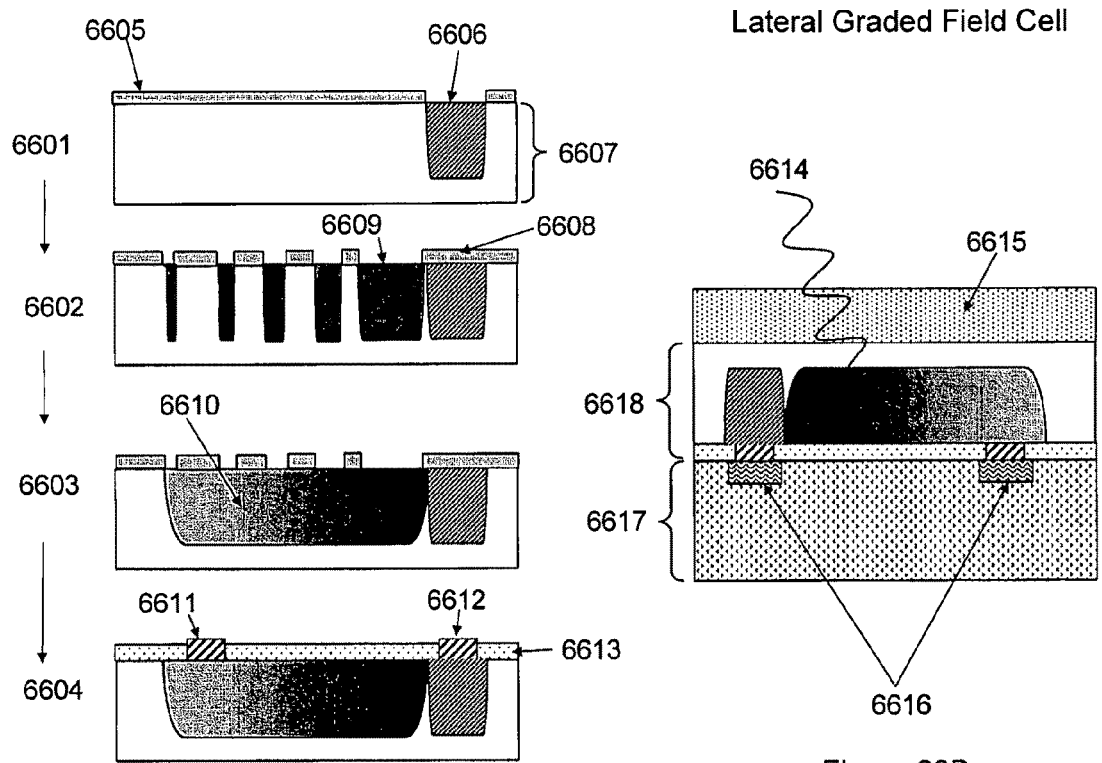

Lateral Graded Field Cell

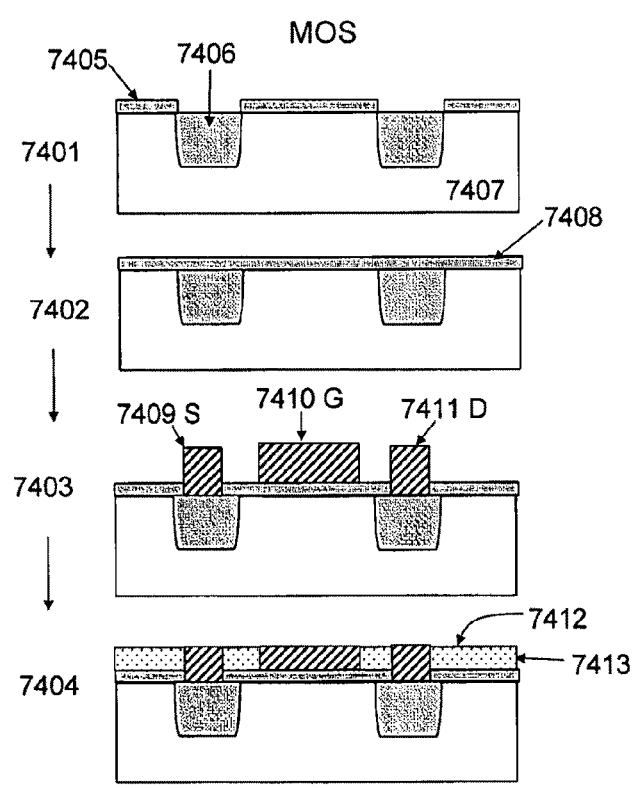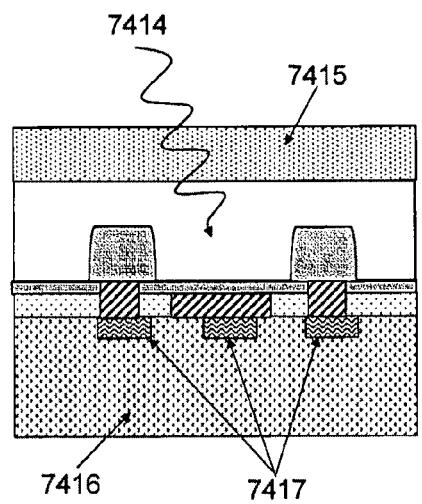
Figure 74A
Figure 74B

Lateral p-i-n MOS Avalanche Multiplier

7805 Metal-Insulator-pSi    7806 Metal-Insulator-nSi

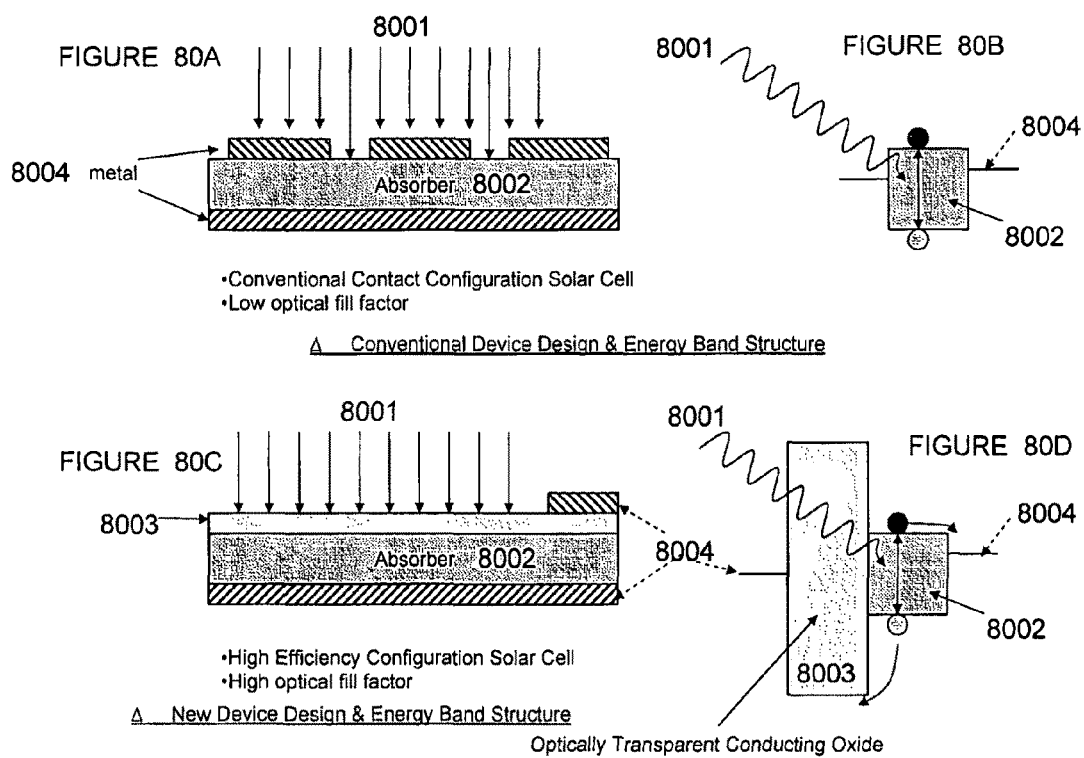

FIGURE 82 — Spatially selective optical filter and OE conversion solar cell (Separate absorption & conversion (SAC) solar cell)

Stacked wavelength selective cells can be electrically configured in:
parallel ( current source) &
series ( photovoltaic)

FIGURE 83 — Germanium-Rare-Earth-Oxide Ternary alloy bandgap engineered absorber Germanium-Rare-Earth Oxide $Ge_x(REO_y)_{1-x}$ Alloy Bandgap Engineering

Graded band gap device : current source

Depletion of high energy photons as function of distance into device.

i.e.: Spatially selective energy absorber

FIGURE 87A
Chirped digitally graded superlattice
FIGURE 87B
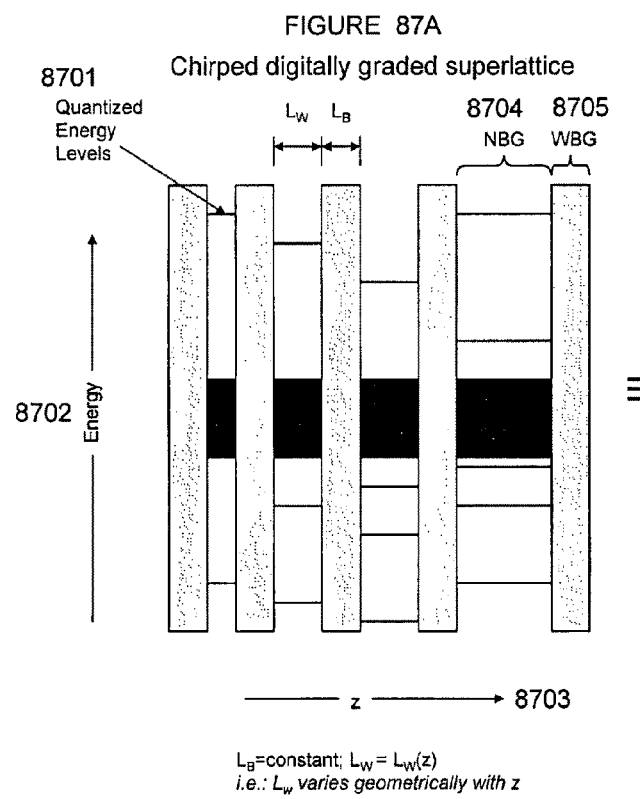
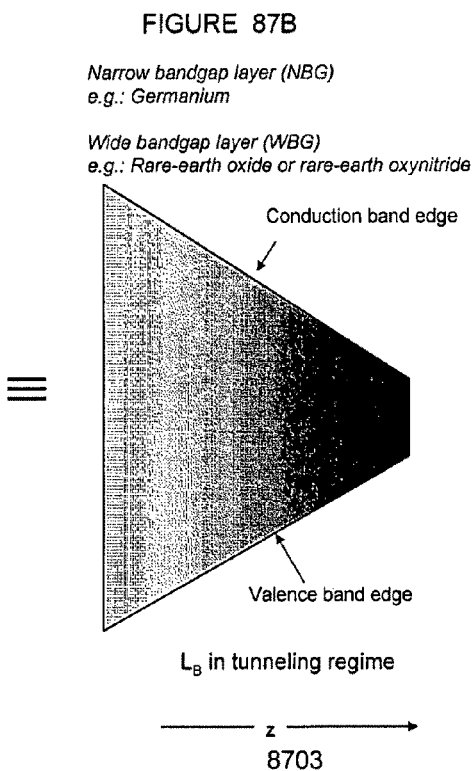

Narrow bandgap layer (NBG)
e.g.: Germanium & or Silicon

Wide bandgap layer (WBG)
e.g.: Rare-earth oxide or rare-earth oxynitride

Grain boundary larger than well size better for photocarrier extraction

TEM of Type I VCOA

ErOx gain layer is polycrystalline and final surface roughness $\Delta L_g << \lambda_o/10$

- Thick film solar cell with textured reflector
- Substrate can be broad band distributed quarter wave multilayer stack reflector Solar Cell Reflector Design Criteria
$(SiN_x / SiO_y)$ λ/4 DBR Simulation
DBR mirror reflectivity
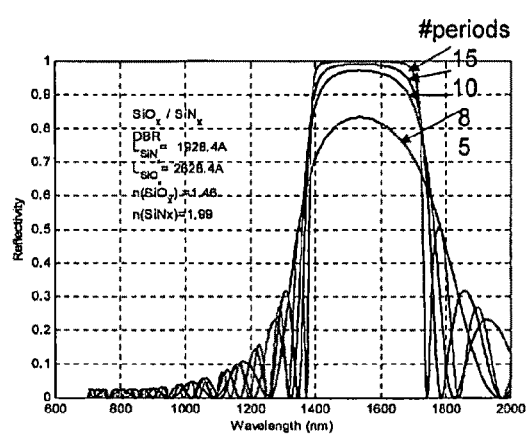
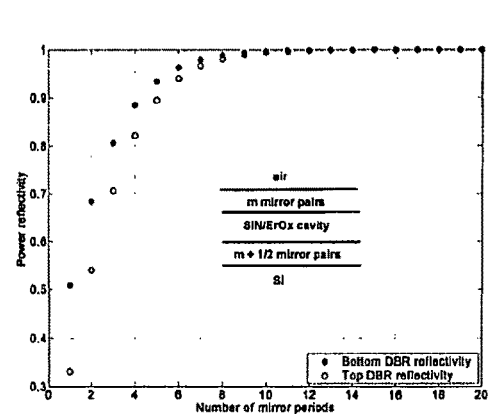
FIGURE 99A
FIGURE 99B Transmission Spectra of passive DBR and $\lambda_{cav}/2n$ $SiO_x$ Cavity

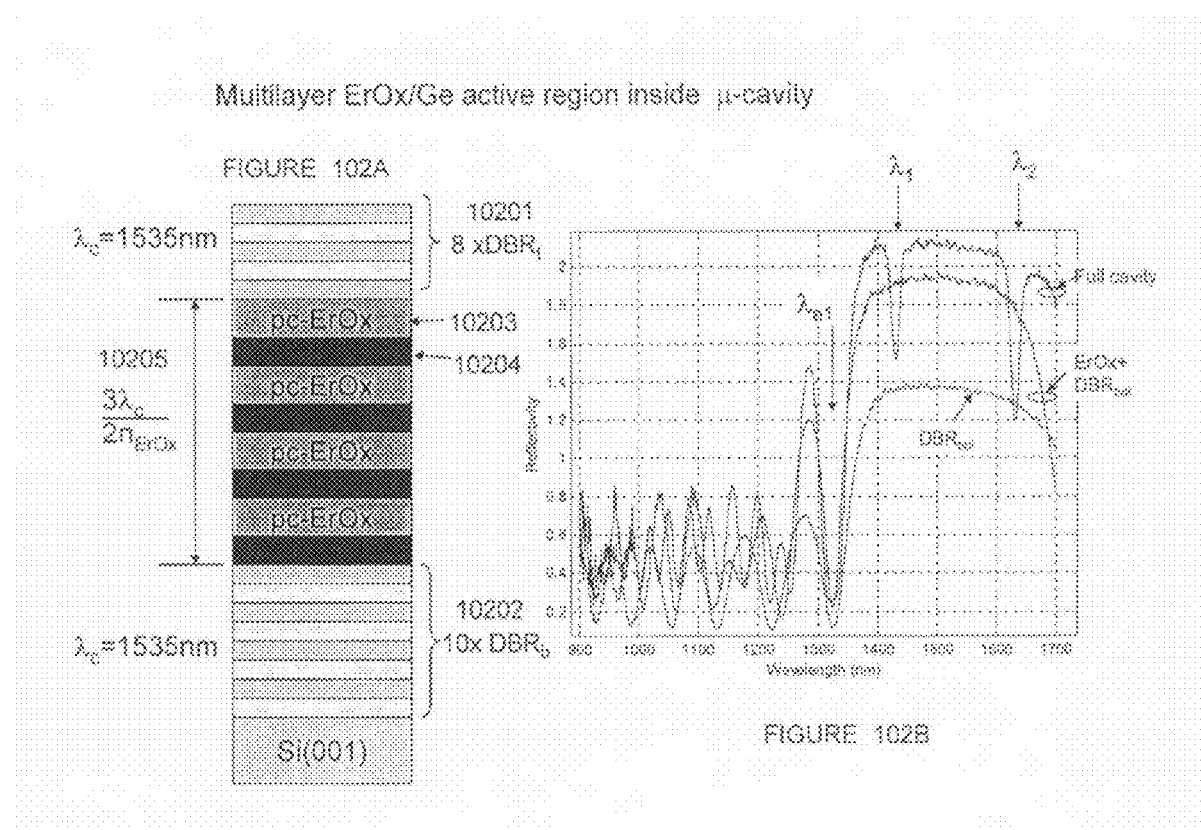

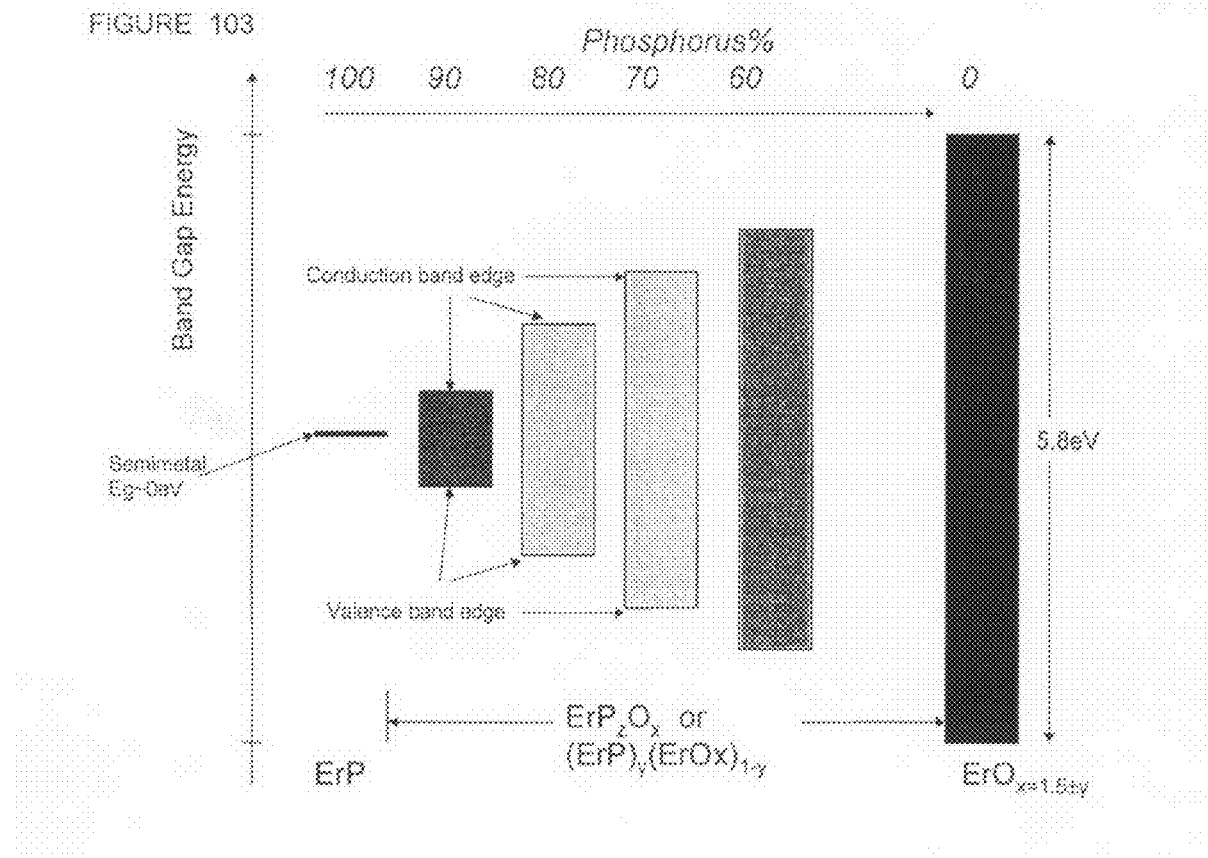

Rare-Earth Oxide Phosphide $(ErP)_x(REO_y)_{1-x}$ Alloy Bandgap Engineering

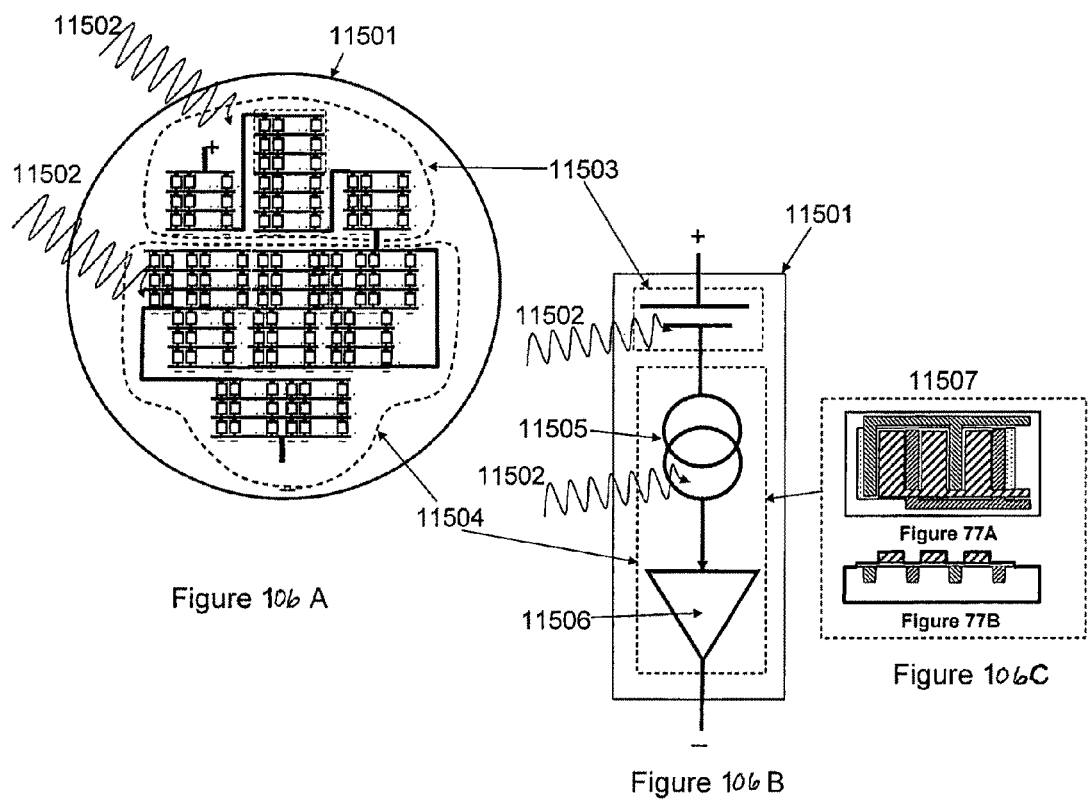

THIN FILM SOLAR CELL

PRIORITY

This application claims priority from Provisional Application 60/811,311 Titled "Solar Cell Band-gap Engineered" filed on Jun. 5, 2006 and Provisional Application titled "Thin Film Solar Cell II" filed on Sep. 27, 2006, Ser. No. 60/847,767.

CROSS REFERENCE TO RELATED APPLICATIONS

Applications and patent Ser. Nos. 09/924,392, 10/666,897, 10/746,957, 10/799,549 10/825,912, 10/825,974, 11/022,078, 11/025,363, 11/025,680, 11/025,681, 11/025,692, 11/025,693, 11/084,486, 11/121,737, 11/187,213, U.S. 20050166834, U.S. 20050161773, U.S. 20050163692, Ser. Nos. 11/053,775, 11/053,785, 11/054,573, 11/054,579, 11/054,627, 11/068,222, 11/188,081, 11/253,525, 11/254,031, 11/257,517, 11/257,597, 11/393,629, 11/398,910, 11/472,087, 60/820,438, 60/811,311, U.S. Pat. No. 7,018,484, U.S. Pat. No. 7,037,806, U.S. Pat. No. 7,135,699 and Provisional Application titled "Thin Film Solar Cell II" filed on Sep. 27, 2006 with Ser. No. 60/847,767, all held by the same assignee contain information relevant to the instant invention and are included herein in their entirety by reference. References, noted at the end, are included herein in their entirety by reference.

FIELD OF INVENTION

The present invention relates to semiconductor devices suitable for optoelectronic applications. In various embodiments the present invention relates to the fabrication of a solar cell through various combinations of rare-earth metal oxides, nitrides, phosphides and Group IV, III-V, and II-VI semiconductors and alloys.

BACKGROUND OF INVENTION

Prior art concerning solar cells known to one knowledgeable in the art is present in the literature. References contained in U.S. Pat. No. 4,128,733, U.S. Pat. No. 5,686,734, U.S. Pat. No. 6,333,457, U.S. Pat. No. 6,423,568, U.S. Pat. No. 6,743,974, U.S. Pat. No. 6,745,687, U.S. Pat. No. 6,998,288, U.S. Pat. No. 7,030,313, U.S. Pat. No. 7,179,677, U.S.2002/0040727, U.S.2004/0200520, U.S.2005/0000566 are cited as prior art and included herein in their entirety by reference. Recent silicon (Si) solar cell devices are manufactured using generally bulk and or thin film configurations. Typically, bulk Si solar cells are classed as first generation devices. In an effort to reduce cell cost, the volume of Si required is reduced using thin films of Si on relatively cheaper substrates, such as glass (e.g., $SiO_2$). Thin film semiconductor solar cell approaches form second generation devices, generally. Unfortunately, depositing high quality single crystal (or monocrystalline) Si on amorphous substrates has proved extremely difficult. Typically, the Si deposited on glass substrates is amorphous. Efforts to produce amorphous Si (a-Si) solar cells have consistently shown inferior performance compared to single crystal bulk Si solar cells. To improve the crystal quality of the a-Si films, they must be heat treated to temperatures approaching the melting point of Si ($T_{melt}$~1420° C.) in order for recrystallization to occur. The result of which is either polycrystalline (poly-Si) and or large domain single crystal Si. Again, the poly-Si and/or large domain single crystal Si (ld-sc-Si) thin film solar cells have energy conversion efficiency below single crystal bulk Si solar cells. Both first and second generation Si solar devices are based on a single junction (SJ) configuration. A limitation of SJ's is only a small optical energy absorption window in the immediate vicinity of the fundamental energy band gap can be used advantageously, thereby rejecting a large portion of the available power from the solar spectrum. It has been (theoretically) shown by workers in the field that the maximum attainable energy conversion efficiency for SJ cells is $\eta_{(SJ)} \leq 25\text{-}32\%$. The present invention solves a long standing problem of detrimental high energy photon effects in Si solar cell devices.

The superior crystal quality of bulk Si substrates manufactured using Czochralski (CZ) growth techniques is due to requirements for silicon based ultra-large-scale-integrated-circuits (ULSICs) based on complementary-metal-oxide-semiconductor (CMOS) transistors. Single crystal silicon (sc-Si) substrates with diameters of 300 mm are presently in widespread CMOS production with plans to implement 450 mm in the near future. A unique aspect of ULSI CMOS industry is the extremely successful manipulation of large form factor substrates using area fabrication tools, such as, ion implantation, thin film deposition and lithography. This allows high complexity planar structures to be economically manufactured with high throughput—i.e., wafer scale manufacture.

The silicon solar cell industry in comparison can be well described as a discrete fabrication technology with extremely low levels of integration. For example, a single junction Si solar cell typically delivers less than 0.7V and large numbers of discrete cells must be interconnected into modules in order to generate useful voltages and current for power generation. Furthermore, each cell must be separately packaged and environmentally sealed. The present invention discloses wafer scale manufacture of SJ silicon modules using high throughput and large area substrates. Furthermore, the present invention discloses large area thin film Si transfer technique onto cost effective substrates. The device fabrication methods disclosed allow complex power systems with low cost when applied to high volume throughput. As a general observation, a solar power fabrication plant producing 1 gigawatt per year using silicon SJ devices will consume approximately 150-200 times more Si substrate area than a 300 mm CMOS plant.
Solar Energy Conversion Devices The broadband solar optical spectrum at ground level ranges from below 300 nm to over 1700 nm, spanning the ultraviolet to far infrared. FIGS. 1A and B show a general power spectrum, punctuated with multiple atmospheric absorption regions. The peak spectral variance is seen to occur in the 400-600 nm region. Optical photon to electron conversion devices employing semiconductors are well known. FIG. 2 shows the absorption coefficient $\alpha_{abs}$ of several technologically mature semiconductors. The indirect bandgap semiconductors Si and germanium (Ge) span major portions of the solar spectrum. Group III-V direct band gap compound semiconductors, such as, gallium arsenide (GaAs), indium phosphide (InP) and indium gallium arsenide (InGaAs) alloy also have good spectrum coverage and exhibit sharp cut-on wavelengths defined by the direct band edges. Wide band gap silicon-carbide (6H:SiC) absorbs only at the highest energies in the UV, and covers the least fraction of the solar spectrum. In comparison Si and Ge, have long wavelength absorption tails due to the indirect energy-momentum band structure; see FIGS. 3A-C. If an optical photon incident upon the Si crystal has energy equal to or above the fundamental band gap energy it is absorbed. This creates an electron-hole pair with the aid of an appropriate lattice phonon wavevector-k which is required in the photocarrier generation process in order to conserve energy and momentum. The inverse process of electron-hole (e-h) recombination is extremely inefficient compared to direct band gap semiconductors. For the present case of optical to electronic conversion, indirect band gap Si is advantageous for high sensitivity photodetection compared to direct band gap semiconductors—where e-h radiative recombination is efficient and represents a significant loss mechanism. Looking closely at the absorption coefficient of Si in FIG. 2 and FIGS. 3A-C, it is clear that the absorption depth near the Si fundamental band gap (Eg~1.1 eV) is extremely long. This means that photons with energy equal to or slightly greater than band gap energy Eg(Si) will penetrate to a depth $L_e=1/\alpha_{abs}$, deep within the crystal. However, the highest absorption coefficient for all the semiconductors is found for Si for wavelengths shorter than ~400 nm. Silicon photodetectors (SiPDs) have been shown to exhibit very low noise, high sensitivity and efficient avalanche multiplication effects. The low noise property is due to the small probability of radiative recombination due to the intrinsic indirect energy bandgap structure. The spectral range of SiPDs spans the broad range 200 nm to 1200 nm, and will be discussed later for application to UV solar cell conversion.

SUMMARY OF INVENTION

FIGS. 3A-C show the overlap of Si 303 and Ge 302 absorption with the solar spectrum 301 as a function of wavelength. Therefore, Ge is a superior choice for solar spectrum absorption and has 10-100× higher absorption co-efficient than Si in the 1.1-3 eV range. This means 10-100× thinner film absorbers using Ge are possible compared to Si. The use of Ge extends absorption down to 0.66 eV and therefore can potentially access more of the available solar spectrum and power.

For the case of high volume, large area and low cost solar cell fabrication, Si substrates are still advantageous and at least ~10-50× cheaper than Ge substrates. However, even by using Si substrates in preference to all other commercially relevant semiconductors, there is a need to increase solar cell efficiency and dramatically reduce cost.

One of the disadvantages of conventional solar cells based on a bulk Silicon semiconductor absorber is that the incidence of high energy photons (E>2 eV) degrades the absorption and optical to electronic conversion efficiency of the Silicon solar cell. Whilst the monochromatic efficiency can be high, the wide energy bandwidth or polychromatic efficiency is much lower. Clearly, this is a large disadvantage with Silicon (and typically all SJ cells) as the solar cells are designed to generate energy from solar radiation. One attempt to overcome this disadvantage is to employ optical filtering to narrow the wavelength band of incident radiation. However, this has the obvious disadvantage that large amounts of useful spectrum are discarded and accordingly more incident power is required at a specific wavelength to increase the output current of the solar cell. Optical concentrator techniques have also been employed but require costly infrastructure, thereby increasing the system cost. Other methods use semiconductors from either III-V compounds or II-VI compounds in preference to Si or in conjunction with Silicon. Specifically GaAs, gallium-indium-phosphide (GaInP), copper-indium-gallium-selenide (CIGS) and cadmium-telluride/sulphide (CdTe/CdS) compounds may be disposed on cost effective substrates, such as glass. However, the aforementioned thin films exhibit amorphous and or polycrystalline structure. Electrical conversion efficiency can be relatively high but typically lower than compared with single crystal silicon solar cells and further suffer the disadvantage of either high cost, non-abundant materials and use of toxic substances. All such devices based on alternative conversion medium are typically SJ devices and therefore constrained to maximum potential efficiency identical to single crystal Si SJ cell.

In some embodiments materials composed of germanium-rare-earth-metal oxides form band gap engineered electronic junctions capable of efficient optical conversion of solar radiation into electrical energy. In particular, the present invention converts solar radiation directly into electrical energy capable of doing useful work when delivered to an electrical load or energy storage medium.

BRIEF DESCRIPTION OF THE DRAWINGS

Illustrative embodiments of the present invention are discussed with reference to the accompanying drawings. The Figures are exemplary and not meant to be limiting; alternative compositions, as discussed in the specification and known to one knowledgeable in the art are possible for each material combination presented in the figures.

FIG. 1B is an overview of the photon-to-electron conversion process.

FIG. 6A shows ion depth profile beneath the Si surface versus implant energy. FIG. 6B shows the article and implantation configuration.

FIG. 8A shows various steps in preparing for thin film defoliation. FIG. 8B shows the preparation steps for the alternative or replacement substrate.

FIG. 12A shows steps for electrical connection of electrode and coupling of incident optical energy to thin film active layer; 12B shows reclaim steps of bulk semiconductor substrate.

FIGS. 13A and B show alternative steps for thin film preparation and patterning of buried electrodes on alternative substrate.

FIGS. 17 A and B shows alternative steps for operating device and substrate reclaim.

FIGS. 23 A and B shows alternative steps for operating device and substrate reclaim.

FIG. 26 shows an optional format for a photovoltaic apparatus; FIG. 26B shows an optional layout scheme for a photovoltaic module fabricated on circular wafer; FIG. 26A shows another optional layout scheme for a photovoltaic module fabricated on large area rectangular wafer.

FIG. 47A schematically shows an alternative radiation conversion type device, a lateral p-n multi-finger junction; FIG. 47B schematically shows another alternative radiation conversion type device, a lateral p-n multi-finger junction with a backside contact.

FIGS. 8C and D schematically show the Energy Band structure for p-n junction and p-i-n devices.

FIGS. 66A and B show a lateral graded electric field thin film solar cell.

FIGS. 74A and B an alternative metal-oxide-semiconductor type solar cell using simple oxide active region fabrication.

FIGS. 80 A, B, C, and D schematically compare conventional and new device solar absorbers. The present invention discloses the use of transparent conducting oxide.

FIGS. 87 A and B, schematically disclose an alternate method of generating a graded band gap structure using a digital alloy consisting of differing thickness layers of either narrow band gap (NBG) or wide band gap (WBG) semiconductors.

FIG. 88 A schematically discloses use of rare-earth oxide potential energy barrier layers and germanium quantum well layers. The WBG & NBG layers can be deposited such that quantum confinement of charge carriers occurs.

FIG. 99A is a theoretical silicon oxide/silicon nitride optical distributed Bragg reflector (DBR). FIG. 99B are theoretical reflectivity curves as a function of low and high refractive index bi-layer number pairs calculated for silicon oxide/silicon nitride distributed Bragg reflectors located above and below an active region functioning as a solar cell.

FIG. 102A discloses a multilayer ErOx/Ge active region for the cavity region of solar cell microcavity composed of a DBR above and below the said active region and attached to a silicon substrate; FIG. 102B shows measured reflectivity of lower DBR only, lower DBR plus cavity and full microcavity.

FIG. 103 is a schematic diagram showing the energy band gap tuning (that is, band gap engineering) of the energy band gap for a rare-earth-oxide-phosphide.

FIGS. 106A, B and C discloses wafer scale solar energy conversion module comprising unit cells interconnected for advantageous function.

DETAILED DESCRIPTION OF SEVERAL EMBODIMENTS

Figure 1A:
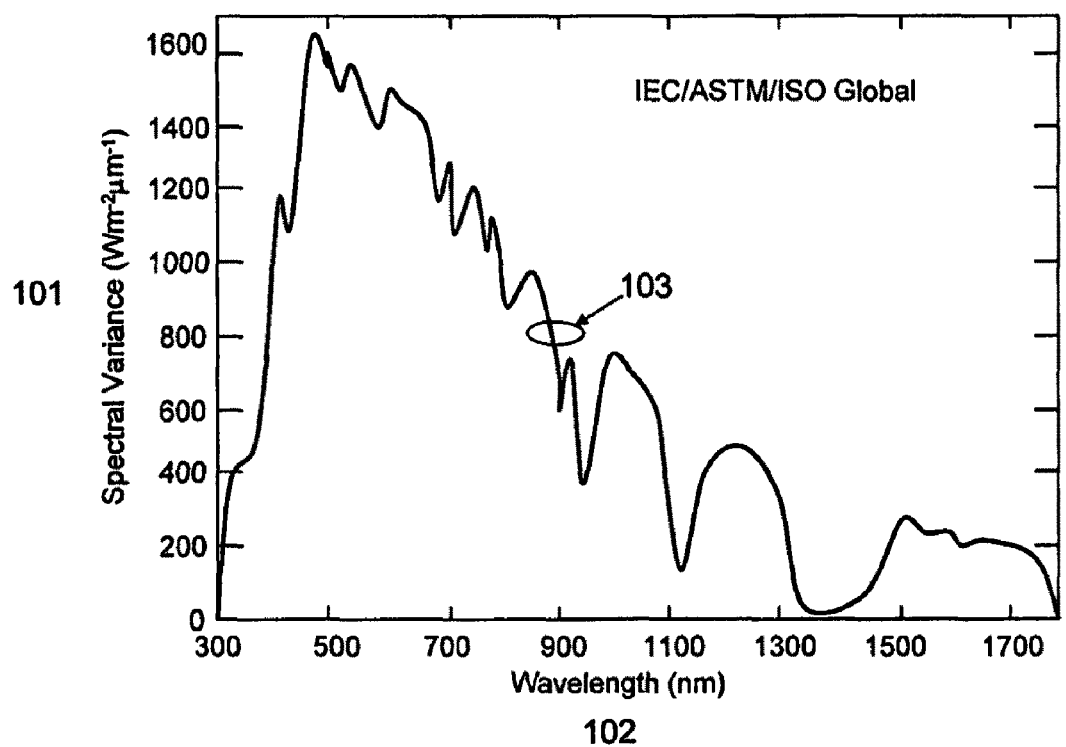
FIG. 1A is a plot of ground level spectral composition of solar radiation from 300 nanometers to 1,800 nanometers.
Figure 2:
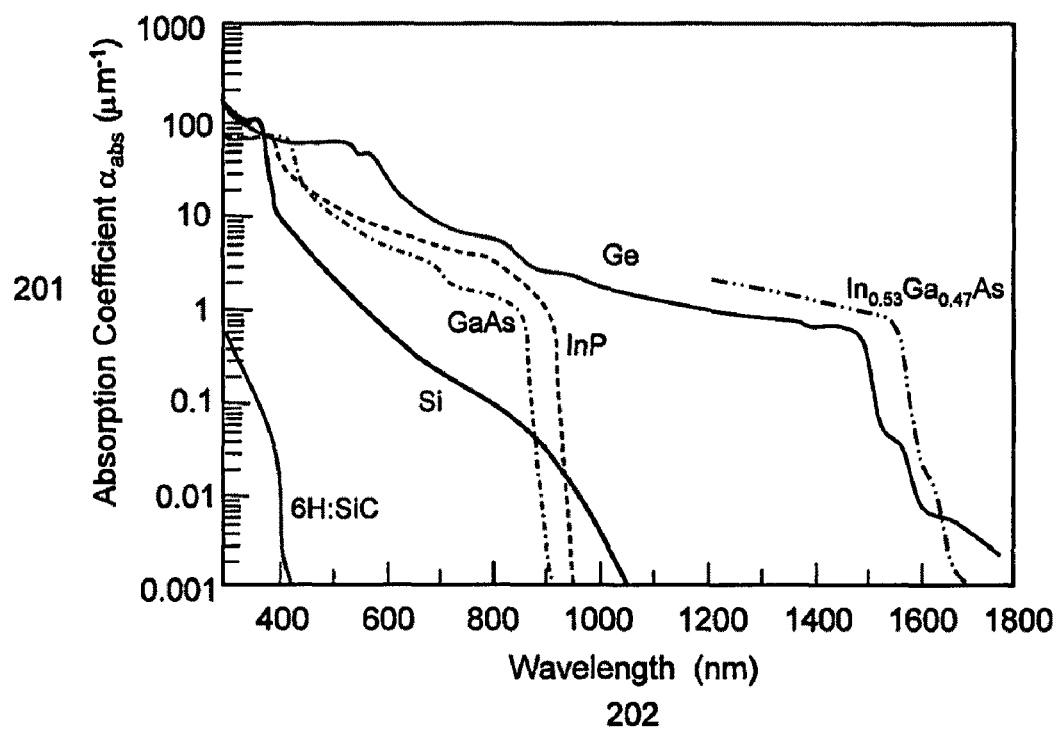
FIG. 2 shows adsorption coefficients versus wavelength for various materials.
Figure 3A:
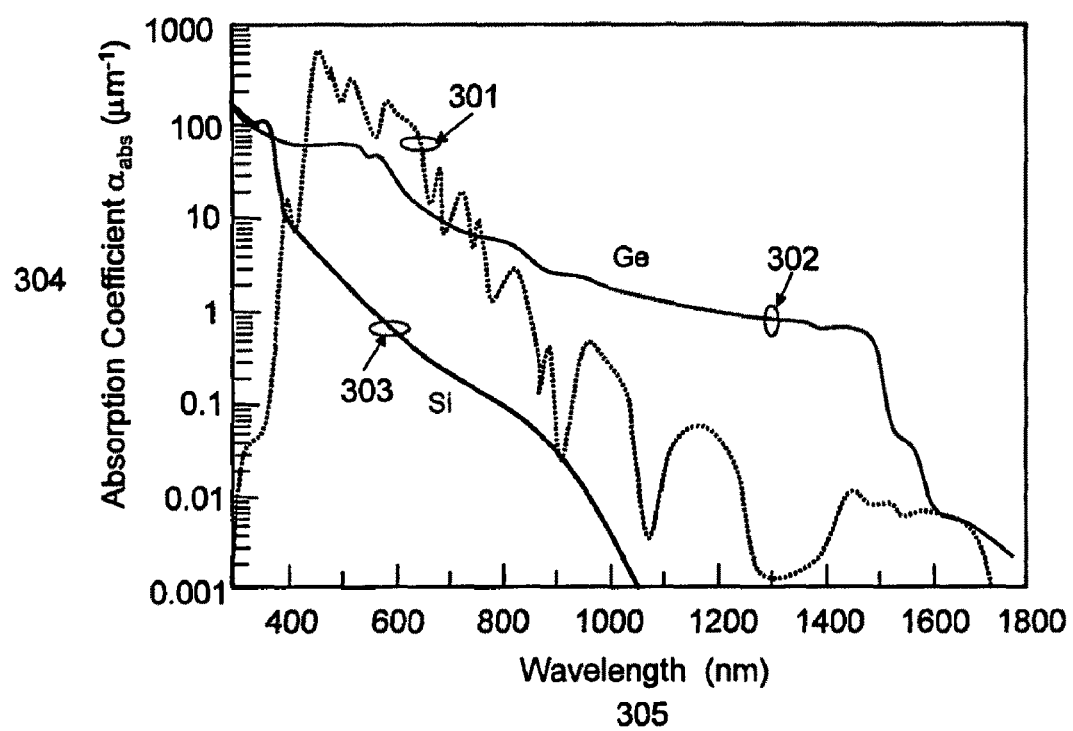
FIGS. 3A, B and C are plots of ground level spectral composition of solar radiation and adsorption coefficients and useful ranges for conventional semiconductors.
Figure 3B:
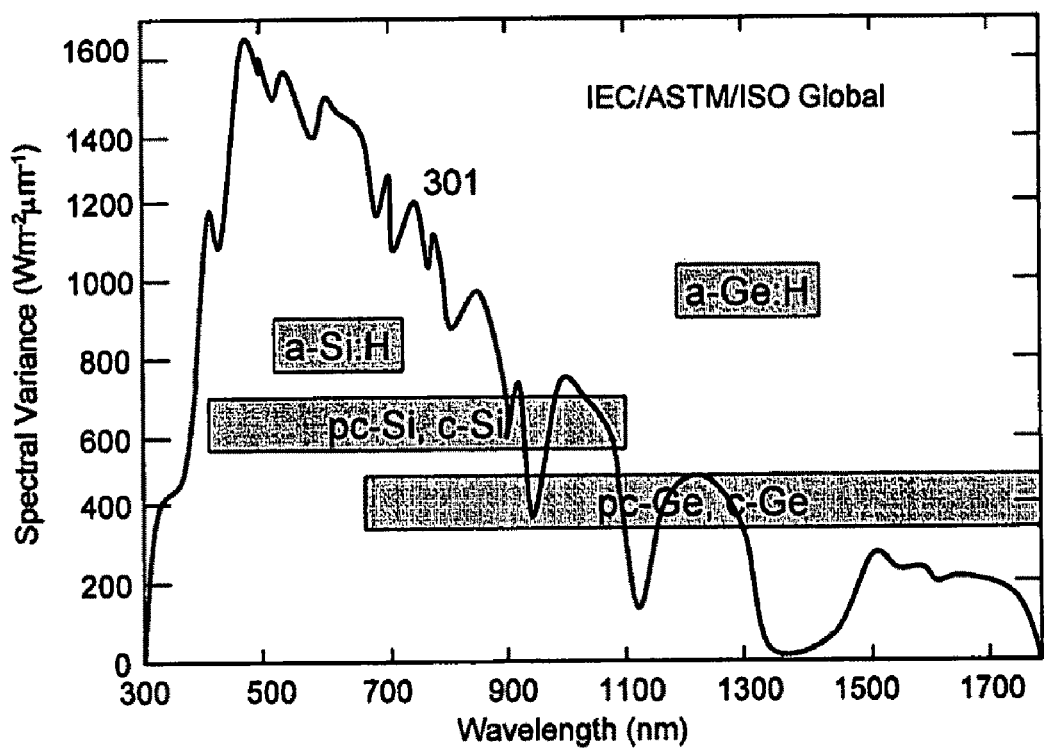
Figure 3C:
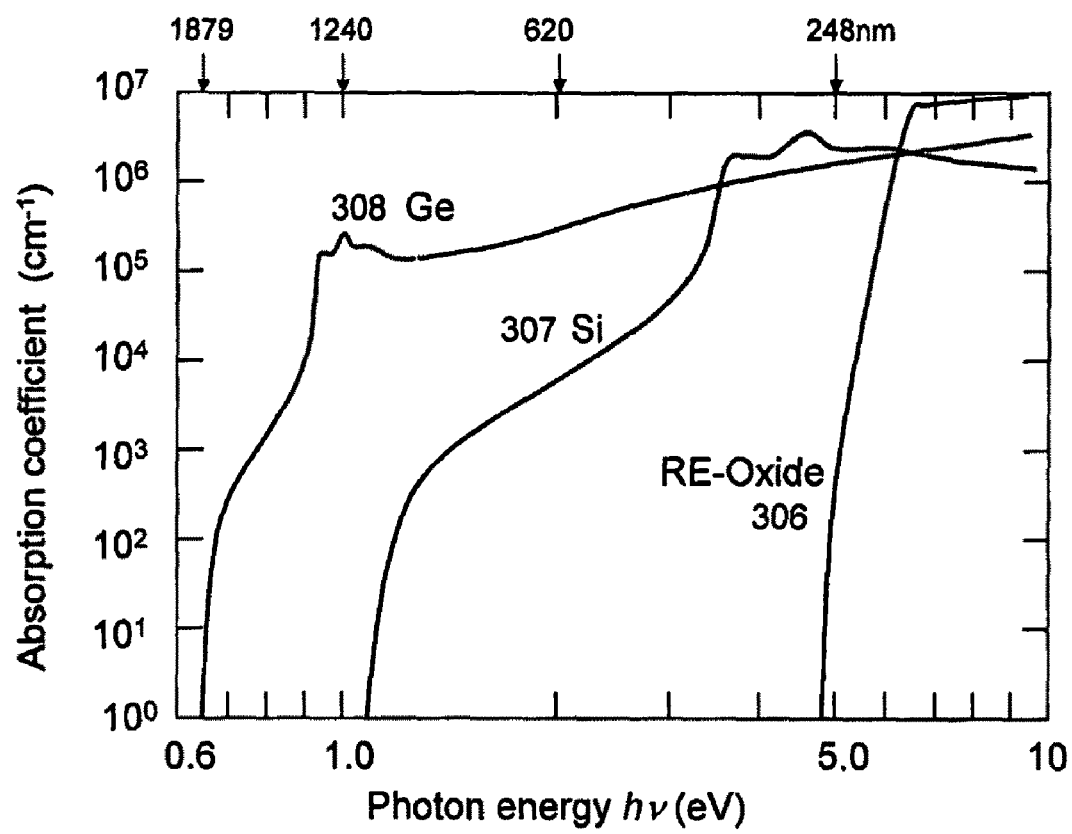

FIGS. 3A and 3B are plots of ground level spectral composition of solar radiation and adsorption coefficients and useful ranges of use for conventional semiconductors such as single crystal silicon, (sc-Si), and single crystal germanium, (sc-Ge); polycrystalline silicon, (pc-Si) and polycrystalline germanium, (pc-Ge); amorphous, hydrogenated germanium, (a-Ge:H) and; amorphous hydrogenated silicon, (a-Si:H). FIG. 3C is a plot of the absorption co-efficient vs. optical energy of various semiconductors, namely single crystal Silicon (Si) 307, single crystal Germanium (Ge) 308 and an exemplary Rare-earth Oxide (RE-Ox) 306. The absorption co-efficient of Ge extends to the far infrared; note, the rare-earth oxide semiconductor is substantially transparent to solar radiation.

Figure 4C:
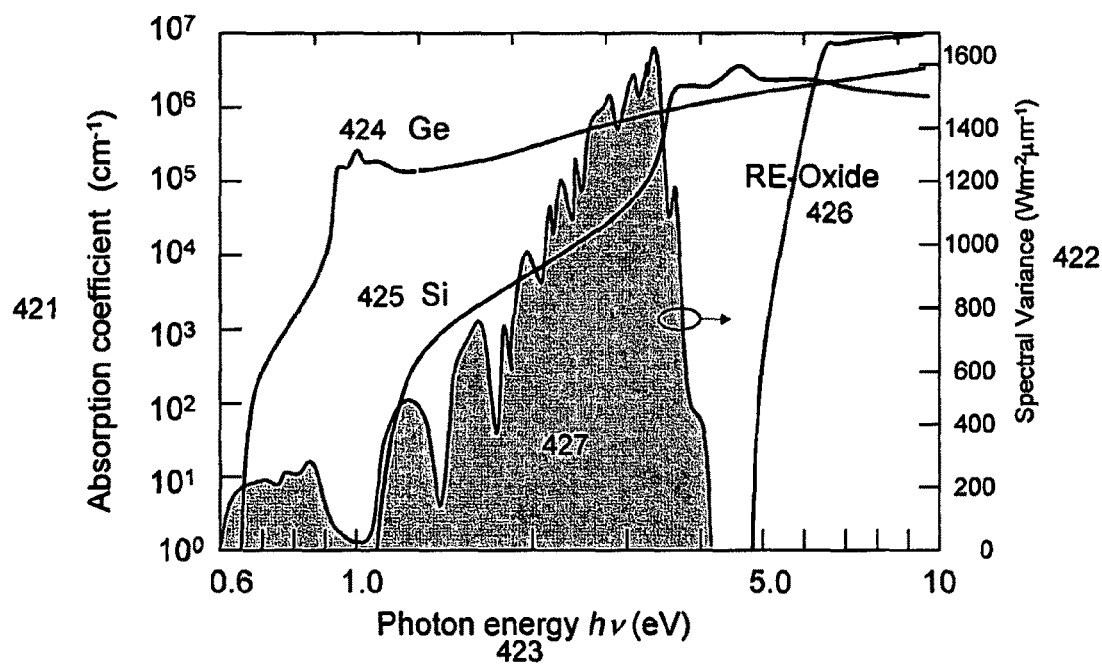
FIGS. 4A, B, C and D present overviews of the optical absorption process in a semiconductor.
Figure 4D:
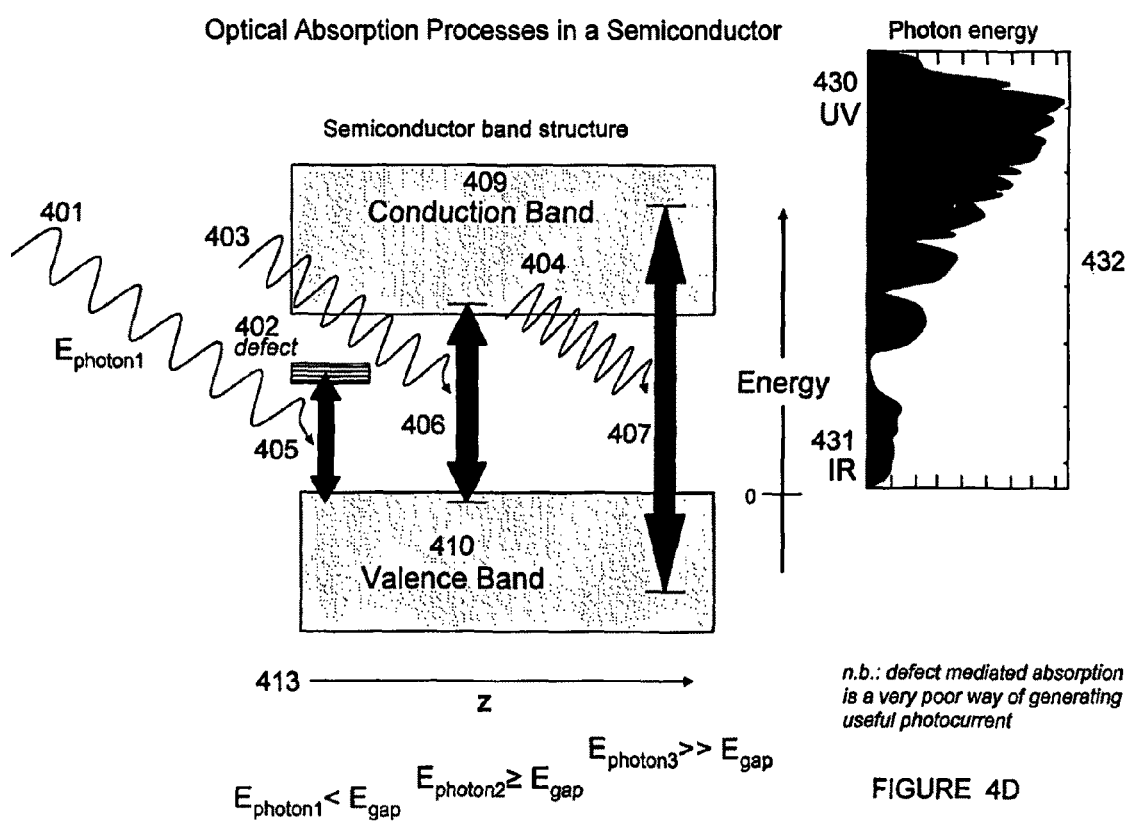

FIGS. 4A, 4B, 4C and 4D present overviews of the optical absorption process in a semiconductor. An incident photon with energy $E_{photon}$ incident upon a semiconductor surface will be transmitted through the material if $E_{photon}$ is less than the electronic band gap $E_{gap}$ of the semiconductor, as shown in FIG. 4A. Conversely, photons of energy coincident or slightly higher energy than $E_{gap}$ 406 will be absorbed. The band gap energy is defined as the energy difference between the lowest lying energy states of the conduction band 409 and the highest lying energy states of the valence band 410, and is determined by the composition and crystal structure of the semiconductor. As shown in FIG. 4B, an absorbed photon of energy co-incident with the band gap 406 simultaneously creates an electron in the conduction band 414 and a hole 415 in the valence band. FIG. 4D shows solar photons with high energy are represented as ultraviolet (UV) 430 and low energy photons are represented as infrared (IR) 431. Photon energies below $E_{gap}$ are not absorbed and the material is transparent to this energy or equivalent wavelength. An exception to this rule is for the presence of optically active defect energy states 402 residing within the forbidden energy gap 405 of the semiconductor. Such isolated defects may participate efficiently in modifying the absorption co-efficient of a pure crystalline semiconductor, however, the resulting photogenerated charge carriers germane to the defects are typically poorly conducted to the conduction band.

FIG. 4C is a plot of the overlap of Si 425, Ge 424 and [RE]Ox 426 semiconductor absorption coefficients 421 and available solar spectrum 427. Rare-earth metal oxides may be created to exhibit the properties of optical transparency to the solar spectrum and have electrical properties of either insulating or conducting depending upon the stoichiometry or oxygen to rare-earth ratio of the [RE]Ox compound.

FIG. 4D is further overview of the optical absorption processes in a semiconductor wherein a defect energy state aligned with energy within the energy band gap of the semiconductor can participate in absorption process. The defect state may arise from structural imperfections of the crystal structure of the semiconductor or be introduced intentionally via the additions of impurity atoms into the crystal structure of the host semiconductor. Localized structural or impurity defect mediated absorption is typically not efficient in the generation of mobile charge carriers such as electrons and holes suitable for external photocurrent extraction.

Impurity atom doping of bulk semiconductors is also possible, wherein an electrical defect level is created within the forbidden energy gap of the host semiconductor. The defect absorption can extend the optical absorption to longer wavelengths (i.e., smaller photon energy) but suffers the disadvantage of poor electrical transport of photogenerated e-h carriers. Therefore, defect type absorber generally exhibit poor optical to electrical conversion efficiency in an external circuit.

In theory, Si should be a very efficient solar cell material; however high energy photons degrade the conversion efficiency. FIG. 4A shows the schematic energy band structure of a general bulk single crystal semiconductor as a function of real space co-ordinate (left) and energy-momentum E-k band structure (right). The periodic array atoms of definite crystal symmetry in the crystal forms an extended band structure consisting of delocalized conduction and valence bands. An electron and hole is constrained to satisfy the E-k dispersion as shown. For silicon, high energy UV photons are efficiently absorbed (within 2 µm of the surface for 400 nm photons) creating energetic electron 416 and hole 417 pairs relative to the conduction band minimum and valence band maximum. These energetic carriers quickly thermalize by emitting lattice phonons of energy $\omega_{LO}$ 408 The UV photogenerated carriers therefore cannot easily participate in photocurrent generation in p-n junction devices.

To increase UV responsivity it is therefore essential to avoid dead layer formation on the surface. Dead layers are typically due to heavy dopant implantation and or diffusion required for good ohmic contacts to Si. A method to circumvent dead layer region(s) is via the use of inversion layer diodes (ILDs). ILDs are constructed by creating a charge inversion layer at the interface between a dielectric material and semiconductor, for example $SiO_2$/Si interface. Alternatively, an inversion layer can generate a potential energy Schottky barrier via appropriate work function metal placed in contact with intrinsic Si. The UV response of ILDs is superior to vertical and or planar p-n and or p-i-n junction type photodiodes. Only small reverse bias is required to deplete the inversion layer region and is advantageous for improving responsivity via higher efficiency photogenerated carrier collection. Photovoltaic operation can be optimized via a built-in voltage generated by advantageous placement of a lightly doped shallow diffused and or implanted junction formation close to the surface of the device. The UV responsivity at a particular wavelength $\lambda$ can be improved by growing an $SiO_2$ or high dielectric constant layer (e.g., RE[Ox]) on the silicon surface with a thickness equal to $m.\lambda/(2^* n_k)$, where $\lambda$ is the wavelength of light in the dielectric, $n_k$ is the refractive index of dielectric and m=1, 3, . . . is an odd integer. High quality $SiO_2$ has a large band gap $Eg(SiO_2)$ ~9 eV, and does not absorb UV light. Depending on the growth and or deposition technique used to form $SiO_2$, (e.g., PECVD or IBD) various amounts of hydrogen may be incorporated in the glass layer. The hydrogen may affect the transmission/absorption properties of the film. Conversely, $SiO_2$ and hydrogen are beneficial for surface passivation of the Si surface states and is a desirable property. Typically, $SiO_2$ is an optimal antireflection (AR) coating well as a passivation layer. The use of alternative transparent AR layers based on rare-earth oxides and the like are used in some embodiments of the present invention.

Typically, single junction (SJ) monochromatic solar cell efficiency $\eta_{mono}$ at wavelengths in the immediate vicinity of the semiconductor band gap is good; For Si, $\eta_{mono}$ is >10%. Conversely, polychromatic solar efficiency $\eta_{solar}$ is much less than $\eta_{mono}$ for conventional SJ solar devices. Optical filtering helps efficiency but discards a large portion of useful spectrum and adds to solar cell manufacturing cost. Using optical filtering techniques to narrow the incident optical energy spectrum therefore requires more incident power at specific wavelength to increase output electrical current. Optical filters using quarter- and half-wavelength dielectric multilayers are well known. The dielectric filters typically use at least two dissimilar refractive index materials, exhibiting high transparency at the desired wavelength range of operation.

Typically, wide band gap energy materials are optically transparent to the solar spectrum; examples are $SiO_2$, magnesium-oxide (MgO), calcium fluoride ($CaF_2$), magnesium fluoride ($MgF_2$), silicon-nitride ($Si_3N_4$), titanium-dioxide $TiO_2$, tantalum-pentoxide ($Ta_2O_5$) and the like are used. The preferential use of large refractive index contrast materials, namely, RE[Ox] and SiOx materials, are advantageous for broad band optical coatings, in particular suitable for ultraviolet applications. The band gap of RE[Ox] ($E_g$(RE[Ox])= 5.8 eV) is substantially larger (~1 eV greater) than silicon nitride $E_g(SiN_x) \leq 5.0$ eV. Therefore, for solar cell applications the preferential use of RE[Ox] and $SiO_x$ is desirable for tailoring multilayer coating below 5.8 eV. In some embodiments x varies from greater than zero to $\leq 5$.

The present invention further teaches a new class of wide band gap optical materials suitable for optical coating; specifically, the materials of rare-earth metal oxide ($REO_x$), rare-earth metal oxynitride ($REO_xN_y$) and rare-earth metal oxy-phosphide ($REO_xP_y$) glasses and or crystalline material and mixtures thereof; in some embodiments as many as three different rare-earths may be present; varying proportions of O, N and P may be present; and combinations of Si, Ge and Si—Ge mixtures may be present; a generalized formula is $[Z]_u[RE1]_v[RE2]_w[RE3]_x[J1]_y[J2]_z$ wherein [RE] is chosen from a group comprising the lanthanide series; [Z] is chosen from a group comprising silicon, germanium and SiGe mixtures, [J1] and [J2] are chosen from a group comprising Carbon (C), Oxygen (O), Nitrogen (N), and Phosphorus (P), and $0 \leq u, v, w, z \leq 5$, and $0 < x, y \leq 5$. A rare-earth metal is chosen from the group commonly known in the periodic table of elements as the lanthanide series or Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb) and Luthium (Lu).

Complex multilayer constructions are possible to create interference filters with narrow and or broadband transmission and or AR characteristics. Less well known, is the use of one-dimensional photonic bandgap and principles of two-dimensionally layered dielectric stacks. Omni-directional reflectors are possible, with reflection property substantially independent of wavelength as a function of incident angle to the surface, similar to an ideal metal, but with negligible absorption. The present invention further teaches that such principles can be used to create omnidirectional transmitters to form broadband optical couplers to solar cell active regions.

High Throughput Thin Film Si Solar Devices

The present invention solves a long standing problem in thin film single crystal silicon solar cell manufacture. The aim of thin film sc-Si solar cell is twofold. Thin film sc-Si reduces the manufacturing cost via reducing the amount of high quality sc-Si consumed in solar cell and the use of cheaper substrates, such as glass, metal, polymer and or flexible substrates. Generally, prior art approaches at generating thin films of sc-Si have been limited via mechanical sawing of bulk Si material and or deposition of amorphous Si followed by complex recrystallization processes. Such prior art approaches have resulted in solar cell conversion efficiency approaching bulk sc-Si cells only via general class of process using essentially sawing techniques. That is, the bulk sc-Si substrate CZ manufacturing process produces the highest crystalline structure perfection and thus the highest efficiency solar cell. Sawing techniques are limited to sc-Si film thickness of the order of millimeters.

The present invention teaches that optimal thin film sc-Si solar cells require active layer film thickness $L_{Si}$ in the range of about $0.1 \ \mu m \leq L_{Si} \leq 250 \ \mu m$. Single junction thin film devices as disclosed in this regime can attain maximum conversion efficiency approaching 25-32%.

Therefore, there is a need for a low cost, high throughput, large area manufacturing technique for producing thin films of high quality sc-Si. Furthermore, there is a need for a cost effective, high throughput, and large area manufacturing technique for producing thin films of high quality sc-Si disposed upon low cost substrates.

There is also a need for a cost effective, high throughput, and large area handling manufacturing technique for creating large numbers of selective area electrically doped Si regions for producing electrical function of the solar cell devices using the said thin films of high quality sc-Si disposed upon low cost substrates.

There is also a need for a cost effective, high throughput, and large area handling manufacturing technique for integrating and interconnecting large numbers of solar cell devices for producing high power modules using the said thin films of high quality sc-Si disposed upon low cost substrates. The present invention solves all the aforementioned needs via the use of planar processing method and large wafer handling technique.

Thin Film Layer Separation

Ion implantation is used to create preferential defect layer and or multiple layers beneath the Si surface of a Si substrate in order to allow removal of a desired thickness of thin film Si in the range of about $0.1 \ \mu m \leq L_{Si} \leq 250 \ \mu m$. The defect layer of the instant invention is produced across the entire wafer to approximately the same depth and thickness. The said defect layer can then be induced to create a chemical and or mechanical reaction so as to locally disrupt the otherwise perfect Si crystal structure. Mechanical fracture localized at the defect layer can separate the topmost sc-Si film from the bulk of the substrate. Prior art for thin film separation is found in U.S. Pat. No. 5,374,564, U.S. Pat. No. 6,372,609, U.S. Pat. No. 6,809,044 and U.S. Pat. No. 7,067,396. The instant invention distinguishes itself from the prior art by requiring the reaction of two species in the defect layer and subsequent volume expansion of the reacted compound to produce a fracture zone separating a thin film from its original substrate.

High energy ion implanters up to 5 MeV are presently used in CMOS processing to generate deep doped Si wells. An embodiment of the present invention utilizes large amounts of foreign atoms being placed in a specific depth range below the Si surface in order to exceed the solubility limit of the host Si crystal structure. The method of ion implantation typically produces a Gaussian depth concentration of the implanted species. The peak of the Gaussian depth $L_D$, is primarily controlled by the ion species and the beam energy of the ion. The CMOS industry routinely implants silicon, germanium, oxygen, hydrogen, deuterium, helium and dopant species such as As, P, B and Sb. Various energy regimes are used to create shallow, medium and deep implant profiles relative to the surface. Typically, CMOS processes do not exceed several microns in depth. The present invention teaches the use of extremely deep implantation profiles in the range of about 1 $\mu m \leq L_D \leq 250 \ \mu m$ to form removable thin films of sc-Si.

One embodiment of the present invention uses high energy ion implantation of hydrogen and/or helium and/or silicon and/or germanium and/or oxygen and/or nitrogen and/or carbon to imbed large concentration of foreign, or non-native, atoms below the surface to a specific depth of a high quality Si substrate. The use of hydrogen is well known to workers in the field as a means to generate buried layer cleaving plane disposed substantially parallel to the wafer surface [1-5]. The present invention further teaches the use of implantation of single ion species and or sequential ion implant of different species.

Ion implantation of rare-gas species in many materials has been known for some time to result in blisters at or immediately below the material surface at fluences of $10^{16}$-$10^{17}$ cm$^{-2}$. For example, Ar$^+$ in Ge and or Si, H$^+$ in GaP and Si [9], He$^+$ in metals such as, Mo, Nb, Ni and Al.

Prior art techniques for Si thin film separation from the remaining bulk substrate using this blistering effect have concentrated on injecting large external source concentrations of ions into the said substrate at the required depth. The substrate is initially deficient in the injected atom species. Upon implantation and thermal anneal sequence, the high concentration of introduced ions, typically hydrogen, form gaseous microbubbles in a predetermined region and results in layer separation. The present invention can also benefit from this method.

A further aspect of the present invention is the use of an improved method of ion implantation facilitated layer separation technique. Implantation of H ions into Si at doses of ~$5\times10^{16}$ cm$^{-2}$ [10] are required to form uniform density of decorated defects and or microbubbles in a buried defect layer. The microbubbles can be made to coalesce into larger structures via externally applied thermal energy. The gaseous hydrogen builds pressure in the defect layer eventually splitting the thin layer from the reaming bulk substrate. A critical step for uniform fracture of large diameter Si substrates requires the defect plane to be substantially aligned to a crystallographic plane to serve as a cleaving plane.

Thin Film Separation Using Helium in Si

The use of helium ion implantation to generate a buried defect plane beneath the Si surface can also be used in the present invention. The heavier atomic mass of He relative to H requires approximately twice as much implant energy for He to penetrate the Si surface to the same depth. Sequential implantation of H and He ion implants may also be used, with the latter providing a means to potentially reduce the total dose required.

While other species such as rare-gases, carbon, nitrogen and fluorine may also result in the same bubble and split process, the energy requirements on the ion implanter are high for the depths proposed for today's SJ thin film sc-Si solar cell devices; devices with higher efficiency and thinner films may be constructed using the disclosed technique however.

Thin Film Separation Using Hydrogen and Oxygen in Single Crystal Cz Si

The growth of single crystal Si from high purity polysilicon (polySi) is germane to wafer production. Two techniques are typically used: (i) crystal pulling (or Czochralski, CZ) method [8]; and (ii) zone-melting (or float-zone, FZ) method [7]. Large area Si substrates ($\geq$300 mm diam.) are typically grown using the CZ method, in which a single crystal is grown by pulling from a molten region of Si. The molten region of Si is contained, (and heat energy supplied from by an external source), using a high purity quartz or vitreous silica (SiO$_2$) crucible. A crucible is filled with polySi pieces and heated just past the melting point of Si. The diameter of the quartz crucible limits the size of the single crystal boule pulled from the molten Si source and thus determines the upper limit on wafer diameter. Prior art has determined the highest quality Si boule is via the use of high purity quartz in preference to all other known crucible materials capable of containing molten Si. A major limiting factor for choice of crucible materials is the fact that Si forms an alloys readily with all refractory metals and or commercially available ceramics, well below the melting point of Si, rendering alternative crucible materials useless. The poisoning of the Si boule by the crucible material is a key aspect determining the final quality and application of the Si product. Single crystal Si is therefore grown by physically pulling from the melt contained in the quartz crucible, with the pulling rate determined in part by the melt temperature. The surface of the quart crucible in contact with the molten Si is consumed over time as a result of the reaction SiO$_2$+Si$\rightarrow$2SiO, and the quartz is said to devitrify. This reaction enriches the Si melt and pulled Si crystal with oxygen atoms. A portion of the oxygen atoms evaporate from the melt surface as volatile silicon monoxide (SiO), and the remaining oxygen atoms become incorporated at the melt-crystal interface and thus into the growing Si crystal boule. These incorporated oxygen atoms determine the electrical, chemical and strength properties of the Si crystal. Historically, oxygen contamination was viewed as a problem and it was determined by prior art that the oxygen atoms were preferentially incorporated at interstitial lattice sites within the Si crystal. The concentration of incorporated oxygen into CZ Si crystals typically exceeds the solid solubility limit, and the supersaturated oxygen can precipitate during subsequent thermal annealing treatments. A key step forward in CZ Si development and therefore CMOS performance, was the observation that the interior defects produced by the oxygen precipitation produce an effective method to suppress epitaxial stacking faults in CZ crystals. Furthermore, the impurity oxygen concentration in CZ Si was shown to advantageously act as an internal gettering agent, and is widely used presently in high performance CMOS industry. The effectiveness of the internal gettering action of oxygen is determined by the initial oxygen concentration and anneal process. In addition to the beneficial effect of oxygen containing CZ Si it has been shown to be advantageous in supersaturated regime rather than oxygen lean regime. Prior art has demonstrated that FZ Si is inferior in mechanical strength compared to oxygen containing CZ Si. Therefore, the oxygen concentration in CZ Si affects: (i) internal defects produced by oxygen precipitation, (ii) mechanical strength, and (iii) the presence of oxygen donors.

The present invention exploits the use of oxygen containing CZ Si wafer for the direct application to the present invention for the purpose thin film cleaving and separation method. The control of oxygen concentration in CZ Si is of paramount importance for application to CMOS ULSICs. The process control, lifetime and purity control of the quartz crucibles is a major component in the manufacture of large diameter Si substrates suitable for CMOS manufacture. The Si wafer becomes the active layer of the field-effect-transistors (FETs) and is the most critical component in the entire front-end-of-line (FEOL) process. The oxygen concentration in CZ Si can be classified into low, medium and high concentration [O]$_{CZ}$ ranges. For CMOS applications, the medium range is characterized by [O]$_{CZ}$ in the 14-17 ppma range [6]. The high and low concentrations are therefore relative to the medium range. For the present invention a preferred CZ Si medium [O]$_{CZ}$ range is given as about $1\times10^{17}$ cm$^{-3}$$\leq$[O]$_{CZ}$$\leq$$1\times10^{18}$ cm$^{-3}$ in the Si crystal; alternative embodiments may be about $2\times10^{16}$ cm$^{-3}$$\leq$[O]$_{CZ}$$\leq$$1\times10^{19}$ cm$^{-3}$.

Therefore, the present invention teaches, in some embodiments, at least a three step process wherein: (i) a Si substrate is chosen in preference from oxygen containing CZ Si; (ii) a wafer is implanted by bombardment of high energy ions, in preference hydrogen (H+) to form hydrogen containing layer spatially separated from the Si surface and residing a predetermined depth from the surface with finite thickness. The hydrogen containing layer substantially uniform in extent and substantially parallel to plane of the wafer surface; (iii) subjecting at least one of a frontside and or backside of a CZ Si wafer containing the as-implanted ions to heat treatment in suitable ambient gas so as to promote reaction between hydrogen and oxygen species in the immediate vicinity of the implanted layer; alternatively other combinations of implantable ions are used.

A wafer comprising regions of associated hydrogen and oxygen and/or bubbles and/or steam generated wherein reactants act so as to cleave the desired topmost CZ Si film free from the remaining portion of the substrate. The prime advantage of the above film separation method in preference to the previously described prior art techniques is the significant reduction of hydrogen dose required for film splitting and separation. This directly translates into shorter and lower cost H+-implanter beam times.

An optional advantage is the steam as produced using the above process may also act so as to oxidize the Si atoms in the immediate neighborhood of the cleave, thereby forming native $SiO_2$ and or releasing hydrogen. This may act as an optional means to passivate surface states at the cleaved Si surfaces.

An additional benefit of the above disclosed process is the use of the denuding action of oxygen during thermal treatment [6]. Oxygen is well known in CZ Si to form a denuded region under thermal treatment. Depending on the exposed surface ambient, either oxygen rich or deficient, the oxygen profile near the exposed Si surface can be manipulated. Typically, oxygen precipitates can be driven into the interior of the Si crystal away from the surface. This is advantageous for the present invention wherein the oxygen precipitates can be driven toward the hydrogen containing layer defining the cleave plane. Note, different temperature selectivity of steam splitting and denuding can be used advantageously. The denuding effect can be incorporated in a separate thermal treatment independent of the cleaving process.

For application to SJ Si solar cell manufacture, the oxygen concentration is not critical. Heat treatment of the oxygen containing CZ Si above approximately 500° C. results in electrically inactive and or neutral precipitates and does not disadvantage the performance of SJ solar cells. This allows cheaper CZ production methods to be utilized to form high quality single crystal Si. That is, single crystal Si substrates can be manufactured for solar cells but not to the same tight tolerances required in the CMOS industry.

The present invention, in some embodiments, utilizes supersaturated oxygen containing CZ Si (O:Si CZ) wafer for the creation of thin film separation method. The O:Si CZ wafer is implanted preferentially with hydrogen to a predetermined depth such as to produce a large hydrogen concentration layer—called the defect or fracture layer, with H+ doses of about $10^{14} \leq H^+ \leq 10^{16}$ cm$^{-2}$. Upon thermal annealing the buried hydrogen and oxygen atoms preferentially combined to form water molecules and or oxygen precipitates and or hydrogenic clusters. The said water molecules and the like cluster to form nanometer and micrometer sized water and or oxygen precipitate and or hydrogenic cluster containing regions. Under the external influence of an appropriate heat treatment, anneal time and oxygen to hydrogen ratio (O:H) the water containing regions will expand in volume with temperature and form a predetermined fracture plane substantially defined by the hydrogen implant profile. The heated water containing regions form gaseous species at low temperature (below about 500° C.) and generally reduces the thermal budget required for defect layer fracture.

As medium to high oxygen incorporation is encouraged via the above described invention, other oxide crucible materials may potentially be used. U.S. patent application No. 60/454, 280 filed March 2003, now Ser. No. 10/799,549, discloses how zirconium oxide ($ZrO_2$) can be used successfully for the containment of molten Si well in excess of the melting point of Si (1420° C.), up to approximately 1700° C. This high temperature operation allows the CZ method to pull the Si boule at a substantially faster rate, thereby increasing CZ Si boule production throughput and thus reducing Si wafer cost. This new method for thin film sc-Si layer production is disclosed and claimed in its entirety herein.

One alternate embodiment of the present invention is the use of alternative means for introducing various ions or atoms or molecules into a wafer; one example is an ion-exchange process for driving large amounts of foreign atoms from the surface to a predetermined fracture depth by imposing a voltage on the wafer in a solution of the desired ions; for instance an acidic solution for protons; or other solutions as one knowledgeable in the art is familiar. The defect or fracture layer so formed using the above methods, is then subjected to a predetermined reaction and/or stress and/or bending to initiate and or complete the fracturing and or cleave process. The fracturing process propagates across the wafer and separates the thin sc-Si film from the bulk portion of the CZ Si substrate. By combining the aforementioned film removal and cleaving process with layer transfer and bonding to a lower cost substrate, thin film silicon, optionally comprising devices, can be bonded to a cost-effective substrate, optionally comprising devices.

Figure 59A:
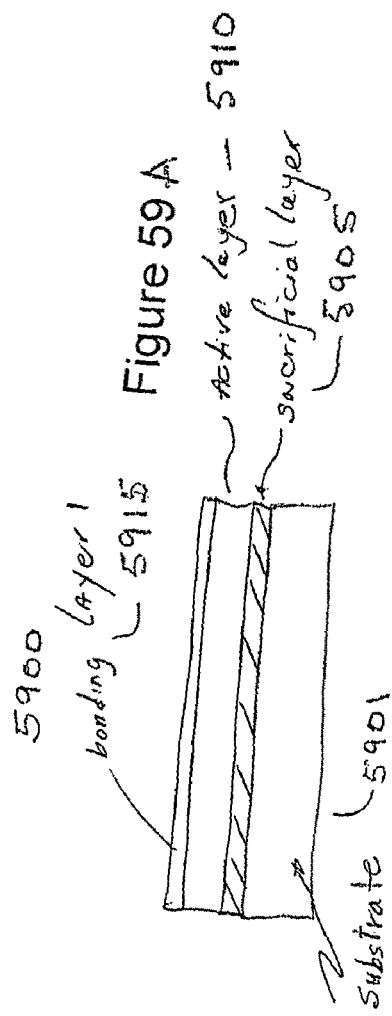
FIG. 59 is a schematic of alternative process for layer separation using sacrificial layer.
Figure 59B:
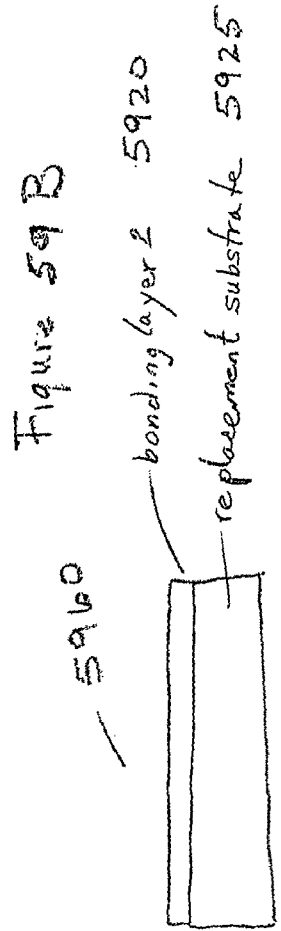
Figure 59C:
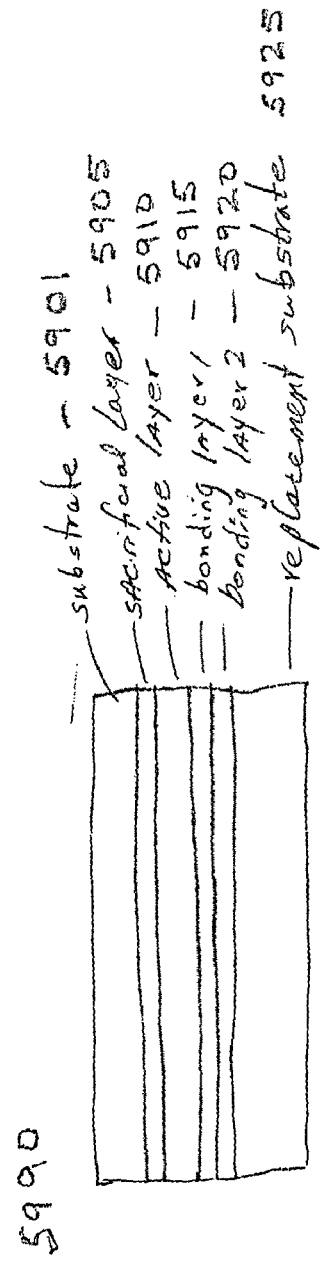

An alternate embodiment of the present invention is the use of a sacrificial layer upon which a single crystal silicon layer can be deposited in a preferred orientation, as illustrated in FIGS. 59A, B and C. In one embodiment a rare-earth oxide, nitride or phosphide thin film, optionally single crystal, layer 5905 is deposited onto a substrate 5901, optionally single crystal as in FIG. 59A. A silicon or other semiconductor material 5910, optionally single crystal, is deposited upon the rare-earth layer. A key requirement is that the rare-earth layer be removable, either through liquid or vapor phase processes such that it does not affect the semiconductor layer 5910. Semiconductor layer 5910 may comprise one or more layers suitable for a photovoltaic device and/or other semiconductor device such as required for control circuitry, microprocessor function or other functions built with an integrated circuit. Active layer 5910 material comprises one or more of Group IV, Group III-V and Group II-VI members. Over layer 5910 is, optionally, one or more bonding layers 5915 comprising materials to facilitate bonding original structure 5900, in FIG. 59A, to replacement substrate structure 5960; these materials to facilitate bonding may comprise passivation layers to protect active layer 5910, metallization layers to interconnect devices on layer 5910, organic adhesives, low temperature melting glasses or metals. In FIG. 59B, replacement substrate 5925 comprises a variety of optional structures ranging from plastic, metal, glass, ceramic, semiconductor and wafers with active devices built therein. Bonding layer 2, 5920, comprises layers similar to 5915. In FIG. 59C, structure 5990 is a schematic after structure 5900 and 5960 have been bonded by bringing surface of layer 5915 into contact with surface of 5920 and undergoing a bonding process. A bonding process is determined by the choice of bonding layers; it may comprise thermal bonding, anodic bonding, fusion bonding, compression bonding or other bonding process known to one knowledgeable in the art. A key novelty of the process is that a single crystal rare-earth may be grown on substrate 5901 and then single crystal semiconductor, optionally silicon, may be grown on sacrificial layer 5905; alternately large grained, polycrystalline rare-earth may be grown and polycrystalline semiconductor, optionally silicon, grown on the rare-earth. The final step of the process, not shown, is to separate substrate 5901 from structure 5990 by removing sacrificial layer 5905 through a subtractive process such as etching or other means for dissolution.

Thin Film Single Crystal Silicon Layer Transfer onto Alternative Substrate for Solar Energy Conversion Devices The present invention discloses alternative methods of single crystal Si layer transfer process onto alternative or replacement substrates to form a thin film article or device. Furthermore, the present invention discloses methods of single crystal Si layer transfer process onto alternative substrates and methods for incorporating electrical and optoelectrical conversion regions within a thin film article or device.

Figure 5:
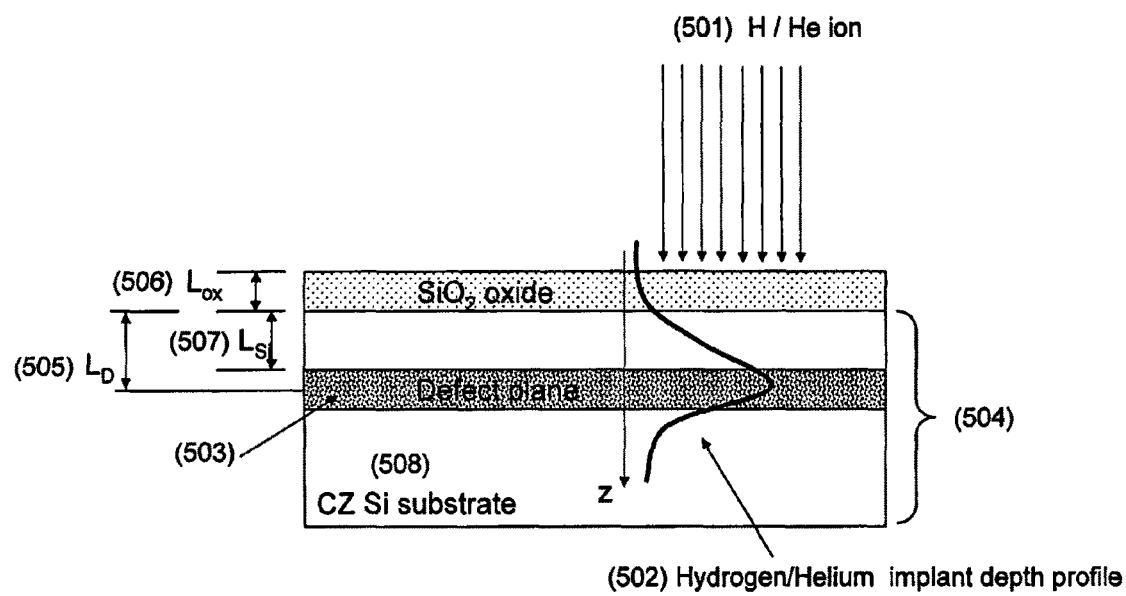
FIG. 5 shows H and/or He ion implantation to a predetermined depth.

FIG. 5 describes the geometry used for ion implantation of foreign species 501 into CZ Si substrate 508 to form a Gaussian profile distribution volume 502 of ions in a Si crystal. The defect plane 503 substantially plane parallel to a Si crystal surface. The depth of the peak of the defect layer distribution is distance $L_D$ 505 from a Si surface. An optional protective oxide layer 506, optionally composed of $SiO_2$, is also shown.

FIG. 6A shows calculated depth profiles for H+ ions 601 of FIG. 6B using various incident energy implants. Optionally, the ion species is chosen from hydrogen and or helium. For the case of $H^+$, the peak depth $L_D$ versus implant energy range 100 keV $\leq$ E $\leq$ 5 MeV is shown. Clearly, the defect layer depth beneath the surface can be placed in the range of about $1 \leq L_D \leq 250$ μm, depending on the energy used. The calculated results were performed using SRIM 2003 ion implant code, and $L_{ox}$=200 Å $SiO_2$, and single crystal Si substrate.

Figure 7A:
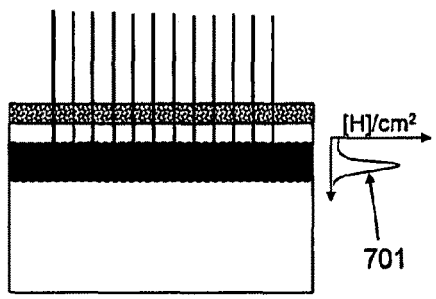
FIG. 7A schematically shows ion implant.
Figure 7B:
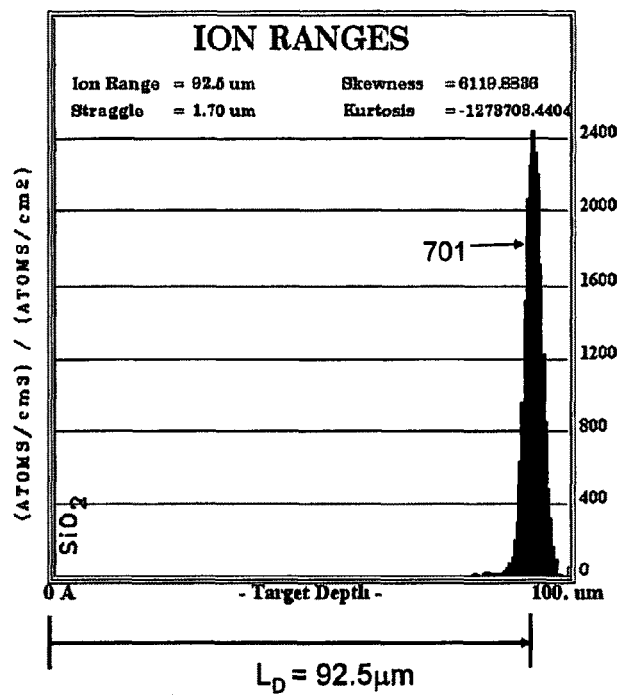
FIG. 7B shows calculated depth profile of H+ ions implanted for a given ion energy.

FIG. 7B shows the distribution of H+ ions 701 of FIG. 7A in the buried layer beneath the Si surface for the case of 3 MeV.

In an alternative embodiment oxygen rich single crystal Si substrate is implanted with H– ions and the selective interaction of the hydrogen and oxygen species is used to form defective region suitable for thin film Si layer transfer process.

Example 1

Thin Film Solar Vertical Process

In one embodiment a disclosed process is used to fabricate a vertical type opto-electronic solar spectrum energy conversion device using thin film single crystal Si layer transfer method. FIGS. 8A and B shows the individual parallel process paths for fabrication of thin film solar cell article. A single crystal CZ Si substrate 801 and alternative substrate 807 are cleaned and prepared for processing. An optional $SiO_2$ protective layer 802 is deposited or thermally grown on the CZ Si substrate 801. The CZ substrate is then implanted, as shown in 803, according to the method described in the present invention to form a buried defect layer 804. The layer 802 is removed via wet or dry etch or other means known to one knowledgeable in the art. The cleaned alternative substrate is then deposited with a uniform conductive layer 805, for example metal such as aluminum and or rare-earth metal, forming surface 850. FIG. 8B shows alternative substrate 807 being processed to structure 809 by addition of conductive layer 808 forming surface 860

Figure 9:
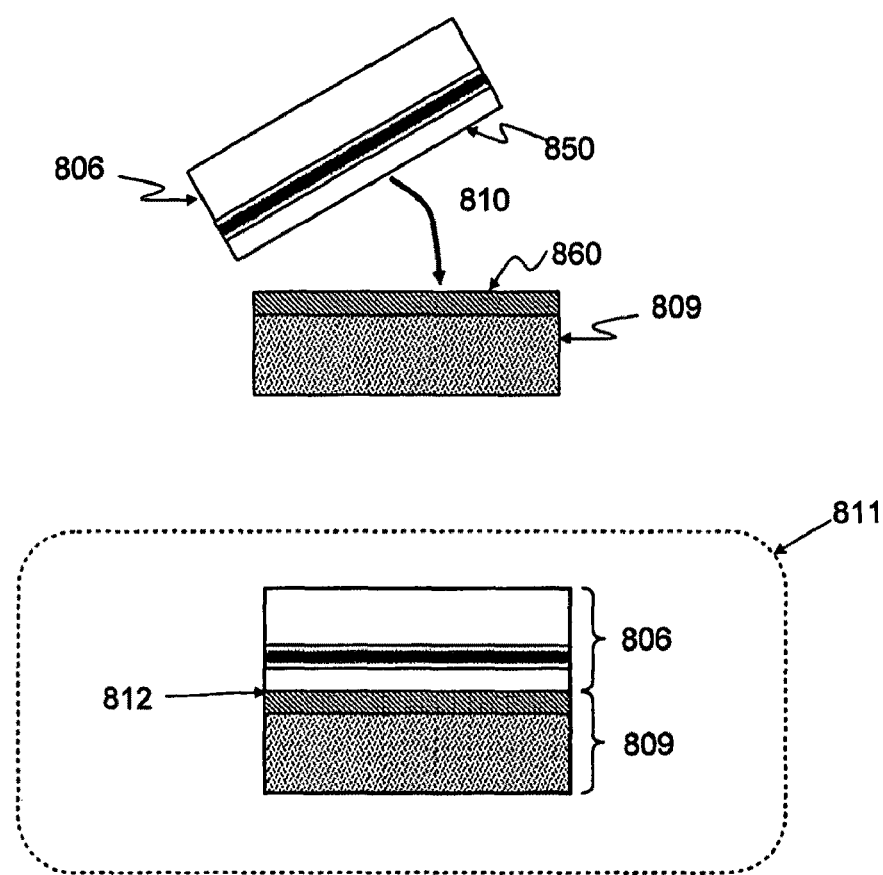
FIG. 9 shows steps for bonding an active wafer to a replacement substrate.
Figure 10:
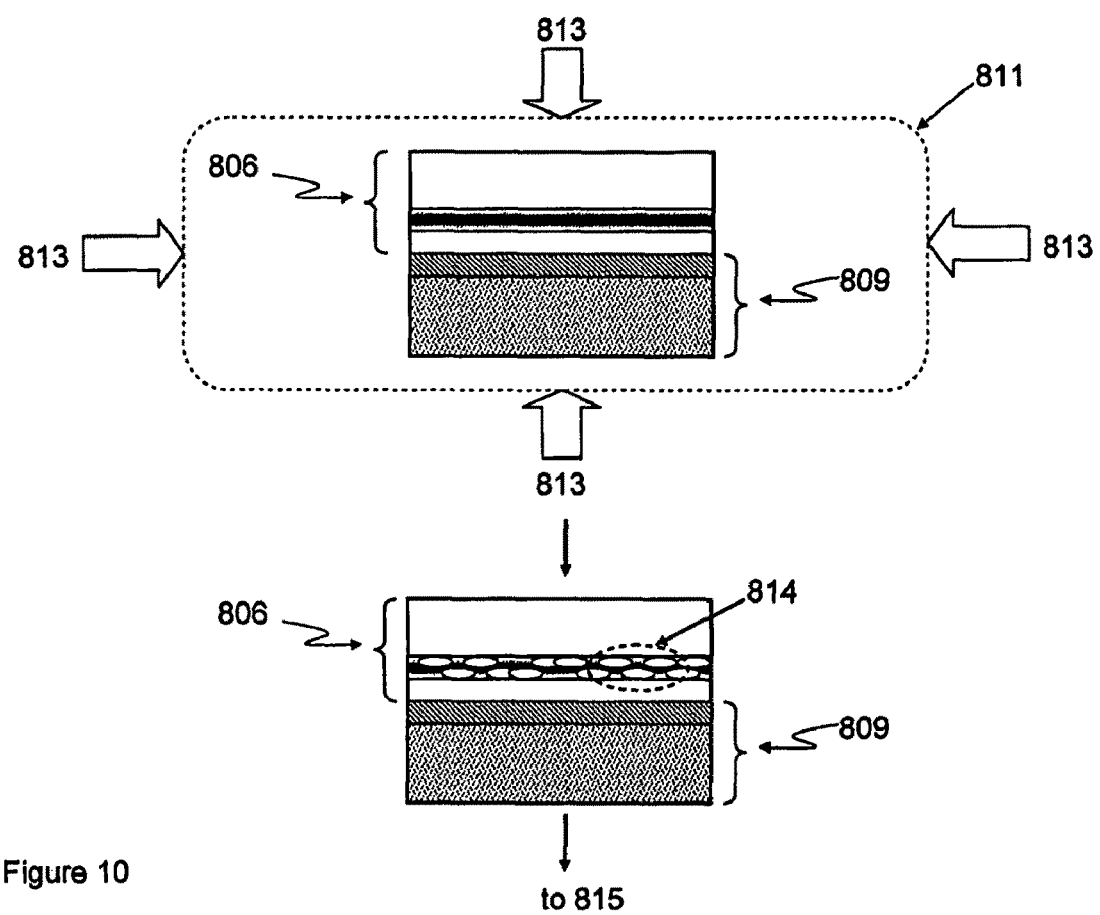
FIG. 10 shows preparation for original semiconductor substrate removal and thin film transfer onto alternative substrate.

FIG. 9 shows how the alternative substrate 809 with conductive layer 808 and implanted CZ Si substrate 806 are joined together, step 810, with opposing surfaces 850 and 860, creating interface 812. The surfaces must be free from particulate contamination and can be vacuum joined, van der Waals attraction bonding, fusion bonded, anodically and the like bonded together. FIG. 10 shows how the compound multilayer article 811 is then subjected to thermal annealing sequence 813 to strengthen the bond between surfaces 850 and 860 and to initiate temperature dependent defect fracture 814 confined to a region advantageously aligned with CZ Si crystallographic axes. The thermal anneal sequence 813 generates fracture within said CZ Si crystal confined substantially to the plane defined by the defect plane. In one embodiment a thermal anneal step is done between 150° C. and 500° C.

Figure 11:
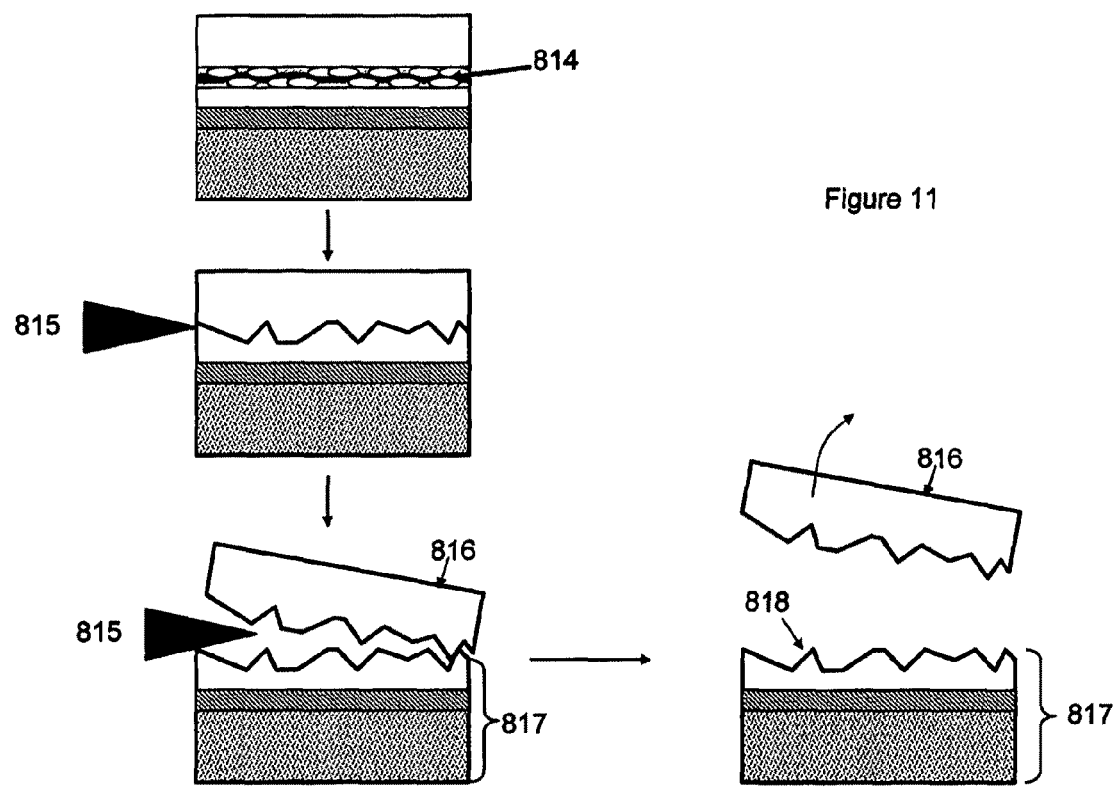
FIG. 11 shows steps for original substrate removal and thin film layer transfer.

FIG. 11 next shows how, in one embodiment, with application of external mechanical stimulus 815 to at least one region of the edge of the compound article 811, the fracture propagates throughout the defect plane causing physical separation of remaining bulk CZ Si substrate 816 and thin film CZ Si coupled to alternative substrate 817. The resulting defect plane may exhibit rough surface 818 on both the exposed thin film CZ Si and the cleaved surface of the bulk substrate. The surface roughness of 818 may have surface features ranging from several nanometers to several micrometers depending on the O:H ration and implant energy. Typically, higher implant energies result in wider full width at half maximum of the Gaussian defect layer. For example, a 3 MeV $H^+$ implant results in a straddle of ~1 μm.

FIG. 12A shows how the wafer bonded thin film CZ Si and conductive buried contact on the alternative substrate 817 are then processed to form a vertical type solar cell device 820. Metal contacts 819 are disposed on the surface 818. Contacts 819 are preferred to be ohmic. For example, high performance solar cells may use rare-earth silicide ($RE\text{-}Si_x$) and or platinum silicide ($Pt\text{-}Si_x$) ohmic contacts. The said silicide contact can be deposited as RE and or Pt metal and then anneal to form the respective silicide by consuming and alloying with Si atoms within the film. The vertical solar cell functions by converting incident solar radiation 822 into photogenerated electronic charge carriers extracted through the external circuit shown.

Lastly, in FIG. 12B, removed bulk CZ Si substrate portion 816 can be reprocessed via chemical mechanical processing (CMP) 821 to form a substantially flat surface 823 resembling the initial CZ Si substrate. As the removed thin Si film has thickness significantly less than the total thickness of the starting CZ Si substrate 801, the reprocessed substrate 823 can be used for subsequent processing of another thin film removal 801.

In one embodiment a method for producing a thin film layer comprises providing a first substrate having a face surface and an oxygen concentration of at least $2 \times 10^{16}$ atoms/$cm^3$; introducing ions into the first substrate at the face surface, such that introduced ions are proximate oxygen atoms in a predetermined range from the face surface, wherein a thin film layer extends from the face surface to the mid-point of the introduced ions; optionally, bonding a replacement substrate to the face surface of the first substrate; processing the first substrate through a predetermined temperature cycle for combining the introduced ions and the oxygen; and, optionally, applying mechanical force to the thin layer, optionally, through the replacement substrate to fracture the thin film layer from the first substrate; wherein applying mechanical force to the thin film layer comprises applying a mechanical force to the second substrate selected from the group consisting of tensile force, shear force, bending forces, and combinations thereof. Optionally, oxygen ions may be introduced into the first substrate at the face surface, such that introduced ions are in a predetermined range from the face surface. Optionally, oxygen or other atoms may be incorporated at the time of crystal growth or later. Optionally, introduced ions may be hydrogen, helium, oxygen, nitrogen, carbon, fluorine or combinations thereof.

Example 2

Thin Film Solar Planar Process

In one embodiment a disclosed process is used to fabricate a planar type opto-electronic solar spectrum energy conversion device using thin film single crystal Si layer transfer method. A key feature of this process is the extensive use of selective patterning of electrical contacts to form planar buried contact arrangement to a interface of the CZ Si thin film active layer.

This planar contact arrangement is suitable for optimized metal-semiconductor-metal (MSM) inter-digitated finger configurations. The shorter wavelengths (i.e., high energy) of the solar spectrum contains the majority of the solar spectrum fluence. Typically, high energy photons, particularly UV photons, are considered detrimental to the performance of single junction solar cells, particularly using Si (refer FIG. 4). The present invention solves this long standing problem by utilizing the wavelength selective nature of absorption of photons in the Si crystal. Silicon SJ solar cells, for example p-n junction diodes, typically can only convert optical energies with relatively high external photocurrent efficiency at or slightly above the fundamental indirect band edge ~1.1 eV. In fact, this is a limitation of all semiconductors used in SJ configuration.

The absorption coefficient of single crystal Si is exceptionally high for UV photons ($\alpha_{abs}$>100 µm$^{-1}$). Compared to the poor absorption near the Si indirect band gap, the UV behavior is superior to all the other commercially relevant semiconductors, as shown FIG. 37 region 3701. UV photons are almost completely absorbed within approximately 2 µm of the surface, forming e-h pairs. Unfortunately, the energetic electrons and holes couple strongly to the lattice phonons and dissipate their energy as heat. This loss mechanism can be reduced and the photocarriers extracted in thin film CZ Si solar devices, disclosed herein.

Figure 39:
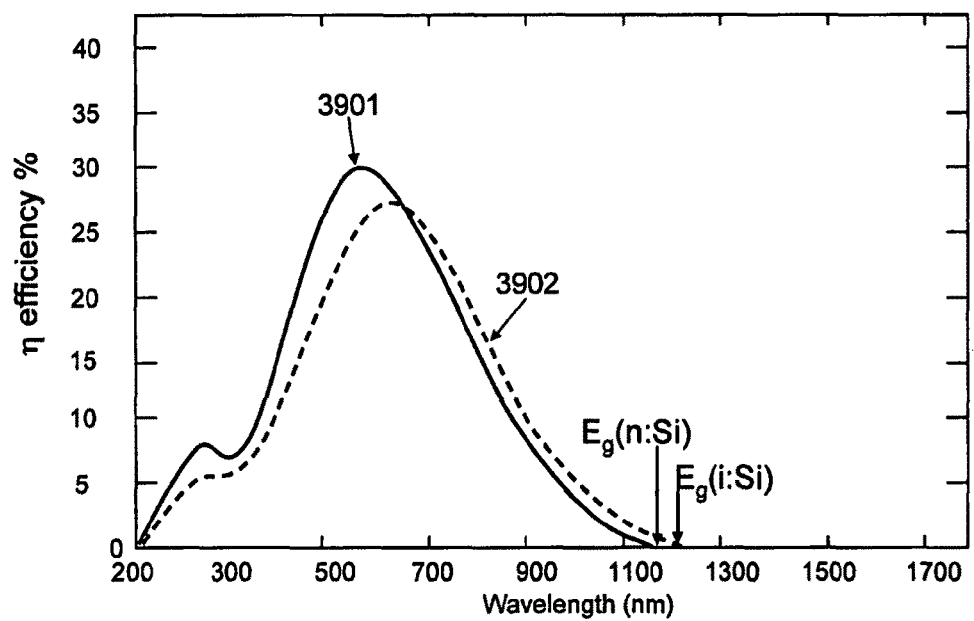
FIG. 39 shows spectral sensitivity of thin film single crystal silicon in a UV selective solar cell.

Utilizing thin film Si and the MSM configuration allows UV photons to be converted into useful electron and or hole (e-h) photocarriers. The said photocreated e-h can be extracted into the external circuit before non-radiative recombination losses occur. The efficiency of SJ thin film CZ Si solar cells in the range 400-700 nm can therefore be optimized as shown in FIG. 39, and therefore utilize a higher energy portion of the solar spectrum.

The electronic structures possible are discussed later and disclosed in FIGS. 27 to 41, inclusive.

FIGS. 13A and B show the individual parallel process paths for fabrication of thin film solar cell article. A single crystal CZ Si substrate 1301 and alternative substrate 1306, in FIG. 13B, are cleaned and prepared for processing. An optional SiO$_2$ or dielectric or metal protective layer 1302 is deposited or thermally grown on the CZ Si substrate 1301. The CZ substrate is then implanted 1303 according to the method described in the present invention to form a buried defect layer 1304. The layer 1302 can be removed via wet or dry etch or evaporated. The cleaned alternative substrate 1306 is then deposited with a spatially patterned conductive layers 1307 and 1308, for example metals such as aluminum (Al) and or rare-earth (RE) metal. If separate metals are used for 1307 and 1308 they can be deposited sequentially using an appropriate mask (not shown). After the contacts 1307 and 1308 are fabricated, an insulating layer 1309 is deposited as shown. The layer 1309 can be SiO$_2$, high-k and or low-k dielectric film. The contacts 1307/1308 and insulating film 1309 can optionally be planarized via CMP to form flat surface 1310, free from particulate contamination. The surface 1310 of article 1312 is then used for wafer bonding in step 1313 in FIG. 14A.

Figure 14A:
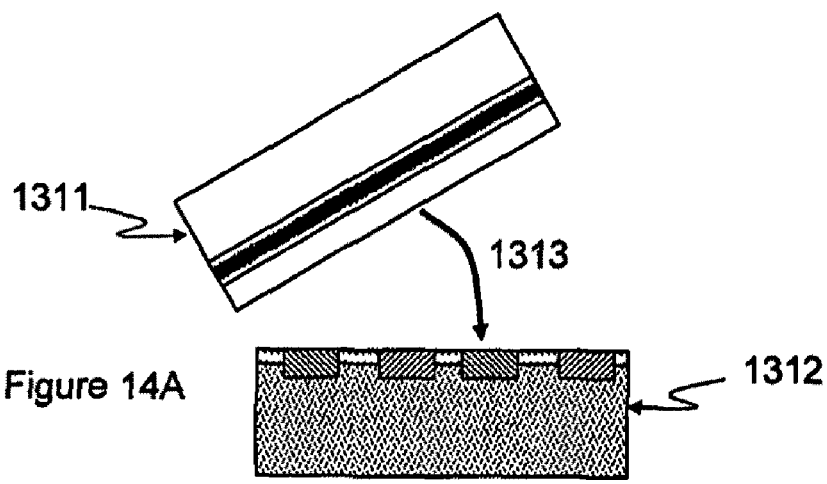
FIGS. 14 A and B show alternative steps for replacement substrate bonding to thin film handle substrate.
Figure 14B:
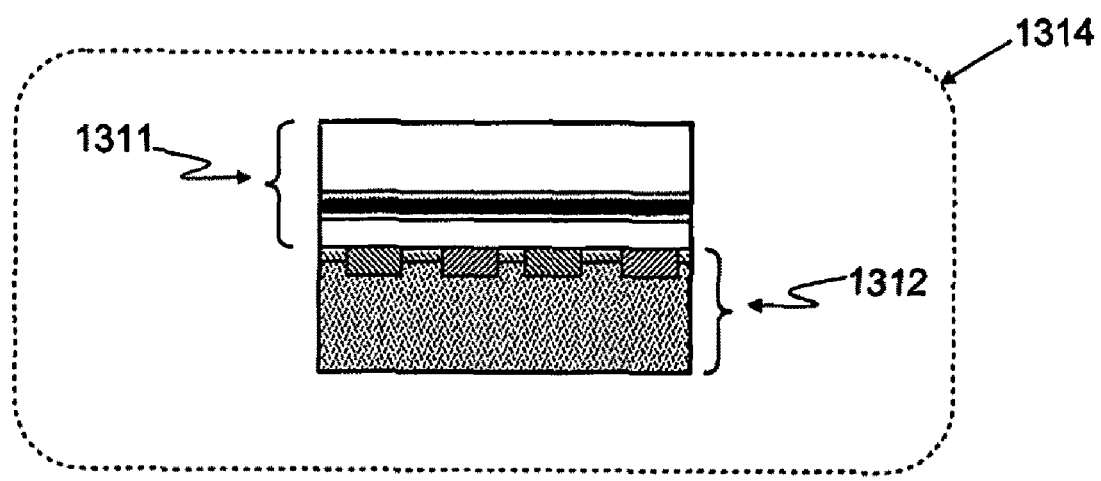

FIG. 14A shows how the alternative substrate with conductive layers 1312 and implanted CZ Si substrate 1311 are joined together 1313 with opposing surfaces similar to 850 and 860. The surfaces must be free from particulate contamination and interfacial voids and can be vacuum joined, van der Waals and the like bonded together, as shown in FIG. 14B, to form article 1314.

Figure 15:
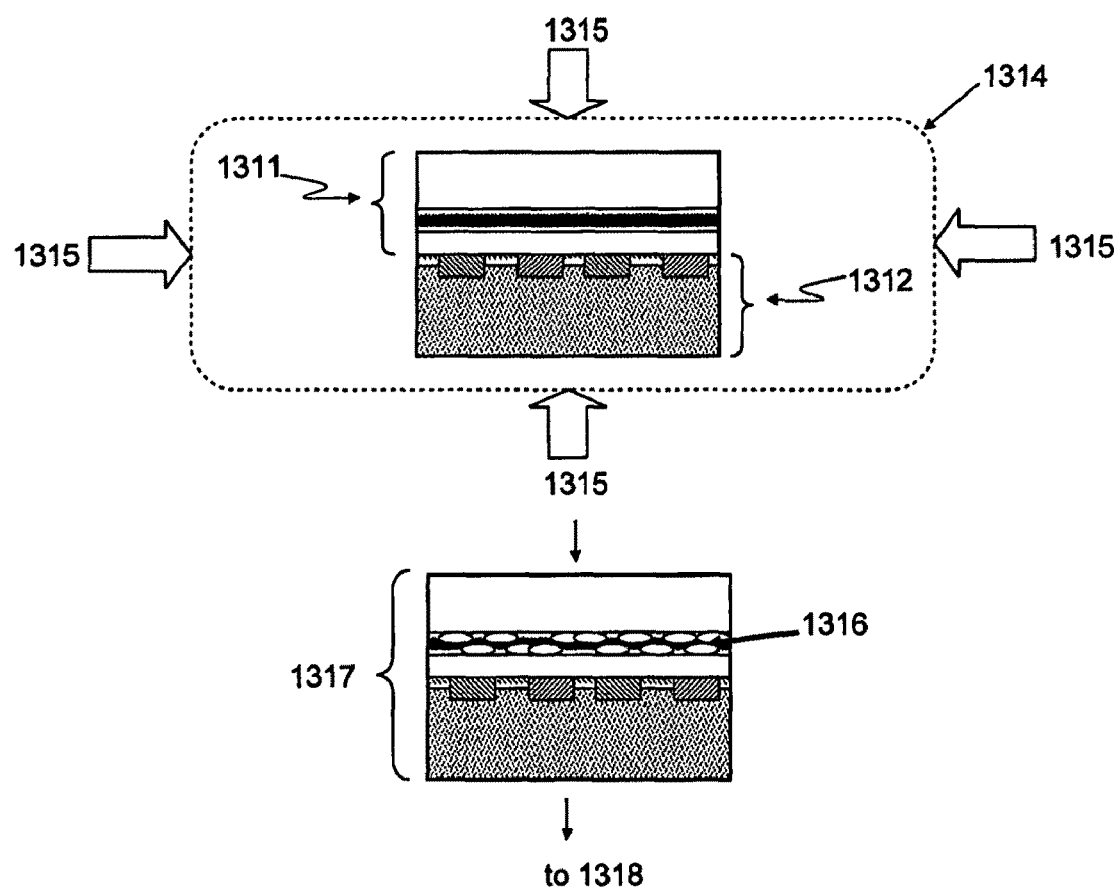
FIG. 15 shows alternative steps for original substrate removal using thermally activated delamination.

FIG. 15 shows how the compound multilayer article 1314 is then subjected to thermal annealing sequence 1315 to strengthen the bond between surfaces and to initiate temperature dependent defect fracture 1316 confined to a region advantageously aligned with CZ Si crystallographic axes. The thermal anneal sequence 1315 generates fracture within said CZ Si crystal confined substantially to the plane defined by the defect plane, 1316.

Figure 16:
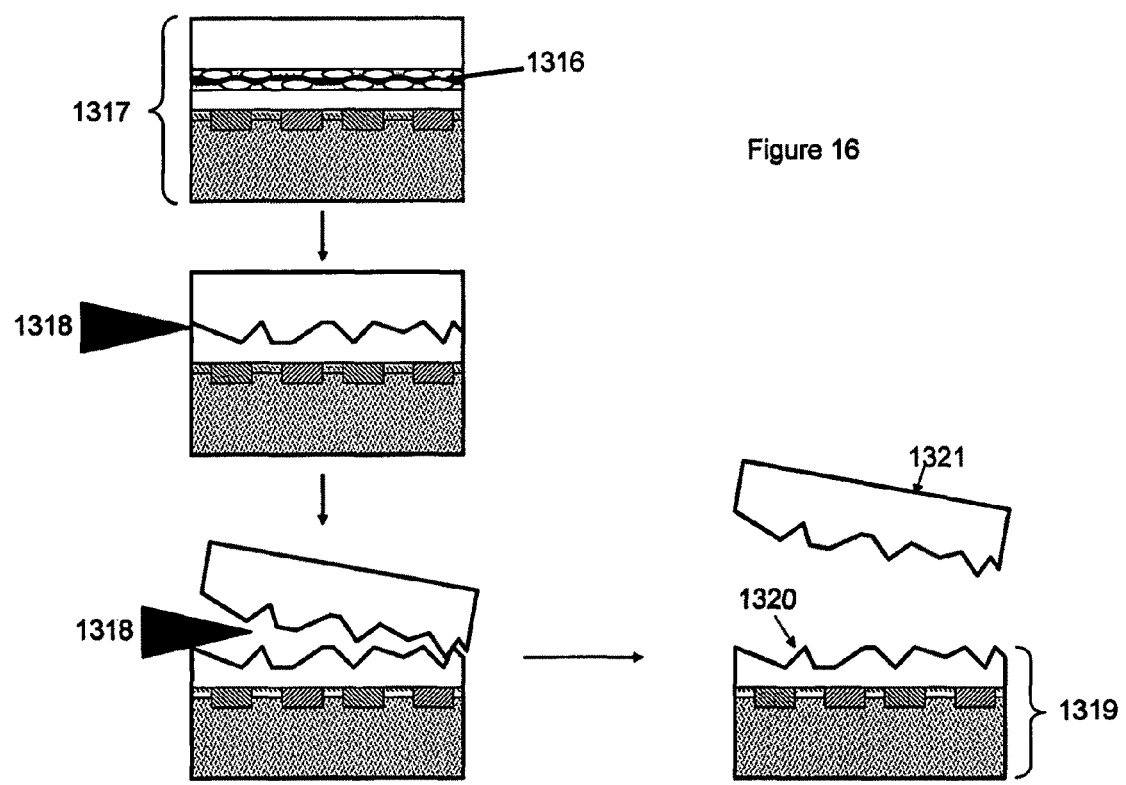
FIG. 16 shows alternative steps for original substrate removal.

FIG. 16 next shows how, with application of external mechanical stimulus 1318 to at least one region of the edge of the compound article 1314, the fracture propagates throughout the defect plane causing physical separation of remaining bulk CZ Si substrate 1321 and thin film CZ Si 1320 coupled to alternative substrate 1319; alternative mechanical stimulus, such as bending, may be appropriate. The resulting defect plane may exhibit rough surface on both the exposed thin film CZ Si 1320 and the cleaved surface of the bulk substrate. The surface roughness of 1320 may have surface features ranging from several nanometers to several micrometers depending on the O:H ratio and implant energy. Typically, higher implant energies result in wider full width at half maximum of the Gaussian defect layer. For example, a 3 MeV H$^+$ implant results in a straddle of ~1 µm.

FIG. 17 shows how the wafer bonded thin film CZ Si and conductive buried contacts on the alternative substrate 1319 are then processed to form a planar type solar cell device 1319. Metal contacts 1307 and 1308 are disposed on the same buried surface 1310. Contacts 1307 and 1308 are optionally ohmic and/or Schottky type. For example, high performance solar cells may use rare-earth silicide (RE-Si$_x$) and or metal, such as platinum silicide (Pt—Si$_x$), ohmic contacts. A silicide contact can be deposited as RE and or Pt metal and then anneal to form the respective silicide by consuming and alloying with Si film. Alternatively, metals exhibiting Schottky barrier when in contact with Si can be also used.

The planar solar cell 1319 functions by converting incident solar radiation 1325 into photogenerated electronic charge carriers extracted through the external circuit shown via interconnected cells. Incident optical solar radiation can be coupled to the planar solar cell 1319 through the surface of cleaved thin film CZ Si layer. If alternative substrate 1306 is transparent to all or a portion of the solar spectrum, incident optical solar radiation can be coupled through 1306 into the thin film CZ Si layer.

Lastly, the removed bulk CZ Si substrate portion 1321 can be reprocessed via chemical mechanical processing (CMP)

1323 to form a substantially flat surface 1324 resembling the initial CZ Si substrate. As the removed thin Si film has thickness significantly less than the total thickness of the starting CZ Si substrate 1301, the reprocessed substrate 1324 can be used for subsequent processing of another thin film removal 1301.

Example 3

Thin Film Solar Planar Process

In one embodiment a disclosed process is used to fabricate a planar type opto-electronic solar spectrum energy conversion device using thin film single crystal Si layer transfer method. A key feature of this process is the extensive use of ion implantation to affect the conductivity type of selective regions within the CZ Si thin film active layer. The electronic structures possible are discussed later and disclosed in FIGS. 44 to 51, inclusive.

FIGS. 18 to 26 disclose the individual process paths for fabrication of thin film solar cell article and wafer scale solar energy conversion modules.

Figure 18:
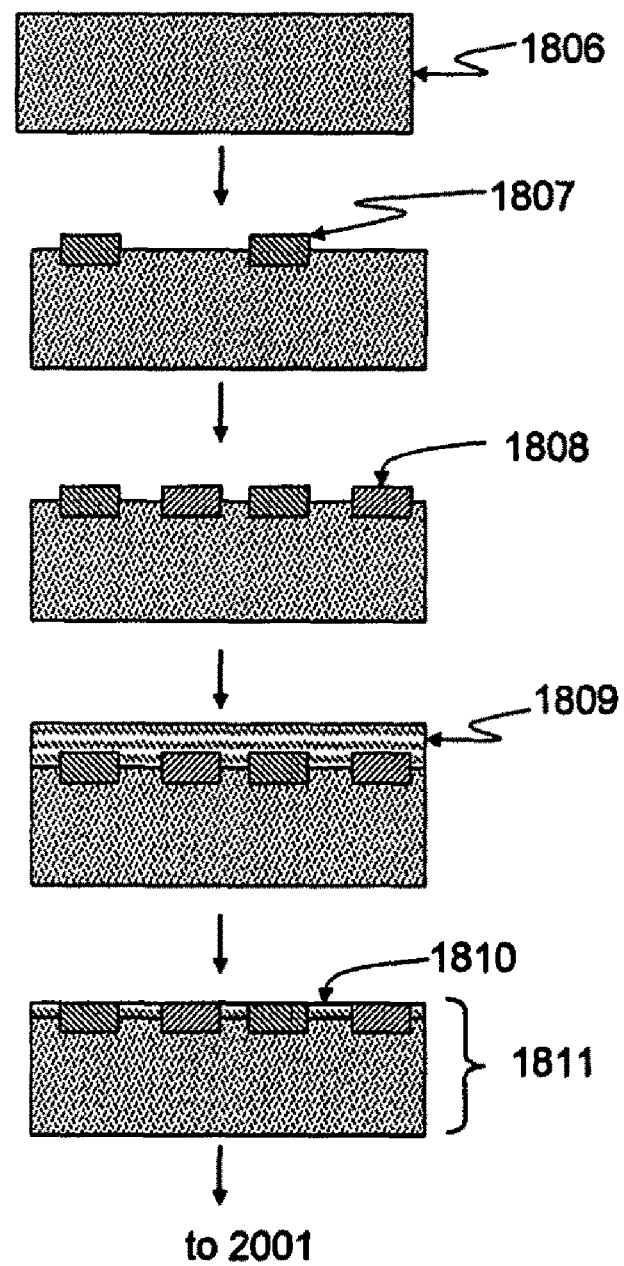
FIG. 18 shows alternative steps for replacement substrate preparation including preparation of buried electrodes.

FIG. 18 shows initial processing steps of the alternative substrate containing patterned planar electrodes. Cleaned alternative substrate 1806 is deposited with spatially patterned conductive layers 1807 and 1808, for example metals such as aluminum (Al) and or rare-earth (RE) metal. If separate metals are used for 1807 and 1808, they can be deposited sequentially using an appropriate mask (not shown). After the contacts/electrodes 1807 and 1808 are fabricated, an insulating layer 1809 is deposited, as shown. The layer 1809 can be $SiO_2$, high-k and or low-k dielectric film. The contacts 1807/1808 and insulating film 1809 can optionally be planarized via CMP to form flat surface 1810, free from particulate contamination.

Figure 19:
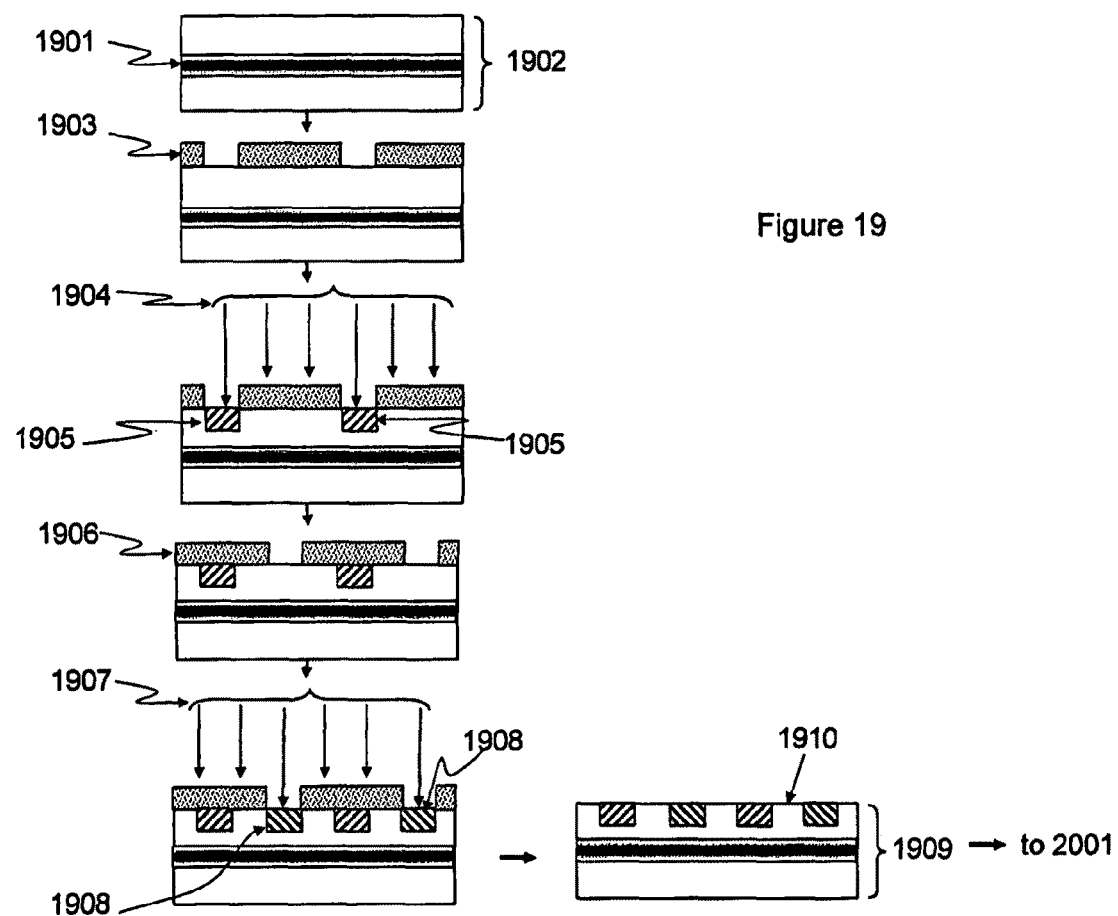
FIG. 19 shows alternative steps for original bulk semiconductor substrate preparation, including steps of masking, forming thin film separation layer, and the selective area implantation of regions within the thin film layer.

FIG. 19 shows a single crystal CZ Si substrate implanted with a defective layer 1901 separating a thin film CZ Si layer 1920 from the remaining bulk CZ Si substrate 1902. The article 1902 is fabricated using at least one of the methods disclosed in the present invention. CZ Si substrate 1902 and patterned alternative substrate 1811 are optionally cleaned and prepared for processing. A protective mask layer 1903 is deposited or thermally grown on 1909 to allow selective area ion implantation into the desired portions 1905 and 1908 of the thin film CZ Si layer. Ion implantation of impurity atoms, such as, Arsenic (As), Phosphorus (P), Boron (B), Carbon (C), Germanium (Ge) and the like are then implanted to alter the conductivity type of the Si region exposed by the mask 1903. The selective area implantation region 1905 defines either an n-type and or p-type conductivity region. An optional, alternate conductivity type region can be performed by removing mask layer 1903 and depositing and patterning mask layer 1906. Again, impurity atoms may be implanted 1907 through mask 1906 to form selective area conductivity regions 1908. Next mask layer 1906 is removed and article 1909 is obtained. The surface 1910 is optionally cleaned and or prepared for wafer bonding to surface 1810 as shown in step 2001 of FIG. 20.

Figures 20A, 20B:
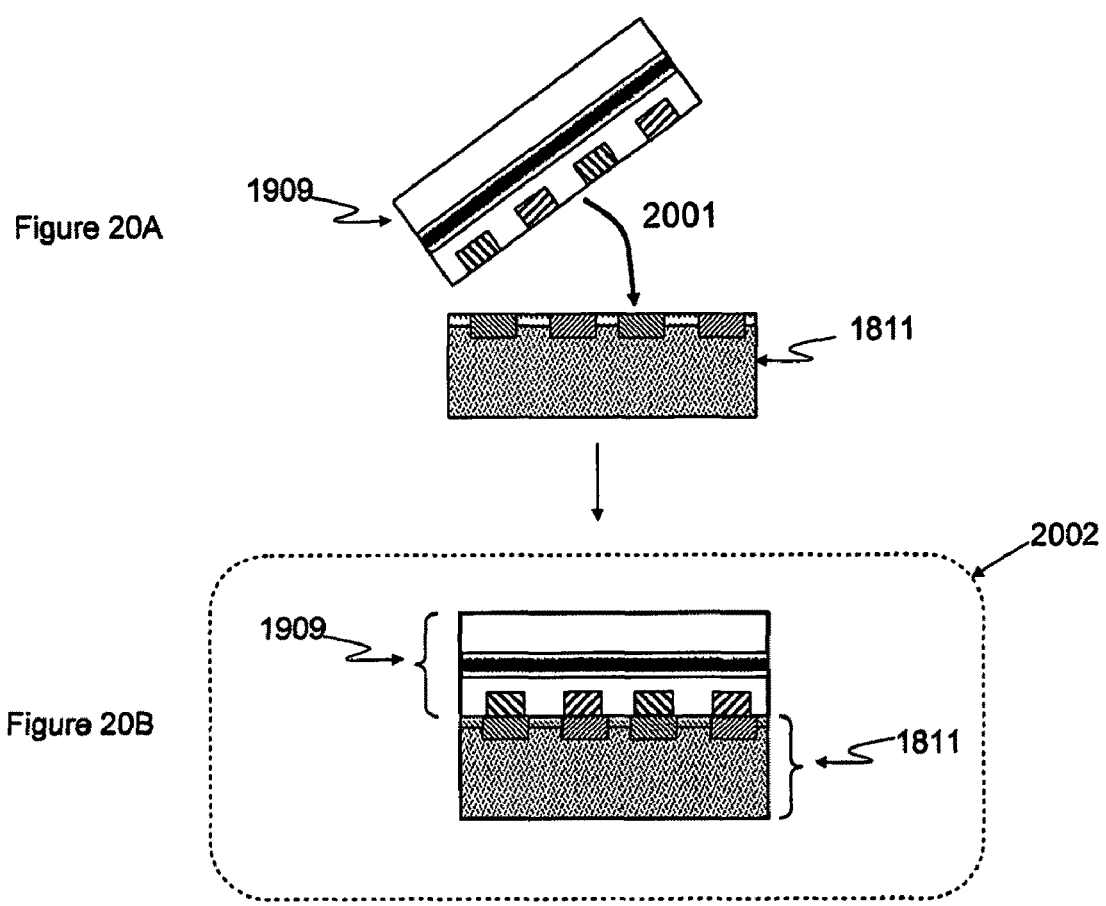
FIGS. 20 A and B show alternative steps for replacement substrate bonding to bulk semiconductor substrate containing buried delamination layer and thin film layer.

FIG. 20A shows the wafer bonding of 1909 and 1811 to form article 2002, in FIG. 20B, containing defect/cleave layer, patterned electrodes and selective area implants in CZ Si thin film.

Figure 21:
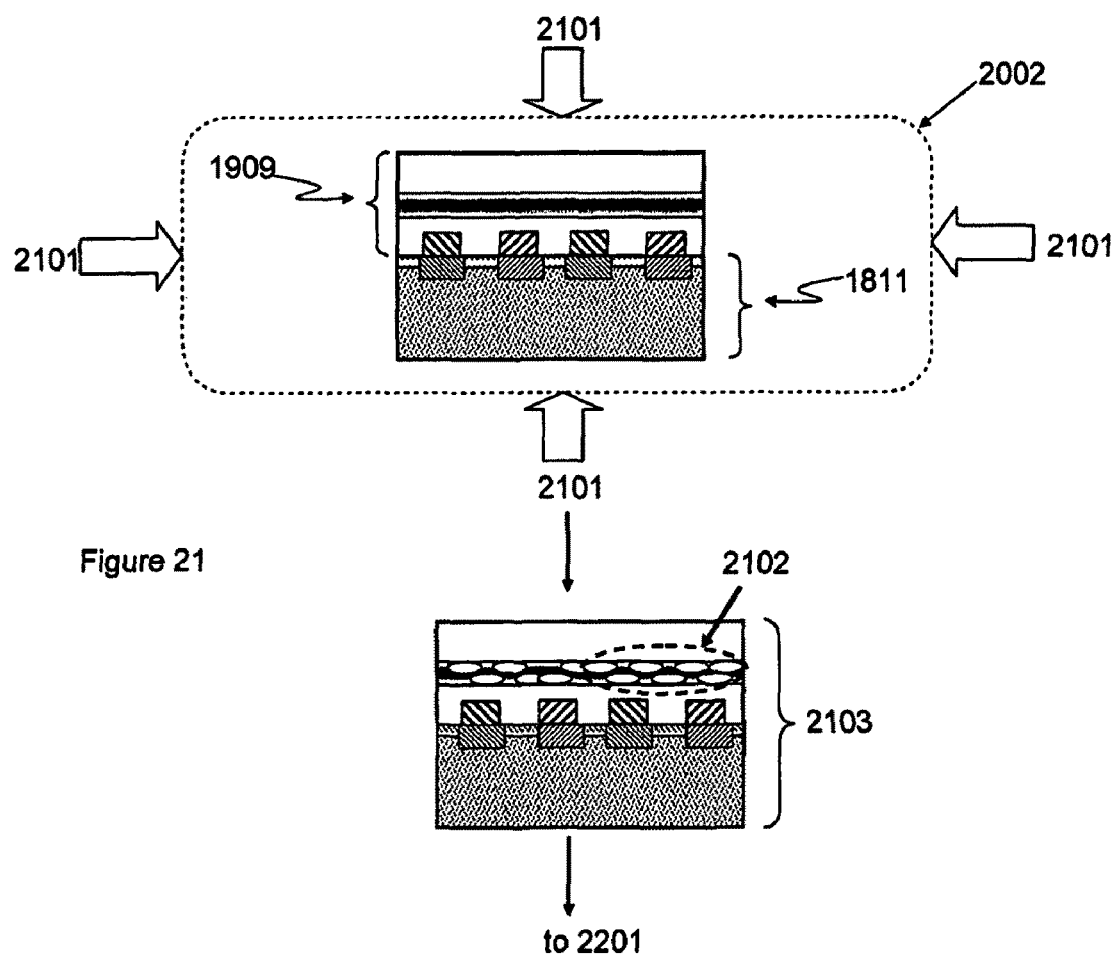
FIG. 21 shows alternative steps for original substrate preparation for separation.

FIG. 21 shows the thermal annealing step 2101 according to the method described in the present invention to form a buried defect layer 2102 in completed multilayered structure 2103. Note, selective removal or release of the separation layer 1901 may also be used to release thin film active layer.

Figure 22:
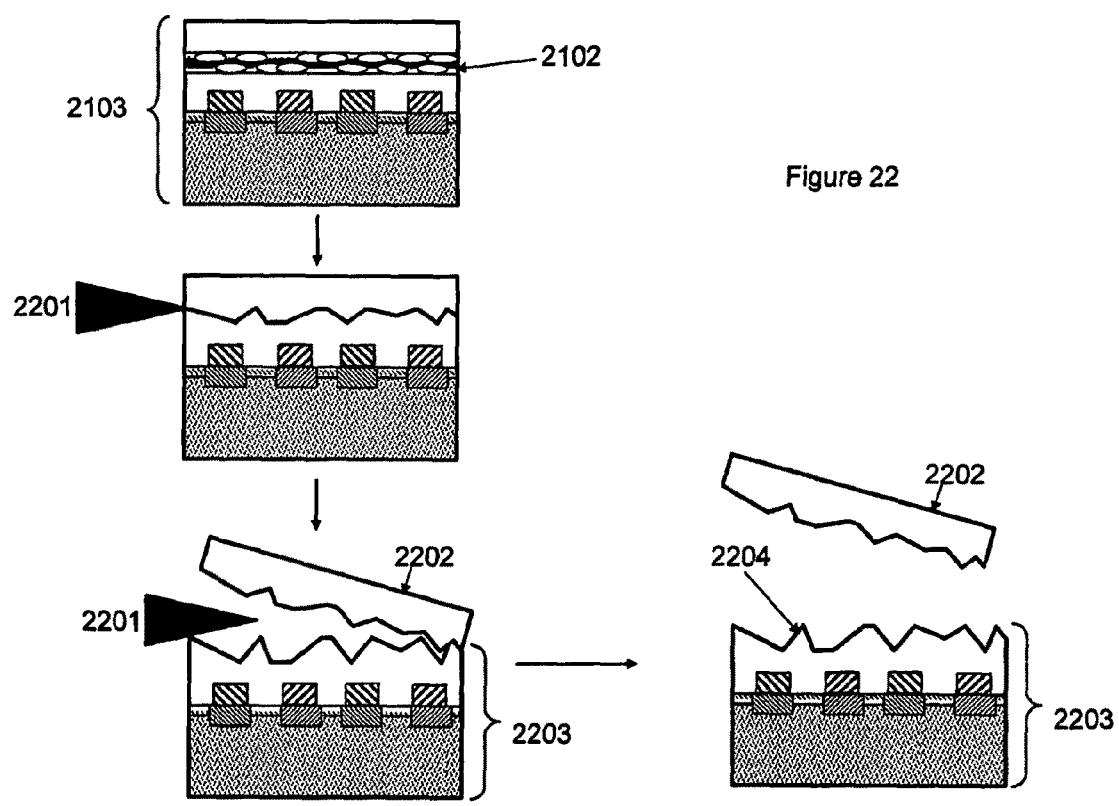
FIG. 22 shows alternative steps for original substrate separation and formation of thin film active layer electrically connected via selective area implantation regions to electrodes disposed upon the alternative substrate.

FIG. 22 shows how the structure 2102 may be cleaved using mechanical, or bending or fluid jet or high pressure gas 2201 to initiate fracture propagation along plane defined substantially by defect layer. Alternatively, gaseous species can be used to react with separation layer 1901 to alter structure and thus provide advantageous properties for thin film release. The defined thin film CZ Si layer and planar implant electronic device(s) 2203 are then separated from the bulk CZ Si substrate 2202 via the defective layer 2102. The structure 2203 has surface 2204 that can be made rough so as to allow advantageous coupling of broadband solar spectrum into the thin film CZ Si active layer. Alternatively, the roughness of 2204 may be small enough so as to be ineffectual for further processing. CMP can also be used to planarize 2204 for subsequent thin film depositions, such antireflection and or filter coatings.

FIG. 23A shows the final schematic steps for formation of a planar implant defined solar conversion device with optical radiation 2301 coupled through surface 2204. The partitioned bulk CZ Si substrate 2202, in FIG. 23B, can then optionally be reprocessed using, for example CMP 2302, to planarize and thus allow recycle of the substrate 2303 acceptable for step 1901.

The unique capability of planar solar cell devices as disclosed in the present invention is shown in FIGS. 24 to 27.

Figure 24:
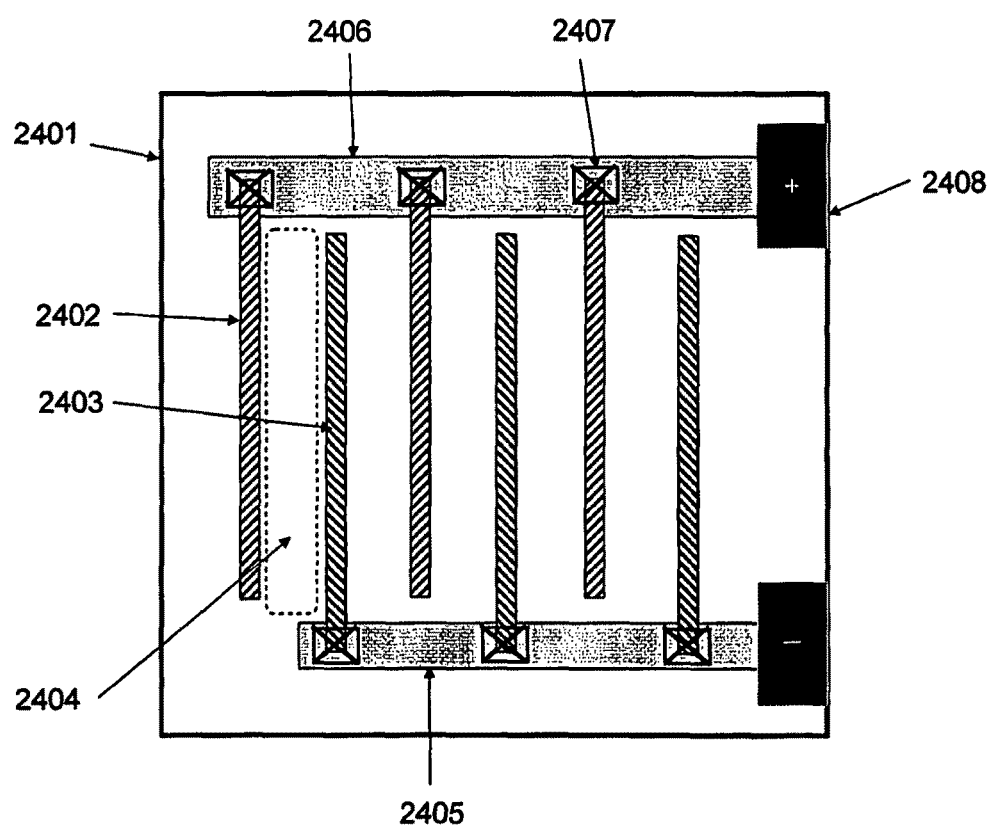
FIG. 24 shows an electrode pattern and implantation regions in a thin film semiconductor forming a photovoltaic device or cell.

FIG. 24 shows a schematic top view of solar cell device 2401 implemented using, optional, interdigitated p-type 2402 and n-type 2403 regions to define selective area conductivity regions in the CZ Si thin film transferred to a patterned electrodes 2406 and 2405 of the alternative substrate. The electrical contacts between the thin film CZ Si implant regions and the alternative substrate electrodes are shown as 2407. The unit cell 2401 can be lithographically scaled to dimensions of the order of centimeters to nanometers using conventional Si processing equipment. The electrical equivalent circuit of unit cell 2401 is shown as 2503 in FIG. 25B.

Figures 25A, 25B:
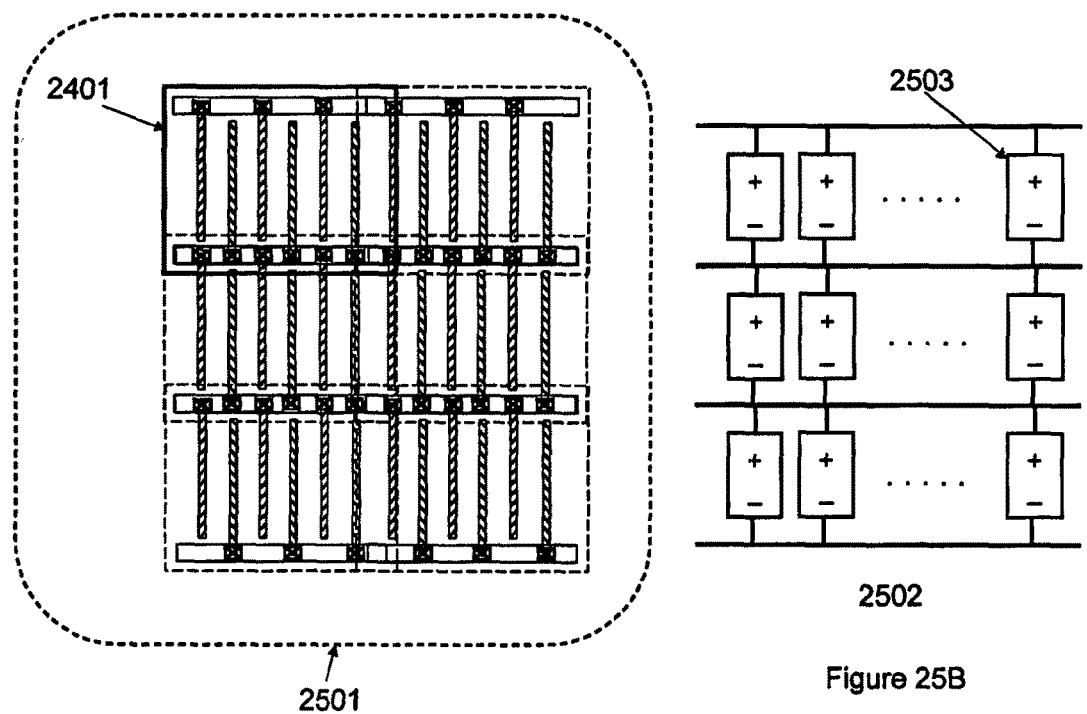
FIGS. 25 A and B shows wafer scale electrode patterns for a photovoltaic module and interconnection scheme consisting of multiple repeating photovoltaic cells.

FIG. 25A shows the large scale integration implementation of repeating unit cell 2401 into interconnected assemblies 2501. An alternative implementation shows unit solar cell 2401 fabricated in the form of interdigitated p-n junctions, repeated many times on a wafer. The alternate carrier type regions defined by implantation are separated by not intentionally doped bulk semiconductor comprising the thin film active layer. Multiple unit cells 2401 are connected electrically via bus bars 2405 and 2406 in parallel and series. The electrical equivalent circuit is shown as 2502.

Figure 26C:
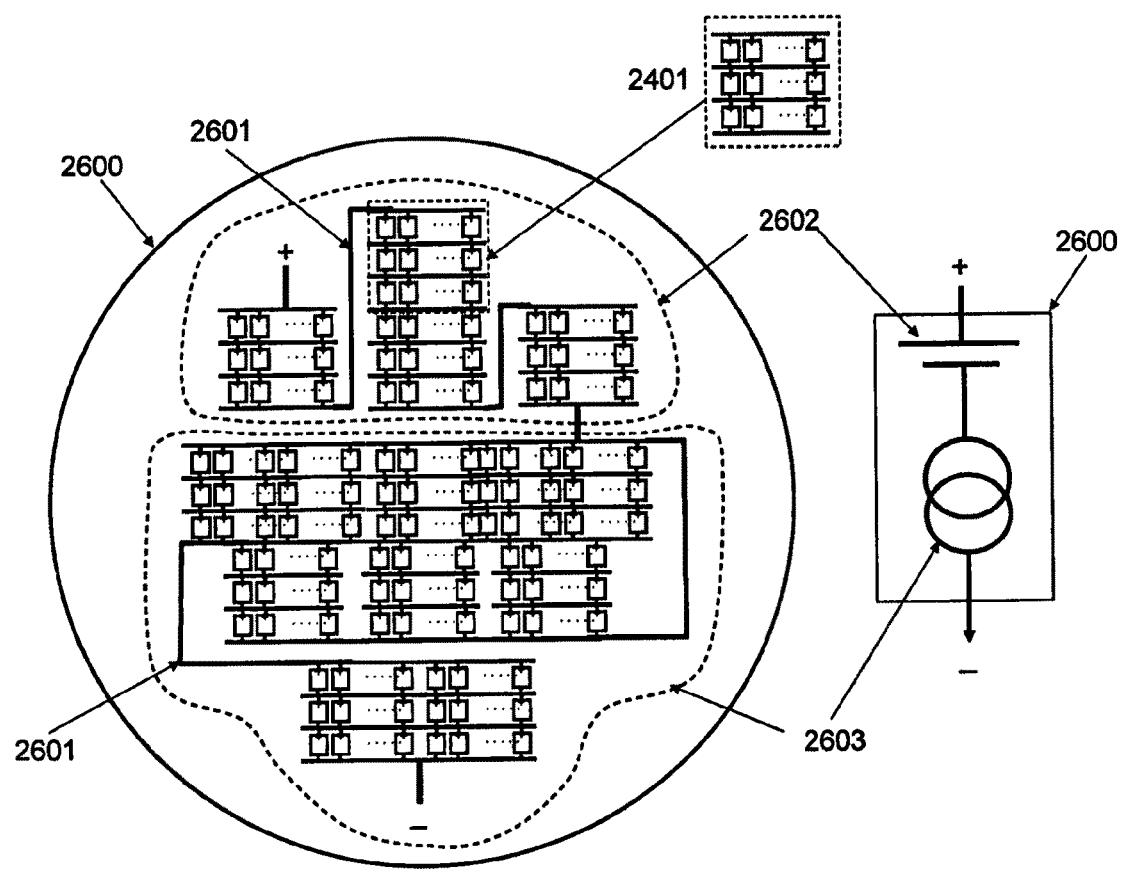
FIG. 26C shows an optional configuration and interconnection for a photovoltaic module using unit cell devices configured to operate in substantially voltage source or current source.

FIG. 26A shows utility of patterning large numbers of appropriately scaled unit cells, for example unit cell 2401, onto a large area wafer format 2601 and 2602.

FIGS. 26B and C disclose alternative embodiments of present invention for high performance thin film CZ Si solar module based on wafer scale manufacturing process disclosed herein. For example, unit cell 2401 is replicated in an advantageous fashion to allow high density packing of 2401 onto a large area wafer. The unit cells can be grouped advantageously to functional blocks of voltage source and current source. That is, the incident solar spectrum impinging the solar module defined by the wafer 2600, can be constructed to generate a photoinduced voltage source 2602 and current source 2603. The unit cell 2401 can be kept constant across the wafer or optimized unit cells can be implemented in advantageous regions across the wafer depending on the defining mask pattern. The cost incurred in altering 2401 is only in the mask, the processing costs will be identical. This is the power of planar CMOS style manufacture. The interconnections between unit cells 2601 on wafer 2600 are shown. The equivalent circuit of the thin film CZ Si solar module is also shown.

FIGS. 27 to 36 disclose thin film CZ Si solar energy conversion structures used for coupling solar optical radiation into the Si and or semiconductor active region. For example, simple metal-semiconductor-metal (MSM) and implant defined conductivity regions are used to implement the electrical functions according to the present invention. Various optical coupling layers are disclosed to optimize all or portion of the incident solar spectrum.

Figure 27:
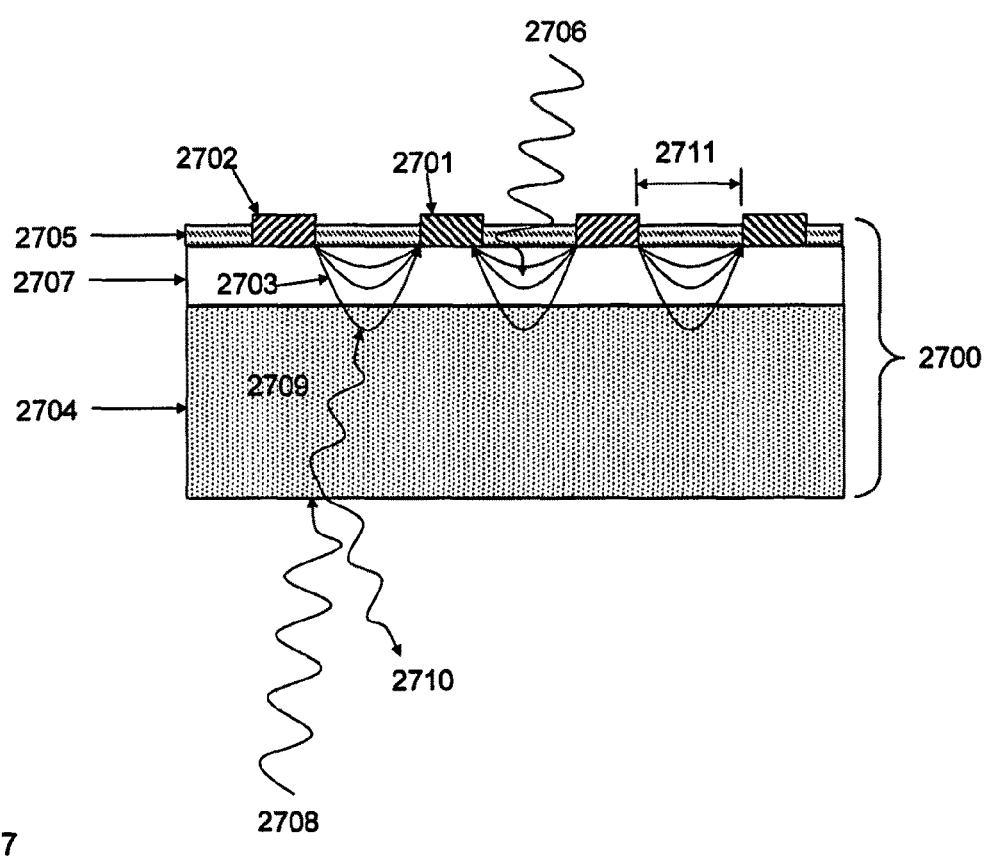
FIG. 27 shows an optional configuration for a thin film photovoltaic devices.

FIG. 27 schematically shows a simple form of the thin film device 2700. Electrodes 2701 and 2702 contact the thin film CZ Si 2707. The electrodes are spaced distance defined by 2711. Optical radiation 2706 or 2708 may couple the active region 2707 of the cell being incident on the electrode side of the device or through the substrate 2704 and directly into 2707. The fill factor is determined by the electrode width and the electrode spacing and impedes the coupling of 2706 into 2707. The electric field lines 2703 between the electrodes extend into the Si film and or the alternative substrate 2704, as shown. Optical radiation 2708 however, suffers reflection loss 2710, leaving only portion 2709 of incident radiation 2708 to couple into the active region. By appropriate choice of alternative substrate 2704 thickness and refractive index, the reflection loss can be minimized.

Figure 28A:
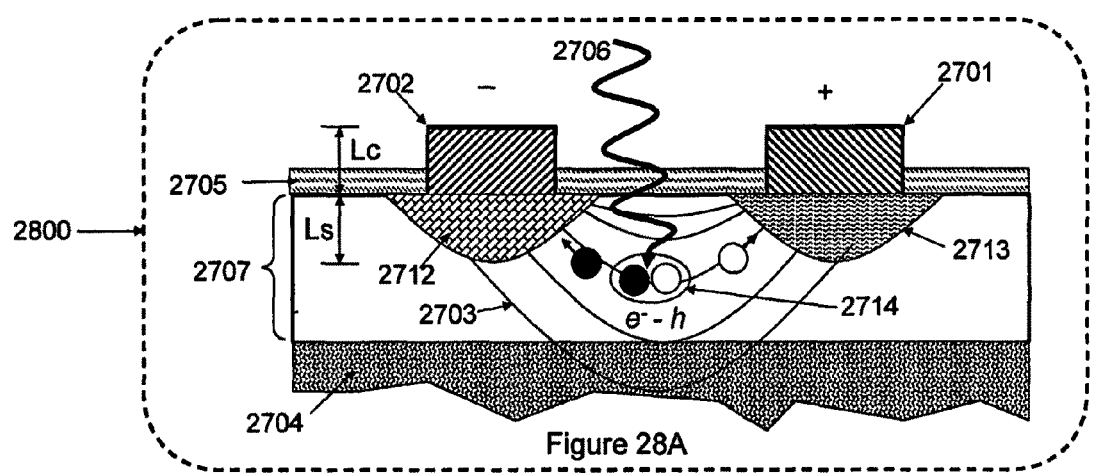
FIGS. 28A and B show another optional configuration for a thin film photovoltaic device.
Figure 28B:
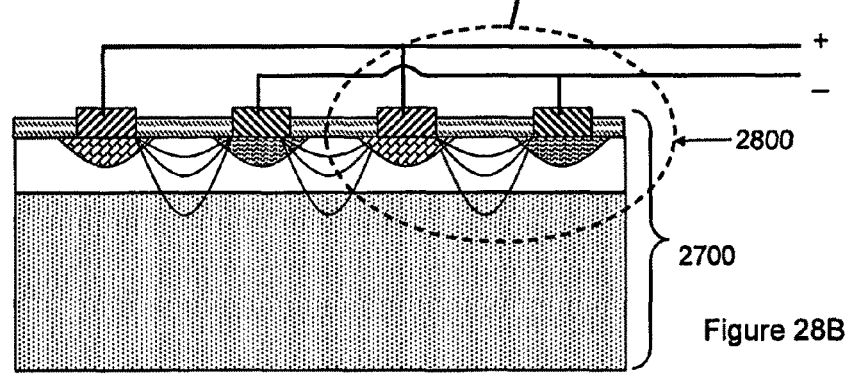

FIG. 28A shows in detail 2800 the optical to electronic conversion process of unit cell 2700. An incident photon 2706 creates an electron and or hoe pair 2714. Example conductivity type implants and or diffused metal and or dopants are shown as regions 2712 and 2713. The separation of the photogenerated e-h pair is shown, with electrons and holes transport to opposite electrodes. UV photons are typically created close to the interface between protective and/or passivation oxide 2705 and the active layer 2707. FIG. 28B shows multiple portions of 2800. If the finger spacing is small enough and or the electric field strength strong enough, the electron and hole are collected before non-radiative recombination process occurs.

Figure 29A:
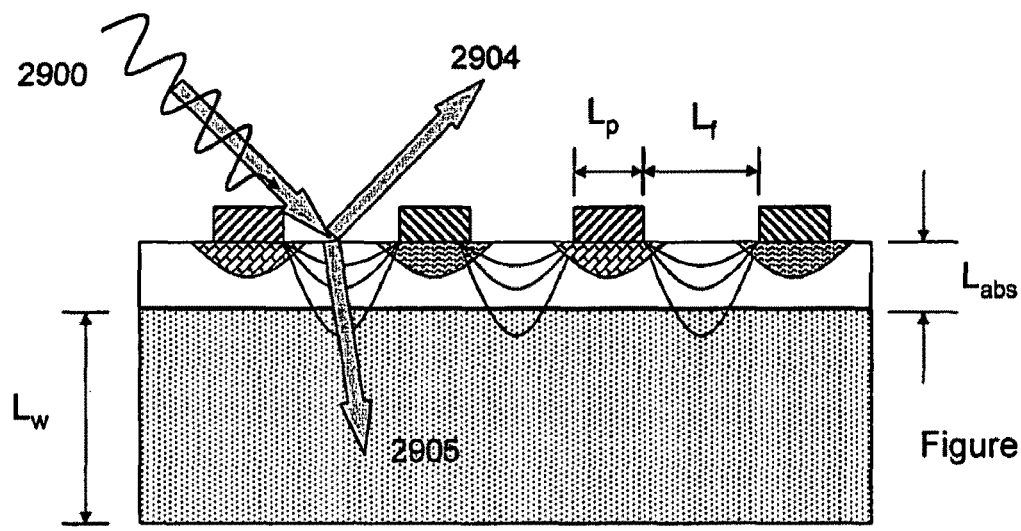
FIGS. 29A and B show another optional configuration for a thin film photovoltaic device.
Figure 29B:
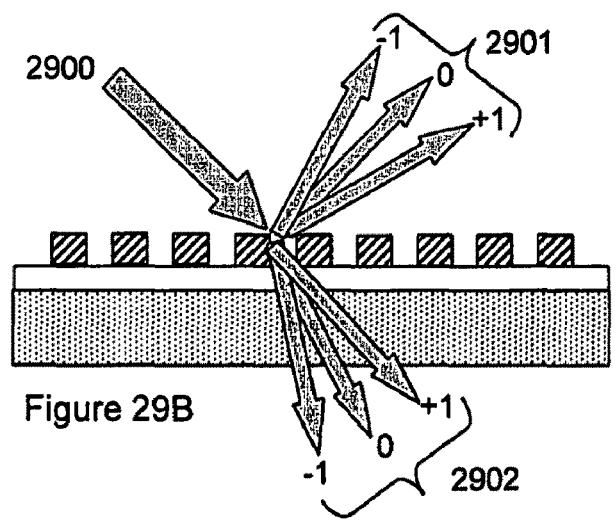

FIG. 29A shows the effect of small electrode width $L_p$, and separation $L_f$ so as to form optical grating action. If the electrode dimensions are very large compared to the wavelength of incident radiation 2900 impinging on the active region will be reflected 2904 and transmitted 2905. The transmitted portion will be refracted into the active region. If the grating is comparable to the optical wavelength or multiple thereof, the incident radiation will diffract into diffractive orders 2901 and 2902. The diffractive effect occurs in a similar fashion for optical radiation impinging from beneath through an alternative substrate. The advantage in the later configuration, the light couples first into the active layer, and may reflect or diffract back from the electrode grating back into the active region. This effect enhances the optical coupling into the thin film active layer.

Figure 30:
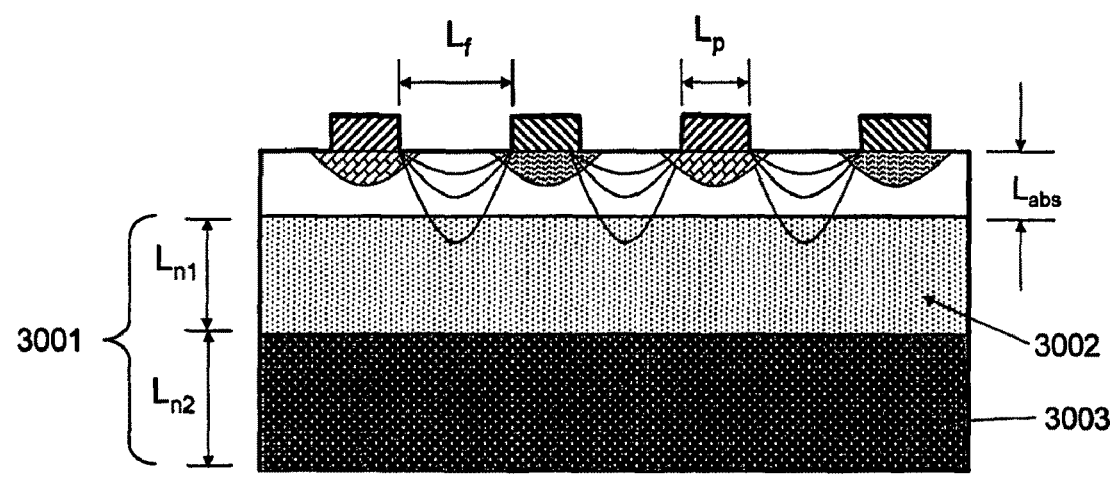
FIG. 30 shows another optional configuration for a thin film photovoltaic device.

FIG. 30 show how the reflective losses of the device in FIG. 27 can be overcome by application of an anti-reflective (AR) coating 3003. If the alternative substrate is transparent to all or part of the solar spectrum, then the alternative substrate 3002 will form part of the AR system. Considering different refractive indices n, for materials 3002 and 3003, the thickness of at least one of 3002 and or 3003 can be chosen to be an odd or even multiple of quarter wavelength.

Figure 31:
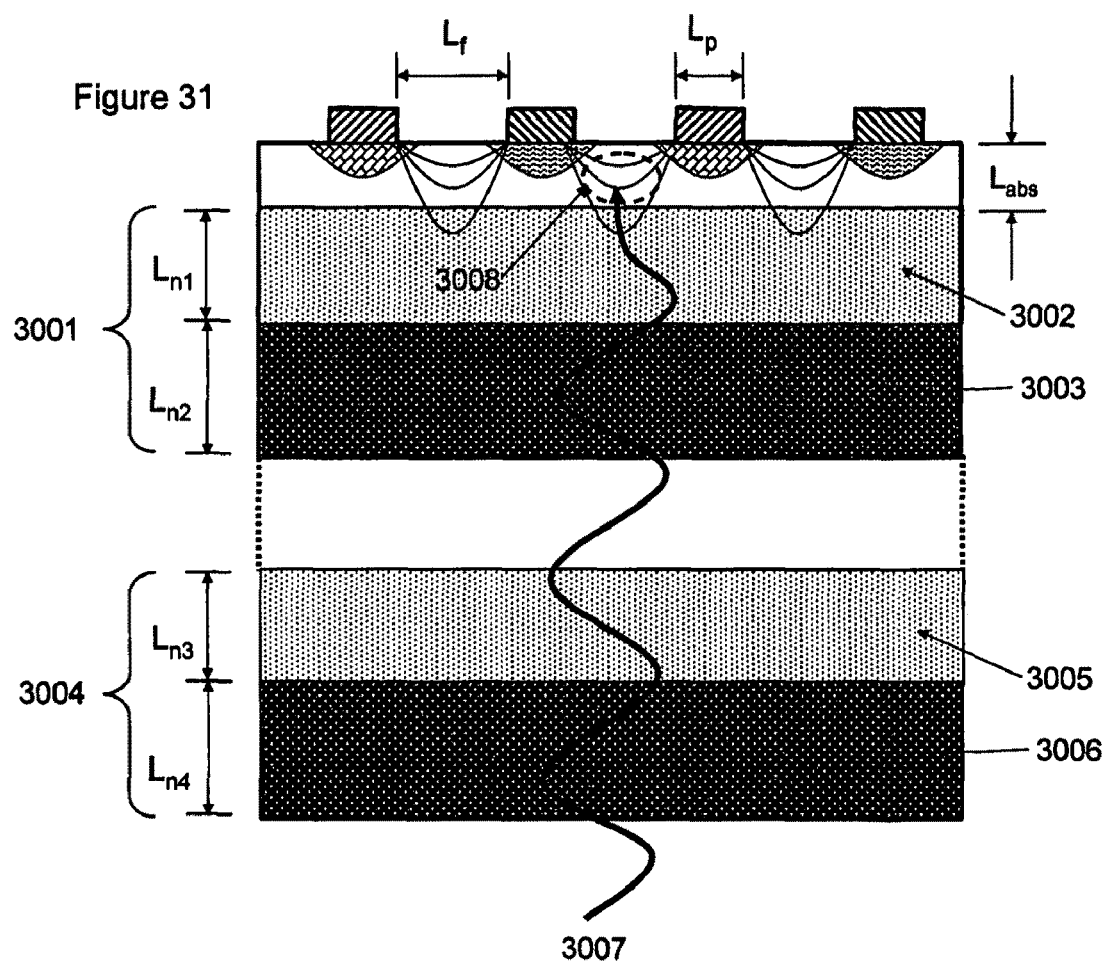
FIG. 31 shows another optional configuration for a thin film photovoltaic device.

FIG. 31 shows how a multiple layer dielectric coating can be deposited on an alternative substrate so as to form an optical filter and or broadband interference filter. The dielectric layer pairs 3001 and 3004 can be identical and or chirped to form a distributed Bragg minor or broad band coupler.

Figure 32:
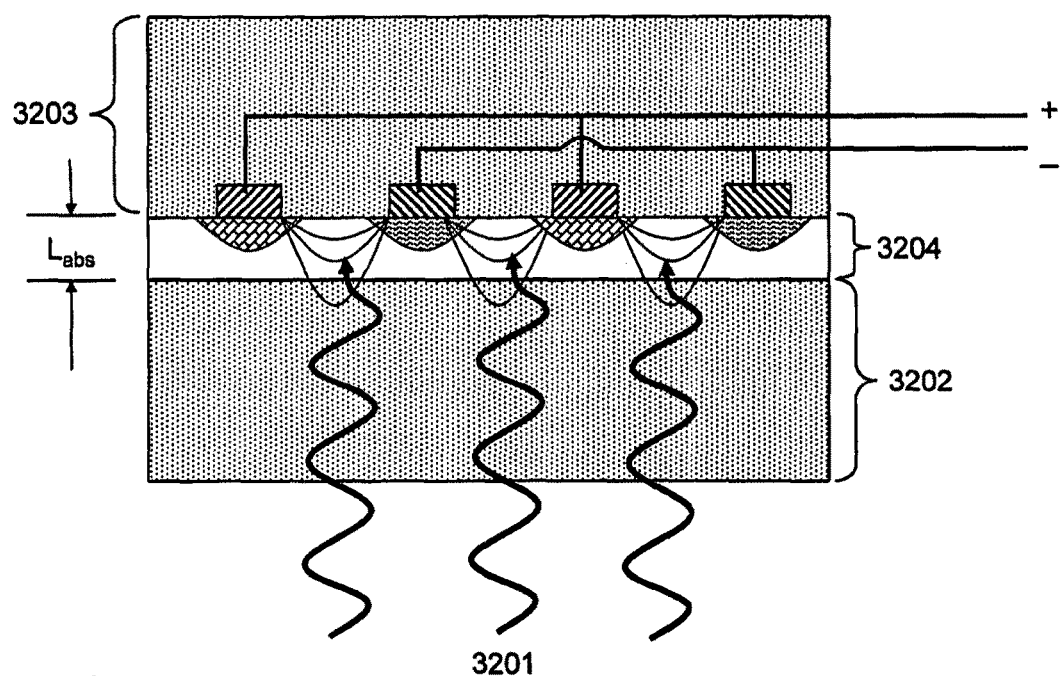
FIG. 32 shows another optional configuration for a thin film photovoltaic device.

FIG. 32 shows how backside optical coupling 3201 through the alternative substrate 3202 can be used to couple into active layer 3204. The addition of dielectric layer 3203 can be used to advantageous couple optical radiation.

Figure 33:
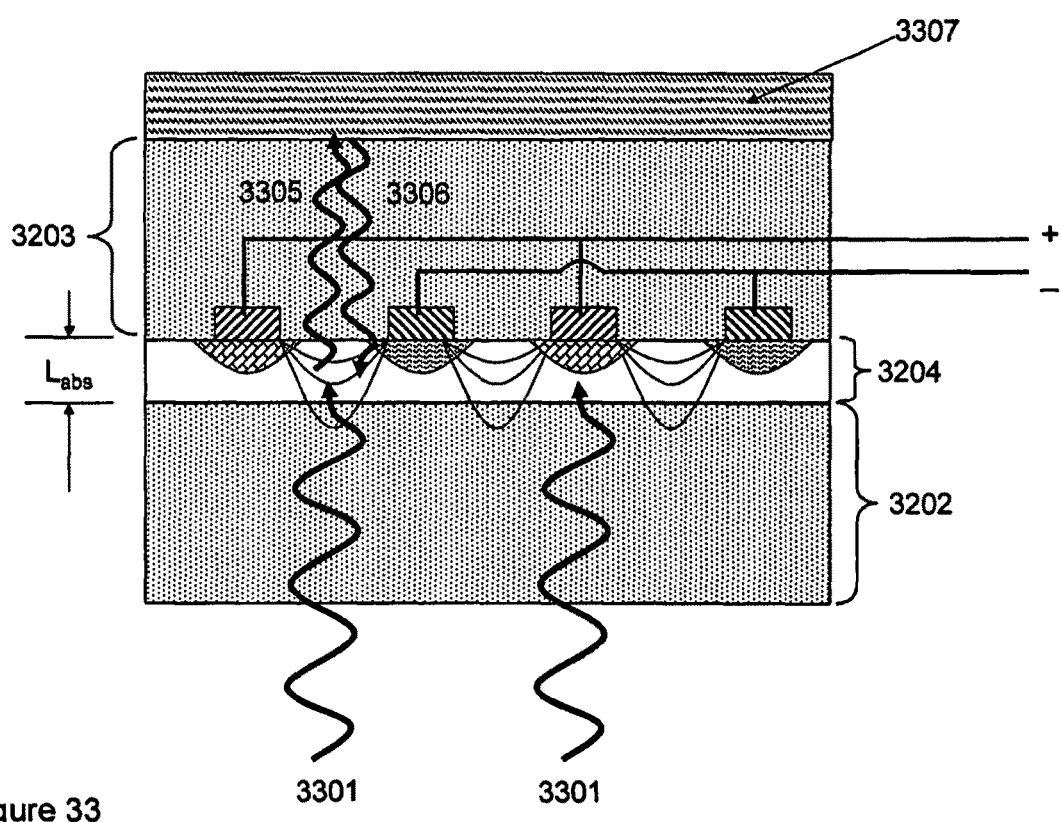
FIG. 33 shows another optional configuration for a thin film photovoltaic device.

FIG. 33 shows how the device of FIG. 32 can be used for photon recycling 3305 and 3306 back into the active layer 3204. A high reflectivity layer 3307 (for example Aluminum) is deposited on the dielectric layer 3203 (for example $SiO_2$).

Figure 34:
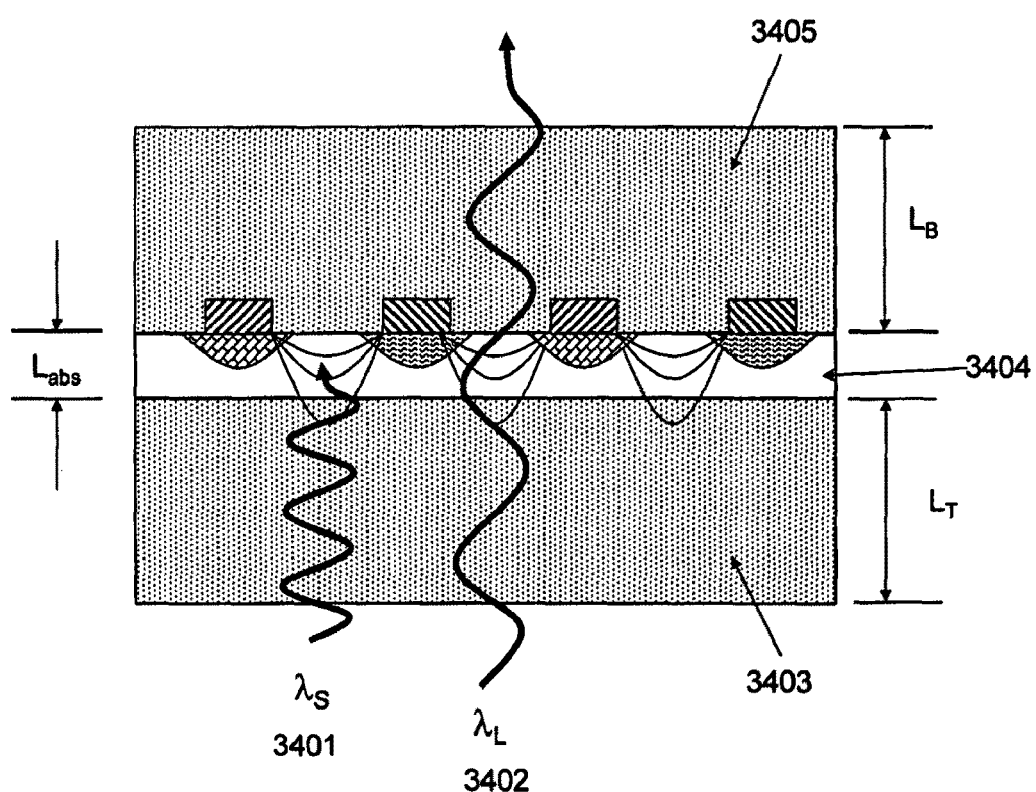
FIG. 34 shows another optional configuration for a thin film photovoltaic device.

FIG. 34 shows how backside optical coupling can be used to affect short 3401 and long 3402 wavelengths into the active region 3404 by suitable choice of layer thicknesses 3405 and 3403.

Figure 35:
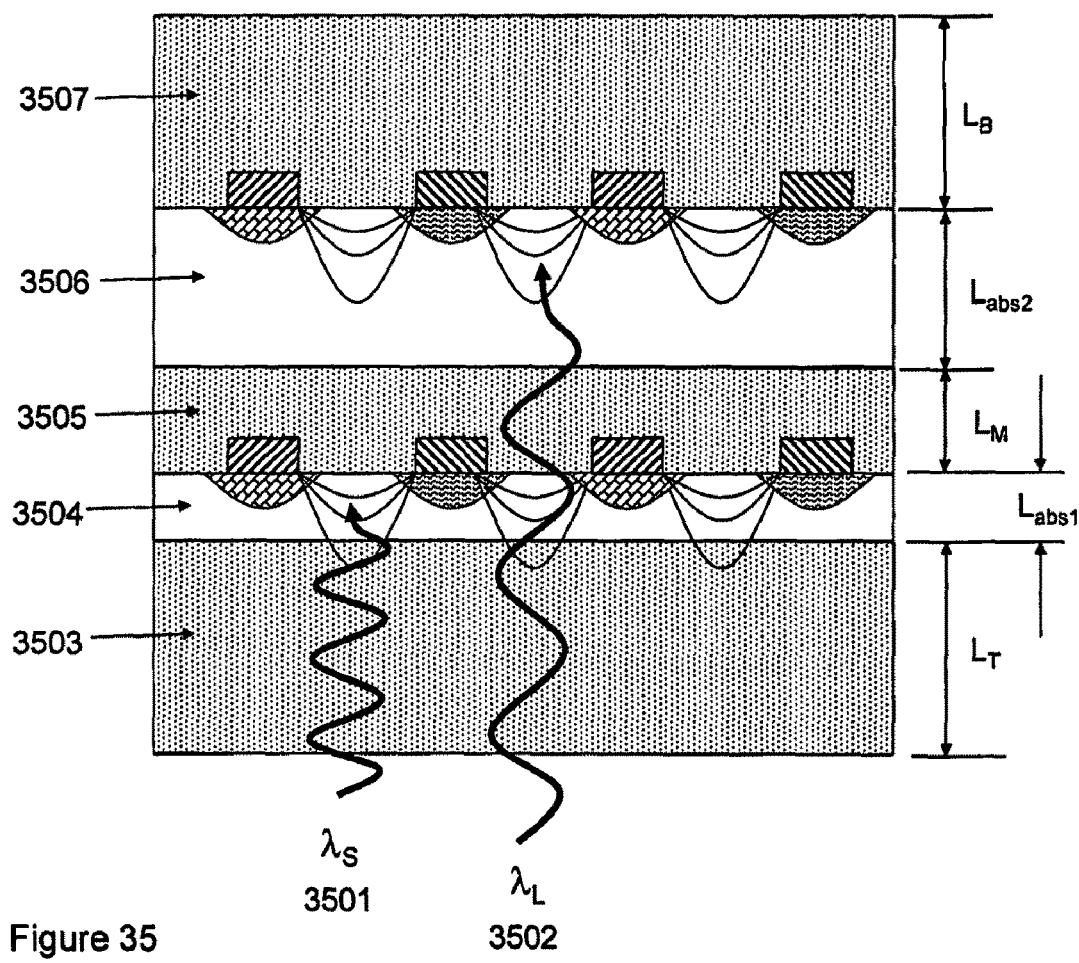
FIG. 35 shows another optional configuration for a thin film photovoltaic device.
Figure 36:
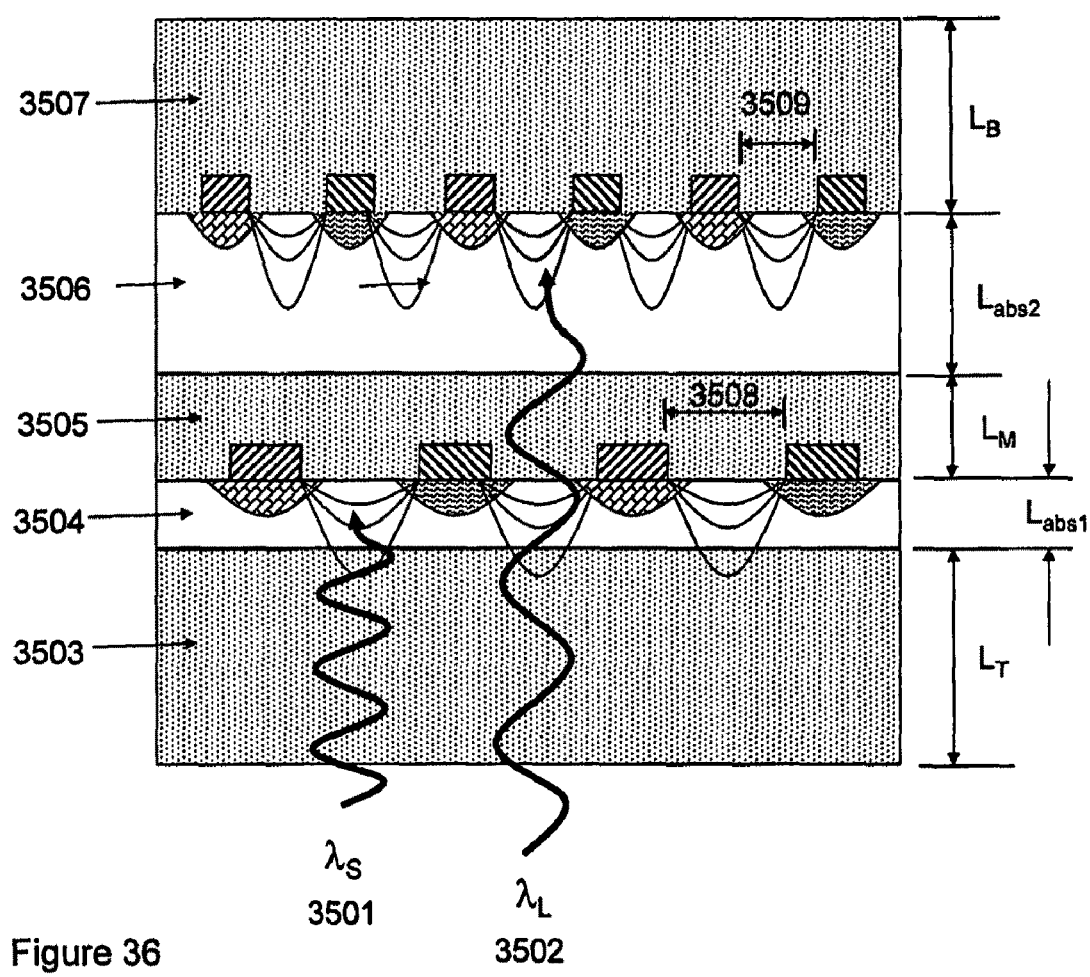
FIG. 36 shows another optional configuration for a thin film photovoltaic device.

FIGS. 35 and 36 show how multiple layer thin films and electrode arrangements can be used to optimize the wavelength selectivity of the solar cell device.

Figure 37:
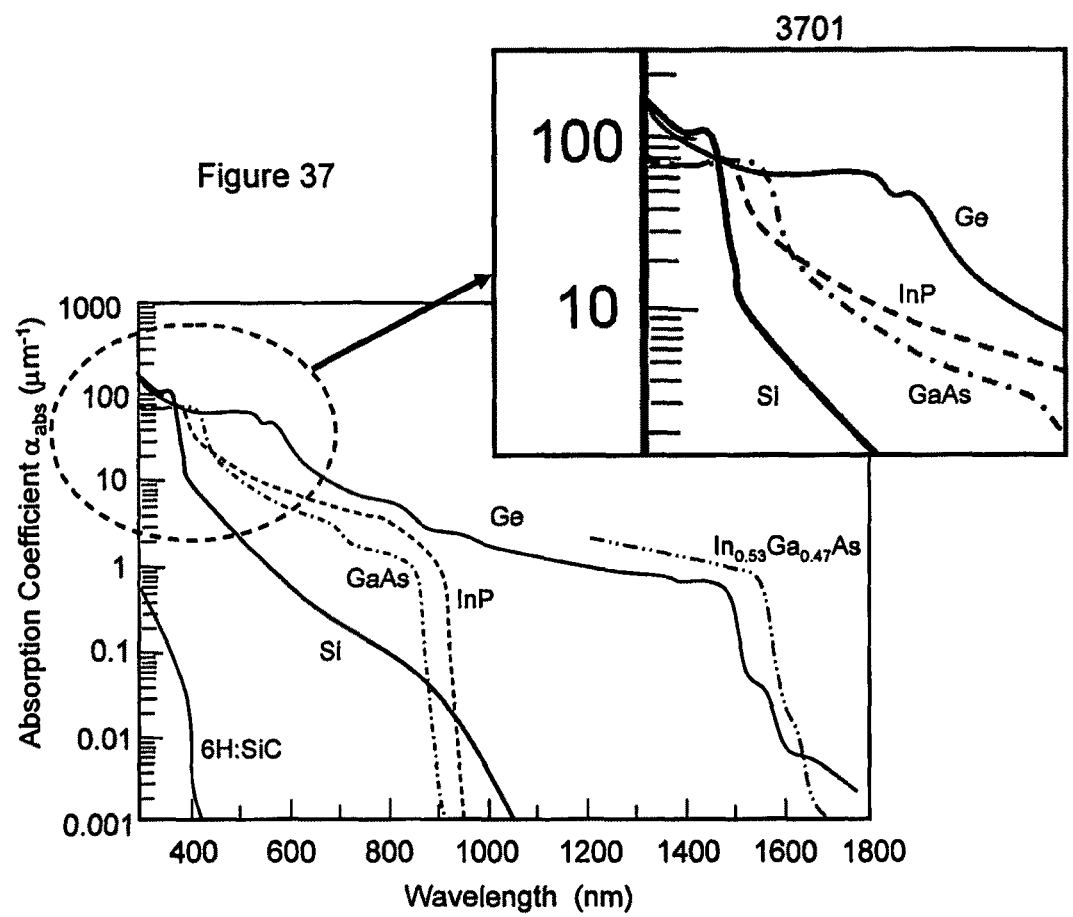
FIG. 37 shows the increased adsorption coefficient for silicon at short wavelengths.

FIG. 37 shows the high energy absorption spectrum 3701 of commercially relevant semiconductors. The indirect absorption edge of Si and Ge exhibit long absorption tails with relatively low absorption co-efficient for a majority of the spectrum. However, the absorption coefficient of Si and Ge exceed those of GaAs, InP and SiC for wavelength smaller than ~400 nm. Therefore, Si can be used advantageously and uniquely for UV solar selectivity.

Figure 38:
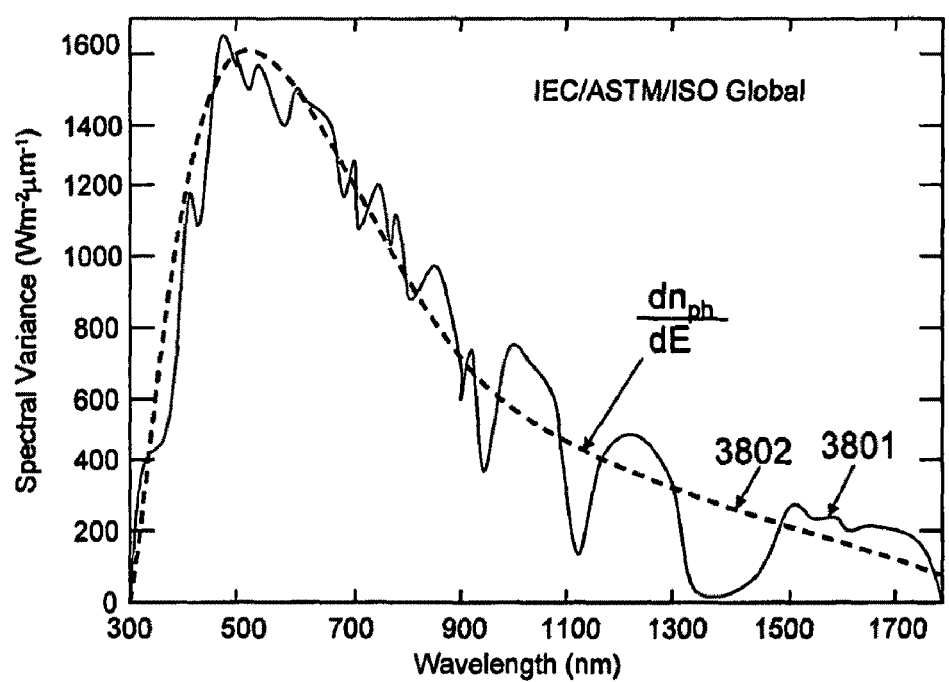
FIG. 38 shows solar spectral variance at ground level.

FIG. 38 shows the ground level solar spectrum 3801 and the approximation 3802. The spectral variance is proportional to the derivative of the photon number with respect to the photon energy. The peak variance is observed to occur ~500 nm or 2.48 eV.

FIG. 39 shows the UV optimized efficiency spectrum of a thin film CZ Si solar cell using the device of FIG. 33. The use of intrinsic (high oxygen doped CZ Si 3901) and n-type doped CZ Si (3902) are shown. Alternatively, oxygen may be implanted; alternatively gases other than hydrogen and oxygen may be employed; any two chemical specie which can be implanted and subsequently react to form a compound which expands on heating are suitable candidates; examples comprise carbon, hydrogen, nitrogen, oxygen; water is preferred but not the only possibility.

Figure 40:
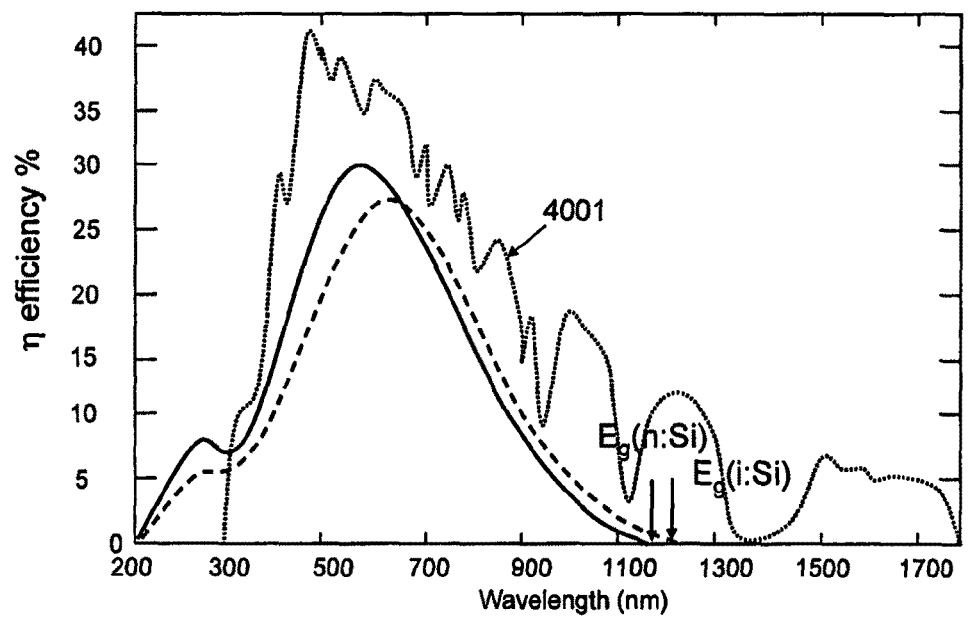
FIG. 40 shows spectral sensitivity of thin film sc silicon in a solar cell compared with the solar spectrum.
Figure 41A:
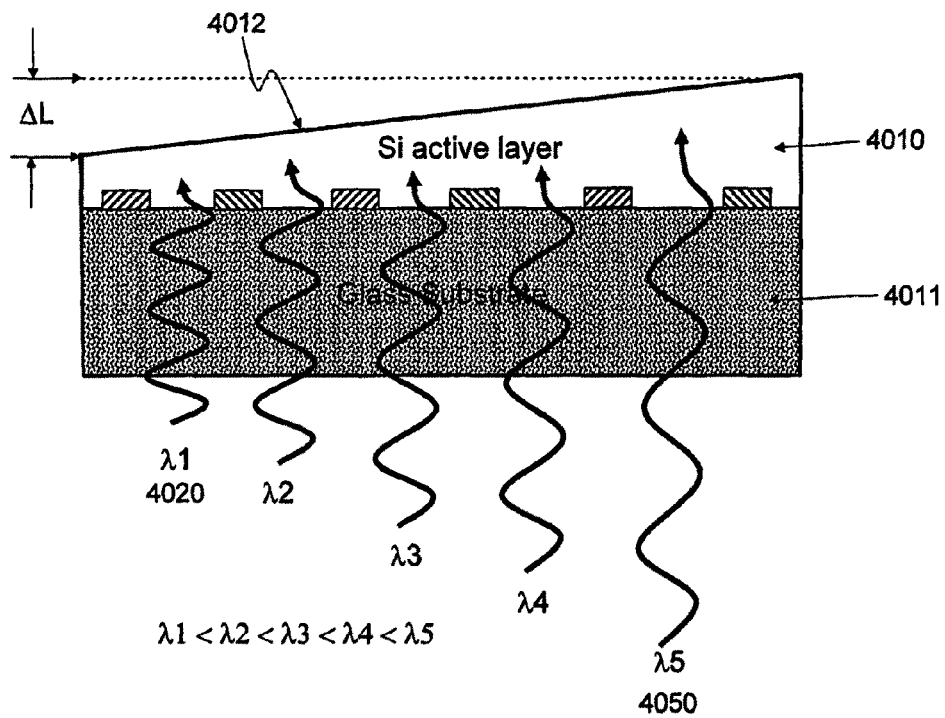
FIG. 41A shows a multi-wavelength selective solar energy conversion device using wedge shaped active layer thin film semiconductor-on-glass. For example, wedge thin film formed by CMP process.
Figure 41B:
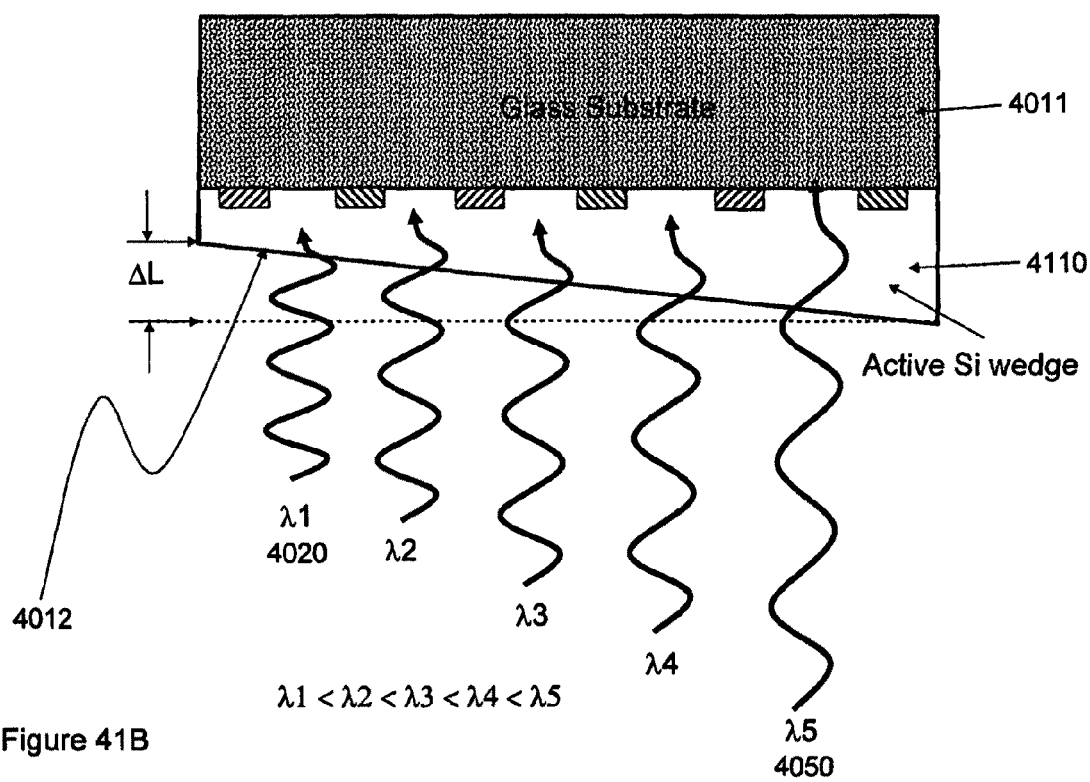
FIG. 41B shows an alternative CMP multi-wavelength selective solar energy conversion device.

FIGS. 40 and 41A and B show solar cell device based on spatially variable thin film CZ Si active layer 4010 transferred on to an alternative substrate 4011. The wavelength selectivity can be advantageously used to couple different wavelengths spatially into the Si active layer. The wedge 4012 can be fabricated by simple CMP polish. Wavelengths range from UV, 4020, to infrared, 4050 are shown absorbed in various regions of the cell.

Figure 42:
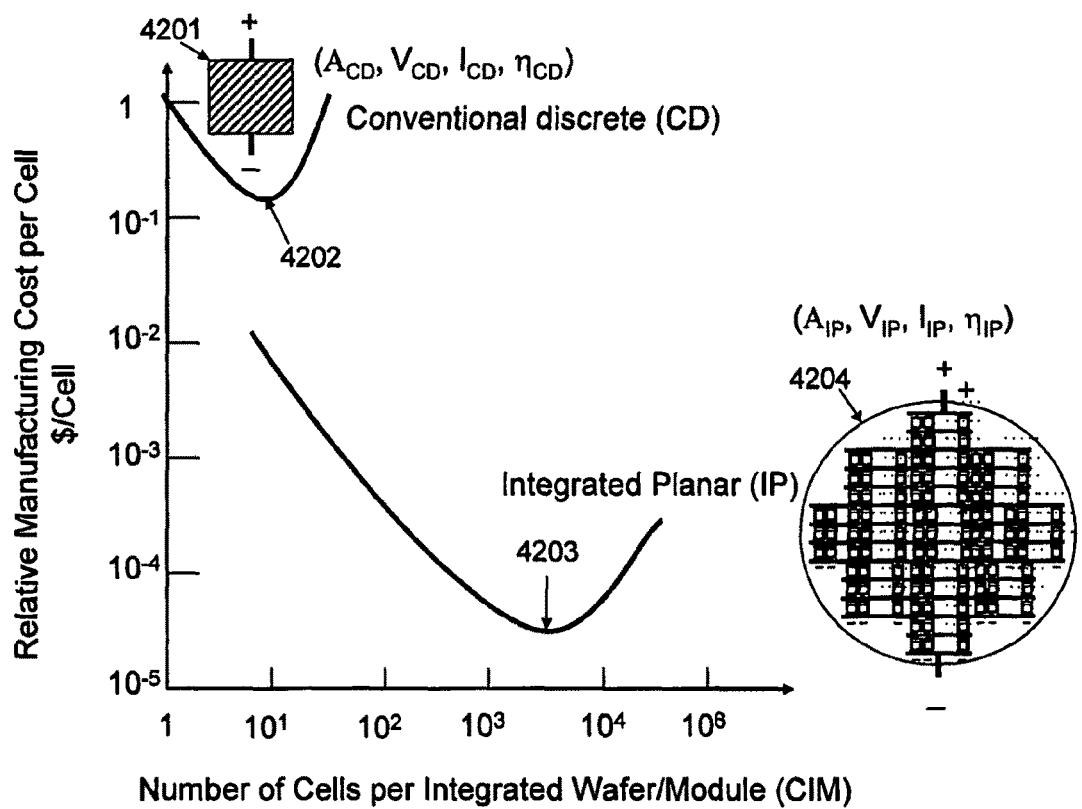
FIG. 42 shows manufacturing cost per solar cell versus number of cells per module.

FIG. 42 schematically shows the comparison of the cost of manufacture of a unit solar cell versus the number of solar cells per module. The discrete manufacturing case is shown as conventional discrete and represents prior art approaches to solar cell and module production. As was demonstrated with the discrete transistor manufacture, a minimum cost curve was found. The integrated planar transistor such as CMOS FETs introduced a new manufacturing paradigm, wherein the minimum cost per transistor was many orders of magnitude lower that the discrete manufacturing process. The planar integrated device allowed more transistors to be densely packed into a finite area with large improvement in complexity and or function and reduced system cost. The present case compares the analogous case for solar cells and solar modules. The instant invention allows the cost per unit solar cell to be dramatically reduced and the number of integrated cells per module to be dramatically increased. The present invention claims that higher efficiency solar modules based on wafer scale manufacturing method as disclosed herein is superior for lowering cost. Further more, the voltage and current of the wafer scale module can be optimized for increased flexibility and function. Yet further, the present invention teaches the optimization of solar cell device efficiency via the use of small scales. Smaller devices require lower lifetime semiconductors to be used and idealized photocurrent conversion structures. Multiplication in number of optimal small solar cells can be used to scale the total electrical output of the module.

Figure 43:
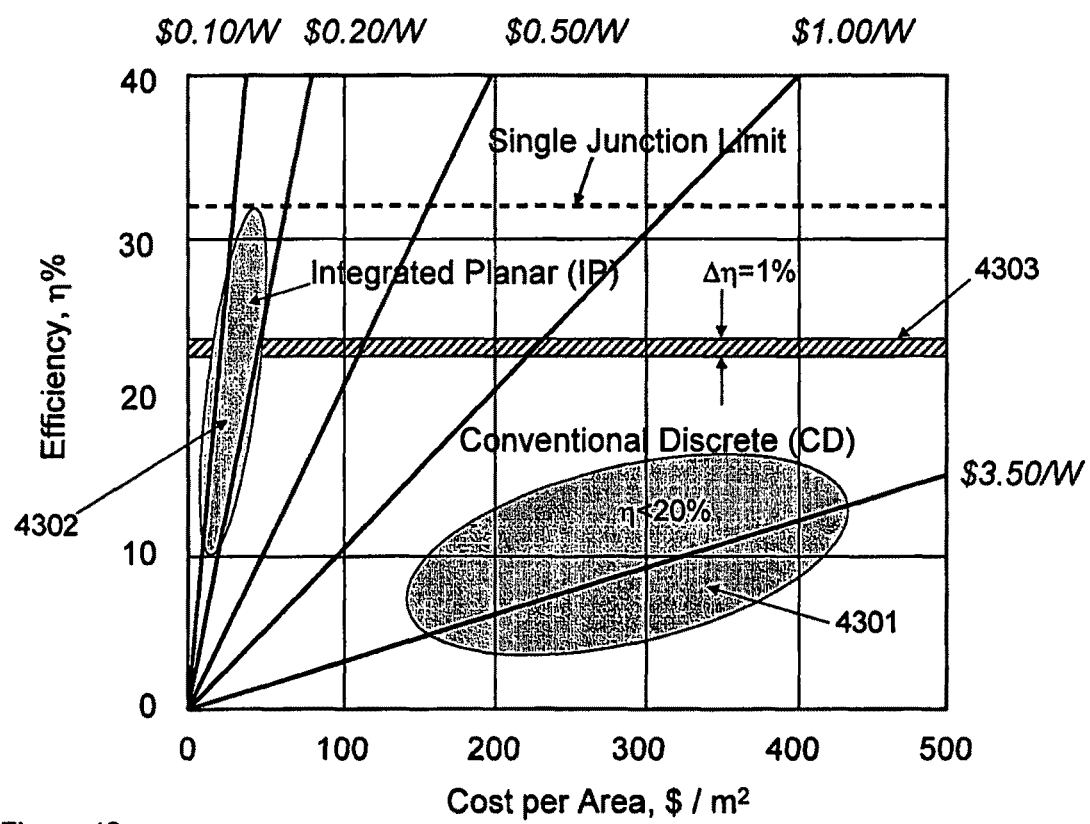
FIG. 43 shows solar efficiency versus cost per area and device type.

FIG. 43 shows the efficiency of single junction (SJ) solar cells versus cost per area. The cost per watt lines area superimposed on the graph. The upper theoretical limit of SJ cells is ~30-32%. Conventional discrete (CD) prior art approaches are represented as the region 4301, typically exhibiting energy conversion efficiencies less than $\eta<20\%$. It is claimed, the devices of the present invention can increase efficiency of SJ from $\eta<20\%$ toward and up to the theoretical maximum by the optimal use of IP manufacturing technique. Note, a 1% increase in efficiency for prior art techniques with high cost per area and low efficiency is prohibitive for innovation. For example, a $\Delta\eta=1\%$ increase for CD technologies cost approximately \$25-50/m². Compared to the present invention using IP method, the $\Delta\eta=1\%$ increase will cost substantially less than <\$1/m². Furthermore, the flexibility in adapting electronic cell designs using implant and lithographic processing method as disclosed, is highly accommodating to innovation.

Unit Cell Configurations

Example embodiments of electrical devices in FIGS. 44 to 51 inclusive, are used for implementing the active layer structures optimized for converting solar radiation into electrical energy. FIGS. 44 to 51 inclusive, are example implementations of the present invention. One knowledgeable in the field understands other configurations are possible and are also herein disclosed.

Figure 44:
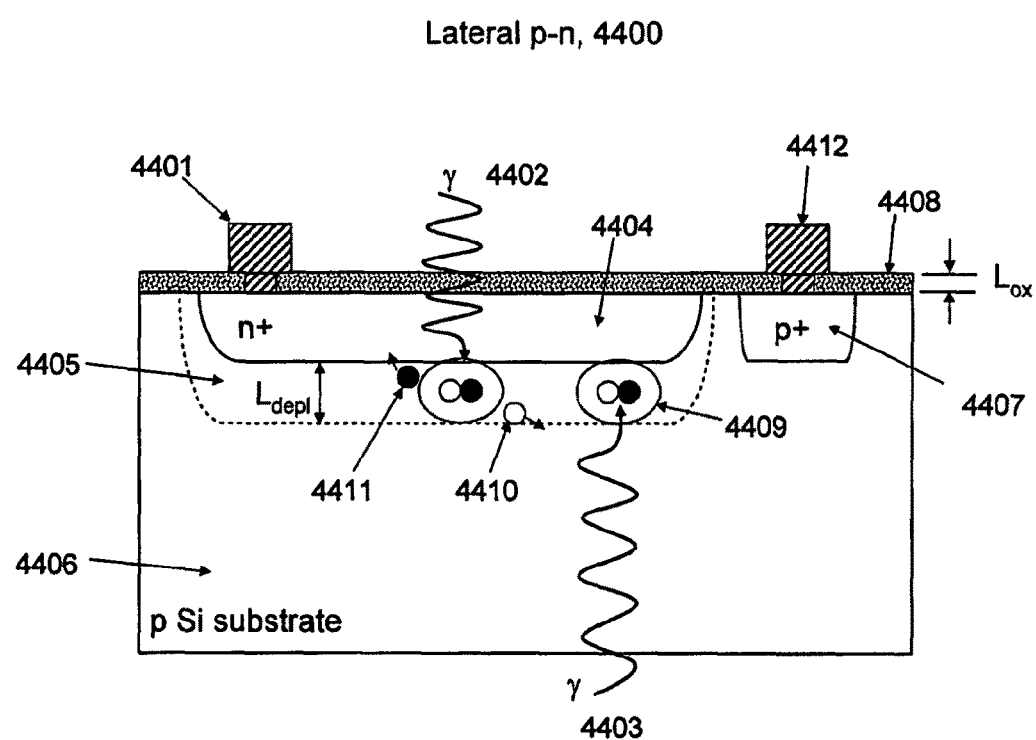
FIG. 44 schematically shows an alternative radiation conversion type device, a lateral p-n diode.

FIG. 44 shows how the active thin film CZ Si layer can be configured to operate as a lateral p-n junction diode 4400. The figure represents a unit cell that can be replicated on wafer into a module. Electrodes 4401 and 4412 contact the implanted regions 4404 and 4407. The depletion layer 4405 formed allows photogenerated e-h pairs 4409 to be separated into electron 4411 and holes 4410 by the built in electric field and be extracted into the n+ 4404 and p+ 4407 regions through the same surface. Optical radiation can couple into the active layer via the electrode side 4402 or through the alternative substrate (not shown) 4403. The CZ Si thin film is p-doped Si (p Si).

Figure 45:
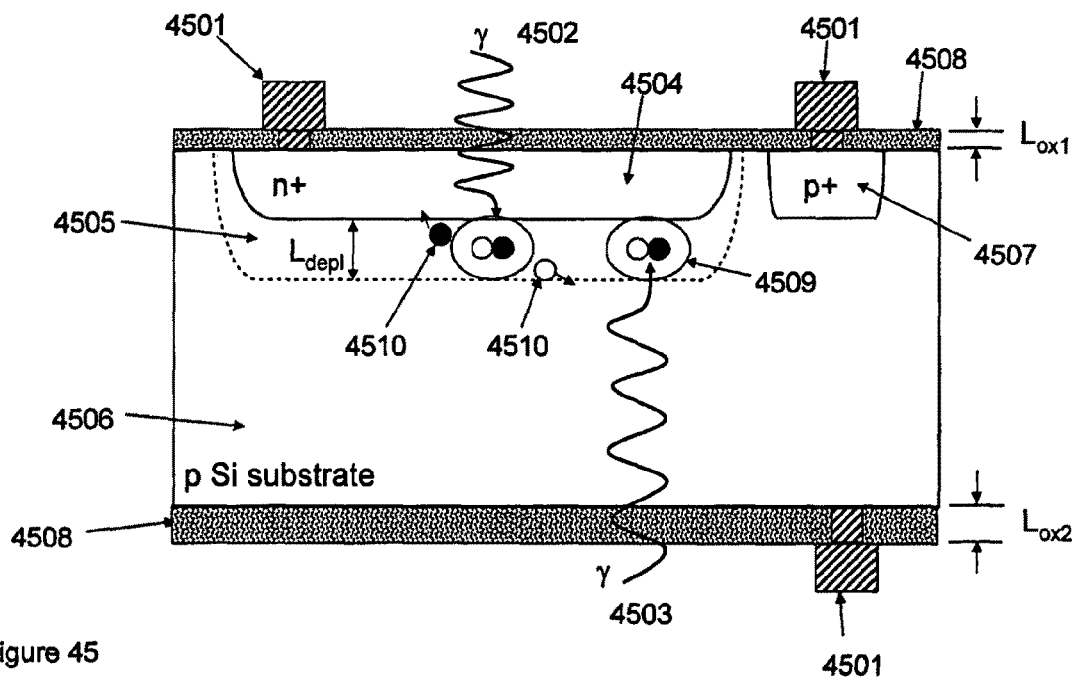
FIG. 45 schematically shows an alternative radiation conversion type device, a dual lateral-vertical p-n diode.
Figure 46:
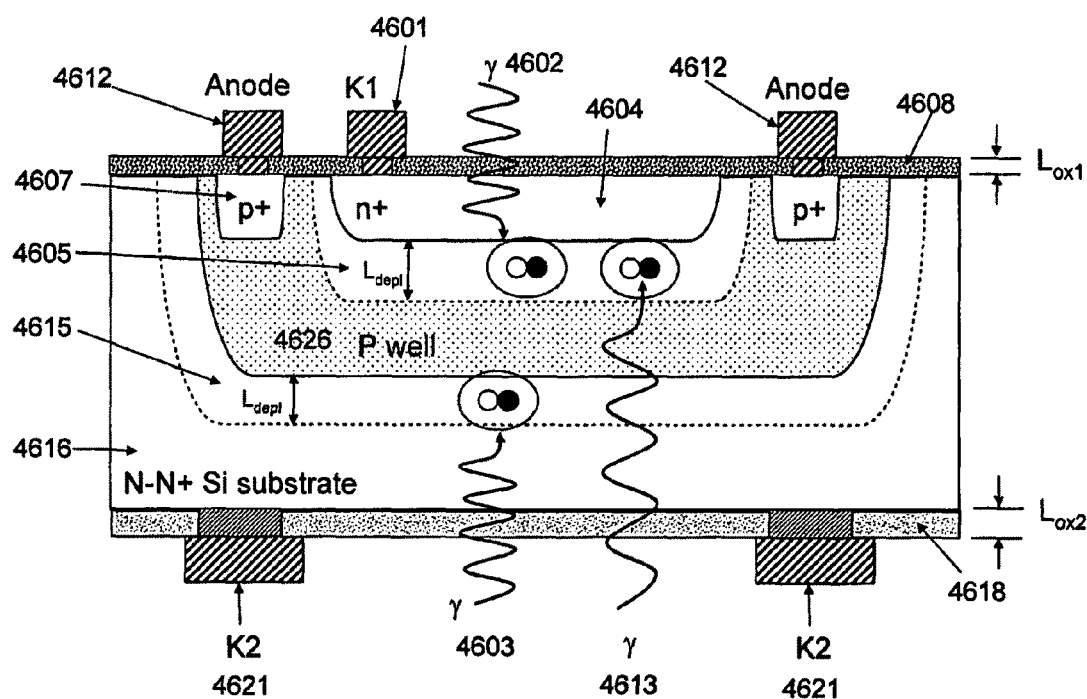
FIG. 46 schematically shows an alternative radiation conversion type device, a double p-n solar cell (n-p-n).

FIG. 45 shows the device 4500 constructed as disclosed in FIG. 44, but having an additional backside contact 4501. FIGS. 45 and 46 are numbered similarly with the addition of backside insulator 4508. FIG. 45 shows radiation 4502 and 4503 creating hole/electron pairs 4509 and 4510 in depletion region 4505; electrical contacts 4501 connect through oxide layer 4508 to backside p substrate 4506, n+ region 4504 and p+ region 4507.

FIG. 46 shows a double p-n junction or n-p-n device 4600. The device 4600 has two depletion layers 4605 and 4615 formed by the n-n+ substrate 4616 and p-well 4626, and also between the p well 4616 and the n+ region 4604. All n-type and p-type conductivity regions are altered from the initial n-n+ Si substrate constituting the thin film Si layer transferred onto an alternative substrate (not shown). Optical radiation may couple the device via 4602, topside, and or 4603, backside. Electrodes 4601, 4612 and 4621 are connected to the external circuit to extract the photocurrent. Optical coupling layers 4608 and 4618 are typically fabricated from $SiO_2$.

FIG. 47A shows how a multi-finger electrode 4706 arrangement can be used to increase photocarrier collection efficiency. The device 4700 utilizes p Si thin film layer 4701 transferred to alternative substrate. The implanted regions 4702, 4705, 4706 and 4710 alter the conductivity type of the thin film Si layer 4701 which is chosen for example as p-type Si. Optical radiation coupled in preference via 4703 through alternative substrate. A guard ring formed by grounding 4707 is used to prevent charge leakage between cells.

FIG. 47B shows device 4700 with additional backside electrode contact 4711 and, optionally, light coming in to the back or top surface.

Figure 48A:
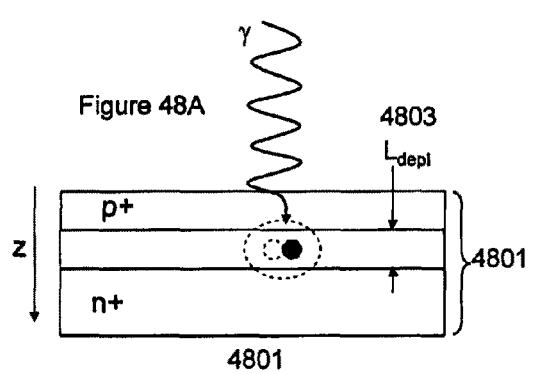
FIGS. 48 A and B schematically show alternative radiation conversion type devices composed of multilayers and or differing conductivity types.
Figure 48B:
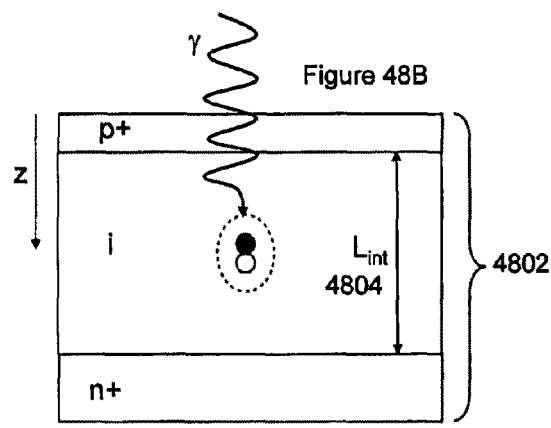
Figure 48C:
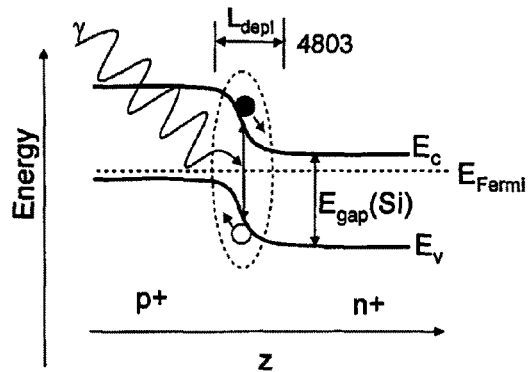
Figure 48D:
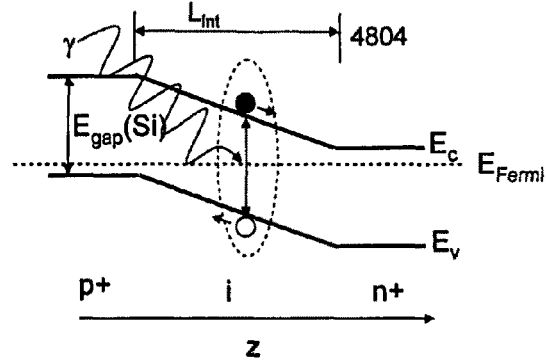

FIGS. 48A and B shows vertical p-n junction diode 4801 and p-i-n diode 4802 configurations for use in solar cell device. The vertical multilayers 4801 and 4802 are shown. The energy band structure versus physical distance z is also shown for the p-n and p-i-n diode configurations. The conduction and valence band edges, FIGS. 48C and D, represent the fundamental band gap of single crystal Si. Incident photon is absorbed in the depletion region 4803 and or intrinsic region 4804 thereby creating an e-h pair.

Figure 49:
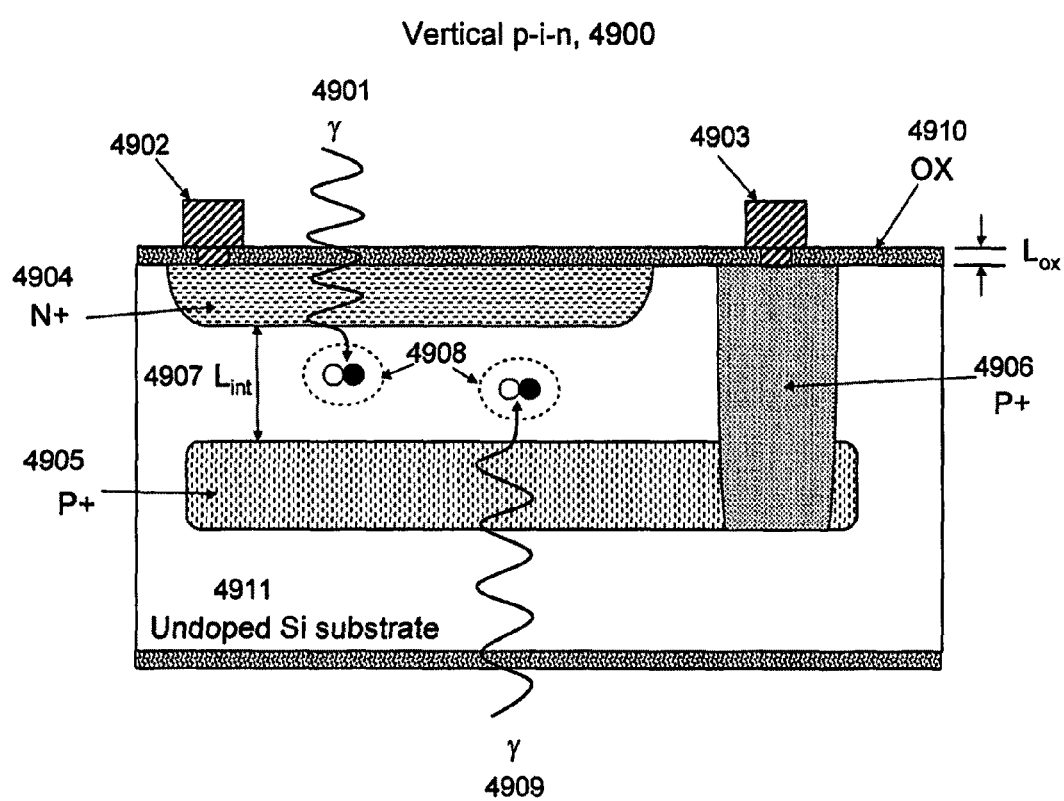
FIG. 49 schematically shows an alternative radiation conversion type device, a vertical p-i-n, using implantation induced conductivity regions.
Figure 50:
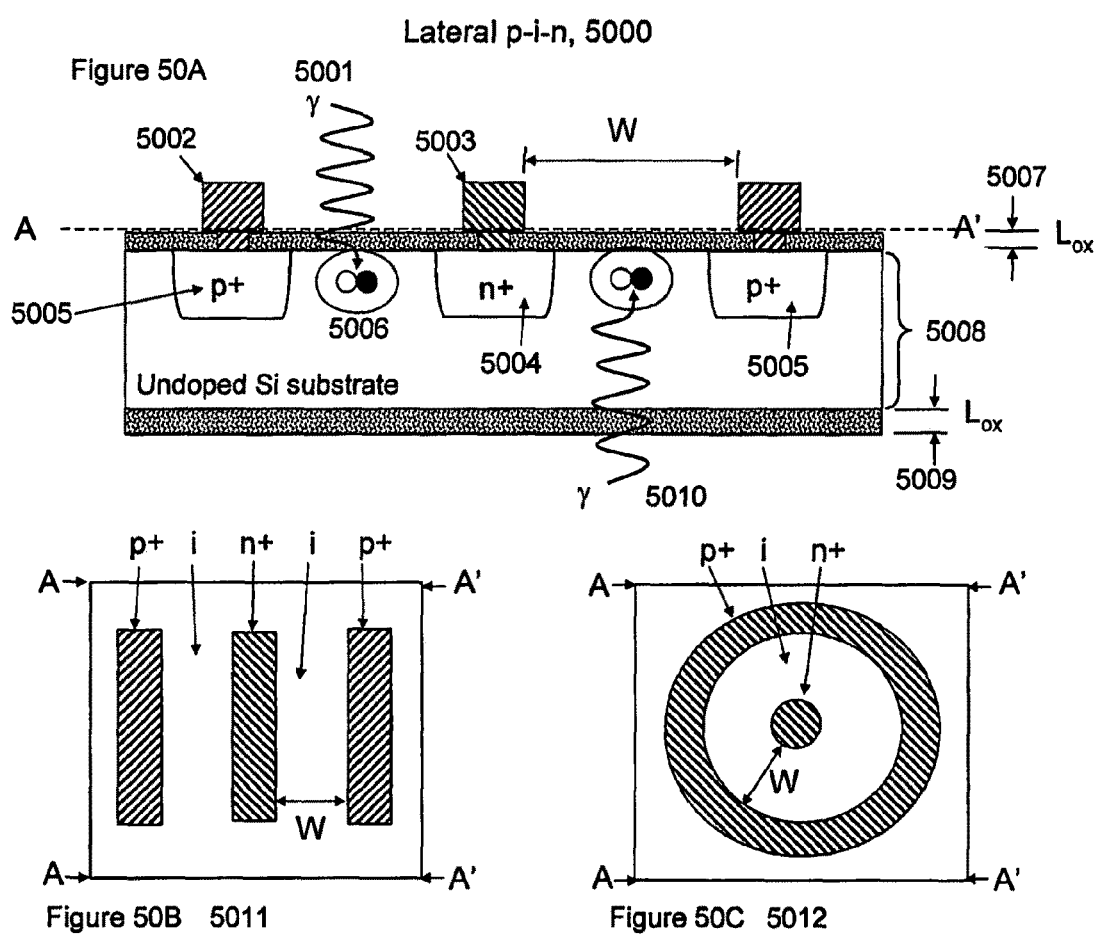
FIG. 50A schematically shows an alternative radiation conversion type device, a lateral p-i-n.
FIGS. 50B and C show alternative electrode patterns.

FIG. 49 shows implementation of vertical pin device 4900 using selective area and depth implantation of impurities in regions 4904, 4906 and 4905, in order to alter the conductivity type of the region. The thin film Si layer 4911 has not intentional doping and or intrinsic. Optical radiation 4901 and or 4909 couple into 4907 and is absorbed, thereby creating e-h pairs 4908.

FIG. 50A shows a lateral p-i-n device 5000 formed via selective area implantation of regions 5005, 5004 into thin film Si active layer 5008. The optical radiation 5001 and or 5010 is absorbed in the active layer and more preferentially into intrinsic region 5006. The electrodes 5002, 5003 and implant regions beneath may be arranged in the configuration 5011 of FIG. 50B and or 5012 of FIG. 50C.

Figure 51:
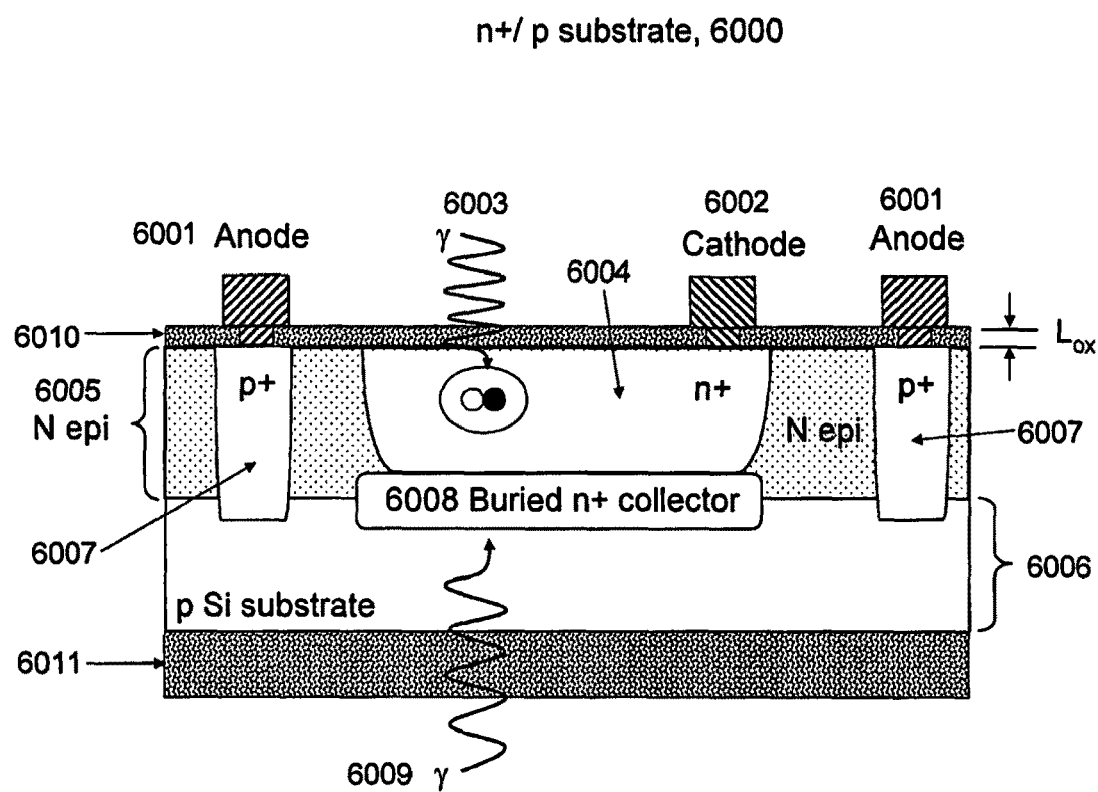
FIG. 51 schematically shows an alternative radiation conversion type device, a n+/p substrate and buried collector.

FIG. 51 shows n+/p diode 6000 used for solar cell element. The thin film layer transferred to an alternative substrate is a p-type Si 6006 followed by n-type epitaxial layer 6005 deposition. The layers 6006 ad 6005 may alternative be transferred from a substrate onto the alternative substrate. The selective area and depth implant regions 6007, 6008, 6004 are performed after the thin film Si layer transfer onto the alternative substrate 6011.

Figure 52:
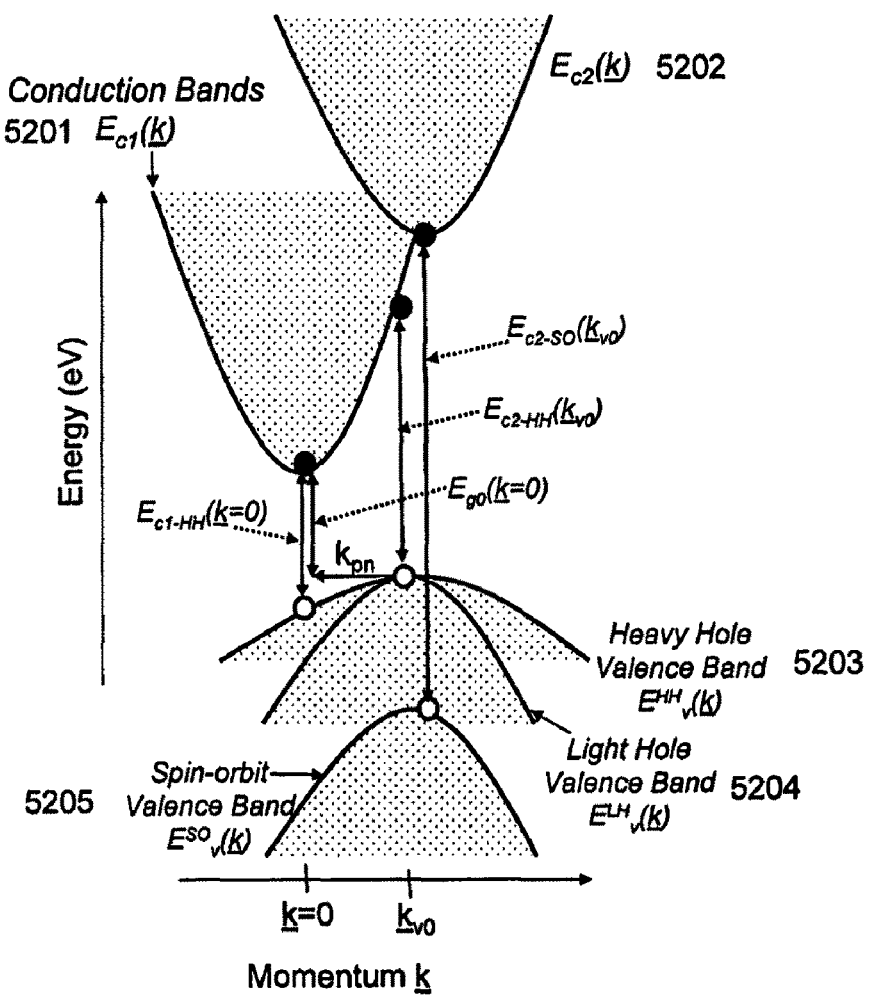
FIG. 52 schematically shows energy-momentum band structure for an indirect semiconductor and possible photo-generated electron and hole pairs.

FIG. 52 depicts schematic of conduction and valence band energy versus crystal momentum of indirect band gap energy semiconductor such as Silicon. The possible optical absorption transistions are shown relative to the conduction and valence bands. Band edge resonant absorption $E_{c1-HH}(k=0)$ requires the additional participation of a phonon of momentum $k_{pn}$. High energy photons may directly create electron-hole pairs with large excess energy with respect to the fundamental band edges. This fact is used advantageously for UV enhanced avalanche multiplication process described herein.

Figure 53:
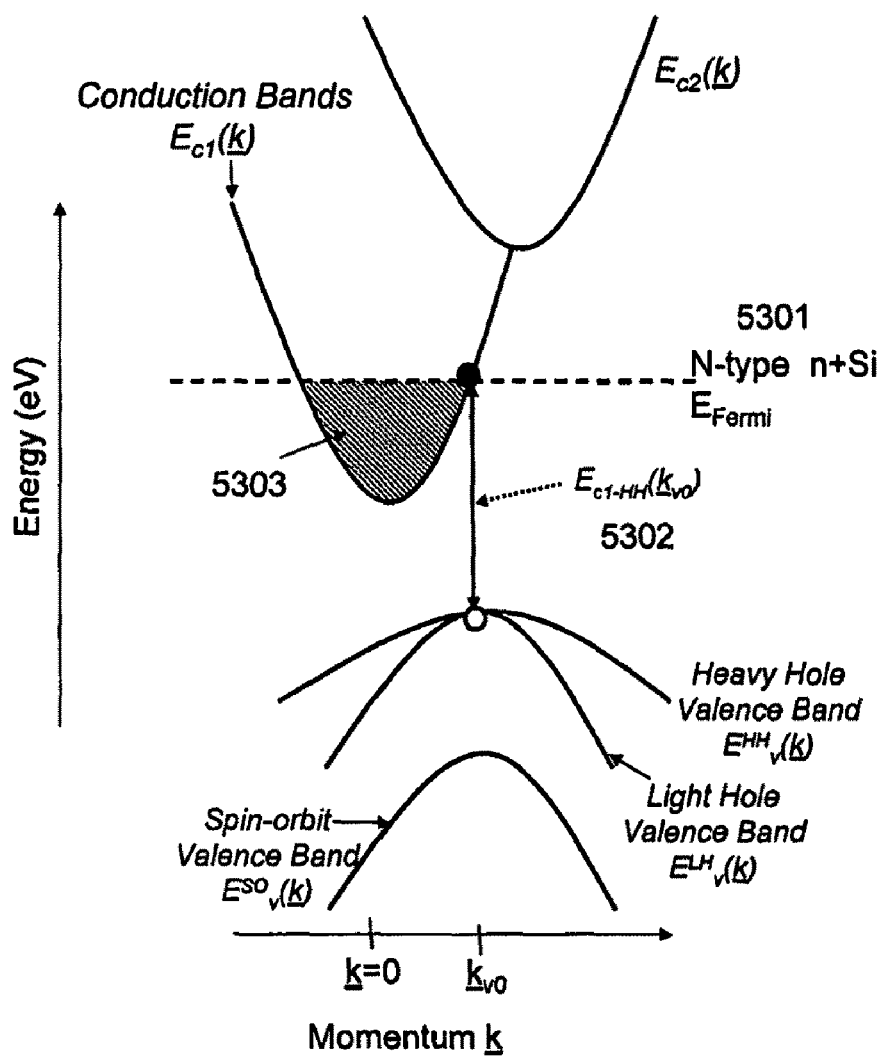
FIG. 53 schematically shows an alternative energy-momentum band structure for a degenerate n-type indirect semiconductor radiation conversion device.

FIG. 53 depicts schematic of conduction and valence band energy versus crystal momentum of indirect band gap energy semiconductor, such as Silicon, doped with impurity atoms to exhibit degenerate n-type conductivity. The Fermi level 5301 shows that the conduction band is filled 5303, causing optical absorption to begin for energies exceeding 5302.

Figure 54:
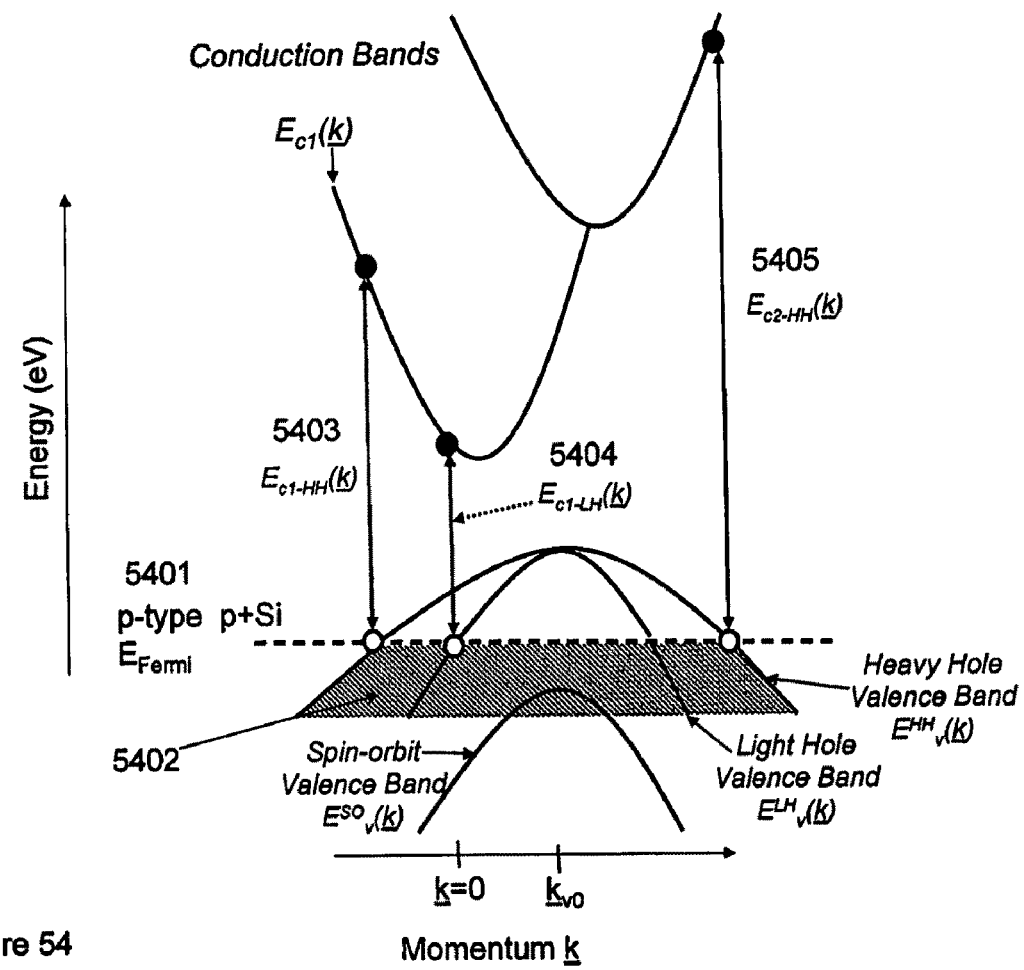
FIG. 54 schematically shows an alternative energy-momentum band structure for a degenerate p-type indirect semiconductor radiation conversion device.

FIG. 54 depicts schematic of conduction and valence band energy versus crystal momentum of indirect band gap energy semiconductor such as Silicon, doped with impurity atoms to exhibit degenerate p-type conductivity. The Fermi level 5401 shows that the valence bands are filled 5402, causing optical absorption to begin for energies exceeding 5403, 5404 and 5405. Therefore, the onset of the absorption edge is shifted to higher energy and results in a sharper transition from transparent to opaque property.

Figure 55:
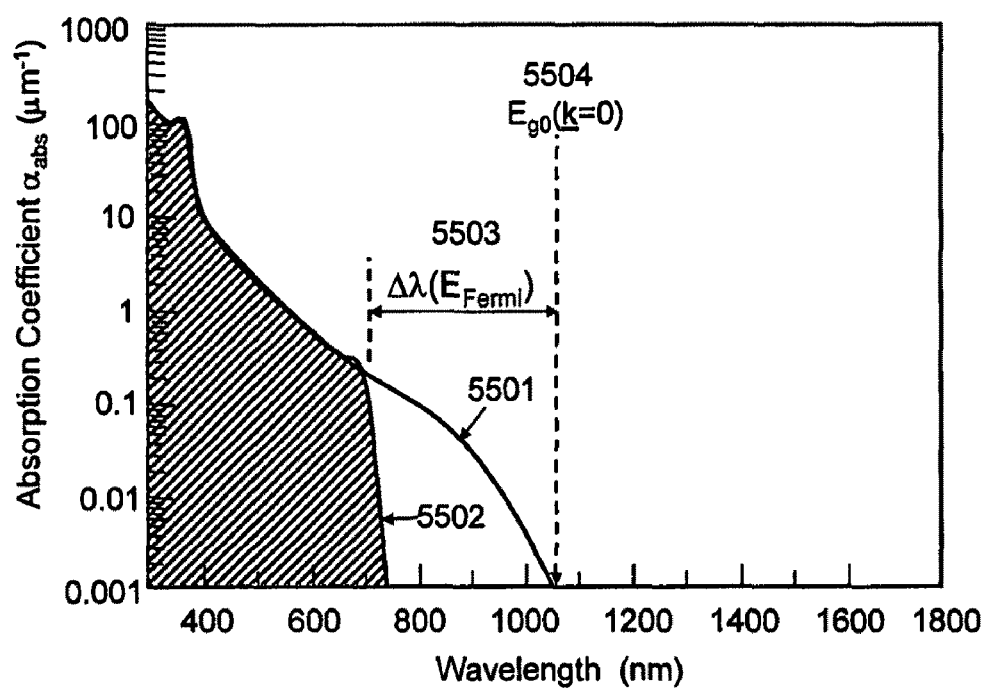
FIG. 55 schematically compares adsorption coefficient versus wavelength for undoped and degenerately doped indirect semiconductor radiation conversion device.

FIG. 55 shows how the optical absorption spectrum of single crystal Si is altered from intrinsic 5501 conductivity type to degenerately p-doped 5502. The blue shift in the absorption edge 5503 is also shown, due to phase space filling.

Figure 56:
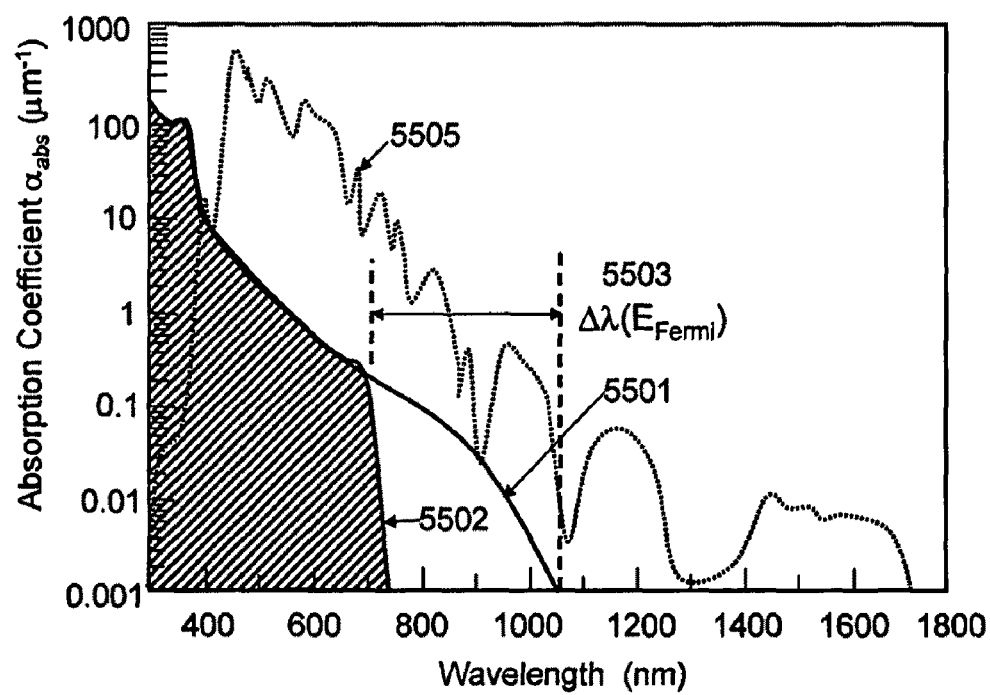
FIG. 56 schematically compares adsorption coefficient and solar spectrum versus wavelength for undoped and degenerately doped indirect semiconductor radiation conversion device.

FIG. 56 shows how the blue shift described in FIG. 56 compares to the solar spectrum at ground level. The impurity doping of Si can be used advantageously for tuning the absorption edge to shorter wavelengths.

Figure 57:
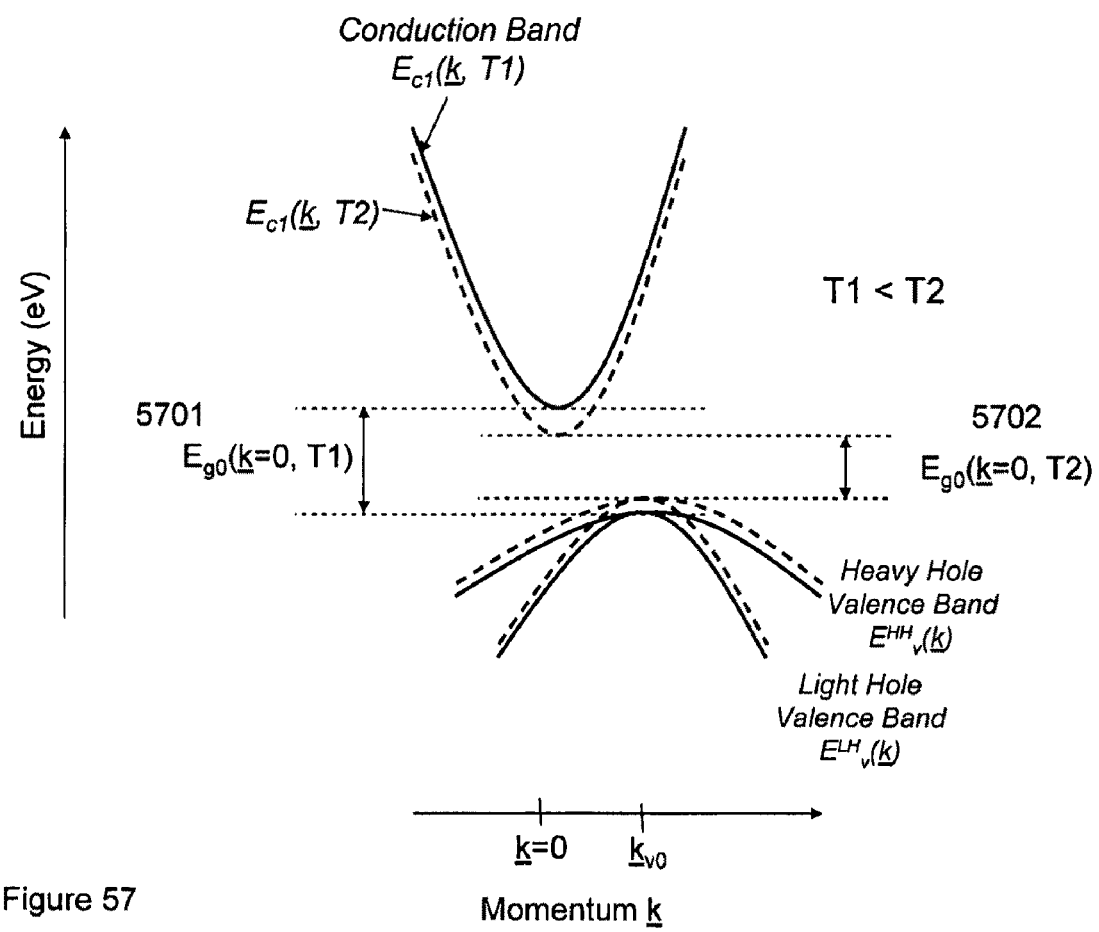
FIG. 57 schematically shows energy-momentum band structure for an indirect semiconductor under the influence of increasing temperature.

FIG. 57 shows how the effect of increased temperature on an indirect band gap material. As temperature increases, from T1 to T2, the band gap 5701 narrows to 5702. The fundamental band gap of single crystal Si is therefore temperature dependent.

Figure 58:
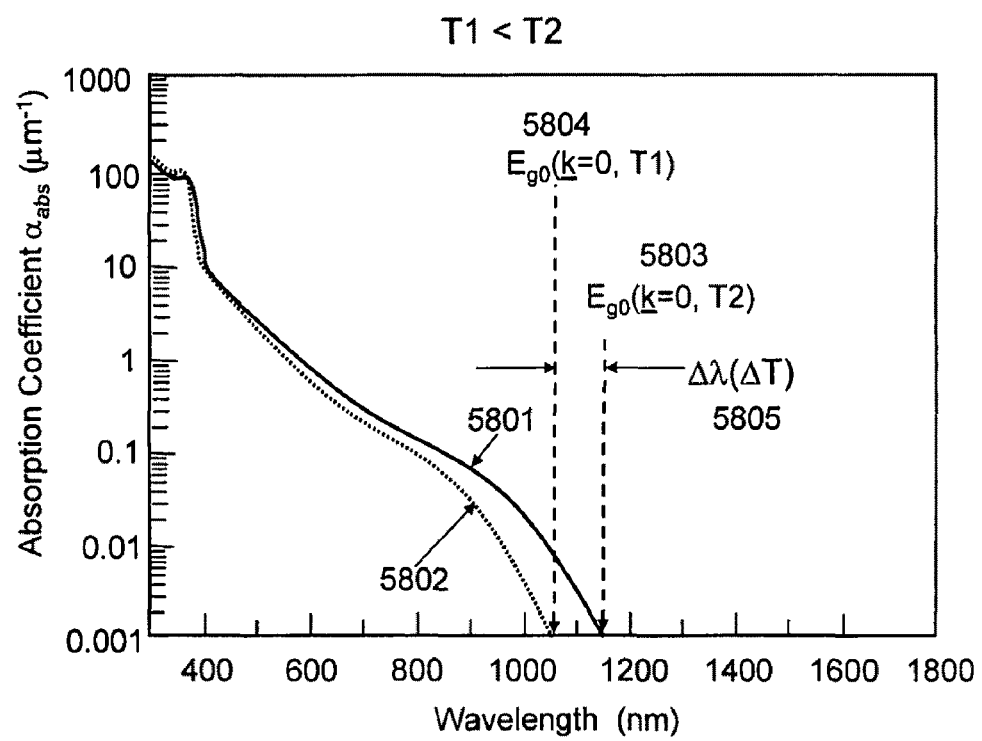
FIG. 58 schematically shows adsorption coefficient versus wavelength for an indirect semiconductor under the influence of increasing temperature.

FIG. 58 shows how the optical absorption spectrum of single crystal Si is changed by the increase in temperature. The absorption edge shifts to longer wavelengths with increasing temperature.

Smart Link Integrated Wafer Scale Reconfigurable Modules

Optoelectronic energy conversion devices fabricated using planar wafer scale processing methods are disclosed. The same method can also be used to fabricate monolithically integrated electronic functions capable of performing digital and or analog functions intimately integrated on the wafer scale sole module. For example, electronic diodes and transistors such as planar p-n junction diodes and planar bipolar n-p-n and or n-p-n transistors can be fabricated using the same mask steps as used for fabrication of solar cell units. The electronic functions can powered from the voltage and or current generated on wafer and are therefore self provisioning. Electronic functions that can be implemented on a planar integrated solar wafer module are power monitoring and smart switches that can be externally programmed to configure unit solar cells to perform voltage source and or current source operation. For example, solar cell unit arrays fabricated by replicating basic energy conversion units may be placed in an array, with smart switches controlling functional blocks on a wafer. That is, analogous functions of programmable array logic can be used for implementation of a programmable power module based on internal configuration of voltage and or current of the wafer module.

Figure 60:
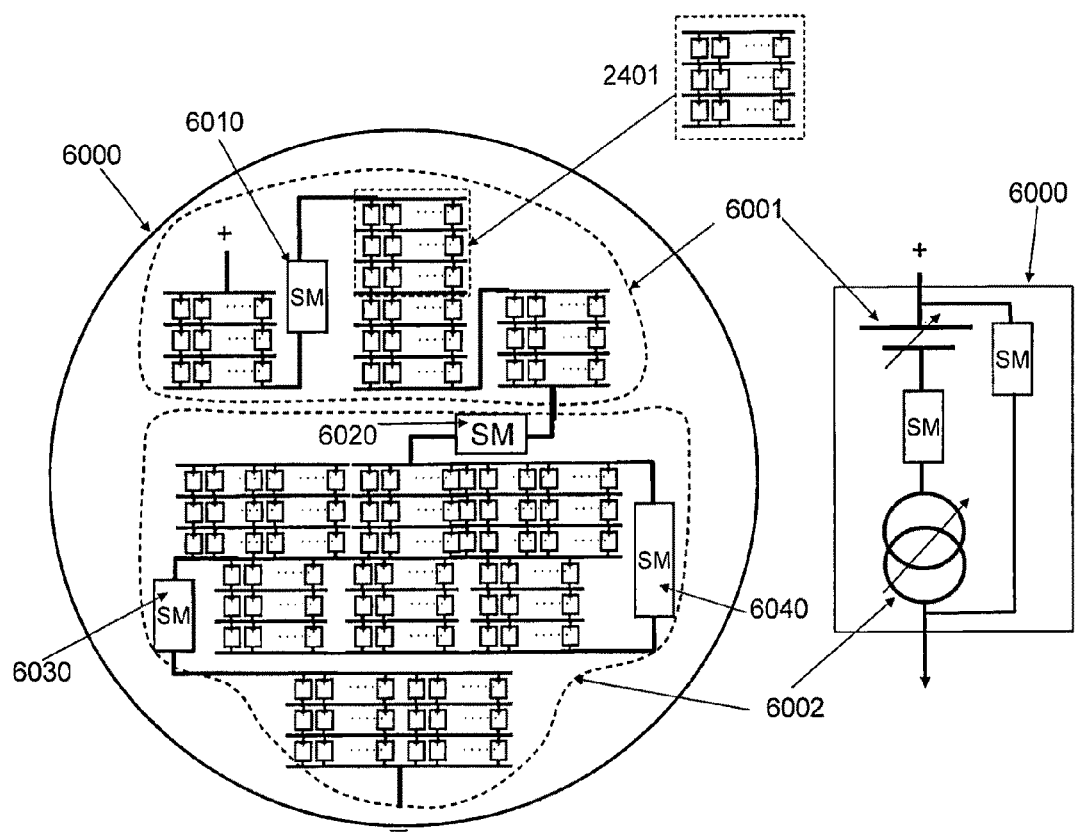
FIG. 60 shows an optional layout scheme for a photovoltaic module wafer, utilizing reconfigurable interconnections.

FIG. 60 shows wafer scale solar module 6000 with smart links and or smart switches 6010, 6020, 6030 and 6040 that are programmable so as to form a programmable voltage source 6001 or current source 6002.

Figure 61:
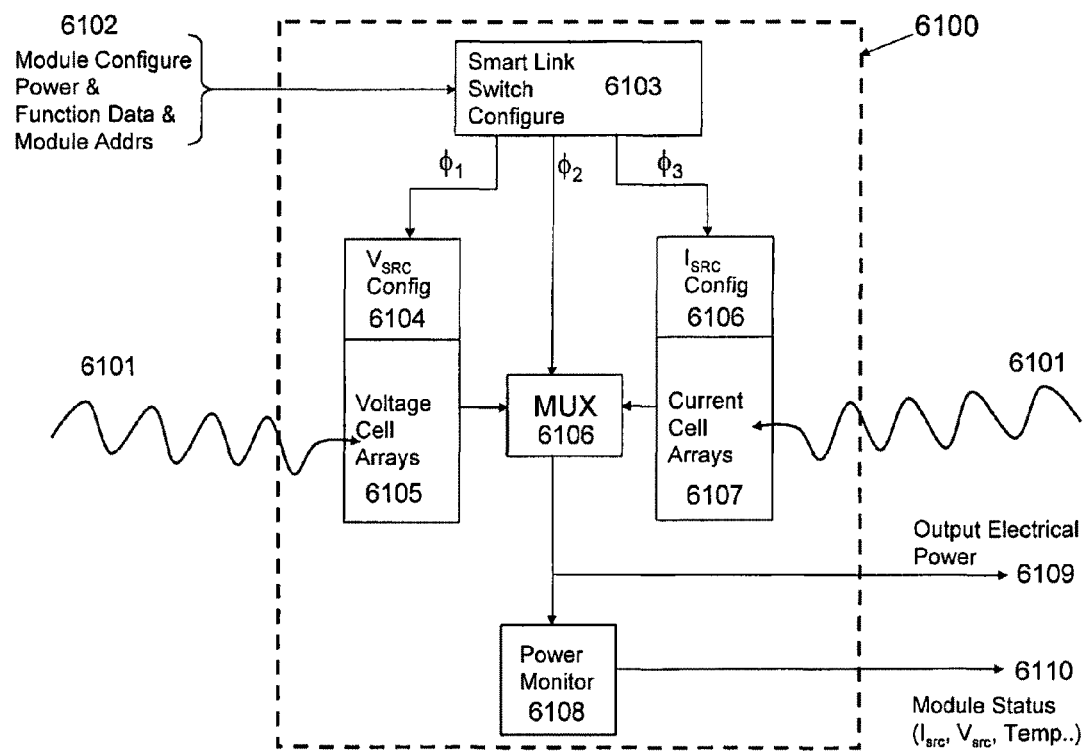
FIG. 61 shows a system level layout scheme for a photovoltaic module wafer.

FIG. 61 develops the programmable module concept further with external control input(s) 6102 used to configure the smart links of wafer scale solar module 6100. The input solar energy 6101 is incident on both voltage source array $V_{src}$ 6105 and current source array $I_{src}$ 6107 sections. The smart links are controlled by configuration section 6103 and 6104, 6106. Output power multiplexer MUX 6106 outputs to module power 6109. Optional power monitoring of the wafer scale solar module 6108 can be used to provide health and or status and or temperature 6110 of the module. The temperature and output power can be used to dynamically optimize the module performance for varying external solar radiation fluence. On board power regulation can also be employed using power regulation electronics also monolithically integrated on the wafer scale solar module.

In summary, the present invention teaches the use of electronic circuitry monolithically integrated in the same wafer scale solar module so as to perform logic and or analog functions. The added electronic functions aid in the performance optimization of the module and make the module reconfigurable for many diverse applications. The additional cost of the electronic functions is negligible as the performance of the transistors need only be simple. For example, high speed performance is not necessary and need only be equivalent to LSI bipolar transistor technology of the 1970-80's.

Figure 62:
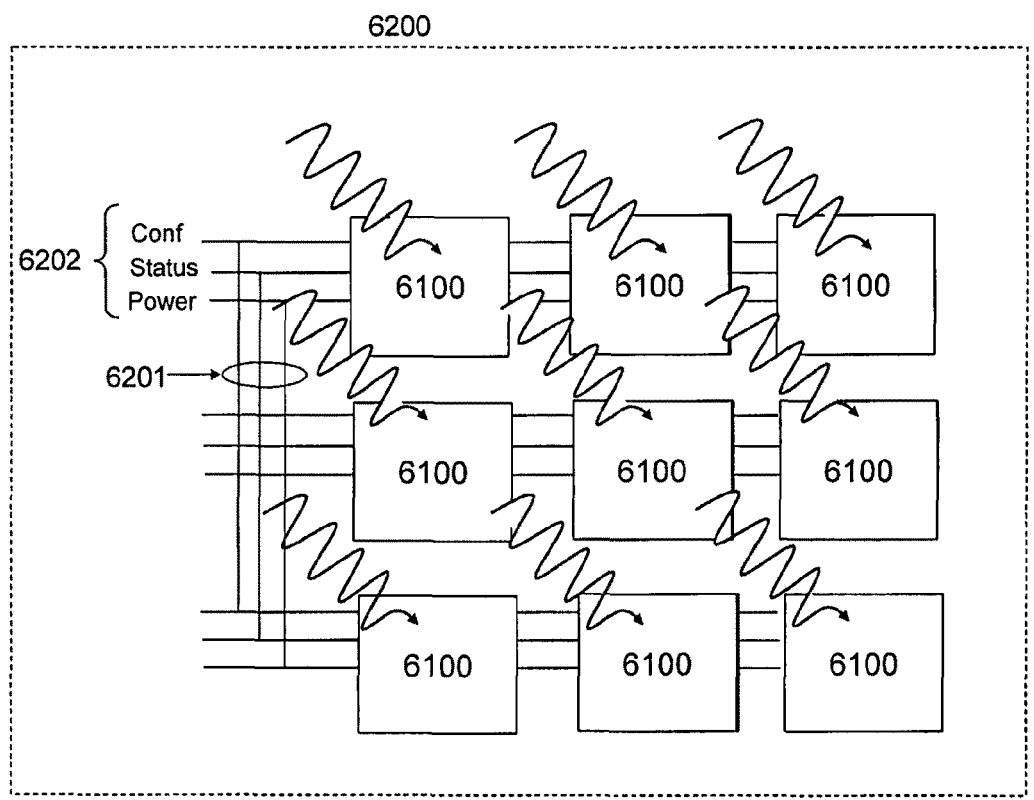
FIG. 62 shows multiple modules wired together utilizing interfacing function.

FIG. 62 discloses the utility of using reconfigurable wafer scale solar modules 6100 in complex systems 6200. For example, a simple array composed of multiple wafer scale solar modules can be interconnected 6201 as shown. Depending on the application and size of the array optimal module configurations 6202 can be employed.

Solar Module Charge Pumping Concept

Typically, solar module functions are designed for steady state operation producing substantially constant direct current and/or power output, for a given constant solar fluence. An alternative method is the concept of charge pumping energy storage units on the wafer by use of capacitor and switch technique. For example, a solar cell unit can be electrically isolated from an external circuit and photogenerated carriers allowed to build up in an essentially capacitive device during timed exposure to solar radiation.

Once a predetermined time and or charge threshold is reached, an electrical switch connects a charge pump to an external circuit and the stored charge transfers to the external circuit. Conceptually, large arrays of solar cell charge storage cells may be interconnected and discharged into an electrical circuit using electrically controlled switches. The electronic functions can be implemented via monolithic means as described in the present invention. Capacitive storage cells can be fabricated using, for example, $SiO_2$, silicon oxynitride, Si nanocrystals, $SiN_x$ and/or high dielectric materials to form suitable capacitive capability.

Figure 63:
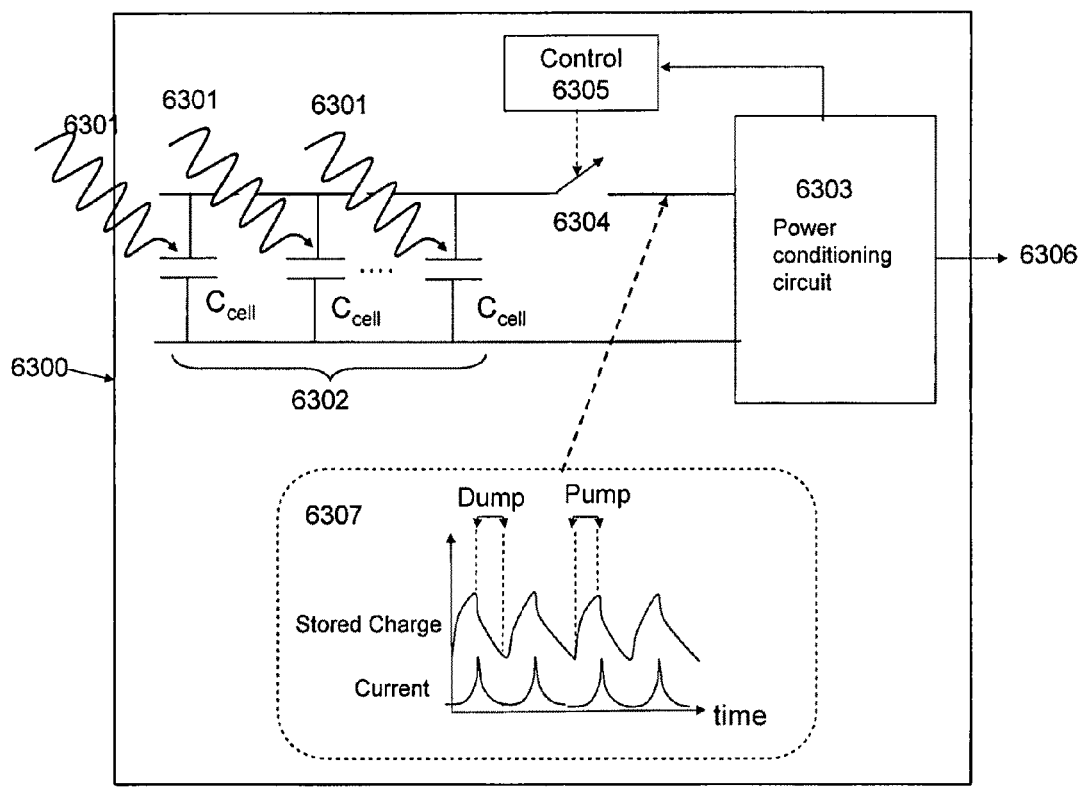
FIG. 63 shows alternative configuration of scheme for energy conversion device based on charge-pump concept.

FIG. 63 discloses charge pump solar module 6300. A charge pump and discharge unit can be replicated across an entire wafer and thus produce wafer scale functionality as described in the present invention. The schematic function of the device consists of charge storage unit cells 6302 which convert optical photons into electronic photocarriers which are stored in an array of $C_{cell}$. Electrical switch 6304 is controlled by electronic circuit 6305 that determines charge time and discharge time of storage cells. A power conditioning unit 6303 processes the time varying current pulses suitable for external power output 6306. Time varying current pulses and stored charge are shown as 6307. Pump and dump cycles are determined by a switch position, open-state and closed-state, respectively. The utility of such a system is that the peak electrical power is large and can be used advantageously in internal and or external power condition circuits for high efficiency conversion into alternating current. External loads may also use advantageously high peak power output from the said module.

Solar Cell with Photocarrier Amplification: Avalanche Multiplication Device

The fundamental limit of prior art single junction, SJ, solar cell designs is at best where one photon, γ, is converted into an electron-hole (e-h) pair and subsequently extracted into useful photocurrent $I_{ph}$ at external electrical contacts. That is, for an ideal case of N photons, $N_\gamma$, convert into N electrons and N holes or $N_\gamma \rightarrow N_{e-h} = N_e + N_h$ and subsequently the photocurrent $I_{ph} \propto N_\gamma = N_e + N_h$. With optimal optical coupling of a solar spectrum into the SJ, this process has a maximum solar energy conversion efficiency $\eta_{SJ} = 25\text{-}32\%$. The present invention teaches a new mechanism for increasing SJ conversion efficiency beyond this limit.

It is possible using the devices and methods disclosed herein to construct a solar energy conversion device that creates one electron-hole pair for an absorbed photon of energy E, and the said photocreated charge carriers to be then internally amplified in number so that the number of electrons and or holes are multiplied by amplification factor $M_e$ for electrons and amplification factor $M_h$ for holes, respectively. That is, $N_\gamma \rightarrow M_e*N_e+M_h*N_h$ and thus $I_{ph} \propto M_e*N_e+M_h*N_h$.

Prior art approaches for SJ solar cell devices are typically unbiased and thus rely on photogenerated carrier transport using simple diffusion and or drift under the influence of small built-in depletion field. The present invention teaches the use of wafer scale planar processing techniques suitable for the construct of dedicated portion of the said wafer module for purpose of generating voltage sources powered by the incident solar radiation. To this end, new solar energy conversion devices can be made to generate large electric fields inside optical to electronic conversion devices.

Avalanche Multiplication in Silicon

The internal electronic gain provided by an avalanche multiplication (AM) process enables optical energy conversion systems to generate larger photocurrents for the same optical fluence. An example implementation of the present invention teaches the use of p-i-n homojunction in silicon for AM process, consisting of p-doped and n-doped regions separated by an optically active intrinsic region under constant electric field throughout the depletion region. Other solar cell structures incorporating AM are: (i) heterojunction bipolar phototransistors (HBPTs); (ii) majority carrier devices; (iii) and photoconductors. Of these devices, the p-i-n is reverse biased and therefore can generate large electric field strengths in the absence of large dark currents. On the other hand, HBPTs and photoconductive devices can have gains equal to or higher than p-i-n devices, although the former devices must draw large dark currents. For the present invention, only direct current operation is required, as the time scale of solar fluence is essentially constant. Since these dark currents are a source of energy loss to an external circuit, the greatest success at improving solar cell photocurrent over those achieved with p/n junction detectors will be obtained using p-i-n structures.

Figure 105:
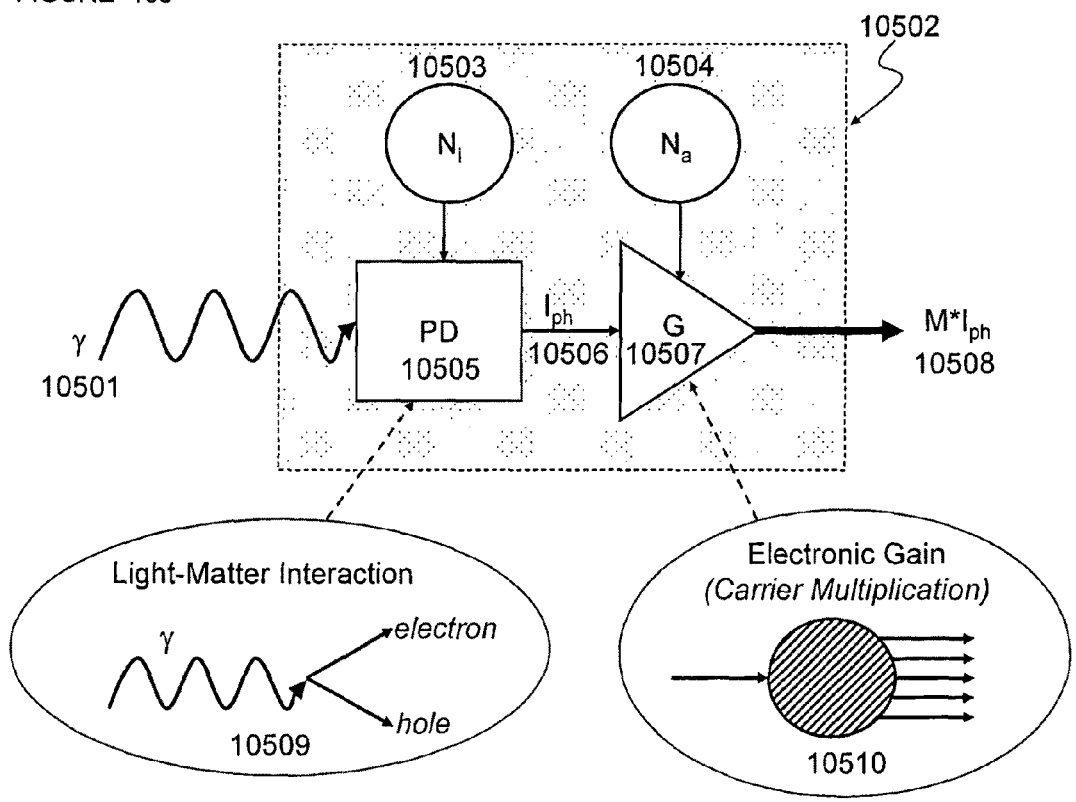
FIG. 105 shows a schematic diagram of an avalanche multiplication (AM) solar cells incorporated within a wafer scale module.

FIG. 105 shows a schematic diagram of an avalanche multiplication (AM) solar cells incorporated within a wafer scale module. The AM cells are represented as a separate electro-optics conversion (PD) block 10505 and an internal electronic gain block (G) 10507. An alternative implementation of the AM cell incorporates PD and G functions in the same unit cell, such as disclosed in FIGS. 77. A photon is converted into and electron and hole as shown in 10509 and constitutes the photocurrent $I_{ph}$. The gain section comprises amplifying the input photocurrent via carrier multiplication process shown in 10510. The noise sources due to absorption and amplification, Ni 10503 and Na 10504, respectively, are superimposed on the intrinsic $I_{ph}$ 10506 and amplified photocurrents $M*I_{ph}$ 10508. Typically, multiplication noise, Na, is a disadvantage and limitation in high sensitivity optical signal detection devices and places a limit on the upper useful multiplication ratio. In the present invention large noise sources do not limit the utility of large multiplication, and thus Na, in solar energy conversion schema. In fact, the equivalent noise power can be used advantageously for contributing to the total generated direct current. The conversion of incident photons into charge carriers occurs efficiently in a semiconductor when the photon energy sufficiently exceeds the electronic band gap. The absorption and subsequent creation of electron-hole pairs occurs on a femtosecond time scale in direct band gap semiconductors and slightly longer in indirect bandgap semiconductors, such as Si. The subsequent relaxation of the photo-created carriers is dependent on the material and device implementation. The amplification of either electrons or holes is achieved by the process of avalanche multiplication.

It is interesting to note that the multiplication of one type of photocreated carrier is analogous to principles used in high gain vacuum photomultiplier tubes.

Silicon is a superior material for avalanche multiplication due to its indirect band structure determined by the diamond crystalline symmetry. However, silicon does not absorb long wavelength radiation efficiently at wavelengths close to the fundamental band edge. Conversely, direct band gap semiconductors, such as group III-V, InGaAsP quaternary alloys with cubic lattice, absorb long wavelength photons extremely efficiently. Unfortunately it is the crystalline symmetry of the cubic lattice and the direct band gap structure that also inhibits avalanche multiplication due to low ionization coefficient differences for electrons and holes.

The present invention, in one embodiment, teaches solar cell devices based on carrier multiplication in single crystal semiconductor crystals exhibiting indirect band gap energy structure. In particular single crystal silicon or germanium or silicon carbide and mixtures of Group IV semiconductors can be used. Compound semiconductors such as gallium-phosphide (GaP) also exhibit indirect band gap energy and are thus also applicable to the present technique. Alternatively, layered structures based on GaP and Si are also possible and can be used advantageously for band gap engineering of AM devices. Alternatively, carrier multiplication in large grained, polycrystalline structures is possible when the crystal grains are sufficiently large that the avalanche process can occur; single crystal grains larger than about one micron are acceptable. A polycrystalline, indirect band gap semiconductor enables low cost, solar cell fabrication on large area substrates such as Corning glass for liquid crystal displays (LCDs) or flexible films, both organic or inorganic such as kapton and stainless steel. In some embodiments solar radiation of 400 nm and shorter produces about 50% or more of the energy output of an energy conversion device due to the benefits of avalanche multiplication.

Direct deposition of thin films exhibiting single crystal and/or large grained indirect bandgap semiconductors are preferred in some embodiments of the present invention.

Direct layer transfer of thin films exhibiting single crystal and/or large grained indirect semiconductors are also preferred in some embodiments of the present invention.

Avalanche Solar Cell Theory

Impact ionization effect in semiconductors is the process where free carriers (e.g., electrons) are accelerated by a high electric field strength until they gain sufficient energy to promote another electron from the valence band into the conduction band by collision. The electric fields required to observe impact ionization depend on the band structure of the semiconductor and range from ~10 kVcm$^{-1}$ in low gap semiconductors (e.g.: CdHgTe and InGaAs with Eg<0.3 eV) to in excess of 100 kVcm$^{-1}$ in wide gap materials such as GaAlN and GaP (Eg>2 eV).

The minimum energy required for impact ionization is the ionization threshold energy $E_{th}$. Threshold energies dictate the ionization rates for electrons and holes, $\alpha_i$ and $\beta_i$, respectively. Ionization coefficients are defined as the inverse of the reciprocal of the average distance along the direction of the electric field, traveled by an electron or hole to create an electron-hole pair. Consecutive impact ionization events produce the effect of avalanche multiplication. The magnitude of the avalanche gain is intimately determined by $\alpha_i$ and $\beta_i$ the length of a high field region and the carrier injection conditions, such as the type of photoabsorption process.

Impact ionization is a three body collision process whereby an energetic incident charge carrier scatters and creates further low energy free carriers. The final states of the charge carriers are distributed by the remaining kinetic energy and momentum. The energy of the incident impact ionizing carrier is typically greater than the band gap energy of the host crystal.

Figure 64:
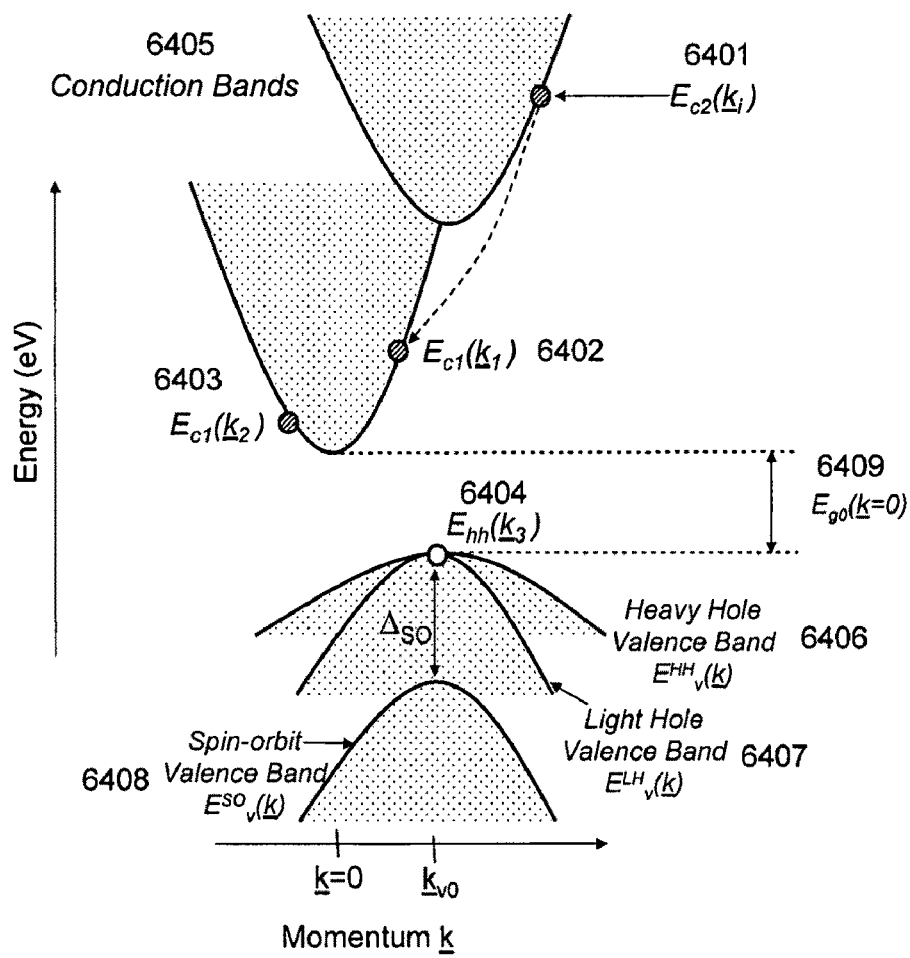
FIG. 64 Energy-momentum band scheme and carrier configuration for impact ionization of hot electron for indirect semiconductor.

The magnitude of the band gap $E_g$, spin orbit split-off valence band separation energy $\Delta_{SO}$, conduction and valence band effective masses, $m^*_e$ and $m^*_h$, respectively are determined by the underlying symmetry of the crystalline structure, as shown in FIG. 64. In general, the E-k dispersion relations of semiconductor bands are not simple parabolic bands for high energies away from the lowest lying conduction and valence band extrema and exhibit complex structure in k-space with strong anisotropies. A model for impact ionization is instructive at this point.

Consider a typical impact ionization event as depicted by the particles on the E-k dispersion relation. An initial hot electron in the conduction band impact-ionizes by promoting another electron from the valence band into the conduction band. The total energy $E_T$ and the total momentum of the carriers $\underline{K}_T$ are given by:

$$E_T = E_c(\underline{k}_1) + E_c(\underline{k}_2) - E_v(\underline{k}_3), \text{ and}$$

$$\underline{K}_T = \underline{k}_1 + \underline{k}_2 - \underline{k}_3,$$

where $E_i(k)$ is the energy in the $i^{th}$ band with wavevector $\underline{k}_i$. To find the ionization threshold, the $E_T$ is minimized for a given $\underline{K}_T$, with energy and momentum conserved. That is, $$d\underline{K}_T = d\underline{k}_1 + d\underline{k}_2 - d\underline{k}_3 = 0,$$

$$dE_T = d\underline{k}_1 \cdot \overline{\nabla}_k E_v(\underline{k}_1) + d\underline{k}_2 \cdot \overline{\nabla}_k E_c(\underline{k}_2) - d\underline{k}_3 \cdot \overline{\nabla}_k E_c(\underline{k}_3) = 0.$$

Upon substitution of the above equations and recognizing the group velocity, $\underline{v}_g = \overline{\nabla}_k E_c(\underline{k})/h$, one obtains the expression $$d\underline{k}_2 \cdot (\underline{v}_1 - \underline{v}_3) + d\underline{k}_3 \cdot (\underline{v}_2 - \underline{k}_3) = 0, \text{ which is satisfied if and only if } \underline{v}_1 = \underline{v}_2 = \underline{v}_3.$$

That is, a necessary but not sufficient condition for an impact ionizing carrier to have a minimum energy consistent with pair production, is to have the final state carriers with equal group velocities.

Lastly, energy-momentum conservation requires the final carriers have total energy equal to the initiating primary electron $E_i(K_i)$. The probability per unit time of electron-initiated impact ionization $\tau_i(E)$ may be expressed by the Born approximation where $E_i(k_i)$ is the initial energy of the impact ionizing electron.

Near threshold the impact ionization rate is given by $\tau_i (E)^{-1} = \tau_{ph}(E_i)^{-1}\Phi(E-E_i)\cdot E_i^{-2}$. For semiconductors with large dielectric constant, the term $\tau_{ph}(E_i)$ is the phonon-scattering rate of the electron at threshold, and $\Phi$ is a constant. Above the threshold energy the ionization probability can increase extremely rapidly and quickly exceed the phonon-scattering rate. Collisions with phonons control the energy and momentum losses of the carriers and thus influence the average distance required to create an electron-hole pair by impact ionization. In the absence of phonon collisions, the distance would be $L = E_i/(q \cdot F)$ where F is the electric field strength and q is the electron charge. Phonon scattering greatly increases this distance. Scattering against the direction of the field is very effective in slowing down, (i.e., cooling) the energetic carriers. For semiconductors with Eg>0.5 eV the scattering process that affects impact ionization is the deformation potential interaction, such as scattering by longitudinal optical and acoustic intervalley phonons with relatively large k, characterized by an energy $E_{ph}$ of the order of the center-zone optical phonon energy (~20-40 meV). Polar optical phonon scattering is of limited strength in small-gap semiconductors such as ErP, ErN, InSb and InAs. Therefore, one expects the multiplication process to be influenced by temperature.

A useful material dependent parameter is the electron (hole) ionization coefficient $\alpha(\beta)$, which corresponds to the probability that the carrier will cause an ionization within a unit length L. The ionization coefficients are highly dependent on the strength and crystallographic orientation of the electric field. An important parameter for describing AM performance is the ionization ratio given by $\xi = \alpha/\beta$. When holes do not contribute to impact ionization, $\xi \gg 1$, which is the case in indirect band gap semiconductors such as silicon. When $\xi \sim 1$, as found in Ge and most III-V alloys, this corresponds to the case where both electrons and holes contribute to impact ionization initiating events. Note due to the fixed direction of the accelerating electric field, there exist competing multiplied electron and hole currents flowing in opposite directions. This produces a positive feedback mechanism, and proceeds in an uncontrolled manner, bouncing back and forth across the gain region. The uncertainty in the multiplication process and the extra time involved in completely clearing all of the ionized carriers reduces the net result in undesirable performance. Even in ideal cases of $\xi = 0$ or $\xi = \infty$, the exact number of impact ionizations that a carrier will experience has an amount of randomness associated with it. This randomness arises due to the total number of impact ionizations depends on the phase space configuration where the carrier was generated or injected, the initiating carrier type, local magnitude of electric field, local doping density, and the path the carrier takes through the gain region. Consequently, the AM process is inherently statistical and therefore unavoidable fluctuations in the exact number of carriers that reach the external circuit for each photon absorbed occurs. This is equivalent to a noise source $N_a$ within the AM solar cell and is termed the multiplication noise or excess noise.

The electron and hole multiplication, $M_e$ and $M_h$, respectively in a p-i-n device with intrinsic region of length L can be used to define the effective ionization coefficients using:

$$\alpha = L^{-1} \ln [M_e/M_h] \cdot (M_e - 1)/(M_e - M_h),$$

$$\beta = L^{-1} \ln [M_h/M_e] \cdot (M_h - 1)/(M_h - M_e).$$

Furthermore, temperature dependence of the ionization co-efficients in the range 15<T<420° K can be adequately described for single crystal Si by:

$$= A_n \exp[-B_n/E] \text{ and}$$

$$= A_p \exp[-B_p/E], \text{ where } B_{n,p}(T) = C_{n,p} + D_{n,p}T.$$

Photomultiplication can be initiated by either pure electron or pure hole injection by selectively absorbing photons in $p^+$ or $n^+$ Si regions of a p+/n and n+/p junctions and p+-i-n+ devices. For example, a 400 nm photon will almost completely be absorbed in 1 μm of Si. If above band gap radiation is incident initially upon the n+ (p+) layer such that it is completely absorbed within the thickness of the highly doped impurity layer creating e-h pairs, then the injection of holes (electrons) into AM region can be neglected.

The ionization ratio $\xi = \alpha/\beta$ increases with increasing electric field strength but typically decreases with increasing temperature in Si. Typically, the operating temperature of the solar cell will determine the optimal AM gain in photocurrent and therefore an onboard wafer module temperature sensor can be used to advantageously modify the electric field strength. Dark current is an important parameter in determining solar energy conversion performance. As the dark current $I_{dark}$ is temperature dependent, varying as $\exp(-E_g/k_BT)$, it is also found that significant performance increase results with temperature reduction.

In practical AM devices the maximum achievable dc multiplication (photocurrent gain) at high incident optical intensity is limited by the series resistance and the space charge effect, represented as R. The photocurrent multiplication $M_{ph}$ is given by the relation:

$$M_{ph}=(I_T-I_{MD})(I_P-I_D)^{-1}=(1-(V_R-I_TR)/V_{BD})^n)^{-1},$$
where $I_T$ is the total multiplied current, $I_D$ is the dark current, $I_{MD}$ is the multiplied dark current, $I_P$ is the total unmultiplied current, $V_R$ is the reverse bias voltage and $V_{BD}$ is the breakdown voltage.

The factor n depends on the specific structure of a device and incident wavelength. For the case of high intensity illumination on the solar cell, the magnitude of $I_P \gg I_D$, $V_{BR} \gg I_T R$ and therefore the maximum multiplied photocurrent $$M_{ph} \sim [V_{BR}/(n \cdot I_P R)]^{0.5}.$$

FIG. 64 shows the AM process in the energy-momentum dispersion structure for an indirect band gap single crystal semiconductor such as Si. An initial hot electron 6401 is injected with large excess energy with respect to the lowest lying conduction band edge. The hot electron scatters via inverse Auger process, that is, impact ionizes, and relaxes to a lower energy state 6402, and creates a further low energy electron 6403 and hole 6404. The hole 6404 may not necessarily be created at the valence band maxima of 6406 and or 6407, but may have $|k_3 - k_{v0}| > 0$. Holes may also be created in the spin-orbit valence band 6408. The initial injected hot electron 6401 typically has excess energy greater or equal to the fundamental band gap energy 6409.

Therefore, the large initial excess energy of ultraviolet electron-hole pairs relative to the Si conduction and valence band edges provides the energy required for efficient AM process to occur at relatively low electric field strengths. That is, by using in preference the selective absorption of high energy photons, the AM process can be optimized for solar energy conversion.

Figures 65A, 65B:
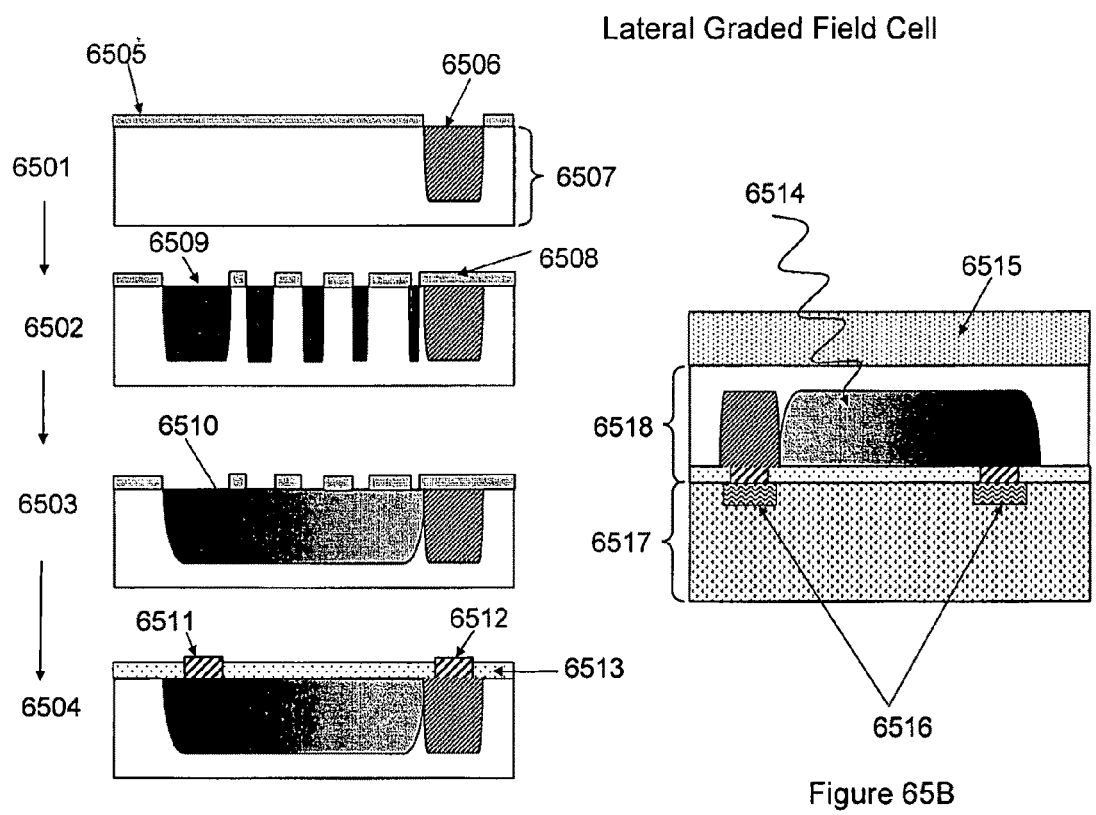
FIGS. 65A and B show a lateral graded electric field formed via digitally graded impurity implantation forming a thin film solar cell.

FIG. 65A shows the general fabrication steps required to form a planar graded electric field p-n AM solar cell. The concept introduces a graded doping profile to modulate the electric field used to accelerate an injected carrier. For example, a Si substrate 6507 is implanted through a mask 6505 to form selectively doped region 6506 to for p+ region. Next a spatially profiled mask is deposited 6508 to allow formation of selective area implant regions 6509 of n+ conductivity. The regions 6509 can be used as digitally doped regions to form electric field profile or the implanted regions can be made to form a substantially continuous graded doping profile as a function of distance across the surface. A thermal anneal can be used to coalesce and or diffuse laterally the doping regions 6509. Next step 6504 performs the electrical contacts 6511 and 6512 to the extrema of the electric field generating regions used to extract the solar generated photocurrent and multiplied current due to the AM process. The final graded field active region composed of thin film single crystal Si is transferred using a process disclosed in the present invention to form a thin film graded field solar cell 6518 disposed upon an alternative or replacement substrate 6517 with integrated electrical interconnections 6516, as shown in FIG. 65B. Antireflection coating(s) 6515 is used to efficiently couple incident solar radiation 6514 into the solar conversion cells forming the wafer scale module. A voltage bias used to generate the electric field used for the AM process is generated by dedicated solar cells optimized for voltage generation from the same incident solar flux 6514 disposed on neighboring portions of a wafer scale module (not shown in FIG. 65).

FIG. 66A shows a similar graded field structure fabricated as the device disclosed in FIG. 65, but with the high and low concentration regions 6610 reversed in gradient relative to the implanted region 6606. The selective area implant regions 6606 and 6609 are defined via masks 6605 and 6608, respectively. A thin film Si graded field AM solar cell 6618 is fabricated upon an alternative substrate 6617, as in FIG. 66B. Solar optical radiation 6614 is coupled to the active region via antireflection coating 6615.

Figure 67:
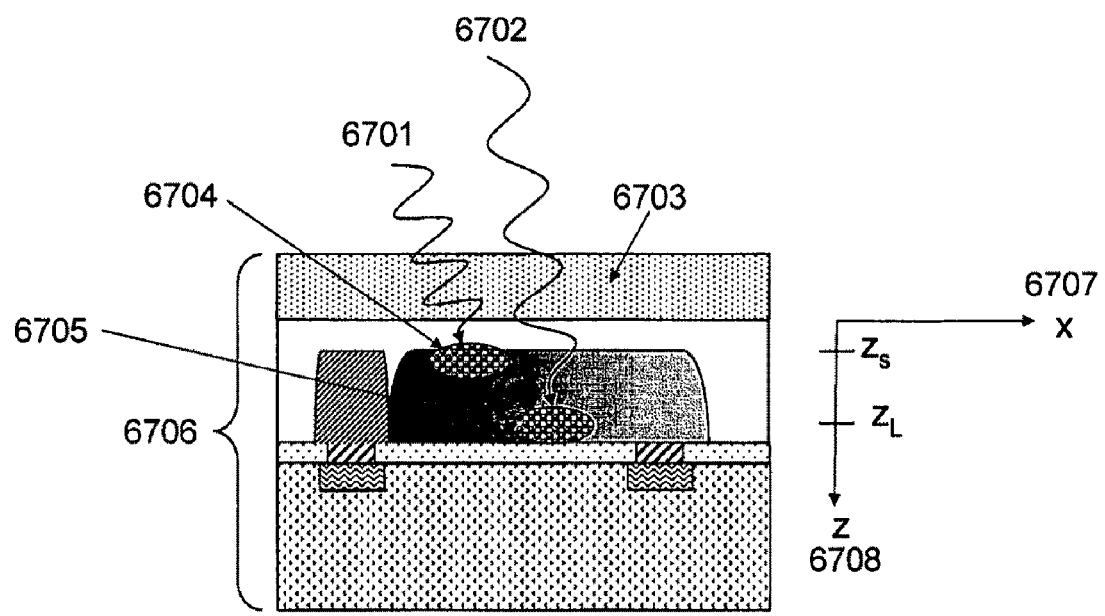
FIG. 67 show schematic representation of wavelength dependent photogenerated carrier regions within lateral graded field solar cell.

FIG. 67 shows a graded field solar cell device 6706 described in FIG. 66 wherein the wavelength selective spatial regions are preferentially absorbed and photocreated charge carriers are initially generated. Long wavelength solar photons 6702 with low absorption coefficient generate e-h pairs in region 6705 close to the thin film Si and alternative substrate interface. Short wavelength photons 6701 generate e-h pairs in region 6701 substantially displaced in the z direction 6708 toward the antireflection coupler 6703. The photogenerated carriers 6704 and 6705 drift and are accelerated advantageously along the lateral field in a direction 6707 such that AM process occurs.

Figure 68:
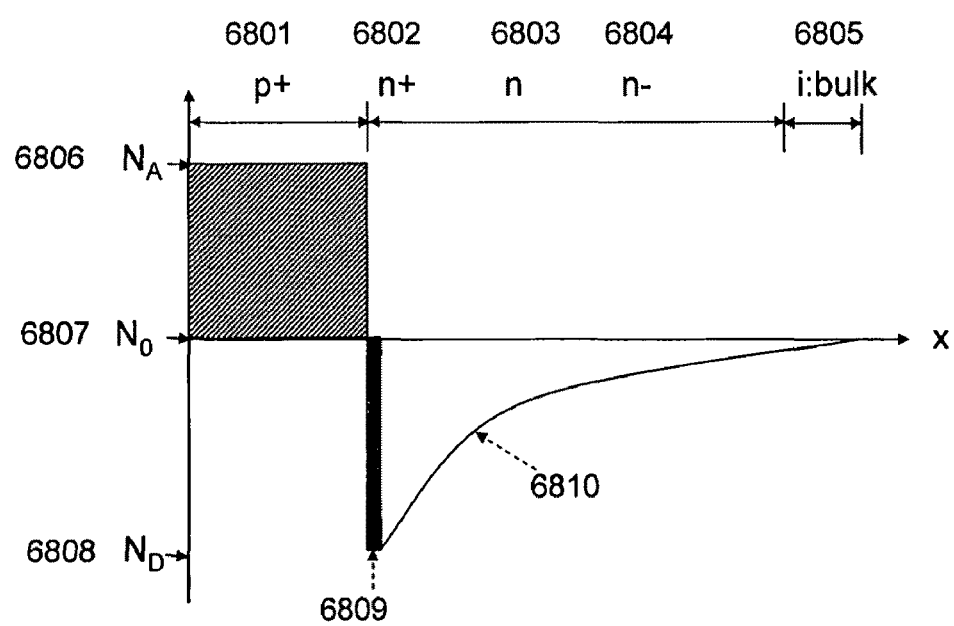
FIG. 68 donor and acceptor carrier concentration for p-n junction thin film solar cell.

FIG. 68 shows an example of impurity type and concentrations in device 6706 of FIGS. 66 & 67. A graded electric field is generated by the p+ region 6801 due to implant 6606. An adjacent spike n+ region 6809 and exponentially graded decaying n-type concentration along direction 6707 is shown as 6810. The lateral electronic structure disclosed forms the basis of the p+ 6801/n+ 6802/n 6803/n− 6804/16805 avalanche multiplication solar cell.

Figure 69:
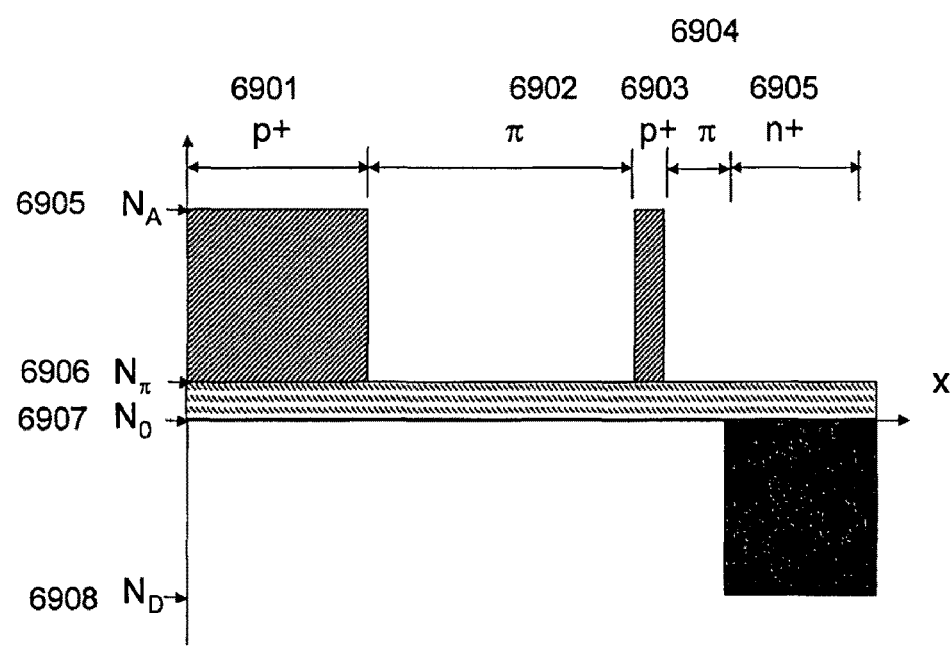
FIG. 69 donor and acceptor carrier concentration for lateral p-π-p-π-n junction thin film solar cell.

FIG. 69 shows an avalanche multiplication solar cell example using an alternative implant impurity doping profile of the present invention. A π-type substrate is used with carrier concentration $N_\pi$, 6909 forming the background. A drift and avalanche region 6902 and 6904 are shown as regions spanning heavily doped p+ 6903 and n+ 6905 regions. The device thus formed is a p+ 6901/π 6902/p+ 6903/π 6904/n+ 6905 AM solar cell.

Figure 70:
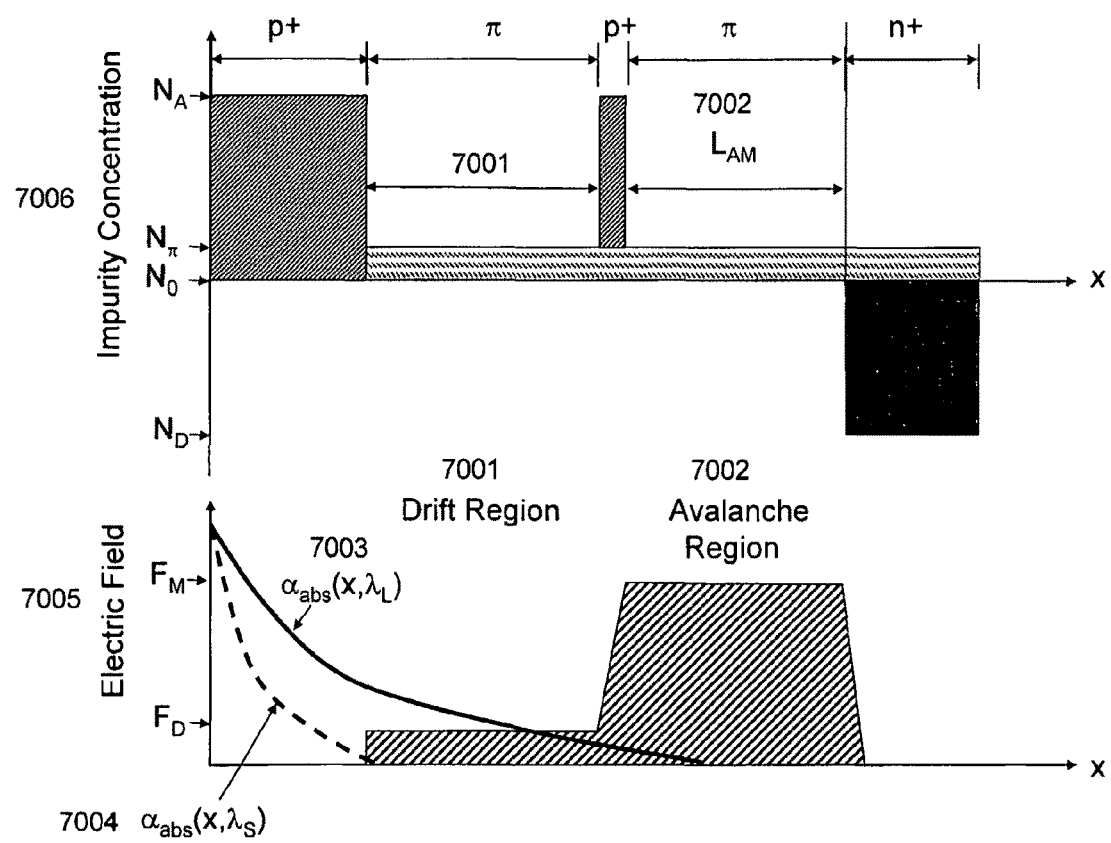
FIG. 70 impurity concentration vs. electric field for lateral p-π-p-π-n junction thin film solar cell.

FIG. 70 further discloses an internal electric field profile 7005 of an AM solar cell device in FIG. 69. Drift 7001 and avalanche multiplication region 7002 are shown. Photogenerated carriers are created with high concentration near the surface and exponentially decay toward the interior of the device. In Si, the long wavelength (low energy) photons 7003 penetrate deeper into the drift region than short wavelength (high energy) photons 7004.

Figure 71:
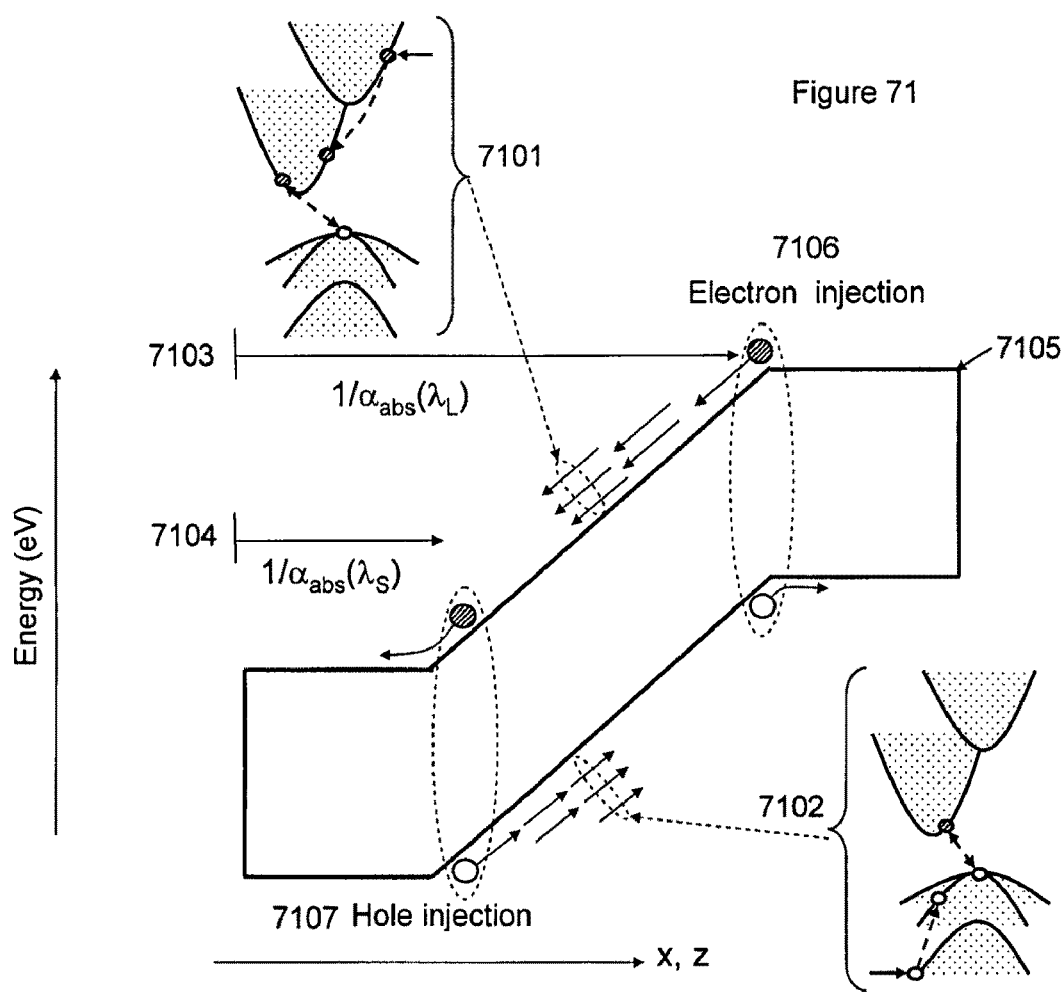
FIG. 71 energy band structure as a function of distance generated by a p-i-n junction. The energy-momentum band structure applicable for the incident hot carrier generating avalanche multiplication is also shown.

FIG. 71 shows schematically wavelength dependent absorption and avalanche processes in a biased n-i-p solar cell. A Si band structure is superimposed for electron injection 7101 and hole injection 7102. Short wavelength photons are absorbed substantially within the n-region 7104 generating injected holes 7107, and long wavelength photons 7103 are absorbed up to the p-type region generating injected electrons 7106. Injected holes initiate a hole cascade 7102 and the injected electrons initiate an electron cascade 7101.

Figures 72A, 72B:
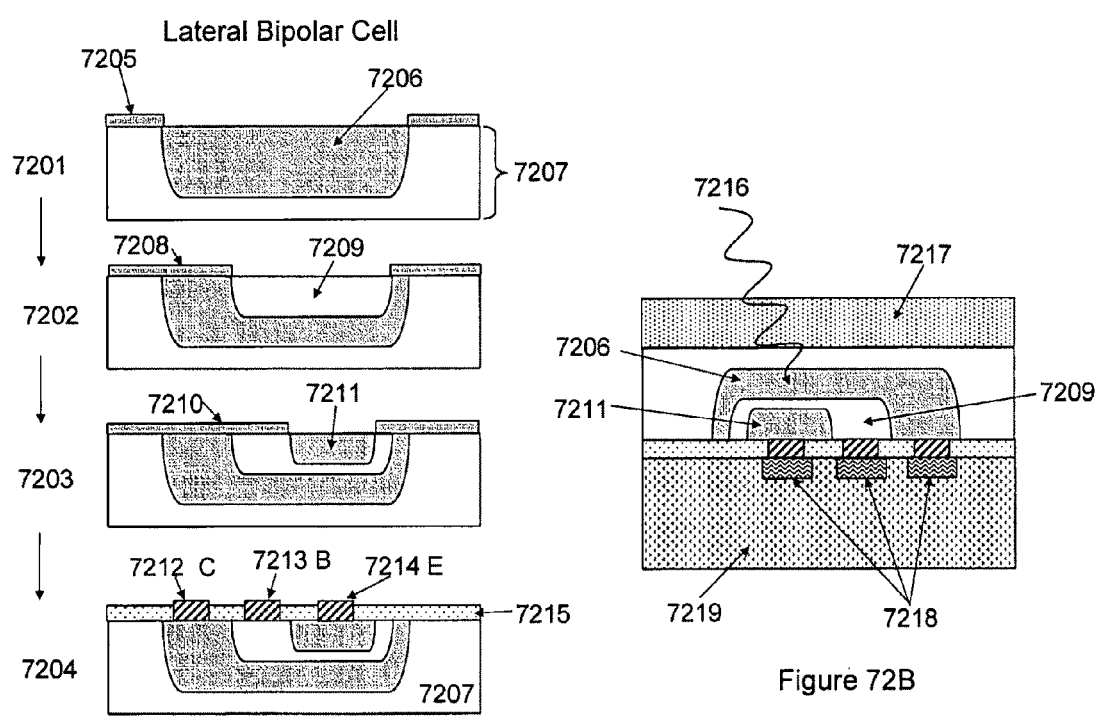
FIGS. 72 A and B lateral bipolar solar cell and transferred thin film device on alternative substrate.

FIG. 72A shows general process steps of fabricating a thin film Si lateral bipolar phototransistor solar cell using methods disclosed in the present invention. A collector region 7206 is first implanted through mask 7205 into, optionally Si, substrate 7207. Similarly, a selective area implant 7209 of step 7202 defines a base with substantially opposite conductivity type to a collector region. Emitter, E, region 7211 is defined via mask 7210 and has substantially the same conductivity type as a collector, C. Finally, step 7204 electrical contacts to a C 7212, B 7213 and E 7214 regions is made an a passivating layer 7215 is fabricated. A thin film Si device is also fabricated on alternative substrate 7219, as in FIG. 72B, using methods disclosed herein. Optical radiation is coupled through coupling layer 7217 into active regions 7207 and or 7206 and or 7211 and or 7209. Photocurrent is extracted using electrical interconnects of the unit cell 7218 and summed advantageously within a wafer scale solar module.

Figure 73A:
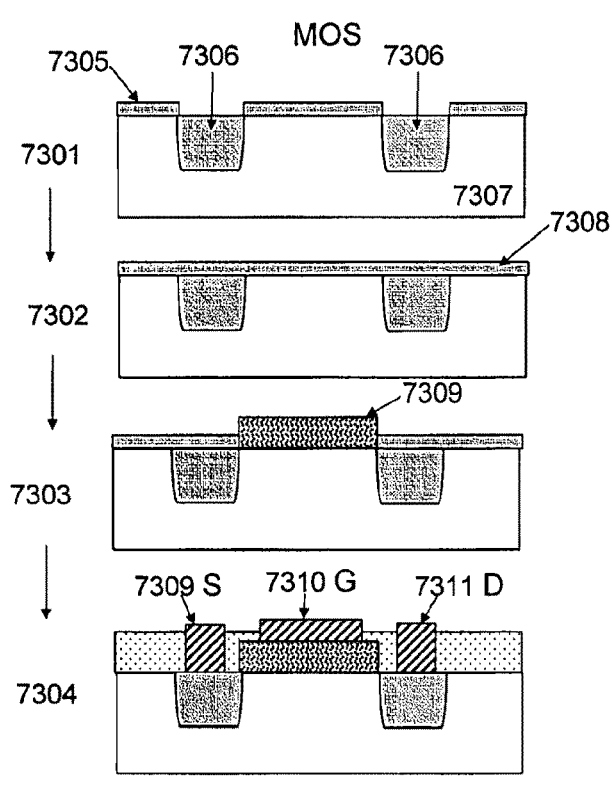
FIGS. 73 A and B disclose a metal-oxide-semiconductor type solar cell and transferred thin film device on alternative substrate. The oxide layer is selectively deposited and patterned to form the active region of the thin film device.
Figure 73B:
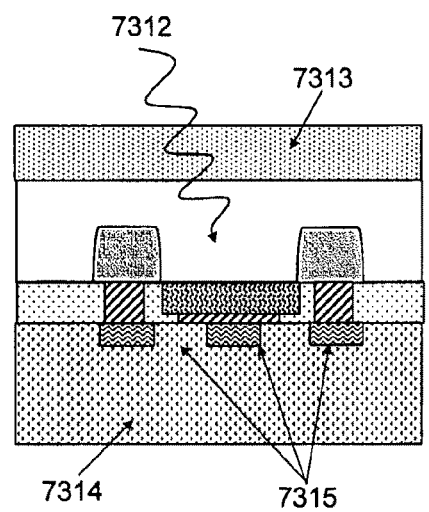

FIG. 73A shows general steps for fabricating an alternate example implementation of the present invention. A metal-oxide-semiconductor thin film Si solar cell is fabricated using selective area implants 7306 of a conductivity type substantially different to that of the substrate 7307. A mask 7305 used in step 7301 is optionally removed and another layer 7308 deposited and or grown. Activation anneal for the implants 7306 can be performed prior to the deposition of the selective area dielectric region 7309. Step 7304 shows electrical contacts 7309, 7310 and 7311 deposited to the thin film Si field effect solar cell. A thin film Si solar cell can be fabricated upon an alternative substrate 7314, FIG. 73B, and interconnected to an array of such cells using interconnects 7315. Optical radiation 7312 is coupled into a Si thin film via low reflection and or absorption loss coupling layer 7313.

FIG. 74A schematically shows steps for fabricating a simple thin film Si device using a dielectric layer 7408 to separate thin film Si layer 7407 from an electrical contact layer 7410. A passivation layer 7412 is deposited and surface 7412 planarized using, optionally, a CMP method. A thin film Si device can be fabricated on an alternative substrate 7416, FIG. 74B, and a cell interconnected to large numbers of similar cells using interconnects 7417. Optical radiation 7414 is coupled into a Si thin film via low reflection and or absorption loss coupling layer 7415.

Figure 75:
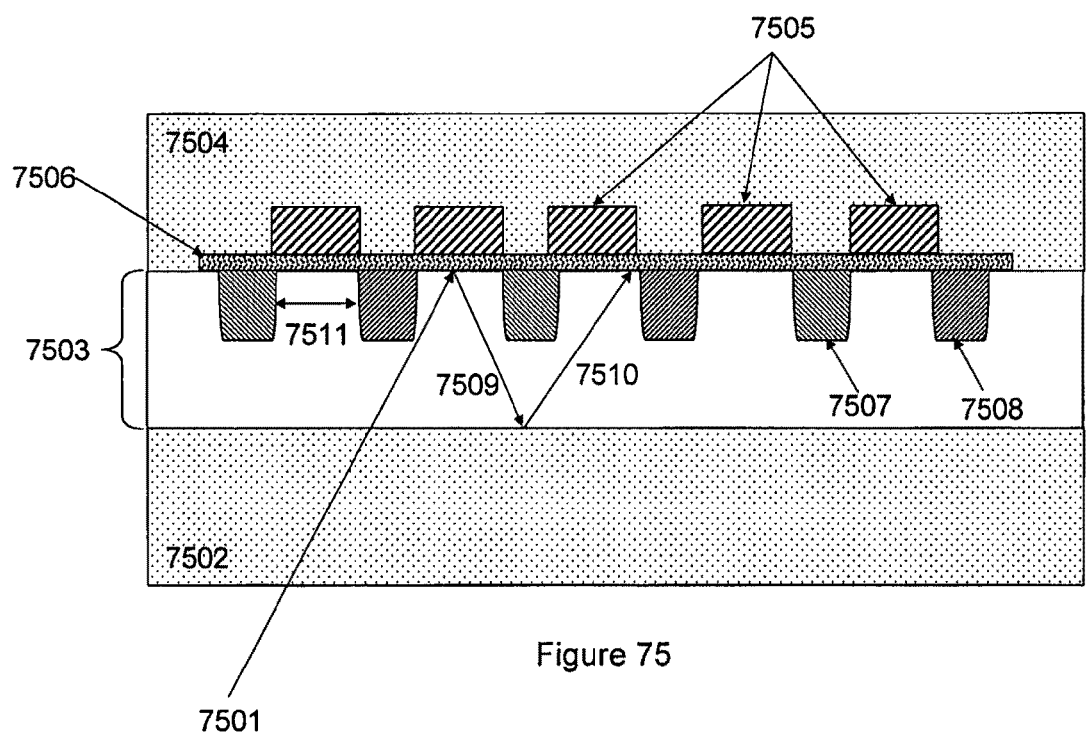
FIG. 75 multiple lateral p-i-n metal-oxide-semiconductor avalanche multiplier thin film solar energy conversion device disposed upon an alternative substrate.

FIG. 75 shows a hybrid thin film single crystal, optionally silicon, device using planar and non-planar electric fields fabricated upon an alternative substrate 7504. The thin film Si layer 7503 is implanted and or diffused with p-type 7507 and n-type 7508 regions separated by a distance 7511. Implanted regions are electrically connected with metallic contacts (not shown interconnecting to an alternative substrate circuit using the method disclosed herein. A dielectric layer 7506 is used to spatially separate Si region 7503 from conductive regions 7505. Electrode 7505 controls an accumulation or depletion of charge at the interface formed between the Si 7503 and the dielectric 7506. Incident optical radiation can be coupled into 7503 via low loss coupling layer 7502. Internal optical reflections 7509 and 7510 can be used to recycle photons which are not absorbed within a thin film Si solar cell.

Figure 76:
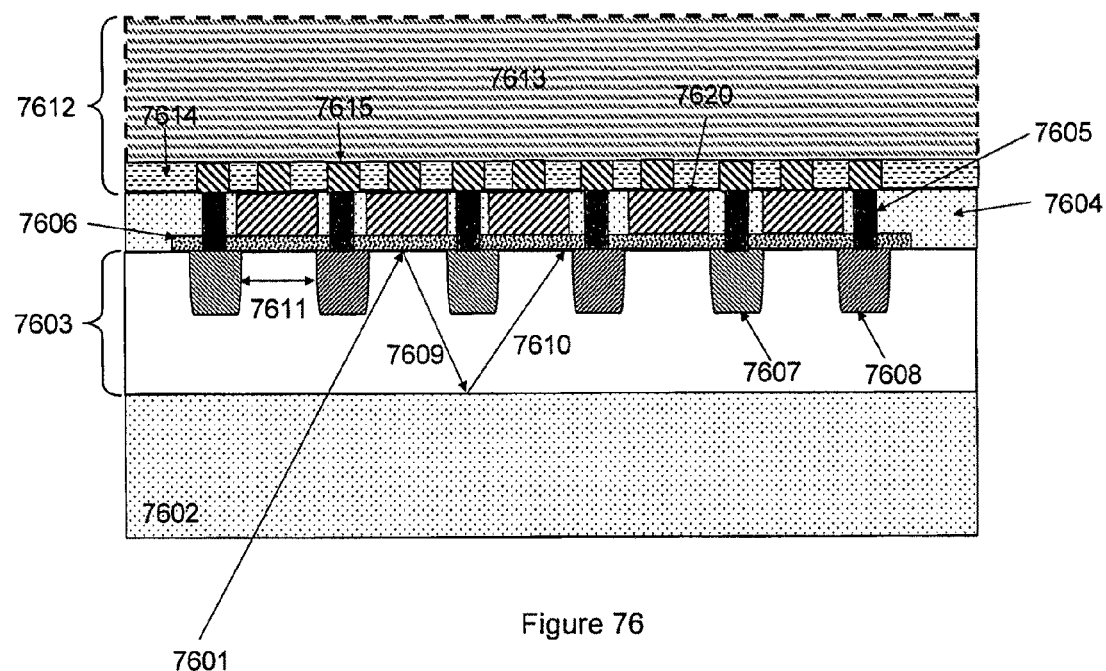
FIG. 76 discloses multiple lateral p-i-n metal-oxide-semiconductor avalanche multiplier thin film solar energy conversion devices showing further detail of the interconnect metals. Each p-i-n consists of three electrical terminals interconnected advantageously into module configuration.

FIG. 76 shows more detail of a hybrid thin film single crystal, optionally silicon, device using planar and non-planar electric fields fabricated upon an alternative substrate 7612. The thin film Si layer 7603 is implanted and or diffused with p-type 7607 and n-type 7608 regions separated by a distance 7611. Implanted regions are electrically connected with metallic contacts 7605 interconnecting to an alternative substrate circuit using electrical circuit formed by 7615, using the method disclosed herein. A dielectric layer 7606 is used to spatially separate the Si region 7603 from a conductive regions 7620. Electrodes 7620 control accumulation or depletion of charge at the interface formed between the Si 7603 and dielectric 7606. Incident optical radiation 7601 can be coupled into 7602 via low loss coupling layer 7502. Internal optical reflections 7609 and 7610 can be used to recycle photons which are not absorbed within a thin film Si solar cell.

Figure 77A:
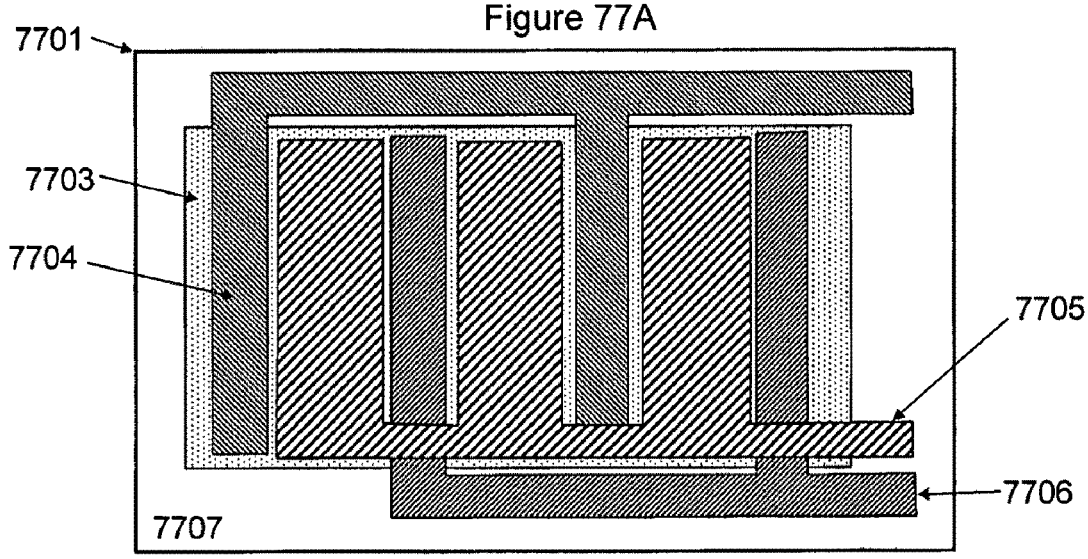
FIGS. 77A and B electrode pattern for a lateral p-i-n MOS avalanche multiplier thin film solar energy conversion device.

FIGS. 77A and B show top view and cross-sectional view of a hybrid lateral p-i-n MOS avalanche multiplier solar cell device described in FIGS. 75 & 76. P-type 7704 and n-type 7706 implant regions are formed using an interdigitated finger configuration. Conductive gate electrodes 7705 are superimposed in FIG. 77A. Avalanche multiplication of photocurrent occurs in a p-n junction (under a gate electrode) where the breakdown potential is reduced due to an additional implant. Voltage applied to the AM-MOS is distributed between the depletion layer of the semiconductor and the oxide layer. The hole carriers created by avalanche process in a given micro region of the p-n junction is collected in a small area of the Si—$SiO_2$ interface. A drift of the hole charge carriers from the avalanche region to the drain contact is provided by a high resistive layer.

MOS APDs: Impact Ionization Across Metal-Oxide-Semiconductors Heterojunction

The well known metal-oxide-semiconductor structure is the basis of current high performance ULSI CMOS. Application to solar energy conversion can also be made by suitable design of the MOS device based on thin film single crystal Si disposed upon alternative substrate. FIGS. 78 A & B and FIGS. 79 A & B depict energy band structures of thin film Si MOS type solar cell devices using $SiO_2$ and or rare-earth oxide, nitride or phosphide dielectric layers. FIGS. 78 A & B shows the device as disclosed in FIGS. 73 to 77, inclusive. The metal electrode is in intimate contact with the dielectric layer. The dielectric layer is disposed upon a single crystal, optionally Si, thin film. For thick dielectric layers the behavior is insulating. For thin dielectric films <10 nm, the films are leaky due to quantum mechanical tunneling. The use of a high dielectric constant material in the MOS structure allows efficient confinement of photogenerated charge carriers at the oxide-silicon interface.

Figures 79A, 79B:
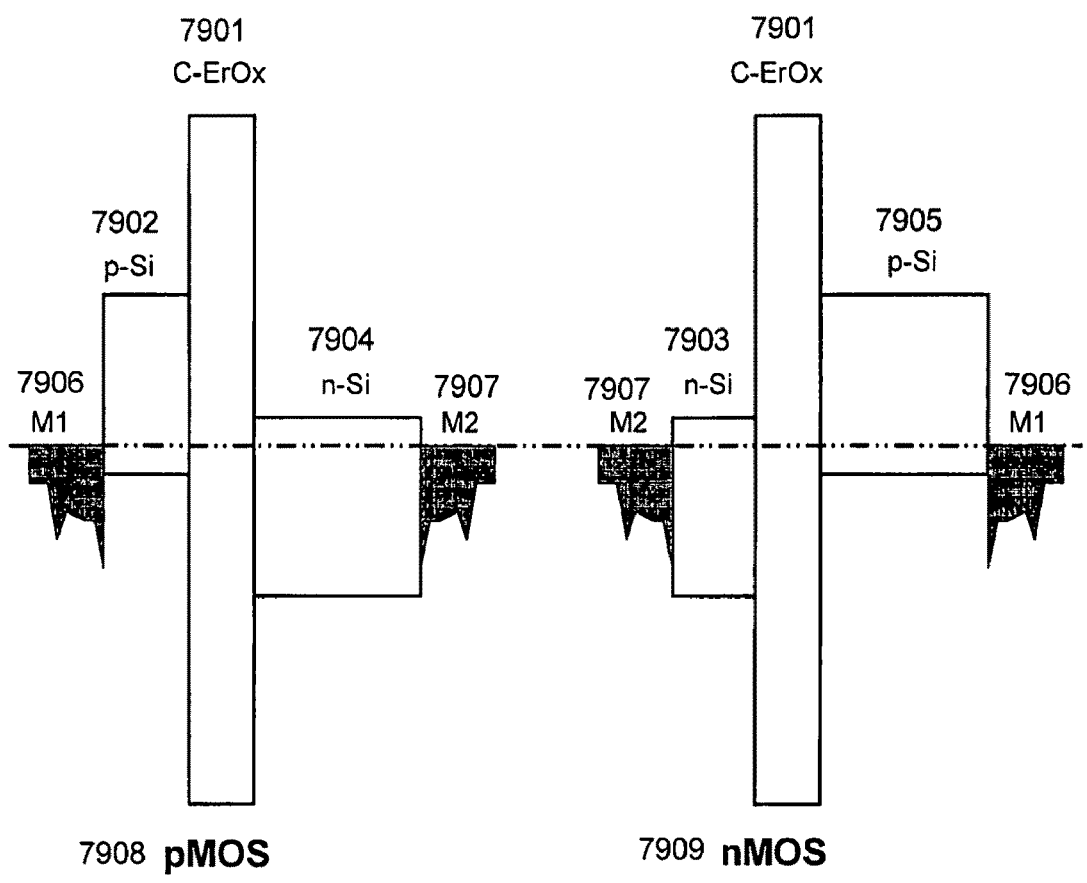
FIGS. 79A and B disclose a semiconductor-oxide-semiconductor (MOS) device using at least one type of p type and n type semiconductors sandwiching the oxide layer. The oxide is chosen from a rare-earth-based material.

FIGS. 79 A and B shows a MOS structure variant with a doped silicon electrode layer deposited on the dielectric layer. An example implementation uses n-type Si contact layer, erbium oxide dielectric and n-type substrate. Other combinations in conductivity type are also possible.

Figure 77B:
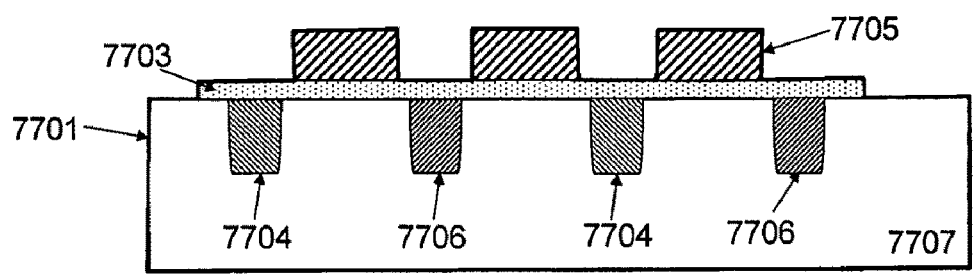
Figure 78A:
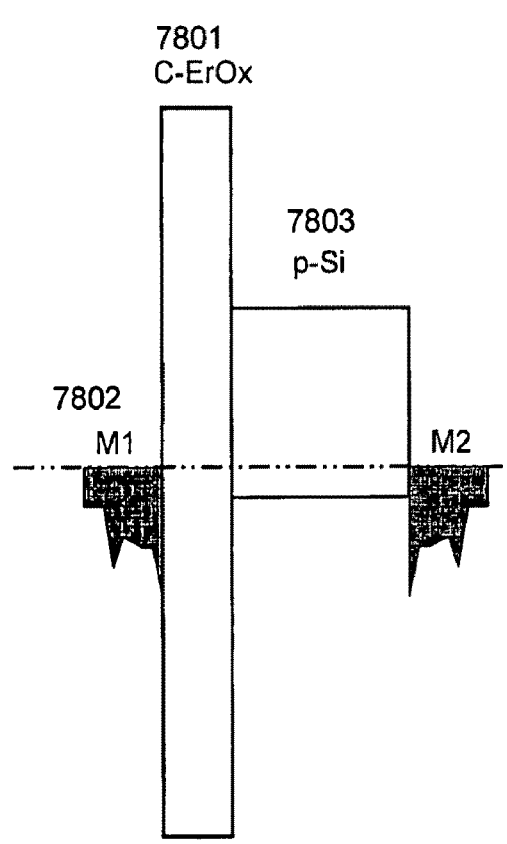
FIGS. 78A and B disclose a metal-insulator-semiconductor (M-I-S) solar energy conversion device using p type and n type semiconductor. The insulator is chosen from an oxide containing a rare-earth-metal. Erbium-oxide is disclosed as the insulator.
Figure 78B:
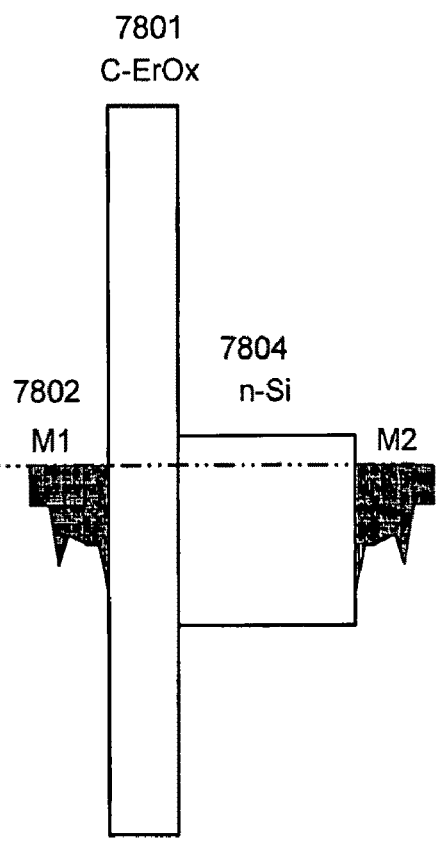

The use of high dielectric RE[Ox] materials can be used as suitable layers for lateral p-i-n MOS AM cell, for example, in FIG. 77B layer 7703. Furthermore, structures in FIGS. 78A & B and 79A & B can also be used for implementing AM solar cell described in the various devices disclosed herein. For example FIG. 73 may be implemented using simple RE[O, N, P] compositions for layer 7309; alternatively more complex films of previously noted compositions $[Z]_u[RE1]_v[RE2]_w[RE3]_x[J1]_y[J2]_z$ may be used in some embodiments.

Separate Avalanche Multiplication Emission Device

Fortuitously, Si exhibits excellent avalanche multiplication properties due to the inherent large difference in electron ($\alpha$) and hole ($\beta$) ionization co-efficient. The present invention further discloses MOS devices with oxide layers composed of silicon dioxide ($SiO_2$) and or rare-earth oxide ($RE\text{-}O_x$) structures. A separate carrier multiplication region using an i:Si layer appropriately positioned between the oxide layers within the p-i-n heterostructure can be used. For example, a metal-$SiO_2$/Si(AMR)/ErOx/Si stack can be formed via epitaxial growth.

A variation of the nMOS solar cell device can be modified to include a separate avalanche multiplication region (AMR). Carriers generated in the AMR will build up over a mean interaction length $L_\lambda$ via impact ionization prior to reaching the $SiO_2$ and or c-ErOx layer. If electrons are injected into the AMR, an e-h pair will be created via impact ionization after a distance of $L_\lambda \sim 1/\alpha_{abs}$. The avalanche process is intrinsically statistical so that individual carriers will have different avalanche gains characterized by a distribution with an average multiplication gain noise thereby amplifying noise fluctuations. This feedback is eliminated if one type of carrier preferentially impact ionizes. In Si, $\xi > 1000$ has been demonstrated. Thin intrinsic region Si p-i-n avalanche photodiodes with abrupt junctions are capable of multiplication ratios M~10. Dead spaces of only 30-100 nm can be use in the present invention. Therefore, an AMR thickness of only ~300 Å can generate M~1-10 with less than 5V reverse bias.

Wavelength Dependence of Avalanche Multiplication in Silicon.

The effect of incident photon energy on the absorption depth and avalanche multiplication processes can be used advantageously in the design of high efficiency thin film single crystal solar energy conversion devices. In particular, incident high energy photons substantially in the ultraviolet portion of the solar spectrum are absorbed completely in very thin depths of Si. The absorbed UV photons are converted almost instantaneously into e-h pairs with large excess energy relative to the lowest lying conduction and valence band edges. These UV photogenerated e-h pairs are said to be hot. In prior art solar cell devices these hot e-h pairs equilibrate thermally within the Si crystal lattice via efficient coupling to phonon field. Prior art devices typically rely on diffusion of charge carriers within a bulk Si device for extraction of photocurrent at the external contacts. In general, prior art devices are incapable of using these UV photons to create useful photocurrent due to the length scale of the devices used—that is, they are large and carriers must diffuse long distances toward contacts (>1 cm).

The present invention teaches the use of thin films of single crystal Si that are optimized for absorption of photon wavelengths ranging from approximately 200-500 nm wavelengths. Furthermore, the said device has a high voltage external bias applied advantageously to a region used for generating large electric field strengths required for avalanche multiplication process and thus amplifying the number of charge carriers initially created by optical absorption process. The present invention is not limited to AM processes. Even modest electric field strengths allow the use of advantageous drift fields suitable for efficient extraction of photogenerated carriers. Therefore, the present invention claims the use of all devices using external voltage bias. The external voltage bias is integrated within a wafer scale integrated solar module and thus is self provisioning.

The present invention teaches the use of absorption of high energy photons via advantageous use of thin film single crystal Si. Furthermore, high energy photons create hot e-h pairs with large excess energy relative to the fundamental band gap of Si, Eg(Si)=1.12 eV. Photocarriers generated at Eg or slightly above have very small excess energy and are said to be cold. For example, a 500 nm (2.48 eV) photon creates e-h pair with total excess energy of 1.36 eV. While this energy is insufficient to initiate avalanche multiplication due to lack of high accelerating electric field, it does however impart to the initially created electron and hole a large initial excess energy which can be heated further by the electric field. That is, the electric field strength required to initiate AM is lower for higher energy photons than photons with energy close to the fundamental band edge.

Furthermore, the selective absorption of 400 nm (3.1 eV) photons initially creates hot e-h photocarriers with total excess energy of 2.9 eV. Depending upon the distribution of energy and momentum to the said electron and hole, the excess energy can be well in excess of the band gap of Si. As discussed previously, this is advantageous for highly efficient AM process. The required field strength required for accelerating the hot charge carrier(s) is therefore less than the case of cold photocarriers.

The present invention further discloses the use of wavelength dependent avalanche multiplication in Si.

Thin Film Solar Cells Comprising Rare-Earth Ions

Solar Cell active regions can be deposited directly on single crystal, poly-crystalline, amorphous, such as glass, or organic or metallic substrates. In one embodiment multilayer rare-earth metal oxide and germanium (RE-Ox/Ge) films are deposited on conventional window glass; alternatively, a polyimide, Kapton® or other polymer based substrate may be a suitable substrate. Poly-crystal RE-Ox layers can be deposited under conditions exhibiting textured structure conducive to poly-crystal germanium, Ge, deposition. Poly-crystal RE-Ox/Ge structures can produce a high efficiency solar cell device. Alternatively, multilayer RE-Ox/Ge thin film structures can be deposited in a flat topology suitable for superlattice and MQW and continuously graded composition and digital alloy structures for solar cell applications.

New semiconductor material compositions are disclosed as a novel component of the instant invention. Rare-earth metal oxide, wherein the rare-earth metal can be chosen from at least one of the lanthanide series {La, Ce, . . . Gd, Er, Tm, Yb, Lu} of the periodic table of elements. Wide band gap materials comprising at least one rare earth oxide, rare earth nitride, rare earth phosphide and combinations thereof may be substituted for materials such as ZnO, GaN and other ceramic materials. Thin film, solar cell structures comprising wide band gap materials and Group IV, III-V, and III-VI semiconductors, such as germanium, as single crystal, sc, or polycrystalline, pc, or amorphous, a, are possible. Alternatively, various alloys, such as silicon and germanium, to form $Si_{1-x}Ge_x$, $0 \leq x \leq 1$ alloys may be used in combination with wide band gap materials. Alternatively, thin film, solar cell structures may comprise compositions previously described, such as $[Z]_u[RE1]_v[RE2]_w[RE3]_x[J1]_y[J2]_z$, in combination with Group IV, III-V, and III-VI semiconductors.

Novel ternary, quaternary, and higher alloys, such as, $[Z]_u[RE1]_v[RE2]_w[RE3]_x[J1]_y[J2]_z$ wherein [RE] is chosen from a group comprising the lanthanide series; [Z] is chosen from a group comprising silicon, germanium and SiGe mixtures, [J1] and [J2] are chosen from a group comprising Carbon (C), Oxygen (O), Nitrogen (N), and Phosphorus (P), and $0 \leq u, v, w, z \leq 5$, and $0 < x, y \leq 5$. are disclosed suitable for tailoring the optical and electrical properties across the entire solar spectrum, whether on earth or in space. Multilayer thin film structures for highly efficient solar spectrum conversion into electrical energy is disclosed using wide, or large, band gap energy insulator and/or conductor layers comprised of Group IV, III-V, or II-VI semiconductors such as C, SiC and $Ga_xAl_{1-x}N$ in combination with narrow, or small, band gap energy semiconductor layers comprised of Group IV, III-V, or II-VI semiconductors such as Ge, Si and $Ga_{1-x}In_xN$, $Al_{1-x}In_xN$. Multilayer structures may be disposed upon single crystal semiconductor, amorphous or crystalline glass, metallic, or plastic and flexible substrates.

Cost effective deposition methods using individual elemental sources of the constituents are preferred; alternatively, deposition techniques such as atomic layer deposition, ALD, chemical vapor deposition, CVD, physical vapor deposition, PVD, metal-organic chemical vapor deposition, MOCVD and molecular beam epitaxy, MBE are possible also. An evacuated chamber and heated substrate may be used to control the deposition conditions. Preferably, elemental sources are heated or controlled to form the required number of species impinging the growing surface forming the deposited material on the substrate. The deposition parameters of chamber vacuum/pressure, ratio and absolute number of impinging species from elemental or multi-component sources and substrate temperature are controlled such that the stoichiometry or composition of the deposited materials is optimized. Deposition chamber pressures of $10^{-10}$ torr to $10^{-3}$ torr facilitate achieving some embodiments. Substrate temperatures may range from 25° C. to 700° C. or higher may be used. Post growth annealing of the multilayer structures may also be advantageous and are included as an embodiment of the present invention. Individual layer thicknesses may vary from 1 nanometer (nm) to 10 microns depending on the type of device structure desired. The purity of rare-earth metal elemental sources is typically limited to commercial sources with 3N, 99.9%, or 4N purity. Typically these pure rare-earth metal sources are used in the deposition method. The purity is typically in excess of the above quoted level when referenced to elements outside of the lanthanide series. Therefore, the device performance of the rare-earth oxide semiconductor may be compromised, enhanced or unaffected by the presence of multiple rare-earth metal species.

Detailed Description of Several Embodiment(s)

FIGS. 80 A, B, C, and D schematically compare Ge & Si solar absorbers. The absorption coefficient is proportional to the length a photon must traverse into the bulk of the semiconductor in order to be absorbed by a 1/e factor. Germanium has a much higher absorption coefficient compared to silicon.

Figure 81:
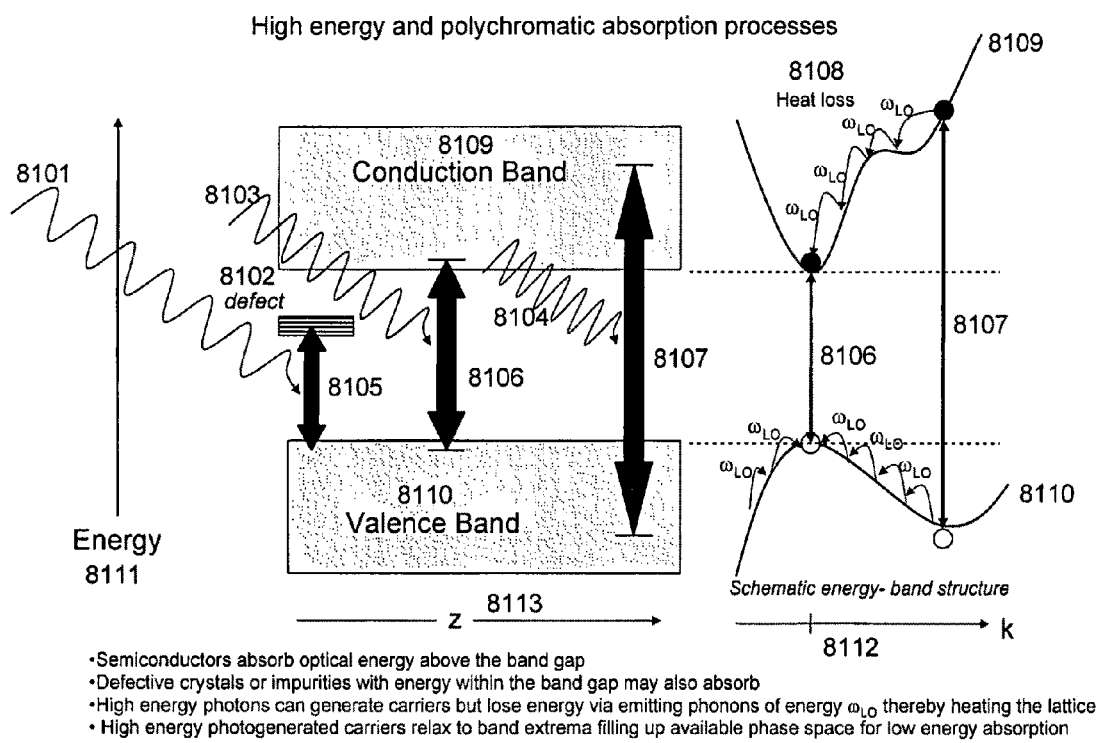
FIG. 81 Absorption processes in semiconductor showing defect, resonant band gap, and above band gap interaction of various energy photons. High energy photocreation of charge carriers and subsequent relaxation mechanism is shown.

FIG. 81 is a comparison between conventional solar cell technologies and some embodiments of the present invention. Conventional solar cell designs utilize an active region or absorber medium to convert photons into charge carriers. Typically a diode p-n homo-junction is used to provide a built in electric field to sweep out the charge carriers. Metallic contacts to the solar material are used to extract charge carriers. The physical length a charge carrier can traverse in a semiconductor material is typically smaller than the dimensions of a solar cell optical widow. Multiple metallic contacts on the front-side are used to solve this shortcoming thereby reducing the optical coupling to the absorber. In an embodiment the present invention uses a transparent conducting rare-earth-metal oxide as dual function front side contact and electrical junction formation. The wide band gap oxide and narrow bandgap semiconductor, such as germanium, layer pair form an active region comprising an electrical junction suitable for efficient extraction of photo-generated charge carriers.

Figure 82:
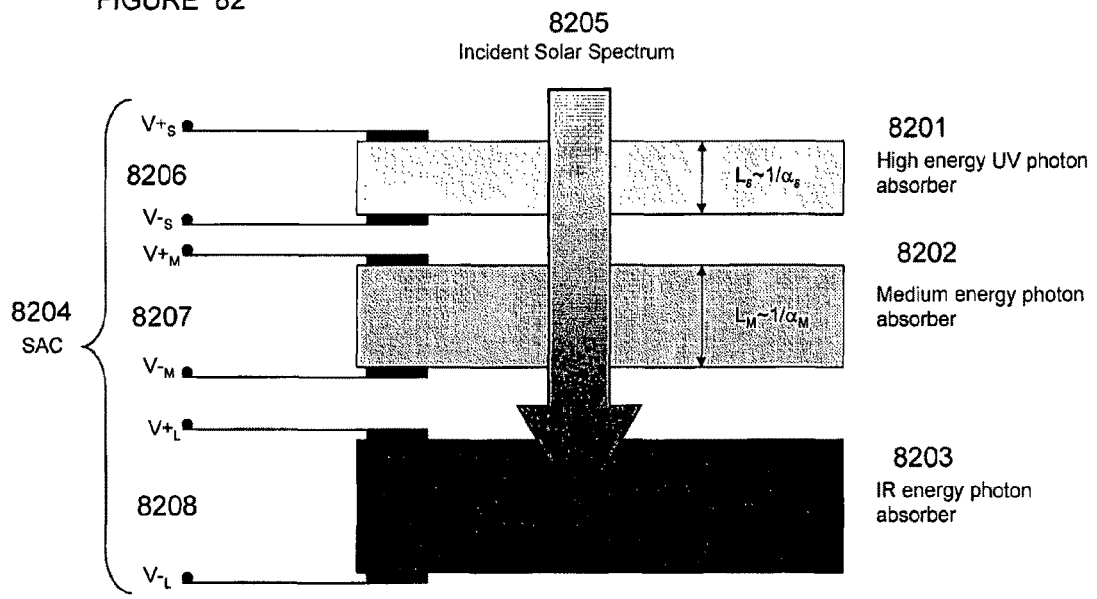
FIG. 82 discloses a schematic diagram showing the serial absorption of polychromatic solar radiation using spatially selective optical material and optoelectronic (OE) conversion device.

FIG. 82 is a schematic diagram showing the effect of high energy optically absorbed radiation on the electronic processes within the semiconductor medium. A high energy photon with energy substantially in excess of the fundamental energy band gap of the semiconductor is absorbed close to the surface of the material, (that is, high absorption co-efficient). The photo-created electron and hole pair subsequently decay in energy typically by emitting quantized thermal lattice excitations, or phonons. The phonon energy is characteristic of the semiconductor and multiple radiations are possible. This relaxation path couples energy into the semiconductor lattice and results in heat. This charge carrier loss mechanism is disadvantageous for the extraction of charge carriers into an external circuit such as required for a solar cell. The relaxation of high energy carriers further populates lower energy states thereby filling available phase space for lower energy absorption. In general, the above process is symptomatic of the low energy conversion of solar cells using polychromatic (full solar spectrum) absorption compared to monochromatic operation.

Figure 83:
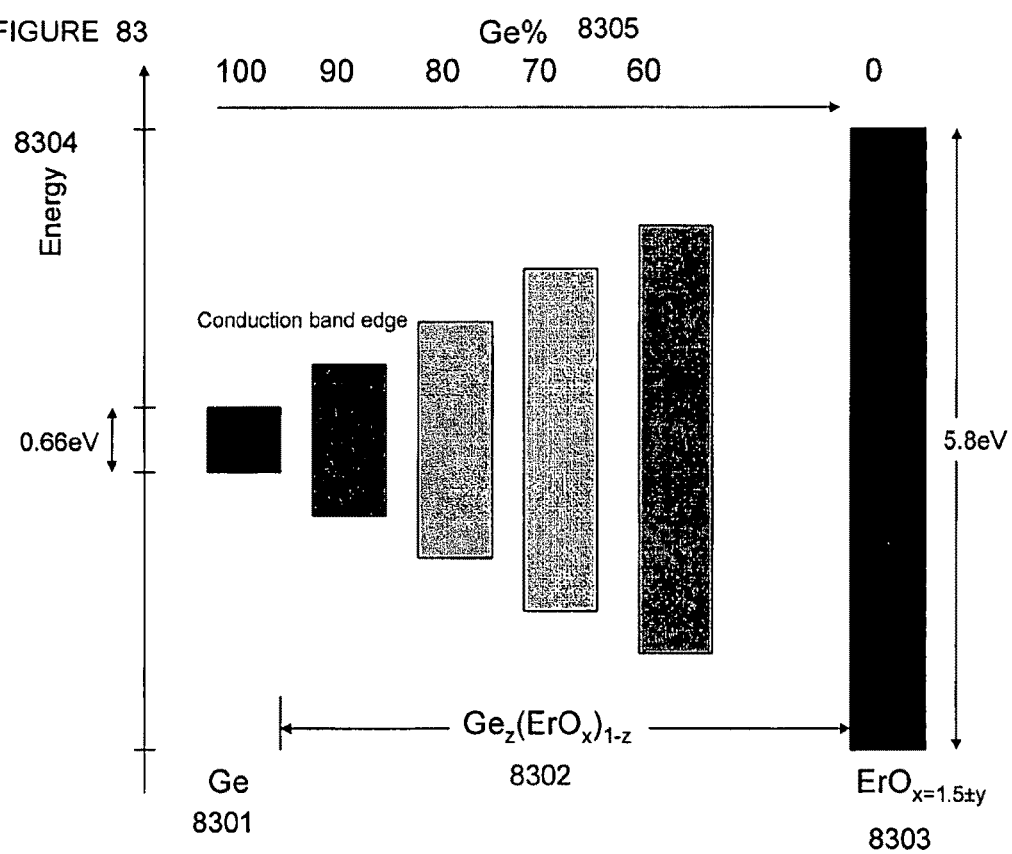
FIG. 83 is a schematic of a germanium-rare-earth-oxide ternary alloy bandgap engineered absorber.

FIG. 83 is a schematic solution to the requirement for solar cell operation using full solar spectrum. A solar cell is divided into separate regions where different energy photons can be absorbed. Preferably, high energy photons are absorbed closest to the surface impinged via the incoming light followed by absorber/conversion sections with longer wavelength (lower energy) characteristic. Each separate absorption and conversion cell may be electrically connected in series or parallel in order to optimize photovoltaic or current source operation.

Figure 84:
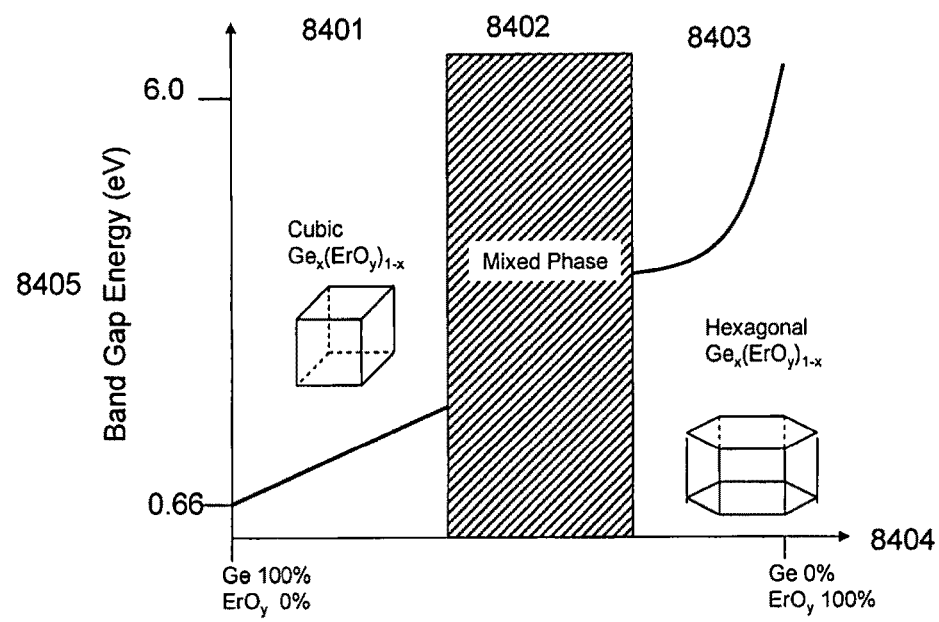
FIG. 84 is a schematic description of the energy band gap versus composition of the present invention utilizing germanium, rare-earth metal oxide and various combinations thereof.

FIG. 84 is a schematic description of an embodiment of the present invention utilizing germanium, rare-earth metal oxide and various combinations thereof. The mixed semiconductor germanium-rare-earth-metal-oxide semiconductor can be engineered to exhibit a particular band gap energy and thus optical and electronic property. For example the Germanium-Rare-earth-oxide semiconductor $Ge_z(ErO_x)_{1-z}$, is depicted optionally using erbium metal for various germanium mole fractions x. The oxygen ratio to the rare-earth metal is shown in the formula as "x", and may be manufactured as oxygen deficient, meaning below stoichiometric and more conductive and oxygen excess meaning above stoichiometric and more insulating. The energy gap can therefore be tuned over the energy range of about 0.66 electron volts (eV) to approximately 6 eV. This range of optical and electronic energy gaps spans most of the solar spectrum.

Figure 85:
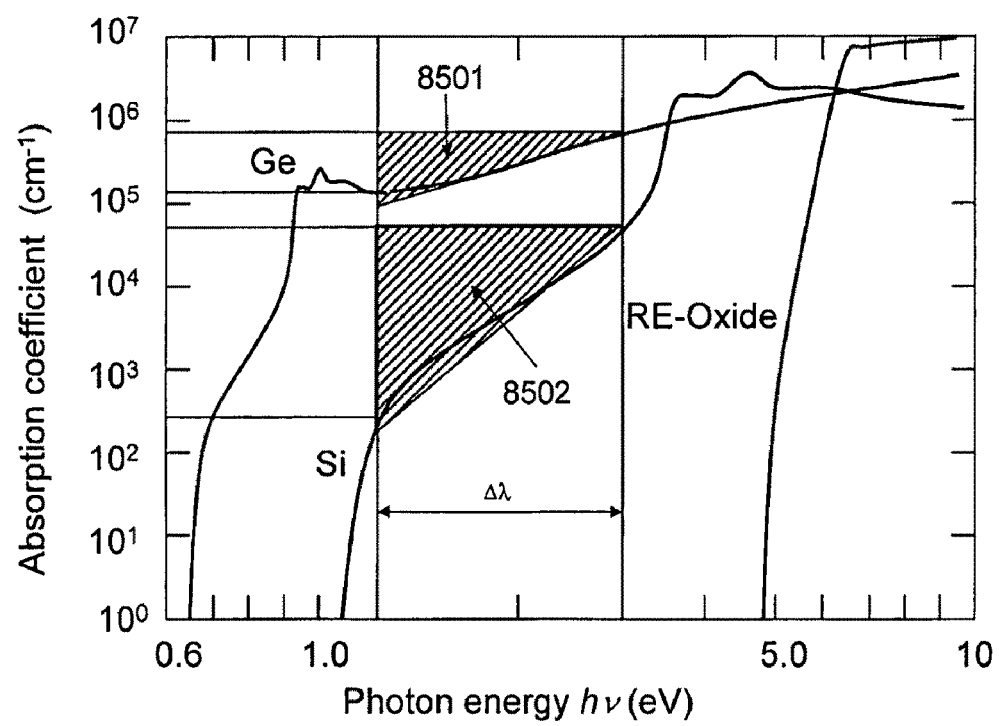
FIG. 85 shows that Germanium has at least two orders of magnitude higher absorption co-efficient compared to Silicon in the shaded energy range.
Figure 86A:
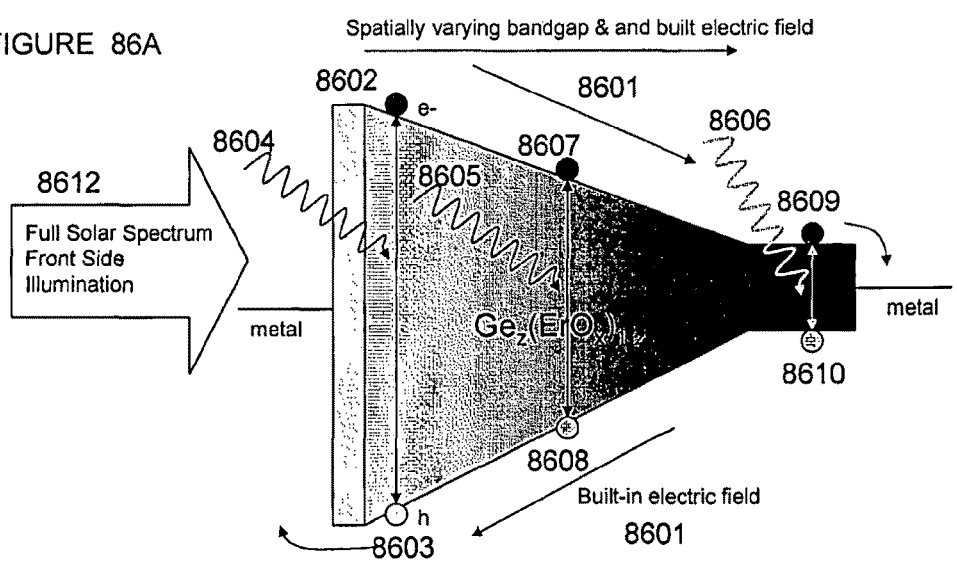
FIGS. 86 A and B, schematically, is a solar cell device designed to span the entire solar spectrum utilizing germanium-rare-earth-oxide ternary alloy bandgap engineered absorber.
Figure 86B:
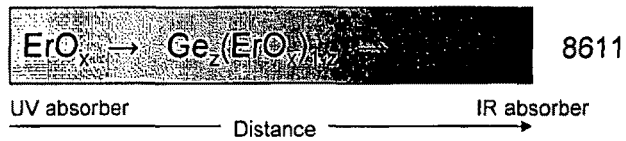

FIG. 85 shows that Germanium has at least two orders of magnitude higher absorption co-efficient compared to the use optical range of Silicon;

FIGS. 86 A and B, schematically, is a solar cell device designed to span the entire solar spectrum. The energy band gap is continuously varied as a function of the layer deposition thickness in a linear manner from about 100% erbium-oxide (ErOx) to about 100% germanium (Ge). Front side illumination by the full solar spectrum results in UV photons being absorbed closest to the surface followed by lower energy photons as optical radiation traverses into the graded band gap "funnel" absorber. The additional advantage of such a graded band gap structure is the formation of a built in electric field that is used advantageously to sweep out photo-created charge carriers before they can recombine and out into external metallic conductors.

FIGS. 87 A and B, schematically, depict an alternate method of generating a graded band gap structure. Instead of continuously changing the germanium percent of the material as a function of growth direction, the use of binary layers can be used. When the layers are sufficiently thin, the narrow band gap and wide band gap layer thicknesses may be varied so as to produce an artificial graded band gap structure. Such a structure is termed a superlattice (SL).

Figures 88A, 88B:
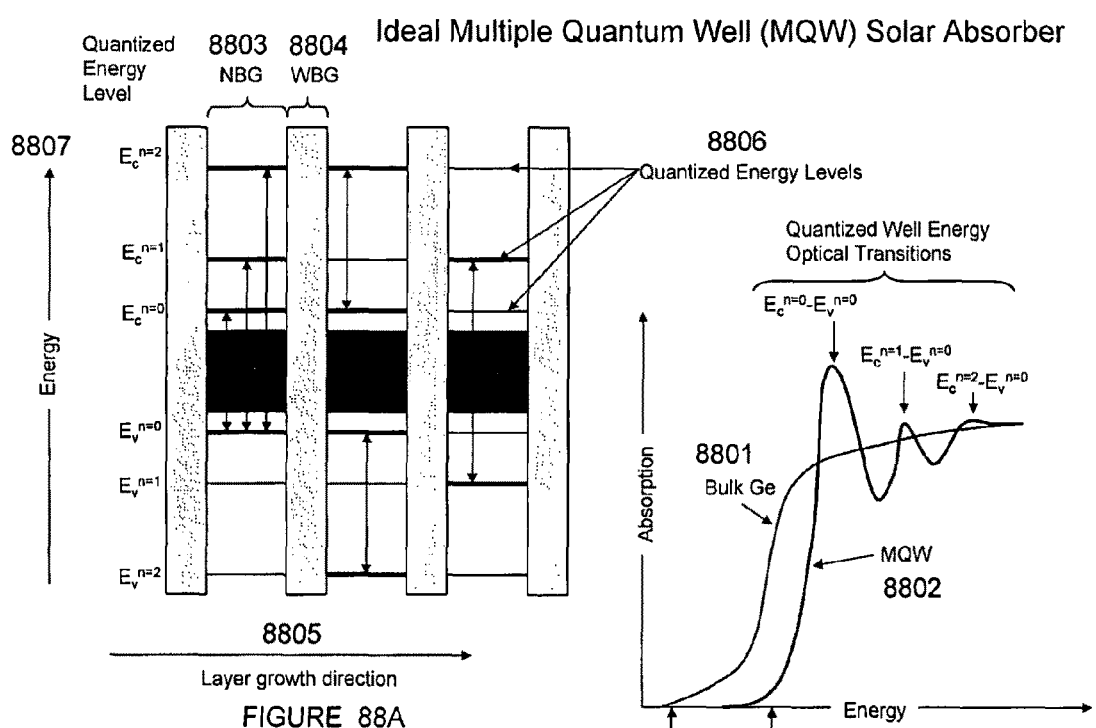
FIG. 88B shows the modification of absorption co-efficient for bulk-like Ge wells and quantum confined Ge wells.

FIGS. 88 A and B, schematically, are a description of rare-earth oxide potential energy barrier layers and germanium quantum well layers. Three potential energy wells are shown. For layer thicknesses in the quantum regime, the allowed energies within the quantum well are not continuous. The energy levels in both the conduction and valence bands are quantized and various optical absorption processes are shown.

Figure 89:
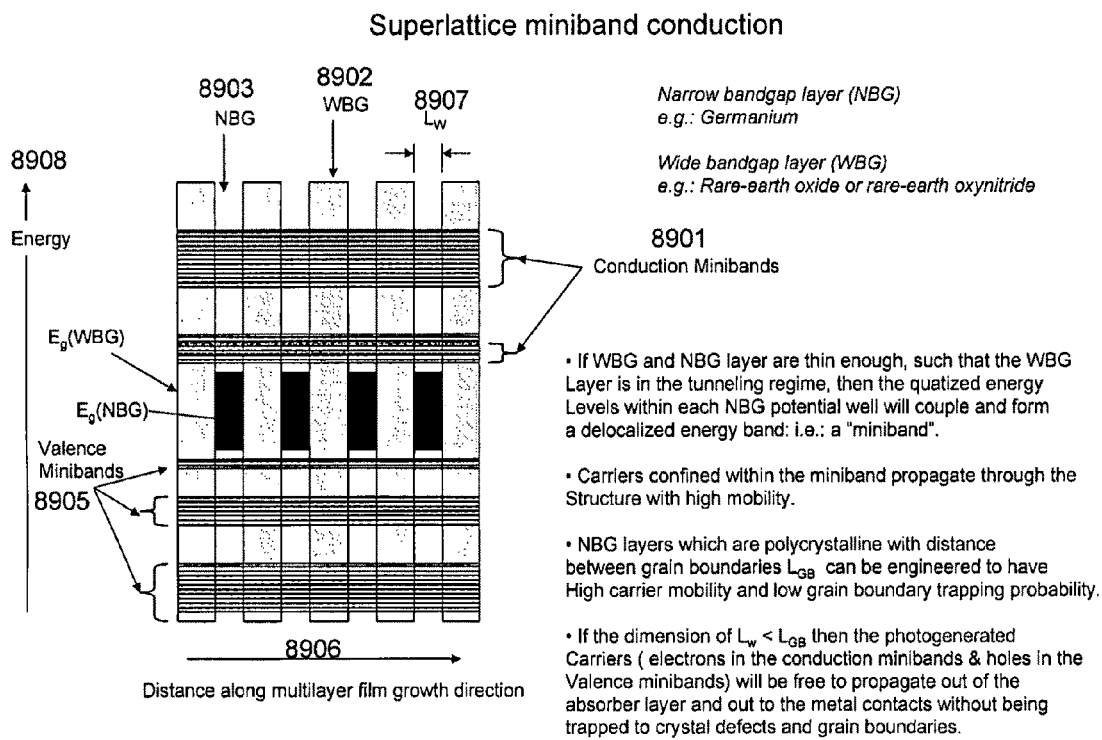
FIG. 89 is a superlattice structure composed of periodic NBG and WBG ultra thin layers. The superlattice exhibiting mini-band conduction perpendicular to the plane of layers.

FIG. 89 is a superlattice exhibiting mini-band conduction perpendicular to the plane of layers. Quantum wells are coupled by thin tunnel barriers. An allowed energy band is termed a miniband. FIG. 89 depicts one embodiment comprising thin, wide-band-gap, WBG, and narrow-band-gap, NBG, layers such that the WBG layer is in the tunneling regime, then the quantized energy levels within each NBG potential well will couple and form a delocalized energy band: i.e.: a "miniband". Carriers confined within the miniband propagate through the structure with high mobility. NBG layers which are polycrystalline with a distance between grain boundaries, $L_{GB}$, can be engineered to have high carrier mobility and low grain boundary trapping probability. If the dimension of Lw<$L_{GB}$ then the photogenerated carriers, electrons in the conduction minibands & holes in the valence minibands, will be free to propagate out of the absorber layer and out to the metal contacts without being trapped to crystal defects and grain boundaries.

Figure 90:
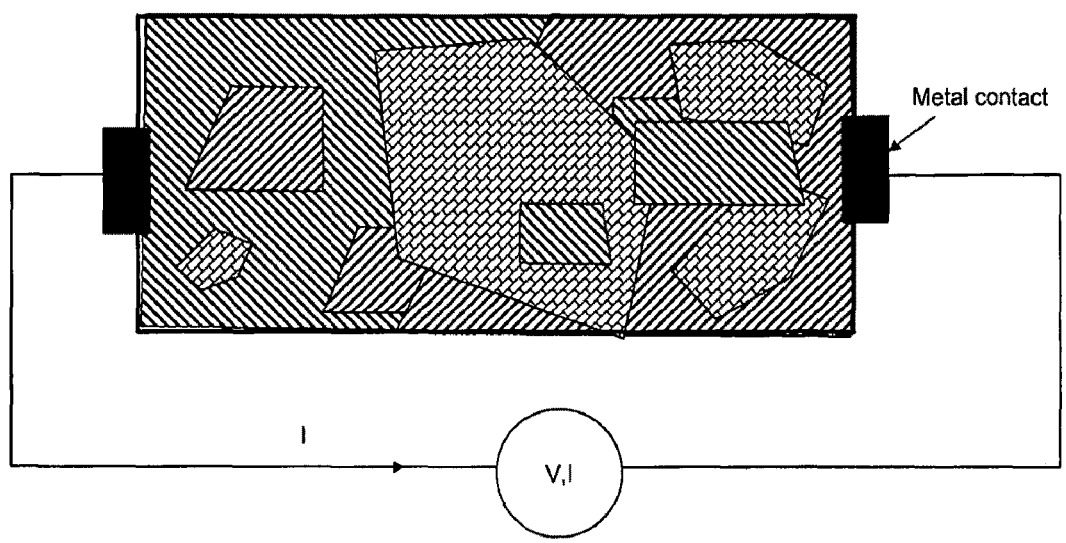
FIG. 90 is a polycrystalline semiconductor solar cell with electrical contacts.

FIG. 90 is a polycrystalline semiconductor solar cell with electrical contacts. Polycrystalline grain boundaries are shown.

Figure 91:
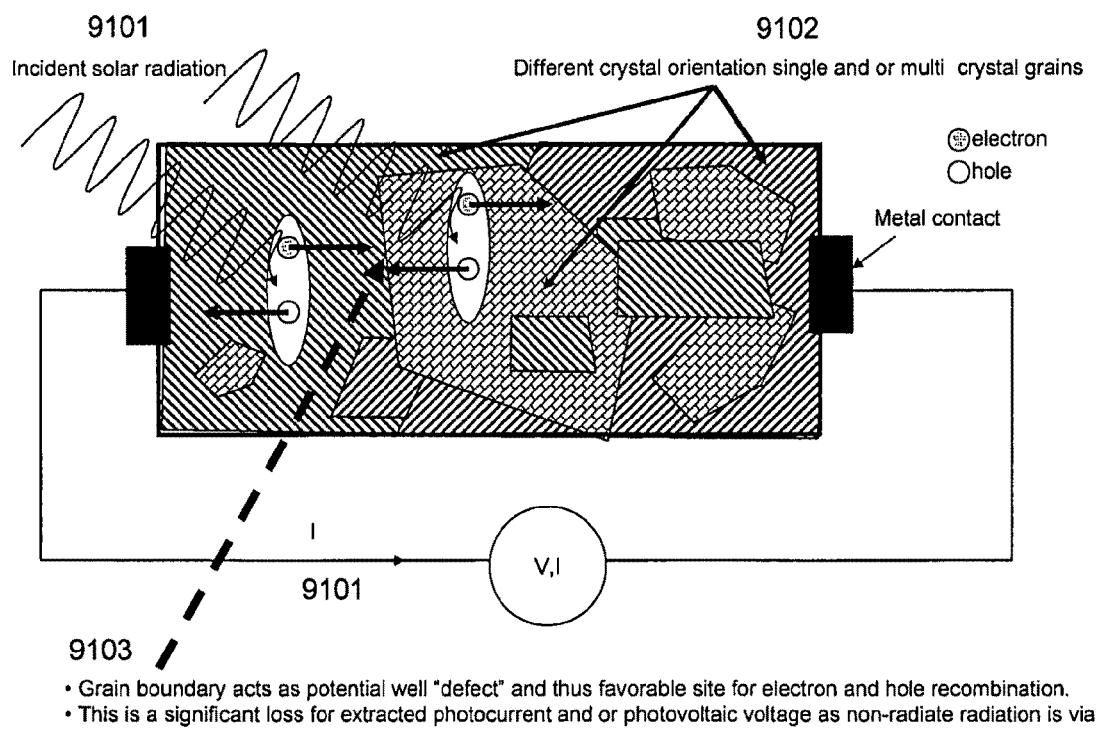
FIG. 91 shows the recombination of photo-generated electrons and hole at a grain boundary.
Figures 92A, 92B:
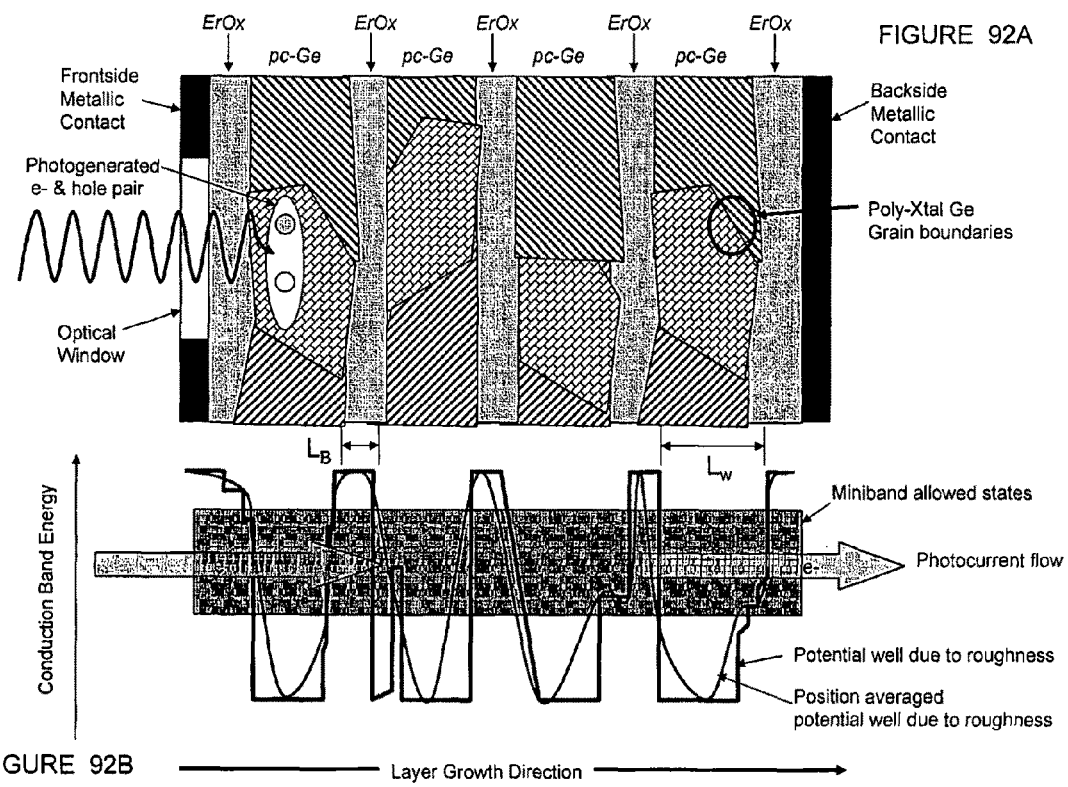
FIGS. 92 A and B, schematically, is a multilayer stack of poly-crystal germanium and rare-earth oxide. The spatial non-uniformity generates an effective superlattice potential as shown.

FIG. 91 shows the recombination of photo-generated electrons and hole at grain boundary;

FIGS. 92 A and B, schematically, is a multilayer stack of poly-crystal germanium and rare-earth oxide. For thin layers mini-band conduction can overcome deleterious grain boundary recombination thereby enhancing electrical conversion efficiency.

Figure 93:
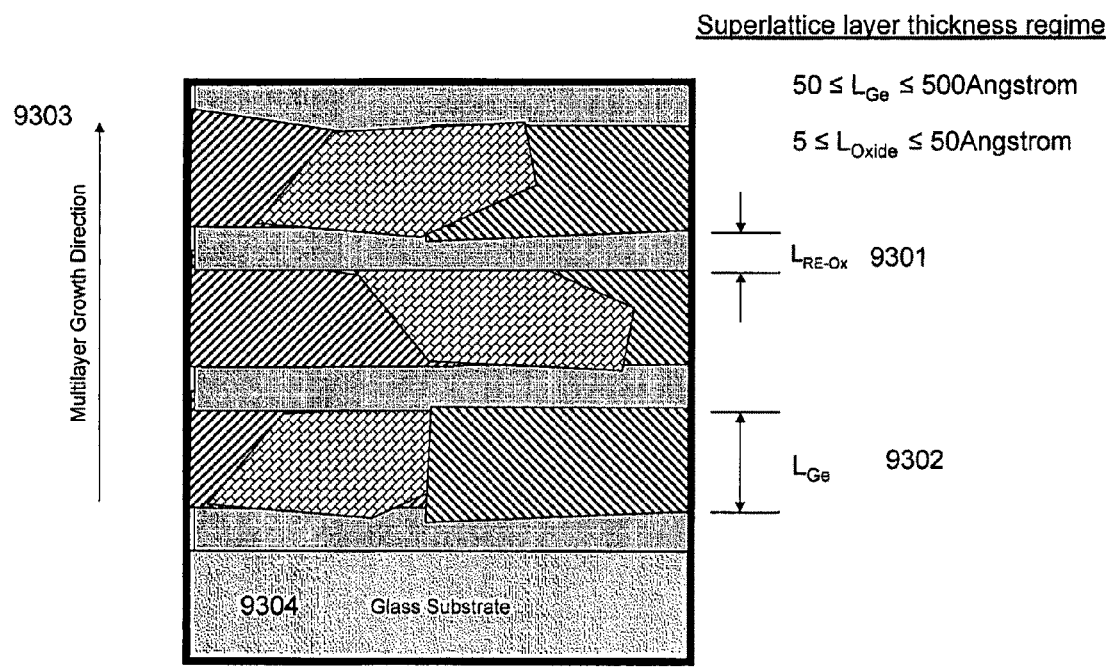
FIG. 93 is one embodiment's range of superlattice layer thicknesses.
Figure 94:
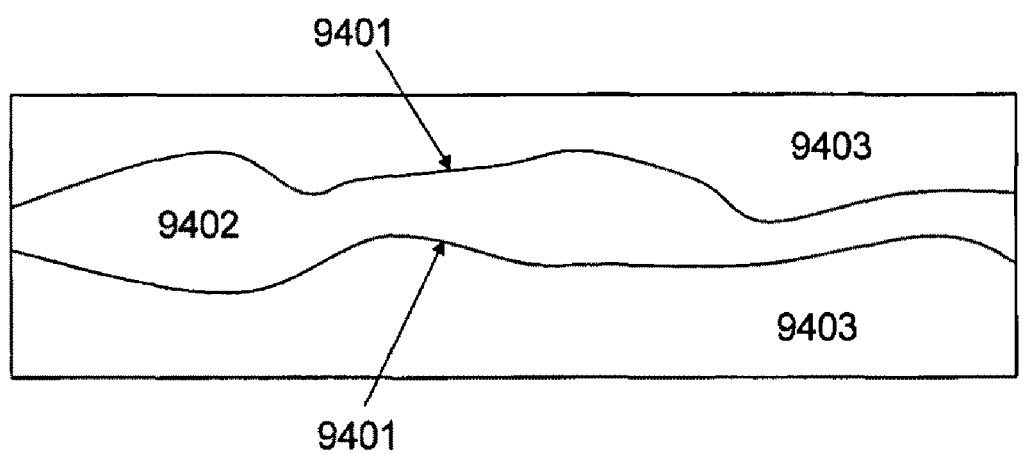
FIG. 94 is a general, nonuniform layer construction.

FIG. 93 is one embodiment's range of superlattice layer thicknesses;

FIG. 94 is a general, nonuniform layer construction.

Figure 95A:
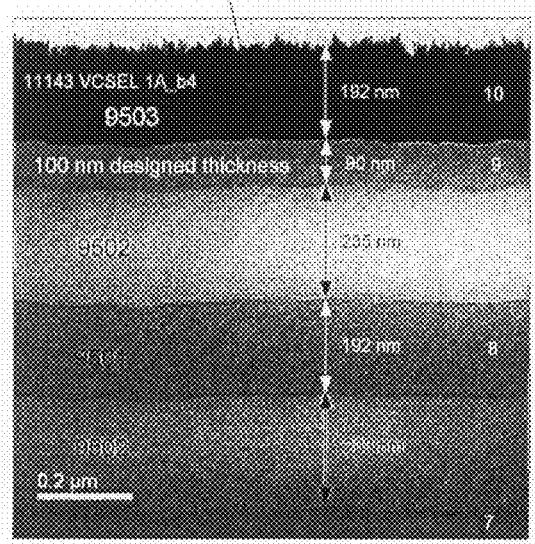
FIG. 95A is a TEM image showing reduction to practice of rare-earth oxide on amorphous substrate consisting of periodic layers of silicon oxide and silicon nitride forming a distributed Bragg reflector (DBR).

FIG. 95A is an actual TEM image showing reduction to practice of rare-earth oxide on amorphous substrate consisting of periodic layers of silicon oxide and silicon nitride.

Figure 95B:
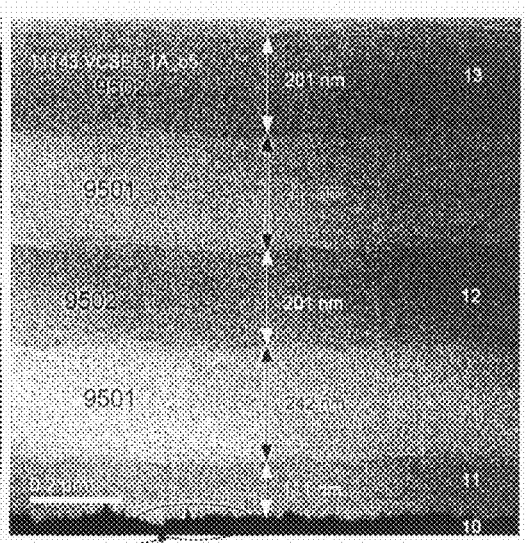
FIG. 95B is an actual TEM image polycrystalline erbium oxide deposited on glass layers and subsequent multilayers deposited upon the said rare-earth oxide.

FIG. 95B is an actual TEM image polycrystalline erbium oxide deposited on glass layers and subsequent multilayers deposited upon the said rare-earth oxide.

Figures 96A, 96B:
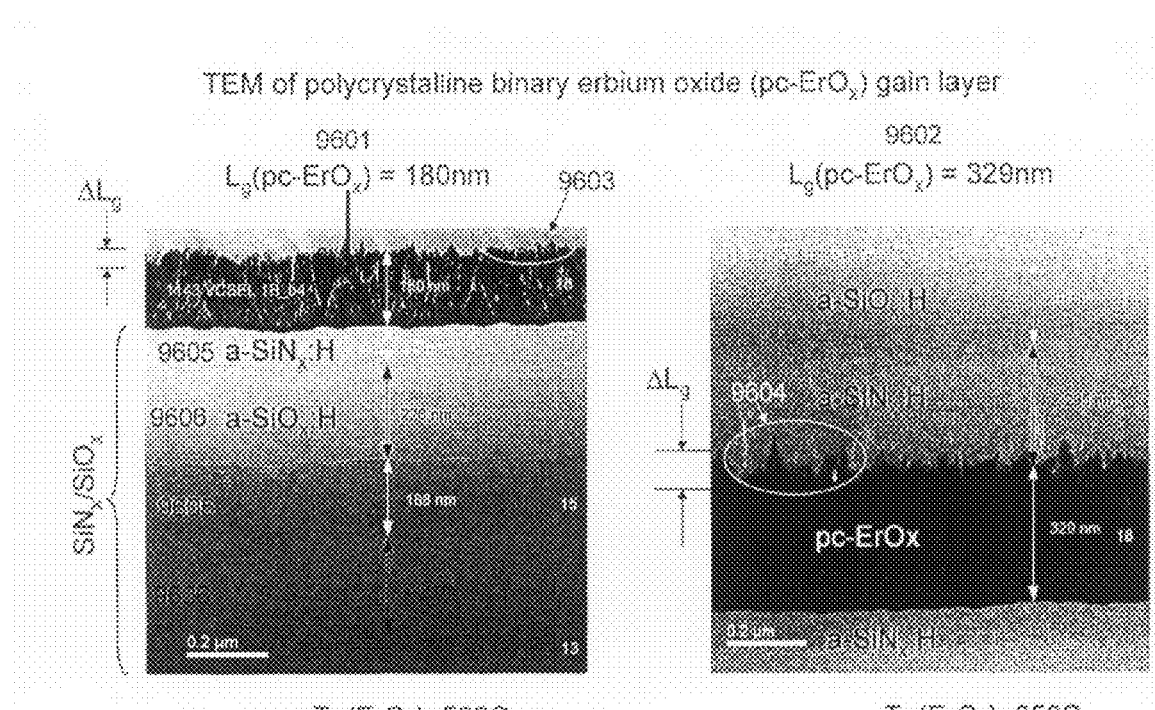
FIG. 96A is a TEM of large grain, Lg, polycrystalline ErOx on a-SiNx.
FIG. 96B is a TEM of large grain, Lg, polycrystalline ErOx on a-SiNx overcoated with a-SiNx and a-SiOx.

FIG. 96A is a TEM of polycrystalline erbium oxide on glass, showing structure 9601 comprising layers 9605, $SiN_x$:H and 9606 $SiO_xH$ on substrate 9608 with top layer 9603 of pc-$ErO_x$.

FIG. 96B is device 9602 cross-section schematic of textured surface used advantageously to increase optical absorption within solar cell devices showing layer 9604, $SiN_x$:H.

Figures 97A, 97B:
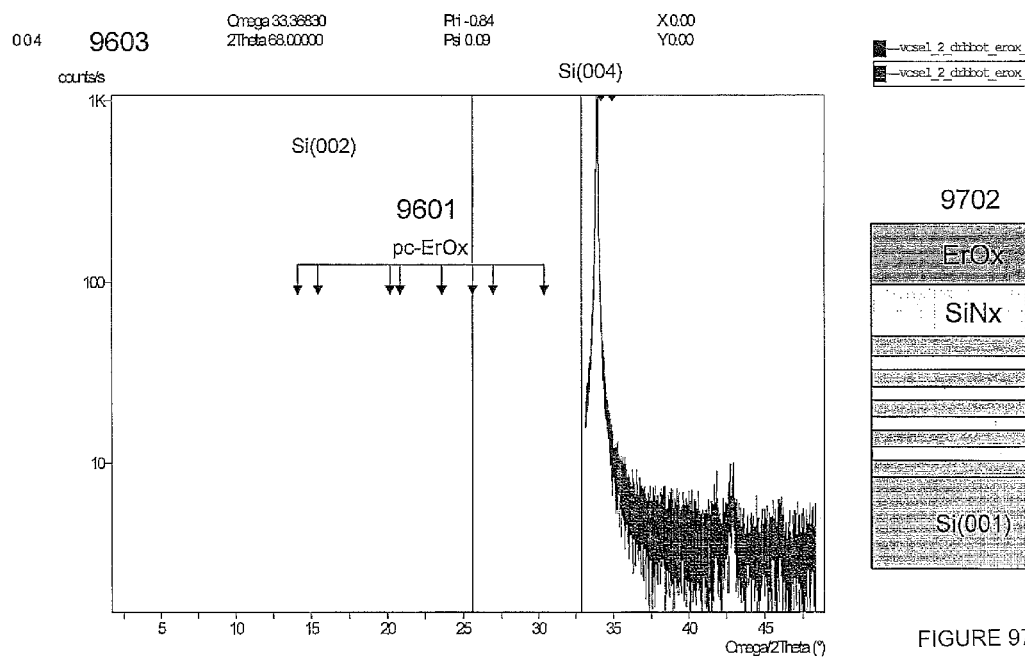
FIG. 97A is an example measured x-ray diffraction scan of bulk erbium oxide deposited directly on glass or amorphous surface, the erbium oxide layer exhibiting polycrystal signature.
FIG. 97B is a distributed Bragg reflector (DBR) showing quarter wavelength pairs of alternate refractive index materials used to fabricate a selective wavelength high reflector.

FIG. 97A is a distributed Bragg reflector (DBR) showing quarter wavelength pairs of alternate refractive index materials used to fabricate a selective wavelength high reflector.

FIG. 97B is an x-ray diffraction scan of erbium oxide on glass showing polycrystal signature. The structure consists of an actual multilayer erbium-oxide and silicon oxide/silicon nitride DBR glass pseudosubstrate deposited on silicon. This reflector can be used as a optical filter for solar cells and enhance a specific wavelength region. This allows the photon number across the solar spectrum to be enhanced in specific regions.

Figure 98:
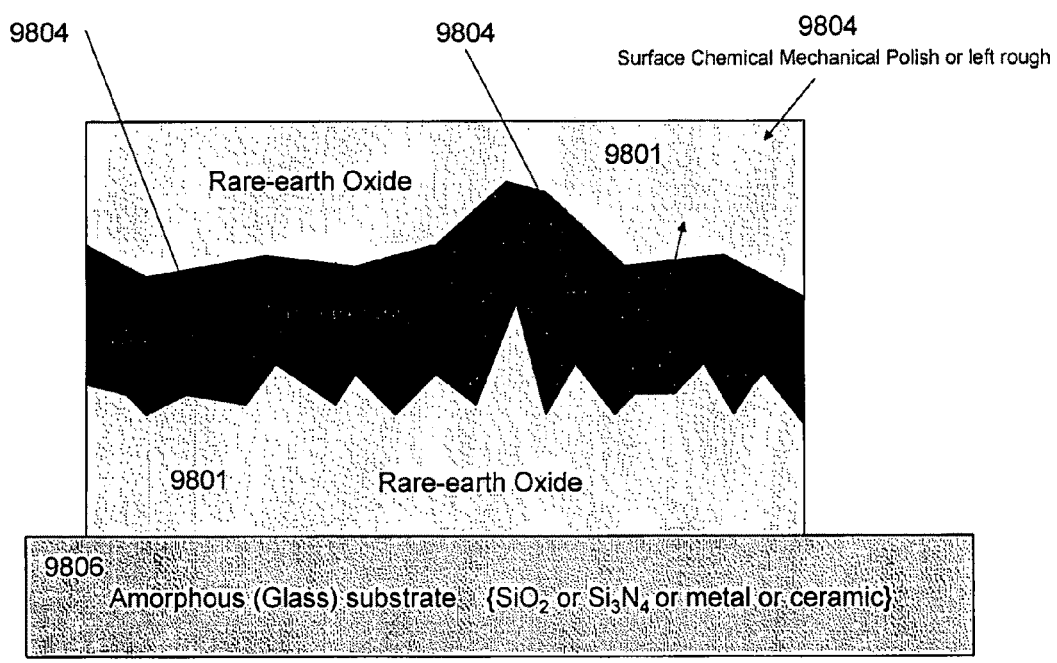
FIG. 98 is a thick film solar cell with textured reflector.

FIG. 98 is a thick film solar cell with textured reflector. The device shows a germanium film sandwiched between two rare-earth-oxide layers, and the multilayer stack deposited on an amorphous substrate.

FIG. 99A is a theoretical silicon oxide/silicon nitride optical distributed Bragg reflector (DBR). This reflector can be used as a optical filter for solar cells to modify the solar spectrum experienced by the active layer(s). For the example shown, the center wavelength λ,c of the DBR is chosen to be 1535 nm and the cavity length is a multiple of half center wavelength.

FIG. 99B are theoretical reflectivity curves as a function of low and high reractive index bi-layer number pairs calculated for silicon oxide/silicon nitride distributed Bragg reflectors located above and below an active region functioning as a solar cell.

Figures 100A, 100B:
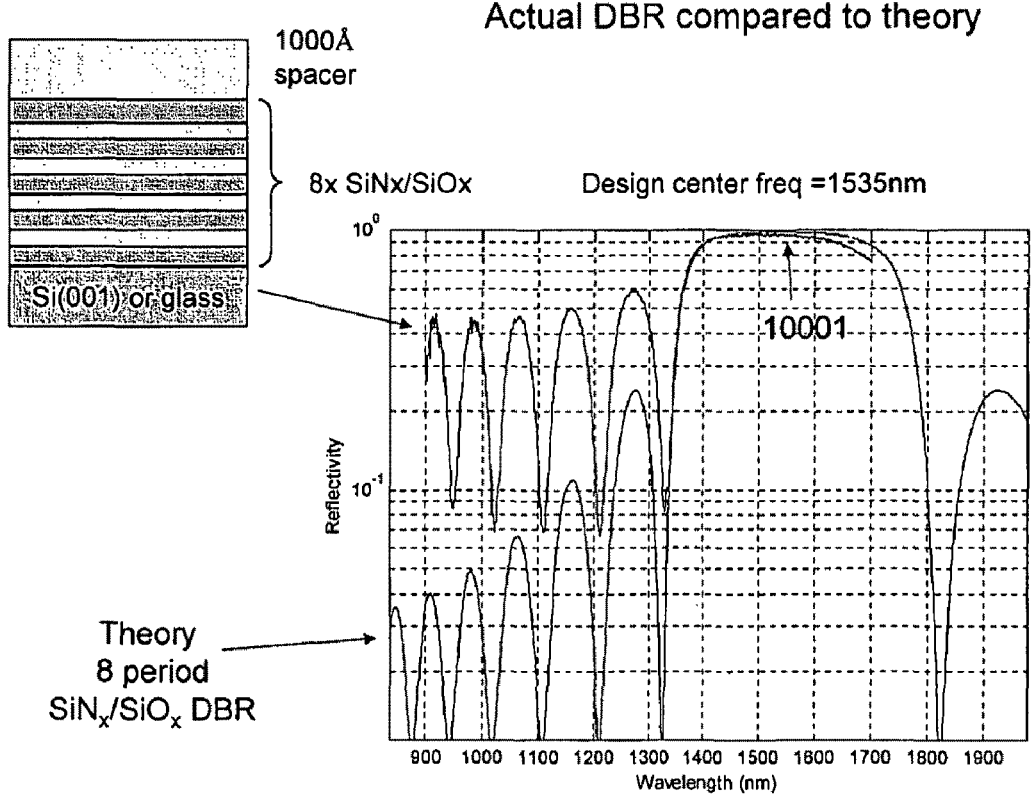
FIG. 100A is schematically a silicon oxide/silicon nitride DBR.
FIG. 100B, is an actual reflectivity spectrum, upper, compared to theoretical, lower.

FIG. 100 B is an actual reflectivity spectrum of silicon oxide/silicon nitride DBR, FIG. 100A, compared to theory. This reflector can be used as a optical filter for solar cells to increase the photon number in a specific wavelength region.

Figures 101A, 101B:
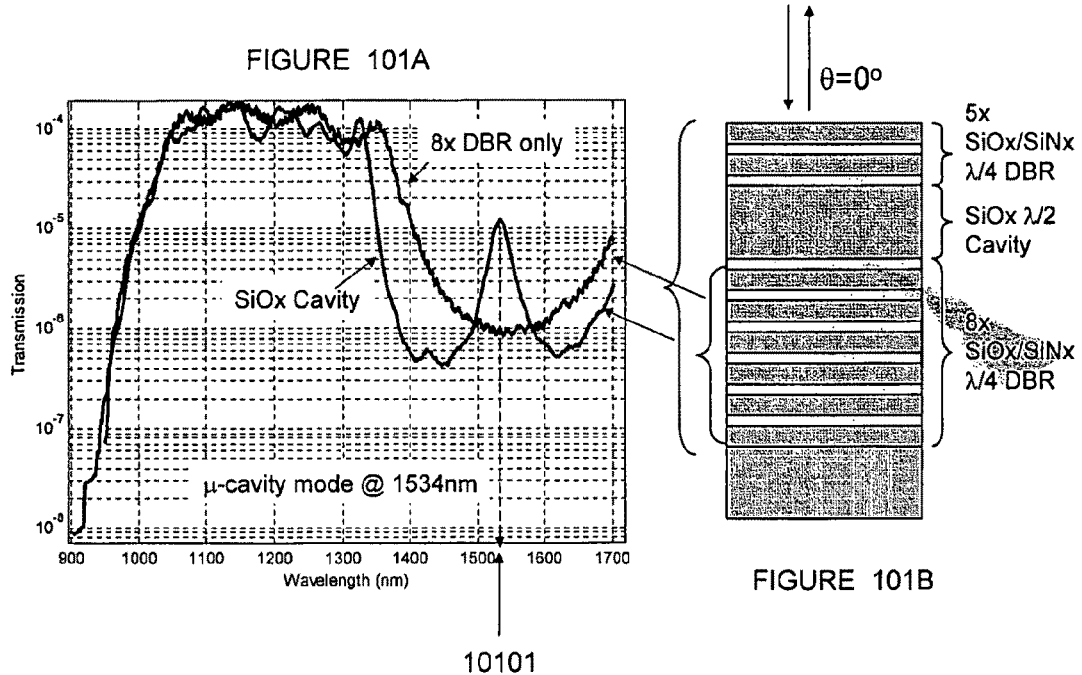
FIG. 101A is a transmission spectra of a passive DBR and micorcavity consisting of Silicon oxide.
FIG. 101B is a schematic of a lower high reflector and lower reflector coupler using passive DBRs separated by a cavity region.

FIG. 101A is a transmission spectra of a passive DBR pair, FIG. 101B, separated by a cavity region.

FIG. 102B is the spectra of a multilayer ErOx/Ge active region for the cavity region of solar cell microcavity composed of a DBR above and below the said active region and attached to a silicon substrate, as schematically shown in FIG. 102A.

FIG. 103 is a schematic diagram showing the tuning (that is, band gap engineering) of the energy band gap for a rare-earth-oxide-phosphide (or equivalently called a rare-earth phosphate or rare-earth oxy-phosphide) semiconductor compound.

Figure 104:
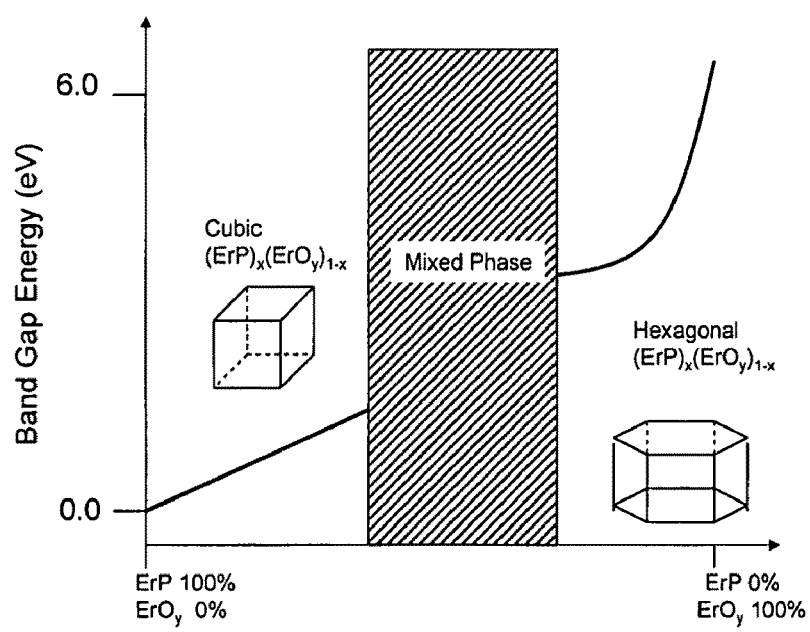
FIG. 104 is a schematic showing the tuning of the energy band gap for a rare-earth-oxide-phosphide.

FIG. 104 is a schematic showing the tuning of the energy band gap for a rare-earth-oxide-phosphide (rare-earth phosphate composed of rare-earth phospide and rare-earth oxide) semiconductor compound in terms of the mixed alloy composed of erbium phosphide, Er—P ($ErP_x$) with rocksalt crystal structure and erbium oxide $ErO_x$ with hexagonal crystal structure. The fraction of ErP and $ErO_y$ in the compound $(ErP)_x(ErO_y)_{1-x}$ s described by the chemical variable "x". For one embodiment the rare earth metal is specifically chosen from erbium. The present invention may also be practiced using more than one rare-earth element. A band gap may be tuned continuously across the solar spectrum using teaching of the instant invention and compositions previously stated such as $[Z]_u[RE1]_v[RE2]_w[RE3]_x[J1]_y[J2]_z$.

When rare earth ions are suitably activated in a triply ionized state, optical absorption and emission of the 4f-shell manifold is possible. Particularly, Erbium has been found to oxidize, nitride and phosphide readily in a suitably activated atomic oxygen/nitrogen/phosphide, metastable oxygen molecular oxygen/nitrogen/phosphide and/or oxygen, oxynitride or oxyphosphide environment. Further, new forms of crystalline-rare earth oxide (c-$REO_x$), c-rare earth nitride (c-RE-Nx), c-rare earth oxynitride (c-RE-$N_xO_y$) c-rare earth phosphide (c-$REP_xO_y$) may be grown on a silicon substrate. As used herein $REO_x$, RE-$N_x$, RE-$P_x$, RE-$P_xO_y$ and RE-$N_xO_y$ mean a rare-earth metal in combination with oxygen and/or nitrogen and/or phosphorus in a ratio of 1 to x or y, where 0<x, y≦5. Such forms of new rare-earth oxides, nitrides and phosphides can be used to further engineer the optical, mechanical and electrical properties. For example, various amounts of nitrogen in concentration ranging from dopant concentrations to many atomic percentile in the compound c-RE-$N_xO_y$ can be used to modify the number and character of oxygen vacancies, electrical conductivity and or alter the structural lattice constant. This is advantageous for matching epitaxy and or deposition conditions for specific substrate surfaces and subsequent semiconductor layers deposited on the said oxide. Similarly, in the rare-earth phosphate compound c-RE-$P_xO_y$, the phosphorus ratio can be used to modify the thermal conductivity, structural character and or electrical and optical properties. Therefore, band gap engineered alloys can be generated from rare-earth phosphate semiconductor with band gap energy varying from essentially zero eV (semimetallic) as binary erbium phosphide, Er—P, to larger band gap energy material exhibiting optically transparent 6 eV band gap such as ErOx. That is, additions of phosphorus atoms (P) can be used advantageously to engineer the properties of rare-earth oxide semiconductor and tune the band gap of c-RE-$P_xO_y$ or pc-RE-$P_xO_y$ or a-RE-$P_xO_y$ and mixtures thereof as semiconductors to span the solar spectrum without the use of germanium.

Another embodiment of the present invention is the alloy compound consisting of the atomic species of germanium, rare-earth metal and oxygen. Similar methods can be employed with addition of germanium and the use of oxides, nitrides and phosphides and combinations thereof are also disclosed in the present invention. The addition of germanium to rare-earth oxide semiconductor can advantageously modify the electronic band gap energy and optical absorption properties of the said material as described in the present invention.

Yet another embodiment of the present invention is an alloy compound consisting of atomic species of silicon, rare-earth metal and oxygen. Similar methods can be employed with addition of silicon and the use of oxides, nitrides and phosphides and combinations thereof are also disclosed in the present invention. The addition of silicon to a rare-earth oxide semiconductor can advantageously modify the electronic band gap energy and optical absorption properties of the said material as described but not limited to in the present invention.

Description of Illustrative Embodiments

Rare-earth metal oxide, nitrides, phosphides and combinations thereof ($REO_xN_yP_z$), wherein the rare-earth metal can be chosen from at least one of the lanthanide series {La, Ce, ... Gd, Er, Tm, Yb, Lu} of the periodic table of elements; erbium is preferred, and the choice of the heavier rare-earth metals are also preferred.

Wide band gap materials, comprising Group IV, III-V, II-IV semiconductors and compounds of rare-earth oxides, nitrides, and phosphides, ($REO_xN_yP_z$), may be used in combinations with other ceramic materials as single crystal, c, and/or polycrystalline, pc, and/or amorphous, a, states. Alloys of various combinations are also possible, as mentioned previously, $[Z]_u[RE1]_v[RE2]_w[RE3]_x[J1]_y[J2]_z$.

Narrow band gap materials, comprising Group IV, III-V, II-IV semiconductors, as single crystal, sc, and/or polycrystalline, pc, and/or amorphous, a, states. Alloys of various combinations are also possible, such as, silicon/germanium alloys to form $Si_{1-x}Ge_x$, $0 \leq x \leq 1$ alloy.

Ternary alloys of Germanium-Rare-Earth-Oxide ($Ge_x(REO_y)_{1-x}$) are disclosed suitable for tailoring the optical and electrical properties across the entire solar spectrum. Multicomponent alloys and layered structures of Group IV, III-V, II-IV semiconductors and compounds of rare-earth oxides, nitrides, and phosphides, ($REO_xN_yP_z$) are disclosed suitable for tailoring the optical and electrical properties across the entire solar spectrum. Structures with varying compositions such that an active region of a solar cell device varies from a large band gap to a smaller band gap are achieved by the previously described techniques.

Multilayer thin film structures for highly efficient solar spectrum conversion into electrical energy are disclosed using wide band gap energy insulator and/or conductor layers interleaved with narrow band gap energy semiconductor layers comprised of Group IV, III-V, II-IV semiconductors elementally or in combination.

In one embodiment a device for converting radiation to electrical energy comprises a substrate; one or more layers of a large band gap material; and one or more layers of a small band gap material for converting radiation to electrical energy, such that the one or more layers of the large band gap material are contacting a layer of the small band gap material; and the large band gap material chosen from a group comprising rare-earth oxide ($RE_xO_z$), rare-earth germanium oxide ($RE_xGe_yO_z$), rare-earth silicon oxide ($RE_xSi_yO_z$), rare-earth-silicon-oxide-phosphide ($RE_xSi_yO_zP_w$), rare-earth-silicon-oxide-nitride ($RE_xSi_yO_zN_w$), rare-earth-silicon-oxide-nitride-phosphide ($RE_xSi_yO_zN_wP_q$). Alternatively, more than one rare-earth may be used; alternatively mixtures of Group IV elements may be used, such as silicon-germanium mixtures; silicon-carbon or germanium-carbon or silicon-germanium-carbon mixtures may be used; this results in the general composition:

[RE1]x[RE2]y[RE3]z[J1]u[J2]v[J3]w[Q1]m[Q2]n[Q3]p; where RE is a member of the lanthanide series; J is chosen from C, O, N, P; Q is chosen from Si, Ge, C; where $0 < x, u \leq 5$ and $0 \leq y, z, v, w, m, n, p \leq 5$.

In one embodiment a device for converting radiation to electrical energy comprising a substrate; one or more layers of a large band gap material; and one or more layers of a small or narrow band gap material for converting radiation to electrical energy, such that the one or more layers of the large band gap material are contacting a layer of the small band gap material; and the small band gap material is chosen from a group comprising rare-earth-silicon ($RE_xSi_y$), rare-earth-germanium ($RE_xGe_y$), rare-earth-phosphide ($RE_xP_y$), and rare-earth-nitride ($RE_xN_y$). Alternatively, more than one rare-earth may be used; alternatively mixtures of Group IV elements may be used, such as silicon-germanium mixtures; silicon-carbon or germanium-carbon or silicon-germanium-carbon mixtures may be used; this results in the general composition:

[RE1]x[RE2]y[RE3]z[Q1]m[Q2]n[Q3]p; where RE is a member of the lanthanide series; Q is chosen from Si, Ge, C; where $0 < x, m \leq 5$ and $0 \leq y, z, n, p \leq 5$.

Multilayer structures may be disposed upon single crystal semiconductor, amorphous glass, metallic, ceramic and/or plastic and/or flexible substrates.

In some embodiments a cost effective deposition method using individual elemental sources of rare-earth metal, oxygen, nitrogen, phosphorous and semiconductor is preferred. In some embodiments a pressure controlled chamber and temperature controlled substrate are used to control deposition conditions of a layered structure. As used herein a small or narrow band gap material has a band gap, Eg, less than about 1.2 eV. A large or wide band gap material has a band gap greater than about 1.2 eV.

In one embodiment a solar cell device comprises a substrate, one or more layers of a large band gap material and one or more layers of a small band gap material, such that the one or more layers of the large band gap material are separated by layers of an individually, predetermined thickness of the small band gap material. Alternatively, the solar cell device also comprises two or more electrical contacts.

In one embodiment a solar cell device comprises a substrate, a layer with a lower surface in contact with the substrate and an upper surface comprising a combination of a large band gap material and a small band gap material, wherein the composition of the layer varies from the upper surface with a higher proportion of the large band gap material to a lower portion of the large band gap material on the lower surface. Alternatively, said large band gap material comprises one or more large band gap materials and said small band gap material comprises one or more small band gap materials.

In one embodiment a solar cell device for converting radiation to electrical energy comprises an active layer for the converting comprising at least a large band gap material and a small band gap material and at least one filtering layer wherein the filtering layer comprises a distributed Bragg reflector comprising at least two layers of different compositions such that the radiation is substantially reflected into the active layer before reaching the substrate. Alternatively, a solar cell device also comprises a substrate.

In one embodiment a solar cell device for converting radiation to electrical energy comprises an active layer for the converting comprising at least a large band gap material and a small band gap material and an optically transparent conducting oxide over at least a portion of the surface of the active layer first receiving the radiation. In some embodiments a solar cell device is converting radiation sources alternative to the sun. In some embodiments a device for converting radiation to electrical energy is not located on the earth.

In one embodiment a solar cell device for converting radiation to electrical energy comprises an active region for the converting comprising at least one rare-earth metal, at least one semiconductor and at least one element chosen from a group comprising oxygen, nitrogen, and phosphorous. Alternatively, an active region comprises a wide band gap metal oxide and a narrow bandgap semiconductor.

Foregoing described embodiments of the invention are provided as illustrations and descriptions. They are not intended to limit the invention to precise form described. In particular, it is contemplated that functional implementation of invention described herein may be implemented equivalently. Alternative construction techniques and processes are apparent to one knowledgeable with integrated circuit and MEMS technology. Other variations and embodiments are possible in light of above teachings, and it is thus intended that the scope of invention not be limited by this Detailed Description, but rather by Claims following.

What is claimed is:

1. A device for converting radiation to electrical energy comprising:
   a substrate;
   a layer of a large band gap material wherein the large band gap material has a band gap of at least 1.2 eV and consists of at least one rare-earth ion and at least one of oxygen, phosphorus and nitrogen; and
   a layer of a small band gap material for converting radiation to electrical energy, such that the layer of the large band gap material is contacting the layer of the small band gap material.

2. The device of claim 1 wherein said small band gap material comprises at least one from a group comprising Group IV, III-V, and II-VI semiconductors and combinations thereof.

3. The device of claim 1 wherein said large band gap material is single crystal.

4. The device of claim 1 wherein said substrate transmits a majority of said radiation impinging upon it to the large band gap material.

5. A device for converting radiation to electrical energy comprising:
   a substrate;
   a layer of a large band gap material; and
   a layer of a small band gap material for converting radiation to electrical energy, such that the layer of the large band gap material is contacting the layer of the small band gap material; and
   the large band gap material is chosen from a group consisting of rare-earth oxide ($RE_xO_z$), rare-earth-oxide-phosphide ($RE_xO_zP_w$), rare-earth-oxide-nitride ($RE_xO_zN_w$), rare-earth-oxide-nitride-phosphide ($RE_xO_zN_wP_q$) and combinations thereof.

* * * * *